(12) United States Patent
Sasada

(10) Patent No.: US 11,889,751 B2
(45) Date of Patent: Jan. 30, 2024

(54) LIGHT EMITTING ELEMENT

(71) Applicant: Sumitomo Chemical Company, Limited, Tokyo (JP)

(72) Inventor: Toshiaki Sasada, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 512 days.

(21) Appl. No.: 17/042,316

(22) PCT Filed: Apr. 24, 2019

(86) PCT No.: PCT/JP2019/017476
§ 371 (c)(1),
(2) Date: Sep. 28, 2020

(87) PCT Pub. No.: WO2019/208648
PCT Pub. Date: Oct. 31, 2019

(65) Prior Publication Data
US 2021/0074922 A1 Mar. 11, 2021

(30) Foreign Application Priority Data

Apr. 26, 2018 (JP) ................................. 2018-085560

(51) Int. Cl.
*H10K 85/60* (2023.01)
*H10K 85/30* (2023.01)
(Continued)

(52) U.S. Cl.
CPC ......... *H10K 85/631* (2023.02); *H10K 85/342* (2023.02); *H10K 85/344* (2023.02);
(Continued)

(58) Field of Classification Search
None
See application file for complete search history.

(56) References Cited

U.S. PATENT DOCUMENTS

| 2011/0108814 A1 | 5/2011 | Iida et al. |
| 2012/0193611 A1 | 8/2012 | Chen et al. |

(Continued)

FOREIGN PATENT DOCUMENTS

| EP | 2492276 A1 | 8/2012 |
| EP | 3133660 A1 | 2/2017 |

(Continued)

OTHER PUBLICATIONS

1 International Search Report dated Jul. 9, 2019 in International Application No. PCT/JP2019/017476.

(Continued)

*Primary Examiner* — Gregory D Clark
(74) *Attorney, Agent, or Firm* — Panitch Schwarze Belisario & Nadel LLP

(57) ABSTRACT

A light emitting device contains an anode, cathode, and two organic layers provided therebetween. One organic layer contains a phosphorescent compound, the second organic layer contains a block copolymer containing an end group, a block that binds to the end group and/or a block that does not bind to the end group, and a crosslinked product of the block copolymer. The non-terminal block contains a non-crosslinkable unit represented by the formula (X) and/or a non-crosslinkable unit represented by the formula (Z). At least one of $X_I > X_{II}$; $Z_I > Z_{II}$; $X_I + Z_I > X_{II} + Z_{II}$ is satisfied when the total number of units having formula (X) and the total number of units having formula (Z) in the non-terminal block are $X_I$ and $Z_I$, respectively, and the total number of units having formula (X) and the total number of units having formula (Z) in the terminal block are $X_{II}$ and $Z_{II}$, respectively.

18 Claims, 1 Drawing Sheet

(51) Int. Cl.
*H10K 50/15* (2023.01)
*H10K 50/16* (2023.01)
*H10K 50/17* (2023.01)

(52) U.S. Cl.
CPC .......... *H10K 85/346* (2023.02); *H10K 50/15* (2023.02); *H10K 50/16* (2023.02); *H10K 50/171* (2023.02)

(56) References Cited

U.S. PATENT DOCUMENTS

| 2013/0248778 A1 | 9/2013 | Goto et al. |
| 2013/0270544 A1 | 10/2013 | Anryu et al. |
| 2014/0231717 A1 | 8/2014 | Sakakibara et al. |
| 2017/0186959 A1 | 6/2017 | Tanaka et al. |
| 2020/0108993 A1 | 4/2020 | Malott et al. |

FOREIGN PATENT DOCUMENTS

| EP | 3136462 A1 | 3/2017 | |
| EP | 3428989 A1 | 1/2019 | |
| EP | 3618134 A1 | 3/2020 | |
| JP | 2012131995 A | 7/2012 | |
| JP | 2014224101 A | 12/2014 | |
| JP | 2016111355 A | 6/2016 | |
| WO | 2008093822 A1 | 8/2008 | |
| WO | 2009123269 A1 | 10/2009 | |
| WO | WO 2009/123269 | * 10/2009 | ............ H01L 51/50 |
| WO | 2012086670 A1 | 6/2012 | |
| WO | 2013058160 A1 | 4/2013 | |

OTHER PUBLICATIONS

Extended European Search Report dated Feb. 3, 2022 in EP Application No. 19791935.0.
Office Action dated Nov. 4, 2022 in JP Application No. 2020-515532.

* cited by examiner

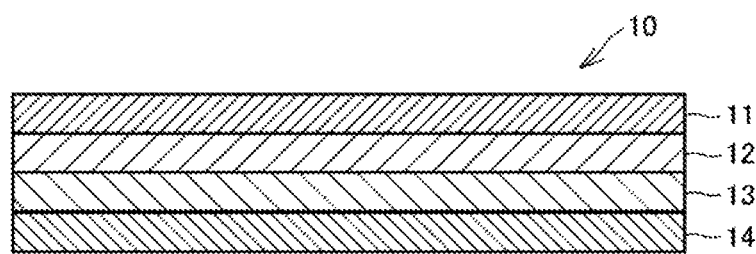

LIGHT EMITTING ELEMENT

CROSS-REFERENCE TO RELATED APPLICATIONS

This application is a Section 371 of International Application No. PCT/JP2019/017476, filed Apr. 24, 2019, which was published in the Japanese language on Oct. 31, 2019 under International Publication No. WO 2019/208648 A1, which claims priority under 35 U.S.C. § 119(b) to Japanese Application No. 2018-085560, filed on Apr. 26, 2018, the disclosures of which are incorporated herein by reference in their entireties.

TECHNICAL FIELD

The present invention relates to a light emitting device.

BACKGROUND ART

Light emitting devices such as organic electroluminescent devices and the like can be suitably used for display and lighting applications, and research and development thereof have been conducted. For example, JP-A No. 2012-131995 (Patent Document 1) discloses a light emitting device having a hole transporting layer containing only a polymer compound containing no block (for example, polymer compound CP2) and a light emitting layer containing a phosphorescent compound. Further, JP-A No. 2016-111355 (Patent Document 2) discloses a light emitting device having a hole transporting layer containing a cured product of a polymer compound containing a block (for example, polymer compound P4) and a light emitting layer containing a phosphorescent compound.

PRIOR ART DOCUMENT

Patent Document

Patent Document 1: Japanese Unexamined Patent Application Publication (JP-A) No. 2012-131995
Patent Document 2: JP-A No. 2016-111355

SUMMARY OF THE INVENTION

Problem to be Solved by the Invention

However, the above-described light emitting devices were not necessarily sufficient in luminance life.
Then, the present invention has an object of providing a light emitting device excellent in luminance life.

Means for Solving the Problem

The present invention provides the following [1] to [14].
[1] A light emitting device comprising an anode, a cathode, and a first organic layer and a second organic layer provided between the anode and the cathode, wherein
the first organic layer is a layer comprising a phosphorescent compound,
the second organic layer is a layer comprising at least one of a block copolymer comprising an end group, a block that binds to the end group and a block that does not bind to the end group, and a crosslinked product of the block copolymer,
the above-described block that does not bind to the end group comprises at least one constitutional unit selected from the group consisting of a non-crosslinkable constitutional unit represented by the following formula (X) and a non-crosslinkable constitutional unit represented by the following formula (Z), and
at least one of the following formulae (i) to (iii) is satisfied when the total number of the above-described non-crosslinkable constitutional unit represented by the formula (X) and the total number of the above-described non-crosslinkable constitutional unit represented by the formula (Z) in the above-described block that does not bind to the end group are represented by $X_I$ and $Z_I$, respectively, and the total number of the above-described non-crosslinkable constitutional unit represented by the formula (X) and the total number of the above-described non-crosslinkable constitutional unit represented by the formula (Z) in the above-described block that binds to the end group are represented by $X_{II}$ and $Z_{II}$, respectively:

$$X_I > X_{II} \tag{i}$$

$$Z_I > Z_{II} \tag{ii}$$

$$X_I + Z_I > X_{II} + Z_{II} \tag{iii}$$

[Chemical Formula 1]

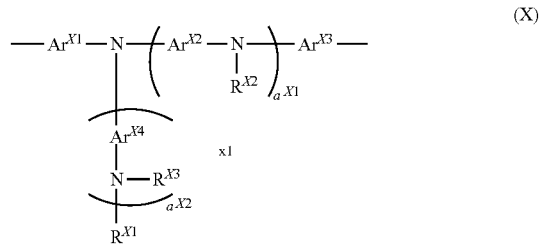

(X)

[wherein,
$a^{X1}$ and $a^{X2}$ each independently represent an integer of 0 or more and 10 or less.
$Ar^{X1}$ and $Ar^{X3}$ each independently represent an arylene group or a divalent heterocyclic group, and the foregoing groups optionally have a substituent.
$Ar^{X2}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent. When a plurality of $Ar^{X2}$ are present, they may be the same or different. When a plurality of $Ar^{X4}$ are present, they may be the same or different.
$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent. When a plurality of $R^{X2}$ are present, they may be the same or different. When a plurality of $R^{X3}$ are present, they may be the same or different.]

[Chemical Formula 2]

$$\mathrm{\{Ar^Z\}} \tag{Z}$$

[wherein, $Ar^Z$ represents a divalent heterocyclic group, or a divalent group in which at least one arylene group and at least one divalent heterocyclic group are bonded directly, and the foregoing groups optionally have a substituent.].

[2] The light emitting device according to [1], wherein the above-described phosphorescent compound is a phosphorescent compound represented by the following formula (1):

[Chemical Formula 3]

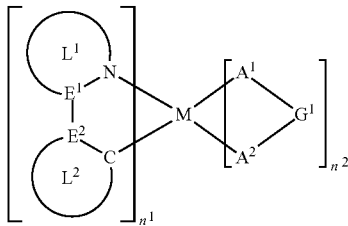

(1)

[wherein,

M represents a ruthenium atom, a rhodium atom, a palladium atom, an iridium atom or a platinum atom.

$n^1$ represents an integer of 1 or more, and $n^2$ represents an integer of 0 or more. However, $n^1+n^2$ is 3 when M is a ruthenium atom, a rhodium atom, or an iridium atom, while $n^1+n^2$ is 2 when M is a palladium atom or a platinum atom.

$E^1$ and $E^2$ each independently represent a carbon atom or a nitrogen atom. However, at least one of $E^1$ and $E^2$ is a carbon atom. When a plurality of $E^1$ are present, they may be the same or different. When a plurality of $E^2$ are present, they may be the same or different.

Ring $L^1$ represents an aromatic hetero ring which optionally has a substituent. When a plurality of the substituents are present, they may be combined together to form a ring together with atoms to which they are attached. When a plurality of Rings $L^1$ are present, they may be the same or different.

Ring $L^2$ represents an aromatic hydrocarbon ring or an aromatic hetero ring, and the foregoing rings optionally have a substituent. When a plurality of the substituents are present, they may be combined together to form a ring together with atoms to which they are attached. When a plurality of Rings $L^2$ are present, they may be the same or different.

The substituent which Ring $L^1$ optionally has and the substituent which Ring $L^2$ optionally has may be combined together to form a ring together with atoms to which they are attached.

$A^1$-$G^1$-$A^2$ represents an anionic bidentate ligand. $A^1$ and $A^2$ each independently represent a carbon atom, an oxygen atom or a nitrogen atom, and these atoms may be ring constituent atoms. $G^1$ represents a single bond or an atomic group constituting a bidentate ligand together with $A^1$ and $A^2$. When a plurality of $A^1$-$G^1$-$A^2$ are present, they may be the same or different.].

[3] The light emitting device according to [2], wherein the above-described phosphorescent compound represented by the formula (1) is a phosphorescent compound represented by the following formula (1-A):

[Chemical Formula 4]

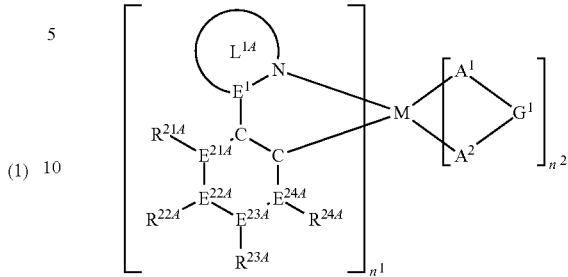

(1-A)

[wherein,

M, $n^1$, $n^2$, $E^1$ and $A^1$-$G^1$-$A^2$ represent the same meaning as described above.

Ring $L^{1A}$ represents a pyridine ring, a diazabenzene ring, an azanaphthalene ring, a diazanaphthalene ring, a triazole ring or a diazole ring, and the foregoing rings optionally have a substituent. When a plurality of the substituents are present, they may be combined together to form a ring together with carbon atoms to which they are attached. When a plurality of Rings $L^{1A}$ are present, they may be the same or different.

$E^{21A}$, $E^{22A}$, $E^{23A}$ and $E^{24A}$ each independently represent a nitrogen atom or a carbon atom. When a plurality of $E^{21A}$, $E^{22A}$, $E^{23A}$ and $E^{24A}$ are present, they may be the same or different at each occurrence. When $E^{21A}$ is a nitrogen atom, $R^{21A}$ is absent. When $E^{22A}$ is a nitrogen atom, $R^{22A}$ is absent. When $E^{23A}$ is a nitrogen atom, $R^{23A}$ is absent. When $E^{24A}$ is a nitrogen atom, $R^{24A}$ is absent.

$R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{21A}$, $R^{22A}$, $R^{23A}$ and $R^{24A}$ are present, they may be the same or different at each occurrence. $R^{21A}$ and $R^{22A}$, $R^{22A}$ and $R^{23A}$, $R^{23A}$ and $R^{24A}$, and the substituent which Ring $L^{1A}$ optionally has and $R^{21A}$ may each be combined together to form a ring together with atoms to which they are attached.

Ring $L^{2A}$ represents a benzene ring, a pyridine ring or a diazabenzene ring.].

[4] The light emitting device according to [3], wherein the above-described phosphorescent compound represented by the formula (1-A) is a phosphorescent compound represented by the following formula (1-B1), formula (1-B2), formula (1-B3), formula (1-B4) or formula (1-B5):

[Chemical Formula 5]

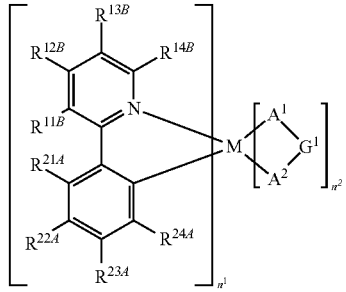

(1-B1)

-continued

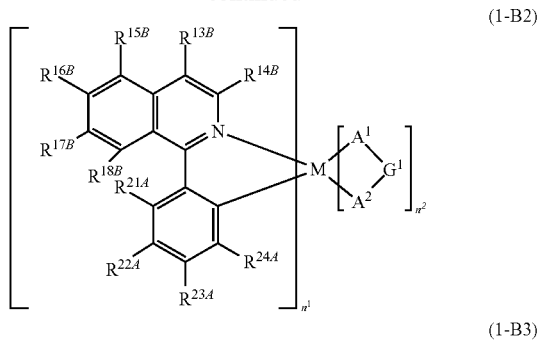

(1-B2)

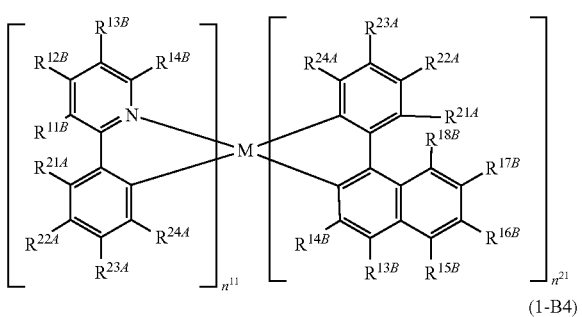

(1-B3)

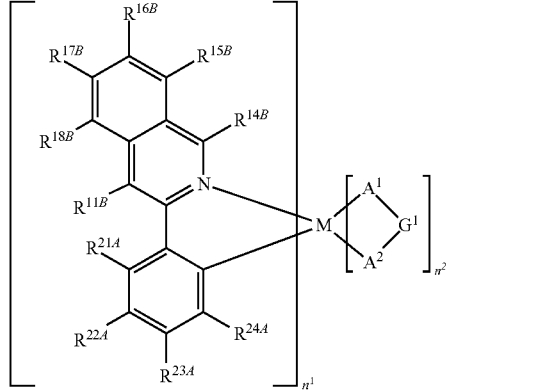

(1-B4)

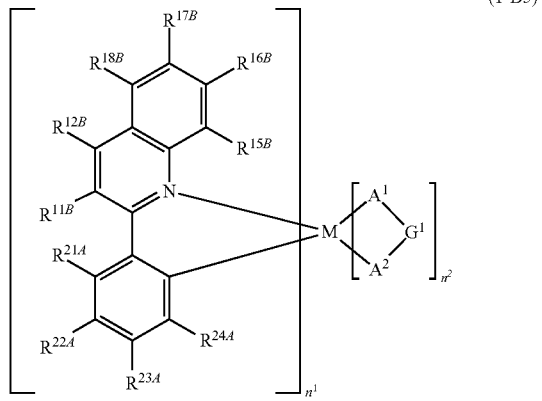

(1-B5)

[wherein,

M, $n^1$, $n^2$, $R^{21A}$, $R^{22A}$, $R^{23A}$, $R^{24A}$ and $A^1$-$G^1$-$A^2$ represent the same meaning as described above.

$n^{11}$ and $n^{21}$ each independently represent 1 or 2. However, $n^{11}+n^{21}$ is 3 when M is a ruthenium atom, a rhodium atom or an iridium atom, while $n^{11}+n^{21}$ is 2 when M is a palladium atom or a platinum atom.

$R^{11B}$, $R^{12B}$, $R^{13B}$, $R^{14B}$, $R^{15B}$, $R^{16B}$, $R^{17B}$ and $R^{13B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence.

In the formula (1-B1), $R^{11B}$ and $R^{12B}$, $R^{12B}$ and $R^{13B}$, $R^{13B}$ and $R^{14B}$, and $R^{11B}$ and $R^{21A}$ may each be combined together to form a ring together with atoms to which they are attached. In the formula (1-B2), $R^{13B}$ and $R^{14B}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{23A}$ may each be combined together to form a ring together with atoms to which they are attached. In the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ may each be combined together to form a ring together with atoms to which they are attached. In the formula (1-B4), $R^{11B}$ and $R^{18B}$, $R^{14B}$ and $R^{15B}$, $R^{15B}$ and $R^{16B}$, $R^{16B}$ and $R^{17B}$, $R^{17B}$ and $R^{18B}$, and $R^{11B}$ and $R^{21A}$ may each be combined together to form a ring together with atoms to which they are attached. In the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and $R^{18B}$, and $R^{11B}$ and $R^{21A}$ may each be combined together to form a ring together with atoms to which they are attached.].

[5] The light emitting device according to [3], wherein the above-described phosphorescent compound represented by the formula (1-A) is a phosphorescent compound represented by the following formula (1-A1), formula (1-A2), formula (1-A3) or formula (1-A4):

[Chemical Formula 6]

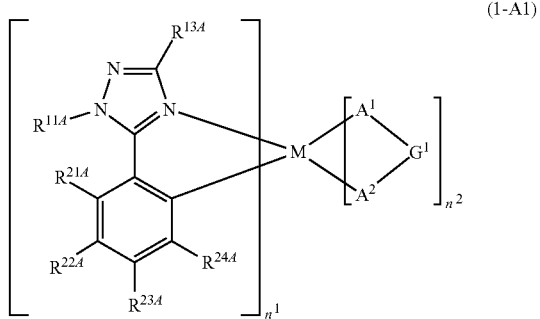

(1-A1)

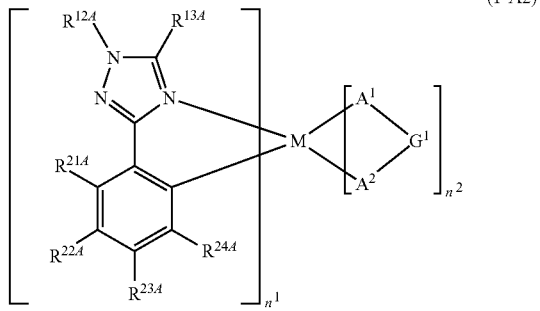

(1-A2)

-continued

[Chemical Formula 7]

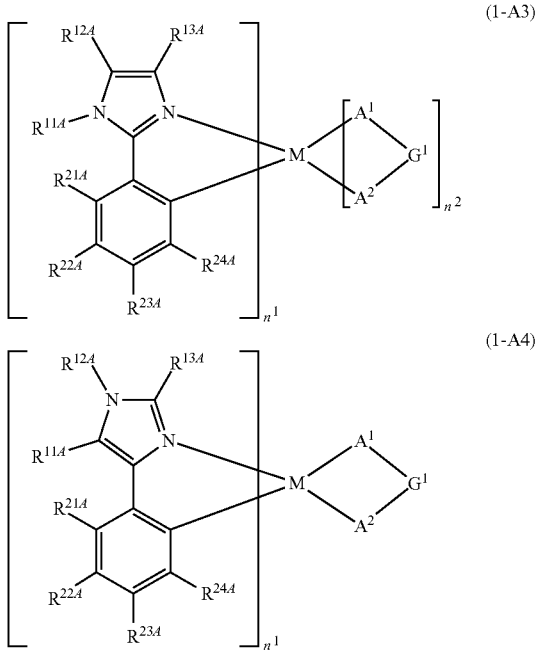

[wherein, M, $n^1$, $n^2$, $R^{21A}$, $R^{22A}$, $R^{23A}$, $R^{24A}$ and $A^1$-$G^1$-$A^2$ represent the same meaning as described above.

$R^{11A}$, $R^{12A}$ and $R^{13A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent. When a plurality of $R^{11A}$, $R^{12A}$ and $R^{13A}$ are present, they may be the same or different at each occurrence.

In the formula (1-A1), $R^{11A}$ and $R^{21A}$ may be combined together to form a ring together with atoms to which they are attached. In the formula (1-A2), $R^{12A}$ and $R^{13A}$ may be combined together to form a ring together with atoms to which they are attached. In the formula (1-A3) and the formula (1-A4), $R^{11A}$ and $R^{12A}$, $R^{12A}$ and $R^{13A}$, and $R^{11A}$ and $R^{21A}$ may each be combined together to form a ring together with atoms to which they are attached.].

[6] The light emitting device according to any one of [1] to [5], wherein the above-described block that binds to the end group comprises at least one constitutional unit selected from the group consisting of a non-crosslinkable constitutional unit represented by the following formula (Y), a non-crosslinkable constitutional unit represented by the above-described formula (X), a non-crosslinkable constitutional unit represented by the above-described formula (Z) and a constitutional unit having a crosslinkable group:

[Chemical Formula 8]

                                                (Y)

[wherein, $Ar^{Y1}$ represents an arylene group which optionally has a substituent.].

[7] The light emitting device according to any one of [1] to [6], wherein the above-described block that binds to the end group does not comprise the above-described non-crosslinkable constitutional unit represented by the formula (X) and the above-described non-crosslinkable constitutional unit represented by the formula (Z).

[8] The light emitting device according to any one of [1] to [7], wherein the above-described block that does not bind to the end group further comprises at least one constitutional unit selected from the group consisting of a non-crosslinkable constitutional unit represented by the formula (Y) and a constitutional unit having a crosslinkable group:

[Chemical Formula 9]

                                                (Y)

[wherein, $Ar^{Y1}$ represents an arylene group which optionally has a substituent.].

[9] The light emitting device according to any one of [1] to [8], wherein the above-described block copolymer comprises a constitutional unit having a crosslinkable group.

[10] The light emitting device according to any one of [6] to [9], wherein the above-described constitutional unit having a crosslinkable group is at least one selected from the group consisting of a constitutional unit represented by the following formula (2) and a constitutional unit represented by the following formula (2'):

[Chemical Formula 10]

                                                (2)

[wherein, nA represents an integer of 0 or more and 5 or less, and n represents an integer of 1 or more and 5 or less. When a plurality of nA are present, they may be the same or different.

$Ar^3$ represents an aromatic hydrocarbon group or a heterocyclic group, and the foregoing groups optionally have a substituent.

$L^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $L^A$ are present, they may be the same or different.

X represents the above-described crosslinkable group. When a plurality of X are present, they may be the same or different.]

[Chemical Formula 11]

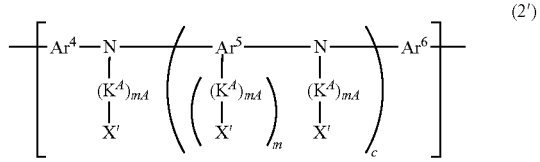                                                (2')

[wherein, mA represents an integer of 0 or more and 5 or less, m represents an integer of 1 or more and 5 or less, and c represents 0 or 1. When a plurality of mA are present, they may be the same or different.

$Ar^5$ represents an aromatic hydrocarbon group, a heterocyclic group, or a group in which at least one aromatic hydrocarbon group and at least one heterocyclic group are bonded directly, and the foregoing groups optionally have a substituent.

$Ar^4$ and $Ar^6$ each independently represent an arylene group or a divalent heterocyclic group, and the foregoing groups optionally have a substituent.

$Ar^4$, $Ar^5$ and $Ar^6$ each may be bonded directly or via an oxygen atom or a sulfur atom, to a group other than that group bonding to a nitrogen atom to which that group is bonded, to form a ring.

$K^A$ represents an alkylene group, a cycloalkylene group, an arylene group, a divalent heterocyclic group, a group represented by —NR"—, an oxygen atom or a sulfur atom, and the foregoing groups optionally have a substituent. R" represents a hydrogen atom, an alkyl group, a cycloalkyl group, an aryl group or a monovalent heterocyclic group, and the foregoing groups optionally have a substituent. When a plurality of $K^A$ are present, they may be the same or different.

X' represents the above-described crosslinkable group, a hydrogen atom, an alkyl group, a cycloalkyl group, an aryl group or a monovalent heterocyclic group, and the foregoing groups optionally have a substituent. When a plurality of X' are present, they may be the same or different. However, at least one X' is the above-described crosslinkable group.].

[11] The light emitting device according to any one of [6] to [10], wherein the above-described crosslinkable group comprises at least one structure selected from the group consisting of a carbon-carbon double bond, a carbon-carbon triple bond, oxirane, oxetane, aziridine, azetidine, azide, benzocyclobutene and naphthocyclobutene.

[12] The light emitting device according to any one of [6] to [11], wherein the above-described crosslinkable group includes at least one group selected from the group consisting of crosslinkable groups represented by the formula (XL-1) to the formula (XL-19) in Group A:
(Group A)

[Chemical Formula 12]

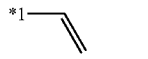
(XL-1)

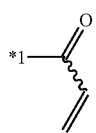
(XL-2)

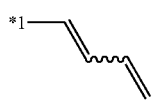
(XL-3)

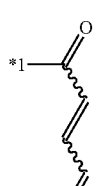
(XL-4)

(XL-5)

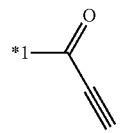
(XL-6)

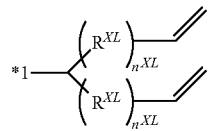
(XL-7)

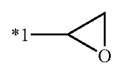
(XL-9)

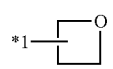
(XL-10)

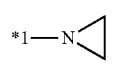
(XL-11)

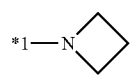
(XL-12)

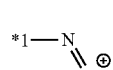
(XL-13)

(XL-14)

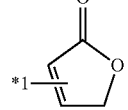
(XL-8)

(XL-15)

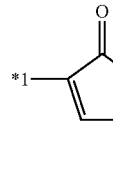
(XL-16)

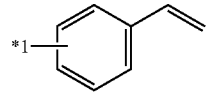
(XL-17)

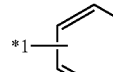
(XL-18)

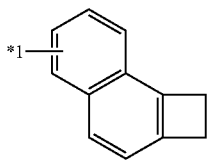
(XL-19)

[wherein, $n^{XL}$ represents an integer of 0 or more and 5 or less. A plurality of $n^{XL}$ may be the same or different.

$R^{XL}$ represents a methylene group, an oxygen atom or a sulfur atom. When a plurality of $R^{XL}$ are present, they may be the same or different.

The wavy line indicates that the group having the wavy line is any one of a plurality of geometric isomers or comprises a plurality of geometric isomers.

* 1 represents a binding position.

The crosslinkable group in Group A optionally has a substituent, and when a plurality of the substituents are present, they may be combined together to form a ring together with carbon atoms to which they are attached.].

[13] The light emitting device according to any one of [6] to [12], wherein the above-described crosslinkable group includes at least one group selected from the group consisting of a crosslinkable group represented by the following formula (XL-1), a crosslinkable group represented by the following formula (XL-16), a crosslinkable group represented by the following formula (XL-17), a crosslinkable group represented by the following formula (XL-18) and a crosslinkable group represented by the following formula (XL-19):

[Chemical Formula 13]

(XL-1)

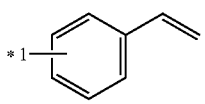
(XL-16)

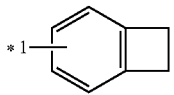
(XL-17)

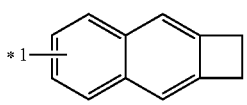
(XL-18)

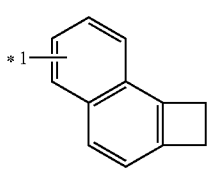
(XL-19)

[wherein,

*1 represents a binding position.

The crosslinkable group represented by the formula (XL-1), the formula (XL-16), the formula (XL-17), the formula (XL-18) or the formula (XL-19) optionally has a substituent, and when a plurality of the substituents are present, they may be combined together to form a ring together with carbon atoms to which they are attached.].

[14] The light emitting device according to any one of [1] to [13], which satisfies the above-described formula (i).

[15] The light emitting device according to any one of [1] to [14], wherein the above-described first organic layer is a layer further comprising a compound represented by the following formula (H-1), a polymer compound comprising at least one selected from the group consisting of a non-crosslinkable constitutional unit represented by the following formula (Y) and a non-crosslinkable constitutional unit represented by the following formula (Z), or both the compounds:

[Chemical Formula 14]

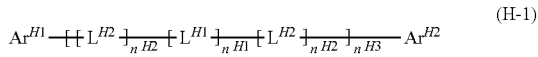
(H-1)

[wherein, $Ar^{H1}$ and $Ar^{H2}$ each independently represent an aryl group or a monovalent heterocyclic group, and the foregoing groups optionally have a substituent.

$n^{H1}$ and $n^{H2}$ each independently represent 0 or 1. When a plurality of $n^{H1}$ are present, they may be the same or different. The plurality of $n^{K2}$ may be the same or different.

$n^{H3}$ represents an integer of 0 or more and 10 or less.

$L^{H1}$ represents an arylene group, a divalent heterocyclic group, or a group represented by —$[C(R^{H11})_2]n^{H11}$-, and the foregoing groups optionally have a substituent. When a plurality of $L^{H1}$ are present, they may be the same or different. $n^{H11}$ represents an integer of 1 or more and 10 or less.

$R^{H11}$ represents a hydrogen atom, an alkyl group, a cycloalkyl group, an alkoxy group, a cycloalkoxy group, an aryl group or a monovalent heterocyclic group, and the foregoing groups optionally have a substituent.

A plurality of $R^{HU}$ may be the same or different and may be combined together to form a ring together with carbon atoms to which they are attached.

$L^{H2}$ represents a group represented by —N(-$L^{H21}$-$R^{H21}$)—. When a plurality of $L^{K2}$ are present, they may be the same or different. $L^{H21}$ represents a single bond, an arylene group or a divalent heterocyclic group, and the foregoing groups optionally have a substituent. $R^{H21}$ represents a hydrogen atom, an alkyl group, a cycloalkyl group, an aryl group or a monovalent heterocyclic group, and the foregoing groups optionally have a substituent.]

[Chemical Formula 15]

(Y)

[wherein, $Ar^{Y1}$ represents an arylene group which optionally has a substituent.]

[Chemical Formula 16]

(Z)

[wherein, $Ar^Z$ represents a divalent heterocyclic group, or a divalent group in which at least one arylene group and at least one divalent heterocyclic group are directly bonded, and the foregoing groups optionally have a substituent.].

[16] The light emitting device according to any one of [1] to [15], wherein the above-described first organic layer further comprises at least one material selected from the group consisting of a hole transporting material, a hole injection material, an electron transporting material, an electron injection material and a light emitting material.

[17] The light emitting device according to any one of [1] to [16], wherein the above-described first organic layer and the above-described second organic layer are adjacent to each other.

[18] The light emitting device according to any one of [1] to [17], wherein the above-described second organic layer is a layer provided between the above-described anode and the above-described first organic layer.

Effect of the Invention

According to the present invention, it is possible to provide a light emitting device excellent in luminance life.

BRIEF DESCRIPTION OF DRAWING

FIG. 1 is a schematic cross-sectional view of a light emitting device according to one embodiment of the present invention.

MODES FOR CARRYING OUT THE INVENTION

Explanation of Common Terms

Unless otherwise specified, the terms commonly used in the present specification will be described as follows with specific examples given as needed.

"Me" represents a methyl group, "Et" represents an ethyl group, "i-Pr" represents an isopropyl group, and "t-Bu" represents a tert-butyl group.

The hydrogen atom may be a heavy hydrogen atom or a light hydrogen atom.

In the formula representing a metal complex and a phosphorescent compound, the solid line representing a bond with a metal means a covalent bond or a coordination bond.

The "polymer compound" means a polymer having molecular weight distribution and having a polystyrene-equivalent number-average molecular weight of $1 \times 10^3$ or more and $1 \times 10^8$ or less.

The "low molecular weight compound" means a compound having no molecular weight distribution and having a molecular weight of $1 \times 10^4$ or less.

The "constitutional unit" means a unit occurring once or more times in the molecular chain of the polymer compound. In addition, the constitutional unit occurring twice or more times in the molecular chain of the polymer compound is particularly referred to as a "repeating unit".

The "block" refers to a block that constitutes a molecular chain of a polymer compound that is a block copolymer, and is a molecular chain portion (block) composed of one or two or more kinds of constitutional units.

The "block copolymer" means a polymer compound containing two or more types of blocks. In the block copolymer, it is preferable that adjacent blocks have different constitutions.

The "adjacent blocks have different constitutions" means, for example, that the constitutional units contained in the blocks adjacent to each other are the same, but their compositions and/or chain distributions are different, and that at least one constitutional unit contained in one of adjacent blocks and at least one constitutional unit contained in the other are different. The adjacent block can be produced by, for example, a method in which one block (hereinafter, also referred to as "first block") is formed by polymerization, and then, the other block is formed, in the presence of the first block, by polymerization and bonded to the first block, and a method in which adjacent blocks are each independently formed, then, these blocks are combined.

The "crosslinkable group" is a group capable of forming a new bond by being subjected to heating, ultraviolet irradiation, near-ultraviolet irradiation, visible light irradiation, infrared irradiation, radical reaction and the like. The crosslinkable group preferably contains at least one structure selected from the group consisting of a carbon-carbon double bond, a carbon-carbon triple bond, oxirane, oxetane, aziridine, azetidine, azide, benzocyclobutene and naphthocyclobutene, as the crosslinkable site, because the polymer compound is excellent in crosslinkability.

The crosslinkable group having the above structure includes the above Group A, namely, crosslinkable groups represented by the formula (XL-1) to the formula (XL-19).

The "non-crosslinkable" constitutional unit denotes that the constitutional unit has no crosslinkable group.

The "alkyl group" may be any one linear or branched. The number of carbon atoms of the linear alkyl group, not including the number of carbon atoms of the substituent, is usually 1 or more and 50 or less, and preferably 1 or more and 20 or less. The number of carbon atoms of the branched alkyl group, not including the number of carbon atoms of the substituent, is usually 3 or more and 50 or less, and preferably 3 or more and 20 or less. The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propyl-heptyl group, a decyl group, a 3,7-dimethyloctyl group, a 2-ethyloctyl group, a 2-hexyldecyl group and a dodecyl group, and groups obtained by replacing a hydrogen atom in these groups with a cycloalkyl group, an alkoxy group, a cycloalkoxy group, an aryl group, a fluorine atom or the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group, and a 6-ethyloxyhexyl group).

The number of carbon atoms of the "cycloalkyl group", not including the number of carbon atoms of the substituent, is usually 3 or more and 50 or less, and preferably 4 or more and 20 or less. The cycloalkyl group optionally has a substituent, and examples thereof include a cyclohexyl group, a cyclohexylethyl group, and a cyclohexylethyl group.

The "aryl group" means an atomic group remaining after removing from an aromatic hydrocarbon one hydrogen atom bonding directly to a carbon atom constituting the ring. The number of carbon atoms of the aryl group, not including the number of carbon atoms of the substituent, is usually 6 or more and 60 or less, preferably 6 or more and 20 or less, and more preferably 6 or more and 10 or less. The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, and a 4-phenylphenyl group, and groups obtained by replacing a hydrogen atom in these groups with an alkyl group, a cycloalkyl group, an alkoxy group, a cycloalkoxy group, an aryl group, a fluorine atom or the like.

The "alkoxy group" may be any of linear or branched. The number of carbon atoms of the linear alkoxy group, not including the number of carbon atoms of the substituent, is usually 1 or more and 40 or less, and preferably 1 or more and 10 or less. The number of carbon atoms of the branched alkoxy group, not including the number of carbon atoms of the substituent, is usually 3 or more and 40 or less, and preferably 3 or more and 10 or less. The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by replacing a hydrogen atom in these groups with a cycloalkyl group, an alkoxy group, a cycloalkoxy group, an aryl group, a fluorine atom or the like.

The number of carbon atoms of the "cycloalkoxy group", not including the number of carbon atoms of the substituent, is usually 3 or more and 40 or less, and preferably 4 or more and 10 or less. The cycloalkoxy group optionally has a substituent, and examples thereof include a cyclohexyloxy group.

The number of carbon atoms of the "aryloxy group", not including the number of carbon atoms of the substituent, is usually 6 or more and 60 or less, and preferably 6 or more and 20 or less. The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

The "p-valent heterocyclic group" (p represents an integer of 1 or more) means an atomic group remaining after removing from a heterocyclic compound p hydrogen atoms among hydrogen atoms bonding directly to carbon atoms or hetero atoms constituting the ring. Of the p-valent heterocyclic groups, "p-valent aromatic heterocyclic group" as an atomic group remaining after removing from an aromatic heterocyclic compound p hydrogen atoms among hydrogen atoms bonding directly to carbon atoms or hetero atoms constituting the ring is preferable.

The "aromatic heterocyclic compound" includes compounds in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and compounds in which an aromatic ring is condensed to a hetero ring even if the hetero ring itself shows no aromaticity such as phenoxazine, phenothiazine, dibenzoborole, dibenzosilole, benzopyran and the like.

The number of carbon atoms of the monovalent heterocyclic group, not including the number of carbon atoms of the substituent, is usually 2 to 60, and preferably 4 to 20. The monovalent heterocyclic group optionally has a substituent and examples thereof include a thienyl group, a pyrrolyl group, a furyl group, a pyridyl group, a piperidinyl group, a quinolinyl group, an isoquinolinyl group, a pyrimidinyl group and a triazinyl group, and groups obtained by replacing a hydrogen atom in these groups with an alkyl group, a cycloalkyl group, an alkoxy group, a cycloalkoxy group or the like.

The "halogen atom" include a fluorine atom, a chlorine atom, a bromine atom and an iodine atom.

The "amino group" optionally has a substituent, and a substituted amino group is preferable. The substituent which the amino group has is preferably an alkyl group, a cycloalkyl group, an aryl group or a monovalent heterocyclic group. The substituted amino group includes, for example, a dialkylamino group, a dicycloalkylamino group and a diarylamino group. The substituted amino group includes, more specifically, a dimethylamino group, a diethylamino group, a diphenylamino group, a bis(4-methylphenyl)amino group, a bis(4-tert-butylphenyl)amino group and a bis(3,5-di-tert-butylphenyl)amino group.

The "alkenyl group" may be any of linear or branched. The number of carbon atoms of the linear alkenyl group, not including the number of carbon atoms of the substituent, is usually 2 or more and 30 or less, and preferably 3 or more and 20 or less. The number of carbon atoms of the branched alkenyl group, not including the number of carbon atoms of the substituent, is usually 3 or more and 30 or less, and preferably 4 or more and 20 or less.

The number of carbon atoms of the "cycloalkenyl group", not including the number of carbon atoms of the substituent, is usually 3 or more and 30 or less, and preferably 4 or more and 20 or less.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

The "alkynyl group" may be any of linear or branched. The number of carbon atoms of the linear alkynyl group, not including the carbon atoms of the substituent, is usually 2 or more and 20 or less, and preferably 3 or more and 20 or less. The number of carbon atoms of the branched alkynyl group, not including the carbon atoms of the substituent, is usually 4 or more and 30 or less, and preferably 4 or more and 20 or less.

The number of carbon atoms of the "cycloalkynyl group", not including the carbon atoms of the substituent, is usually 4 or more and 30 or less, and preferably 4 or more and 20 or less.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

The "arylene group" means an atomic group remaining after removing from an aromatic hydrocarbon two hydrogen atoms bonding directly to carbon atoms constituting the ring. The number of carbon atoms of the arylene group, not including the number of carbon atoms of the substituent, is usually 6 or more and 60 or less, preferably 6 or more and 30 or less, and more preferably 6 or more and 18 or less. The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group and a dibenzocycloheptanediyl group, and these groups having a substituent, and groups represented the formula (A-1) to the formula (A-23) described below are preferable. The arylene group may be a group in which a plurality of these groups are bonded.

[Chemical Formula 17]

(A-1)

(A-2)

(A-3)

(A-4)

(A-5)

(A-6)

[Chemical Formula 18]

(A-7)

(A-8)

(A-9)

(A-10)

[Chemical Formula 19]

(A-11)

(A-12)

(A-13)

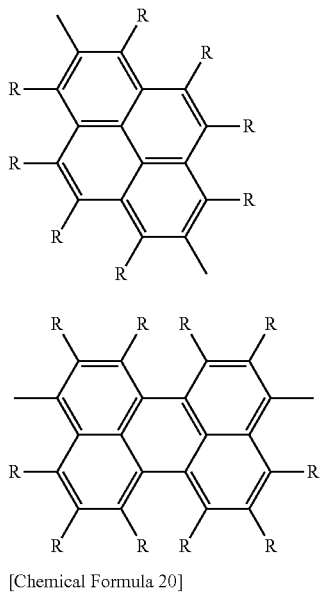
(A-14)

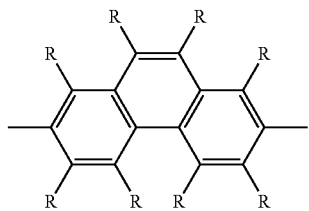
(A-19)

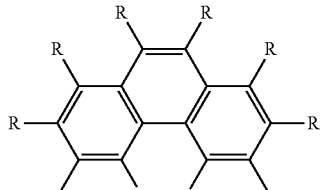
(A-20)

[Chemical Formula 20]

(A-15)

[Chemical Formula 21]

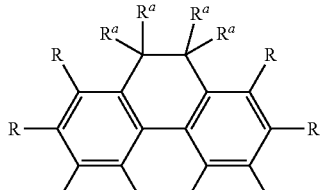
(A-21)

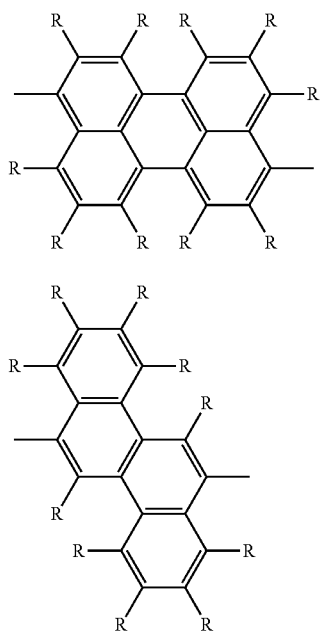
(A-16)

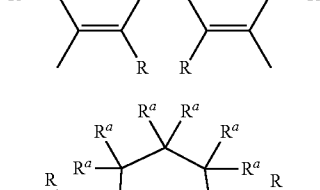
(A-22)

(A-17)

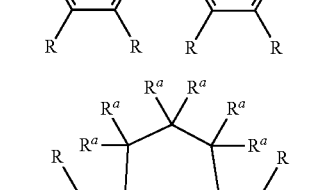
(A-23)

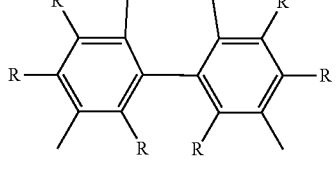

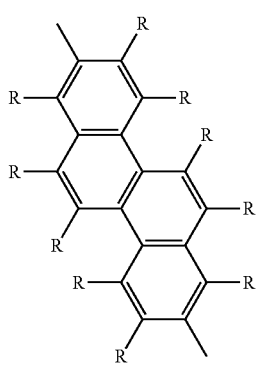
(A-18)

[wherein, R and $R^a$ each independently represent a hydrogen atom, an alkyl group, a cycloalkyl group, an aryl group or a monovalent heterocyclic group. A plurality of R and $R^a$ each may be the same or different, and the plurality of $R^a$ may be combined together to form a ring together with atoms to which they are attached.]

The number of carbon atoms of the divalent heterocyclic group, not including the number of carbon atoms of the substituent, is usually 2 or more and 60 or less, preferably 3 or more and 20 or less, and more preferably 4 or more and 15 or less. The divalent heterocyclic group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, and groups represented by the formula (AA-1) to the formula (AA-34) described below are preferable. The divalent heterocyclic group may be a group in which a plurality of these groups are bonded.
[Chemical Formula 22]
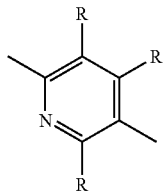
(AA-1)
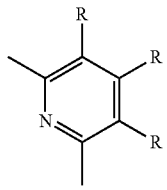
(AA-2)
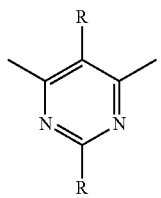
(AA-3)
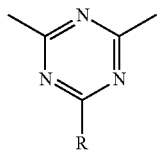
(AA-4)
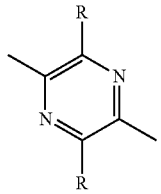
(AA-5)
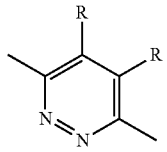
(AA-6)
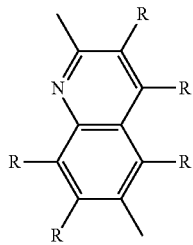
(AA-7)
[Chemical Formula 23]
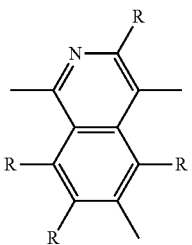
(AA-8)
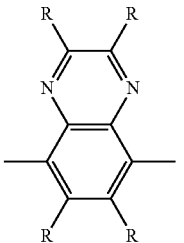
(AA-9)
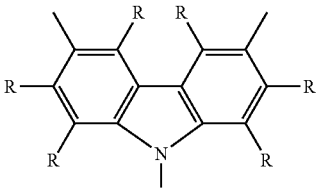
(AA-10)
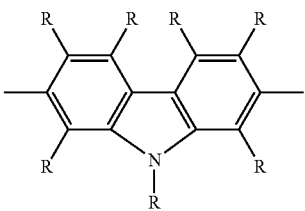
(AA-11)
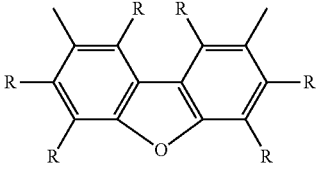
(AA-12)
[Chemical Formula 24]
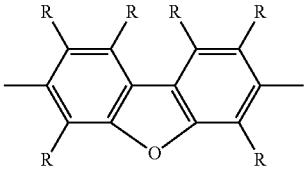
(AA-13)
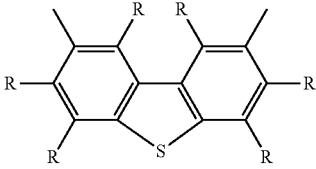
(AA-14)

-continued
(AA-15)
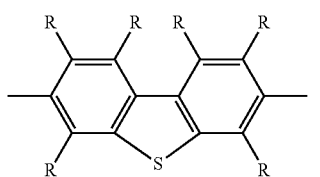
(AA-16)
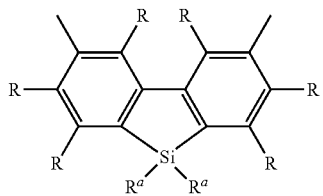
[Chemical Formula 25]
(AA-17)
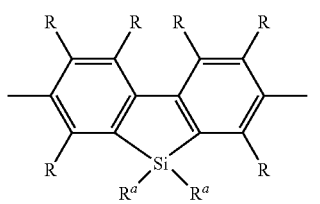
(AA-18)
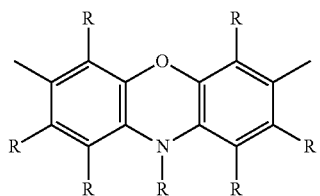
(AA-19)
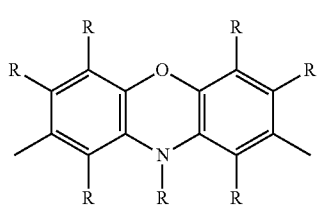
(AA-20)
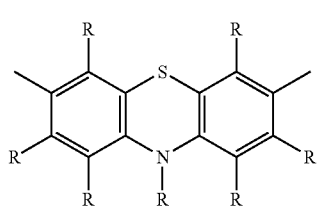
[Chemical Formula 26]
(AA-21)
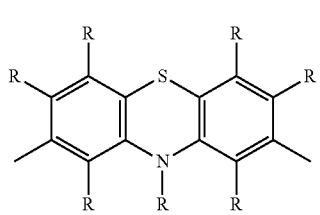
-continued
(AA-22)
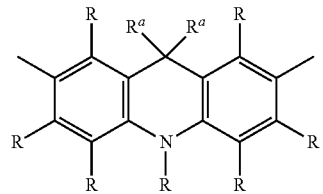
(AA-23)
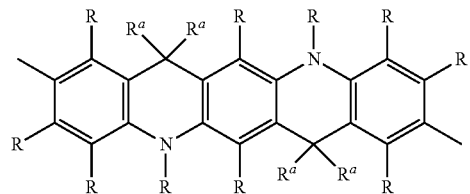
(AA-24)
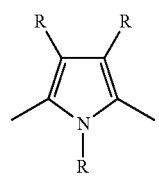
(AA-25)
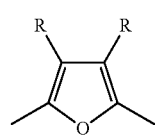
[Chemical Formula 27]
(AA-26)
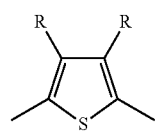
(AA-27)
(AA-28)
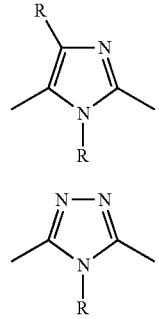
(AA-29)
(AA-30)
(AA-31)
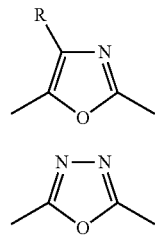

-continued

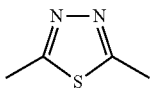
(AA-32)

[Chemical Formula 28]

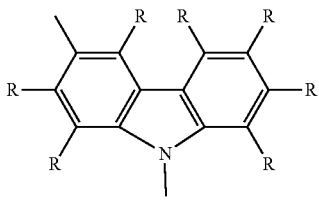
(AA-33)

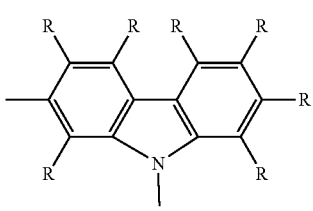
(AA-34)

[wherein, R and $R^a$ represent the same meaning as described above.]

The "substituent" means a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Constitutional Unit Represented by the Formula (X)>

The constitutional unit represented by the formula (X) is a non-crosslinkable constitutional unit.

The constitutional unit represented by the formula (X) is a constitutional unit which is useful for improving charge transportability (especially, improving hole transportability).

In the above-described formula (X), $a^{X1}$ is preferably an integer of 0 or more and 5 or less, more preferably an integer of 0 or more and 2 or less, further preferably 0 or 1, and particularly preferably 1, from the standpoint of improving the luminance life of the light emitting device according to the present invention.

$a^{X2}$ is preferably an integer of 0 or more and 5 or less, more preferably an integer of 0 or more and 2 or less, and further preferably 0, from the standpoint of improving the luminance life of the light emitting device according to the present invention.

$R^{X1}$, $R^{X2}$ and $R^{X3}$ are each preferably an aryl group or a monovalent heterocyclic group, and more preferably an aryl group, and the foregoing groups optionally have a substituent.

The aryl group represented by $R^{X1}$, $R^{X2}$ and $R^{X3}$ is preferably a group obtained by removing from a benzene ring, a naphthalene ring, an anthracene ring, a phenanthrene ring, a dihydrophenanthrene ring, a naphthacene ring, a fluorene ring, a pyrene ring, a perylene ring or a chrysene ring one hydrogen atom bonding directly to a carbon atom constituting the ring, more preferably a group obtained by removing from a benzene ring, a naphthalene ring, a phenanthrene ring, a dihydrophenanthrene ring or a fluorene ring one hydrogen atom bonding directly to a carbon atom constituting the ring, further preferably a phenyl group or a fluorenyl group, and particularly preferably a phenyl group, and the foregoing groups optionally have a substituent.

The monovalent heterocyclic group represented by $R^{X1}$, $R^{X2}$ and $R^{X3}$ is preferably a group obtained by removing from a pyridine ring, a diazabenzene ring, a triazine ring, an azanaphthalene ring, a diazanaphthalene ring, a carbazole ring, a dibenzofuran ring, a dibenzothiophene ring, a phenoxazine ring, a phenothiazine ring or a dihydroacridine ring one hydrogen atom bonding directly to a carbon atom or a hetero atom constituting the ring, and more preferably a group obtained by removing from a pyridine ring, a diazabenzene ring, a triazine ring, a carbazole ring, a dibenzofuran ring or dibenzothiophene ring one hydrogen atom bonding directly to a carbon atom or a hetero atom constituting the ring, and the foregoing groups optionally have a substituent.

The arylene group represented by $Ar^{X1}$, $Ar^{X2}$, $Ar^{X3}$ and $Ar^{X4}$ is preferably a phenylene group, a naphthalenediyl group, an anthracenediyl group, a phenanthrenediyl group, a dihydrophenanthrenediyl group, a pyrenediyl group, a fluorenediyl group or a dibenzocycloheptanediyl group, more preferably a phenylene group, a naphthalenediyl group, a phenanthrenediyl group, a dihydrophenanthrenediyl group or a fluorenediyl group, and further preferably a phenylene group or a fluorenediyl group, and the foregoing groups optionally have a substituent, from the standpoint of improving the luminance life of the light emitting device according to the present invention.

The divalent heterocyclic group represented by $Ar^{X1}$, $Ar^{X2}$, $Ar^{X3}$ and $Ar^{X4}$ is preferably a group obtained by removing from a pyridine ring, a diazabenzene ring, a triazine ring, an azanaphthalene ring, a diazanaphthalene ring, a carbazole ring, a dibenzofuran ring, a dibenzothiophene ring, a phenoxazine ring, a phenothiazine ring or a dihydroacridine ring two hydrogen atoms bonding directly to carbon atoms or hetero atoms constituting the ring, and more preferably a group obtained by removing from a pyridine ring, a diazabenzene ring, a triazine ring, a carbazole ring, a dibenzofuran ring or a dibenzothiophene ring two hydrogen atoms bonding directly to carbon atoms or hetero atoms constituting the ring, and further preferably, the foregoing groups optionally have a substituent.

The arylene group represented by $Ar^{X1}$ and $Ar^{X3}$ is preferably a group represented by the formula (A-1) to the formula (A-9) or the formula (A-19) to the formula (A-21), more preferably a group represented by the formula (A-1) to the formula (A-3), the formula (A-8) or the formula (A-9), further preferably a group represented by the formula (A-1) to the formula (A-3), and particularly preferably a group represented by the formula (A-1), from the standpoint of improving the luminance life of the light emitting device according to the present invention.

The divalent heterocyclic group represented by $Ar^{X1}$ and $Ar^{X3}$ is preferably a group represented by the formula (AA-1) to the formula (AA-15) or the formula (AA-18) to the formula (AA-22), and more preferably a group represented by the formula (AA-1) to the formula (AA-6) or the formula (AA-10) to the formula (AA-15), from the standpoint of improving the luminance life of the light emitting device according to the present invention.

$Ar^{X}_{I}$ and $Ar^{X3}$ are each preferably an arylene group optionally having a substituent, from the standpoint of improving the luminance life of the light emitting device according to the present invention.

The arylene group represented by $Ar^{X2}$ and $Ar^{X4}$ is preferably a group represented by the formula (A-1) to the formula (A-14) or the formula (A-19) to the formula (A-23), more preferably a group represented by the formula (A-1) to the formula (A-10) or the formula (A-19) to the formula (A-21), further preferably a group represented by the formula (A-1) to the formula (A-3), the formula (A-6) to the formula (A-9) or the formula (A-19) to the formula (A-21), particularly preferably a group represented by the formula (A-1) to the formula (A-3), the formula (A-8) or the formula (A-9), and especially preferably a group represented by the formula (A-1) or the formula (A-9), from the standpoint of improving the luminance life of the light emitting device according to the present invention.

Preferable examples of the divalent heterocyclic group represented by $Ar^{X2}$ and $Ar^{X4}$ are the same as the preferable examples of the divalent heterocyclic group represented by $Ar^{X1}$ and $Ar^{X3}$.

Preferable examples of the arylene group and the divalent heterocyclic group in the divalent group in which at least one arylene group and at least one divalent heterocyclic group are bonded directly represented by $Ar^{X2}$ and $Ar^{X4}$ are the same as the preferable examples of the arylene group and the divalent heterocyclic group represented by $Ar^{X2}$ and $Ar^{X4}$.

The divalent group in which at least one arylene group and at least one divalent heterocyclic group are bonded directly represented by $Ar^{X2}$ and $Ar^{X4}$ includes, for example, groups represented by the following formulae, and the foregoing groups optionally have a substituent.

[Chemical Formula 29]

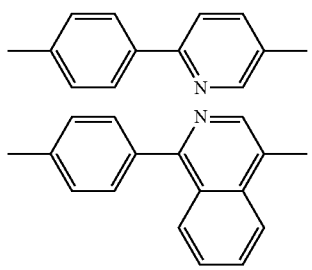

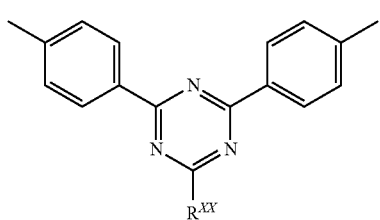

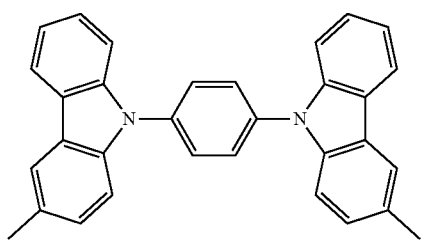

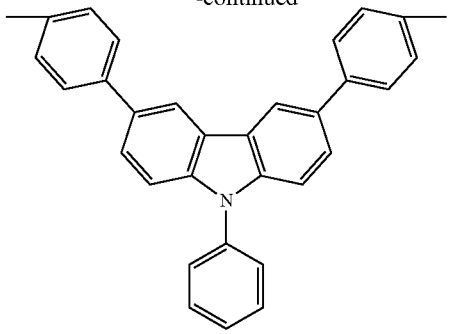

[wherein, $R^{XX}$ represents a hydrogen atom, an alkyl group, a cycloalkyl group, an aryl group or a monovalent heterocyclic group, and the foregoing groups optionally have a substituent.]

$R^{XX}$ is preferably an alkyl group, a cycloalkyl group or an aryl group, and the foregoing groups optionally have a substituent.

$Ar^{X2}$ and $Ar^{X4}$ are each preferably an arylene group optionally having a substituent, from the standpoint of improving the luminance life of the light emitting device according to the present invention.

The substituent which the groups represented by $Ar^{X1}$ to $Ar^{X4}$ and $R^{X1}$ to $R^{X3}$ optionally have is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group, a monovalent heterocyclic group or a substituted amino group, further preferably an alkyl group, a cycloalkyl group or an aryl group, and particularly preferably an alkyl group, and the foregoing groups optionally further have a substituent.

Examples and preferable examples of the aryl group and the monovalent heterocyclic group as the substituent which the groups represented by $Ar^{X1}$ to $Ar^{X4}$ and $R^{X1}$ to $R^{X3}$ optionally have are the same as the examples and preferable examples of the aryl group and the monovalent heterocyclic group represented by $R^{X1}$ to $R^{X3}$, respectively.

In the substituted amino group as the substituent which the groups represented by $Ar^{X1}$ to $Ar^{X4}$ and $R^{X1}$ to $R^{X3}$ optionally have, the substituent which the amino group has is preferably an aryl group or a monovalent heterocyclic group, and more preferably an aryl group, and the foregoing groups optionally further have a substituent. Examples and preferable examples of the aryl group as the substituent which the amino group has are the same as the examples and preferable examples of the aryl group represented by $R^{X1}$, $R^{X2}$ and $R^{X3}$. Examples and preferable examples of the monovalent heterocyclic group as the substituent which the amino group has are the same as the examples and preferable examples of the monovalent heterocyclic group represented by $R^{X1}$ to $R^{X3}$.

The substituent which the substituent which the groups represented by $Ar^{X1}$ to $Ar^{X4}$ and $R^{X1}$ to $R^{X3}$ optionally have optionally further has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group or a monovalent heterocyclic group, and further preferably an alkyl group or a cycloalkyl group, and the foregoing groups optionally further have a substituent, but preferably have no substituent.

Examples and preferable examples of the aryl group, the monovalent heterocyclic group and the substituted amino group as the substituent which the substituent which the groups represented by $Ar^{X1}$ to $Ar^{X4}$ and $R^{X1}$ to $R^{X3}$ optionally have optionally further has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

The constitutional unit represented by the formula (X) is preferably a constitutional unit represented by the following formula (X-1) to the formula (X-7), and more preferably a constitutional unit represented by the formula (X-1) to the formula (X-6).

[Chemical Formula 30]

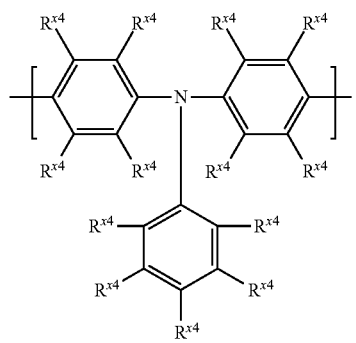

(X-1)

[Chemical Formula 31]

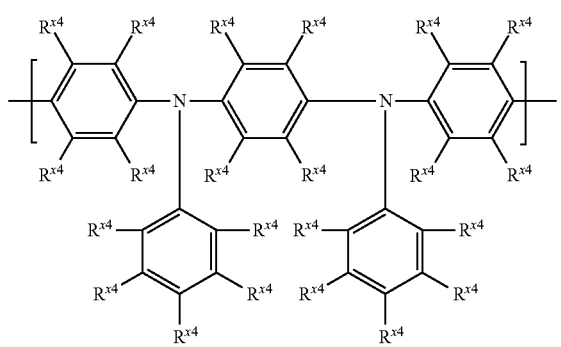

(X-2)

(X-3)

[Chemcial Formula 32]

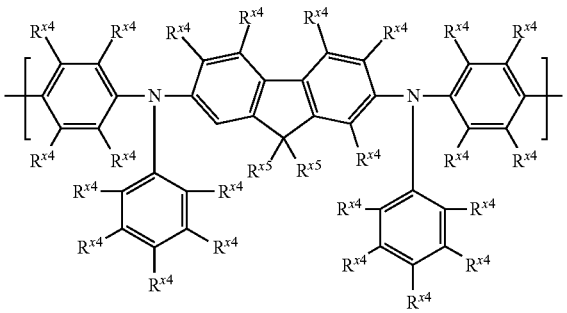

(X-4)

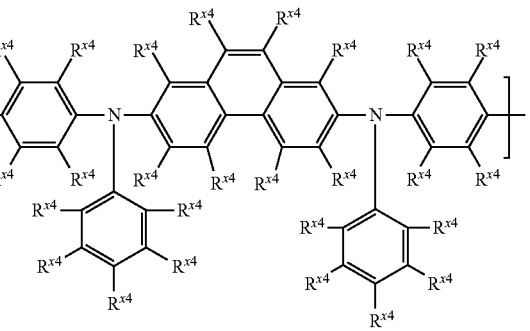

(X-5)

[Chemical Formula 33]

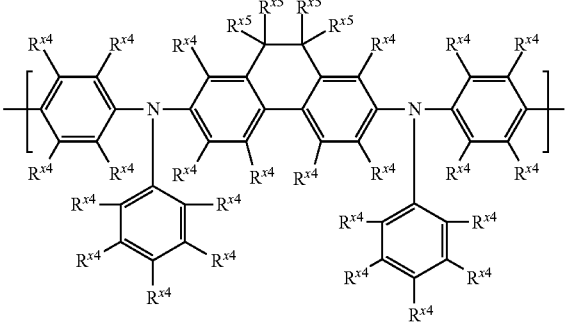

(X-6)

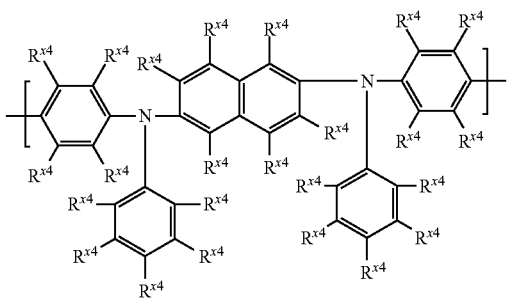

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group, a cyano group or a substituted amino group, and the foregoing groups optionally have a substituent. A plurality of $R^{X4}$ may be the same or different. A plurality of $R^{X5}$ may be the same or different, and groups $R^{X3}$ (preferably adjacent groups $R^{X5}$) may be combined together to form a ring together with carbon atoms to which they are attached.]

$R^{X4}$ and $R^{X5}$ are each preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, and further preferably a hydrogen atom or an alkyl group, and the foregoing groups optionally have a substituent.

Examples and preferable examples of the aryl group, the monovalent heterocyclic group and the substituted amino group represented by $R^{X4}$ and $R^5$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the groups represented by $R^{X4}$ and $R^{X5}$ optionally have are the same as the examples and preferable examples of the substituent which the groups represented by $Ar^{X1}$ to $Ar^{X4}$ and $R^{X1}$ to $R^{X3}$ optionally have.

The constitutional unit represented by the formula (X) includes, for example, constitutional units represented by the formula (X1-1) to the formula (X1-19) described below.

[Chemical Formula 34]

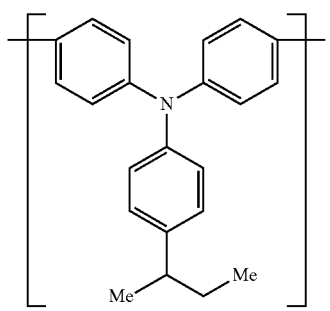
(X1-1)

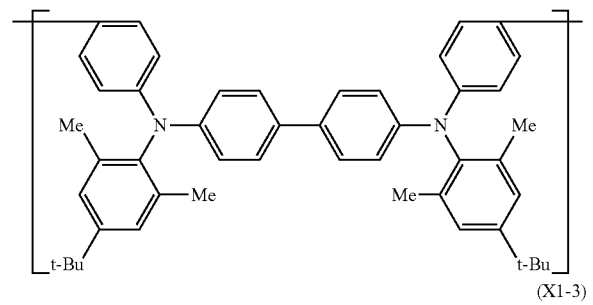
(X1-2)

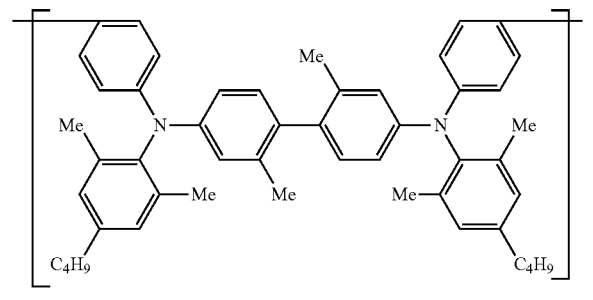
(X1-3)

[Chemical Formula 35]

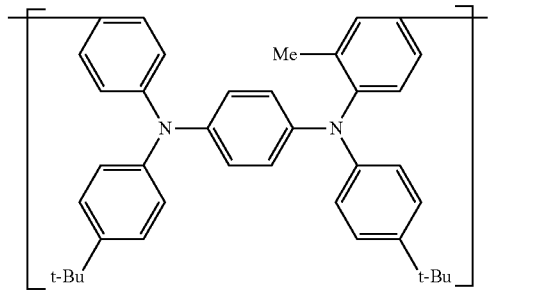
(X1-4)

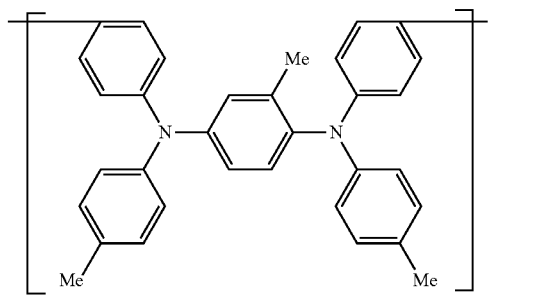
(X1-5)

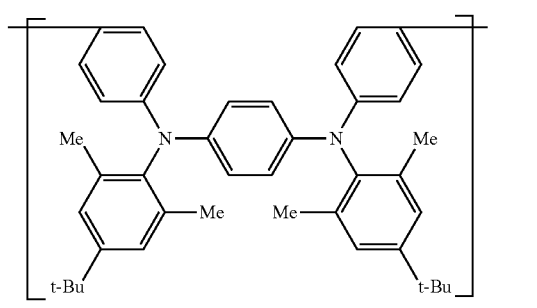
(X1-6)

[Chemical Formula 36]

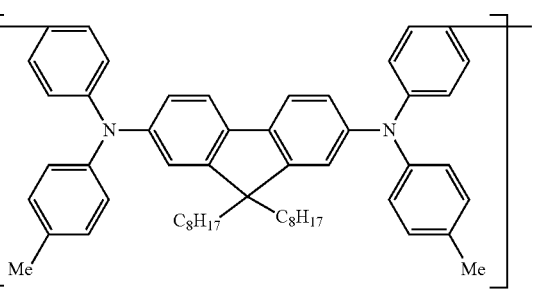
(X1-7)

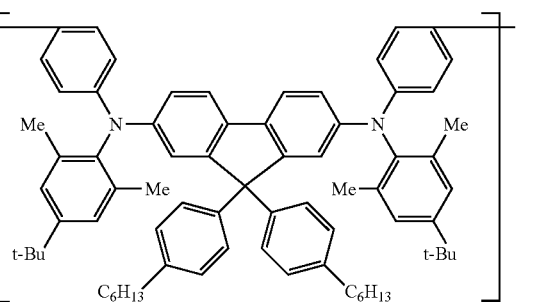
(X1-8)

-continued
[Chemical Formula 37]
(X1-9)
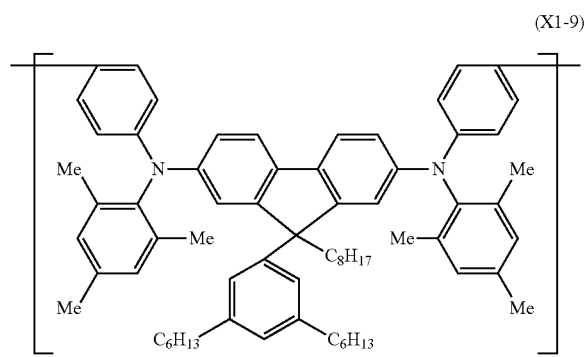
(X1-10)
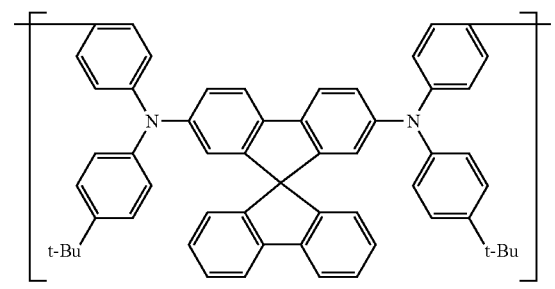
[Chemical Formula 38]
(X-1-11)
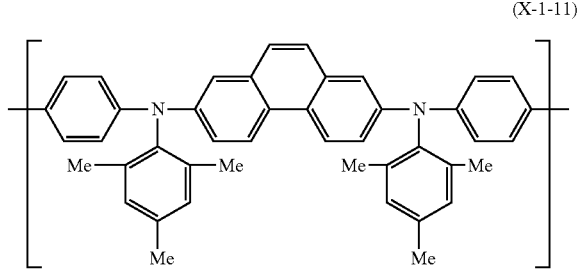
(X1-12)
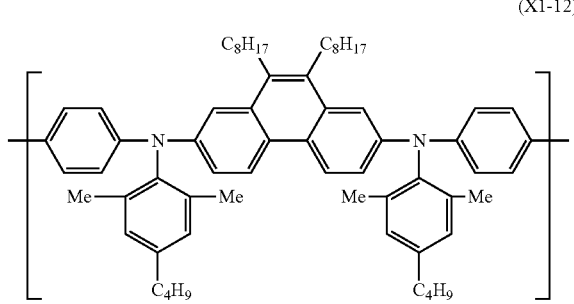
-continued
[Chemical Formula 39]
(X1-13)
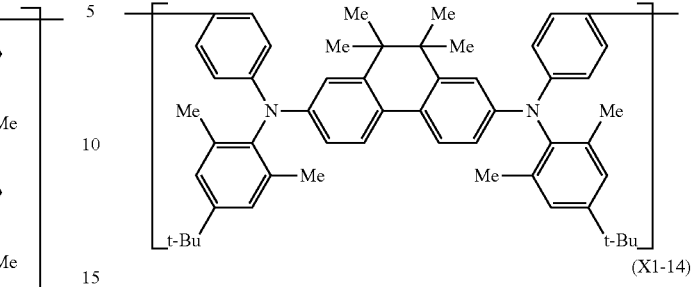
(X1-14)
[Chemical Formula 40]
(X1-15)
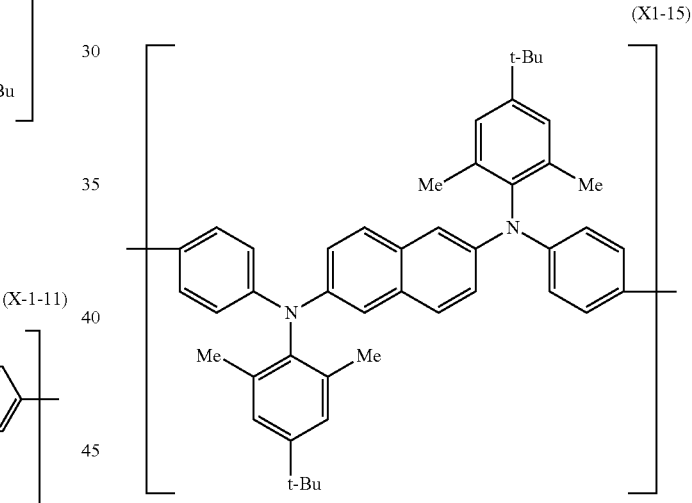
(X1-16)
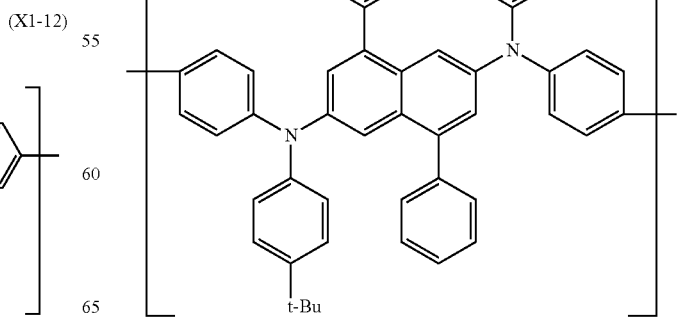

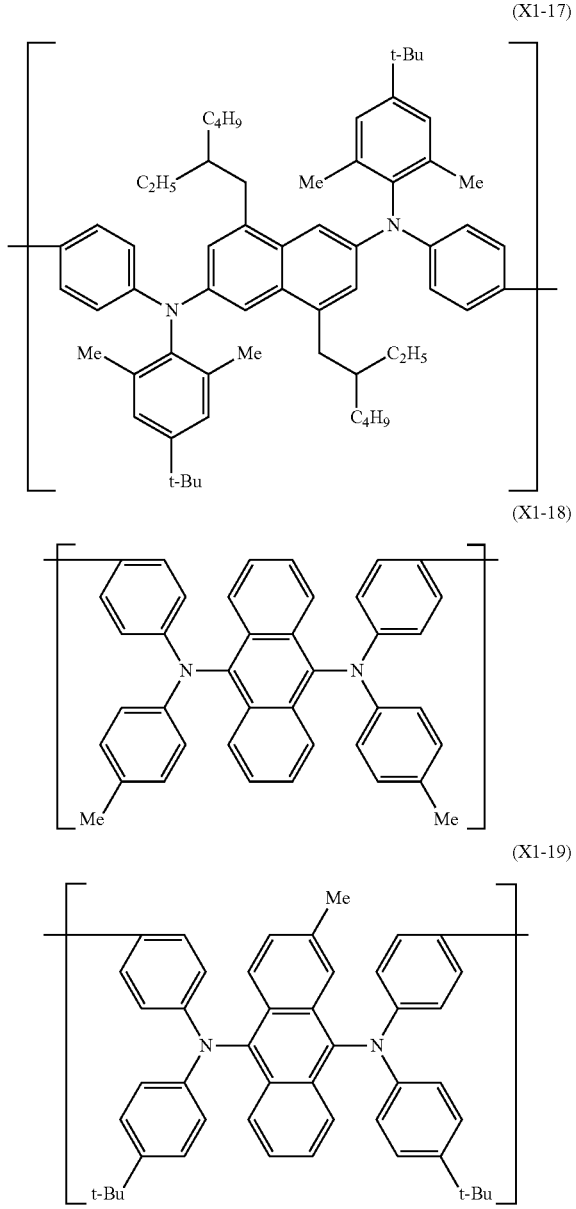

<Constitutional Unit Represented by the Formula (Z)>

The constitutional unit represented by the formula (Z) is a non-crosslinkable constitutional unit.

The number of carbon atoms of the divalent heterocyclic group represented by $Ar^Z$, not including the number of carbon atoms of the substituent, is usually 2 or more and 60 or less, preferably 2 or more and 30 or less, and more preferably 3 or more and 15 or less.

The number of hetero atoms of the divalent heterocyclic group represented by $Ar^Z$, not including the number of hetero atoms of the substituent, is usually 1 or more and 30 or less, preferably 1 or more and 10 or less, more preferably 1 or more and 5 or less, and further preferably 1 or more and 3 or less.

The divalent heterocyclic group represented by $Ar^Z$ is preferably a group obtained by removing from a hetero ring containing as the ring constituent atom at least one hetero atom selected from the group consisting of a boron atom, a nitrogen atom, an oxygen atom, a silicon atom, a phosphorus atom, a sulfur atom and a selenium atom two hydrogen atoms bonding directly to carbon atoms or hetero atoms constituting the ring, more preferably a group obtained by removing from a hetero ring containing as the ring constituent atom at least one hetero atom selected from the group consisting of a nitrogen atom, an oxygen atom and a sulfur atom two hydrogen atoms bonding directly to carbon atoms or hetero atoms constituting the ring, and further preferably a group obtained by removing from a hetero ring containing as the ring constituent atom a nitrogen atom two hydrogen atoms bonded directly to carbon atoms or hetero atoms constituting the ring (hereinafter, also referred to as "divalent nitrogen-containing heterocyclic group"), and the foregoing groups optionally have a substituent.

Regarding the divalent heterocyclic group represented by $Ar^Z$, the divalent heterocyclic group other than the divalent nitrogen-containing heterocyclic group includes, for example, groups obtained by removing from a borole ring, a furan ring, a silole ring, a phosphole ring, a thiophene ring, a selenophene ring, a benzofuran ring, a benzothiophene ring, dibenzoborole ring, a dibenzofuran ring, a dibenzosilole ring, a dibenzophosphole ring, a dibenzothiophene ring or a dibenzoselenophene ring two hydrogen atoms bonding directly to carbon atoms or hetero atoms constituting the ring, and is, from the standpoint of advantage for an improvement in the luminance life of the light emitting device according to the present invention, preferably a group obtained by removing from a furan ring, a thiophene ring, a benzofuran ring, a benzothiophene ring, a dibenzofuran ring or a dibenzothiophene ring two hydrogen atoms bonding directly to carbon atoms or hetero atoms constituting the ring, and more preferably a group represented by the formula (AA-12) to the formula (AA-15), and the foregoing groups optionally have a substituent.

Regarding the divalent heterocyclic group represented by $Ar^Z$, the divalent nitrogen-containing heterocyclic group is preferably a divalent nitrogen-containing heterocyclic group containing a nitrogen atom having no double bond as the ring constituent atom and not containing a nitrogen atom having a double bond as the ring constituent atom (hereinafter, also referred to as "divalent nitrogen-containing heterocyclic group containing nitrogen atom having no double bond"), and this group optionally has a substituent, from the standpoint of improving charge transportability (especially, improving hole transportability). Further, regarding the divalent nitrogen-containing heterocyclic group represented by $Ar^Z$, the divalent nitrogen-containing heterocyclic group is preferably a divalent nitrogen-containing heterocyclic group containing a nitrogen atom having a double bond as the ring constituent atom (hereinafter, also referred to as "divalent nitrogen-containing heterocyclic group containing nitrogen atom having double bond"), and this group optionally has a substituent, from the standpoint of improving charge transportability (especially, improving electron transportability).

The "nitrogen atom having no double bond" means a nitrogen atom having only a single bond between the nitrogen atom and all the atoms bonded to the nitrogen atom.

The phrase "containing a nitrogen atom having no double bond as the ring constituent atom" means that —N(—$R^N$)—

(wherein, $R^N$ represents a hydrogen atom or a substituent) or a group represented by the following formula is contained in the ring.

[Chemical Formula 42]

The divalent nitrogen-containing heterocyclic group containing a nitrogen atom having no double bond includes, for example, groups obtained by removing from a pyrrole ring, an indole ring, an isoindole ring, a carbazole ring, a dihydroacridine ring, a 5,10-dihydrophenazine ring, an acridone ring, a quinacridone ring, a phenoxazine ring, a phenothiazine ring, an indolocarbazole ring or an indenocarbazole ring two hydrogen atoms bonding directly to carbon atoms or hetero atoms constituting the ring, and is, from the standpoint of improving the luminance life and improving the charge transportability (especially, improving hole transportability) of the light emitting device according to the present invention, preferably a group obtained by removing from a carbazole ring, a dihydroacridine ring, a 5,10-dihydrophenazine ring, a phenoxazine ring, a phenothiazine ring, an indolocarbazole ring or an indenocarbazole ring two hydrogen atoms bonding directly to carbon atoms or hetero atoms constituting the ring, more preferably a group obtained by removing from a carbazole ring, a dihydroacridine ring, a 5,10-dihydrophenazine ring, a phenoxazine ring or a phenothiazine ring two hydrogen atoms bonding directly to carbon atoms or hetero atoms constituting the ring, further preferably a group obtained by removing from a carbazole ring, a phenoxazine ring or a phenothiazine ring two hydrogen atoms bonding directly to carbon atoms or hetero atoms constituting the ring, particularly preferably a group represented by the formula (AA-10), the formula (AA-11) or the formula (AA-18) to the formula (AA-21), and especially preferably a group represented by the formula (AA-18) or the formula (AA-19).

The "nitrogen atom having a double bond" means a nitrogen atom having a double bond between the nitrogen atom and the atom bonded to the nitrogen atom.

The phrase "containing a nitrogen atom having a double bond as the ring constituent atom" means that a group represented by —N= is contained in the ring.

The divalent nitrogen-containing heterocyclic group containing a nitrogen atom having a double bond includes, for example, groups obtained by removing from a diazole ring, a triazole ring, an oxadiazole ring, a thiadiazole ring, a thiazole ring, an oxazole ring, a benzodiazole ring, a benzotriazole ring, a benzooxadiazole ring, a benzothiadiazole ring, an azacarbazole ring, a diazacarbazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring or a triazaphenanthrene ring two hydrogen atoms bonding directly to carbon atoms or hetero atoms constituting the ring, and is, from the standpoint of improving the luminance life and improving the charge transportability (especially, improving electron transportability) of the light emitting device according to the present invention, preferably a group obtained by removing from a pyridine ring, a diazabenzene ring, a triazine ring, an azanaphthalene ring, a diazanaphthalene ring, an azaanthracene ring, a diazaanthracene ring, an azaphenanthrene ring or a diazaphenanthrene ring two hydrogen atoms bonding directly to carbon atoms constituting the ring, more preferably a group obtained by removing from a pyridine ring, a diazabenzene ring or triazine ring two hydrogen atoms bonding directly to carbon atoms constituting the ring, further preferably a group represented by the formula (AA-1) to the formula (AA-4), and particularly preferably a group represented by the formula (AA-4), and the foregoing groups optionally have a substituent.

Examples and preferable examples of the arylene group in the divalent group in which at least one arylene group and at least one divalent heterocyclic group are bonded directly represented by $Ar^Z$ are the same as the examples and preferable examples of the arylene group represented by $Ar^{X1}$ and $Ar^{X3}$.

Examples and preferable examples of the divalent heterocyclic group in the divalent group in which at least one arylene group and at least one divalent heterocyclic group are bonded directly represented by $Ar^Z$ are the same as the examples and preferable examples of the divalent heterocyclic group represented by $Ar^Z$.

Examples of the divalent group in which at least one arylene group and at least one divalent heterocyclic group are bonded directly represented by $Ar^Z$ include, for example, examples of the divalent group in which at least one arylene group and at least one divalent heterocyclic group are bonded directly represented by $Ar^{X2}$ and $Ar^{X4}$.

The substituent which the group represented by $Ar^Z$ optionally has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group or a monovalent heterocyclic group, and further preferably an alkyl group or an aryl group, and the foregoing groups optionally further have a substituent.

Examples and preferable examples of the aryl group, the monovalent heterocyclic group and the substituted amino group as the substituent which the group represented by $Ar^Z$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^Z$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

The constitutional unit represented by the formula (Z) is preferably a constitutional unit represented by the formula (Z-1) to the formula (Z-4), more preferably a constitutional unit represented by the formula (Z-1) or the formula (Z-3), and further preferably a constitutional unit represented by the formula (Z-1), from the standpoint of improving the luminance life and improving the charge transportability (especially, improving electron transportability) of the light emitting device according to the present invention.

Further, the constitutional unit represented by the formula (Z) is preferably a constitutional unit represented by the formula (Z-5) to the formula (Z-1), and more preferably a constitutional unit represented by the formula (Z-5), from the standpoint of improving the luminance life and improving the charge transportability (especially, improving hole transportability) of the light emitting device according to the present invention.

[Chemical Formula 43]

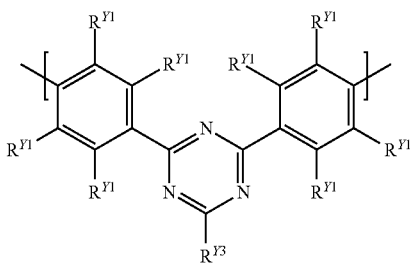
(Z-1)

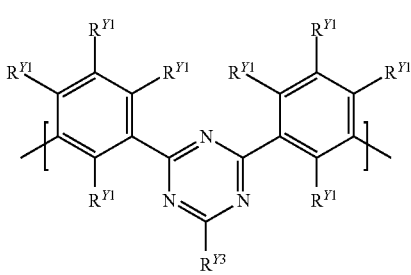
(Z-2)

[Chemical Formula 44]

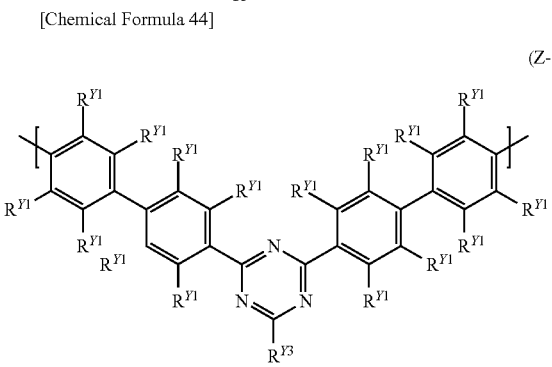
(Z-3)

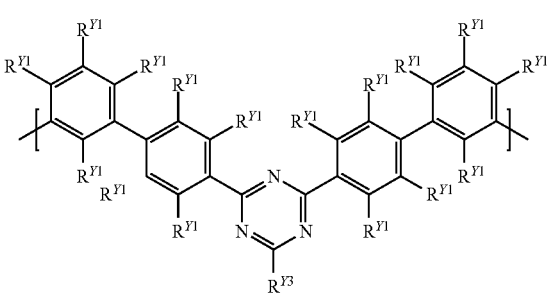
(Z-4)

[wherein, $R^{Y1}$ and $R^{Y3}$ each independently represent a hydrogen atom, a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y1}$ may be the same or different and may be combined together to form a ring together with carbon atoms to which they are attached.]

$R^{Y1}$ is preferably a hydrogen atom, an alkyl group, a cycloalkyl group, an aryl group or a monovalent heterocyclic group, more preferably a hydrogen atom, an alkyl group, a cycloalkyl group or an aryl group, and further preferably a hydrogen atom or an alkyl group, and the foregoing groups optionally have a substituent.

$R^{Y3}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

Examples and preferable examples of the aryl group, the monovalent heterocyclic group and the substituted amino group as the group represented by $R^{Y1}$ and $R^{Y3}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which $R^{Y1}$ and $R^{Y3}$ optionally have are the same as the examples and preferable examples of the substituent which the groups represented by $Ar^{X1}$ to $Ar^{X4}$ and $R^{X1}$ to $R^{X3}$ optionally have.

The constitutional unit represented by the formula (Z-1) is preferably a constitutional unit represented by the formula (Z-1'). Further, the constitutional unit represented by the formula (Z-3) is preferably a constitutional unit represented by the formula (Z-3').

[Chemical Formula 45]

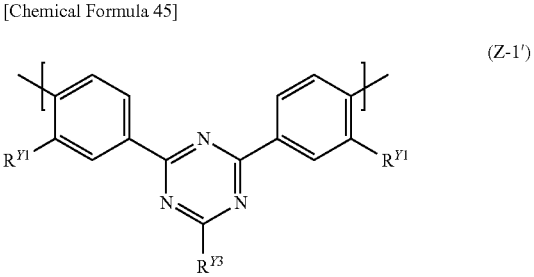
(Z-1')

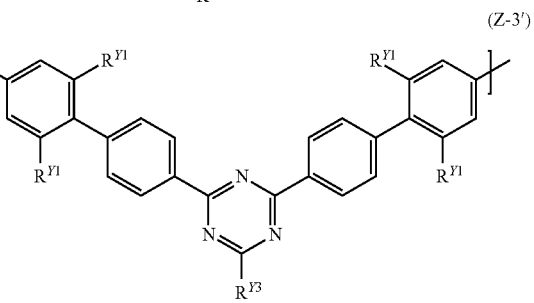
(Z-3')

[wherein, $R^{Y1}$ and $R^{Y3}$ represent the same meaning as described above.]

[Chemical Formula 46]

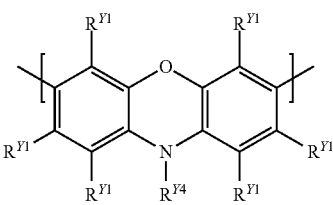
(Z-5)

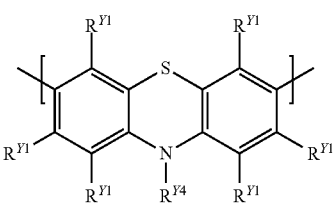
(Z-6)

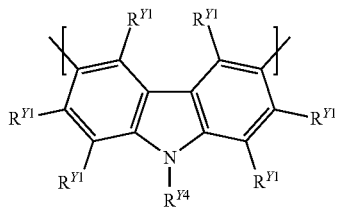
(Z-7)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent.]

$R^{Y4}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

Examples and preferable examples of the aryl group and the monovalent heterocyclic group as the group represented by $R^{Y4}$ are the same as the examples and preferable examples of the aryl group and the monovalent heterocyclic group as the substituent which the groups represented by $Ar^{X1}$ to $Ar^{X4}$ and $R^{X1}$ to $R^{X3}$ optionally have, respectively.

Examples and preferable examples of the substituent which $R^{Y4}$ optionally has are the same as the examples and preferable examples of the substituent which the groups represented by $Ar^{X1}$ to $Ar^{X4}$ and $R^{X1}$ to $R^{X3}$ optionally have.

The constitutional unit represented by the formula (Z) includes, for example, constitutional units composed of a divalent heterocyclic group represented by the formula (Z-201) to the formula (Z-215), and constitutional units composed of a divalent group in which at least one arylene group and at least one divalent heterocyclic group are bonded directly represented by the formula (Z-301) to the formula (Z-310).

[Chemical Formula 47]

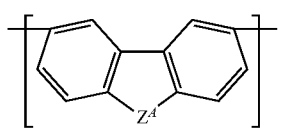
(Z-201)

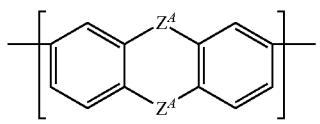
(Z-202)

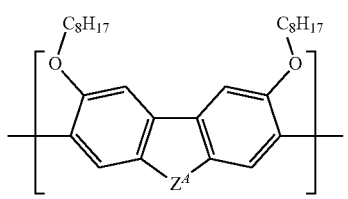
(Z-203)

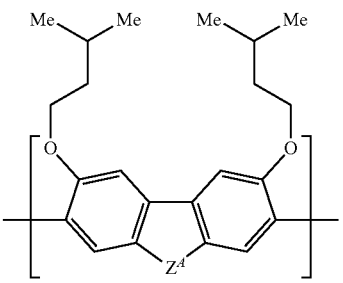
(Z-204)

[Chemical Formula 48]

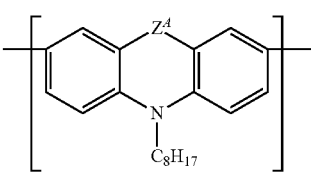
(Z-205)

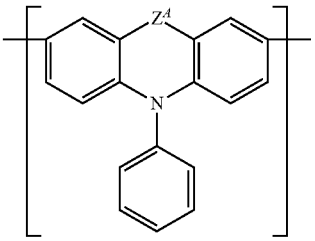
(Z-207)

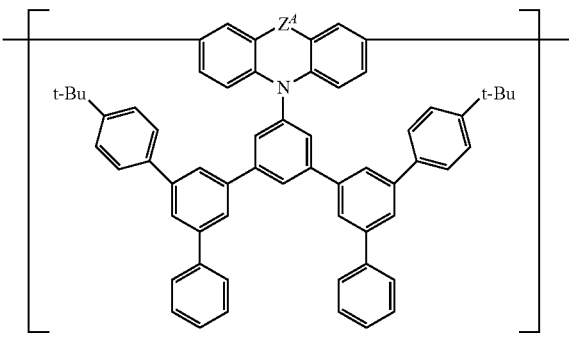
(Z-209)

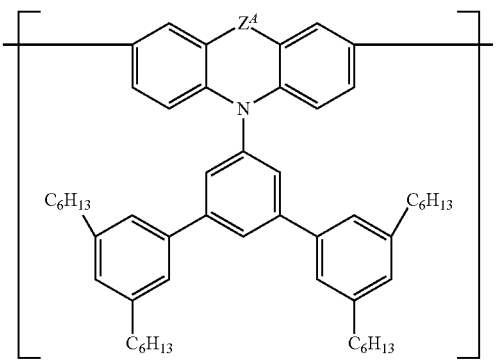
(Z-210)

-continued
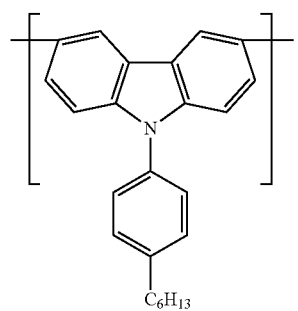
(Z-206)
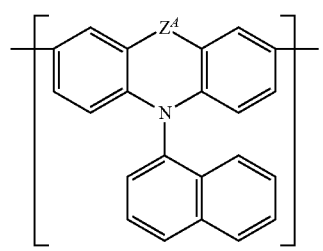
(Z-208)
[Chemical Formula 49]
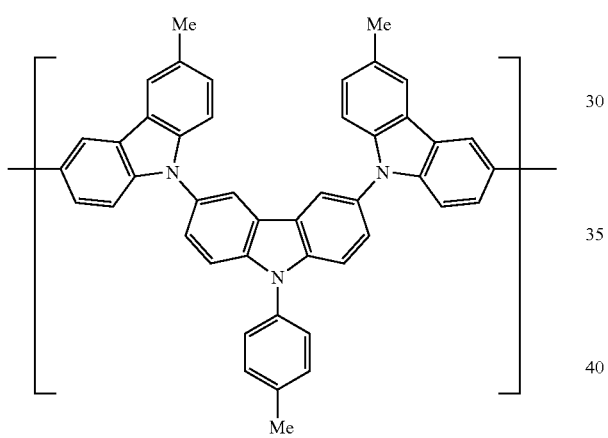
(Z-211)
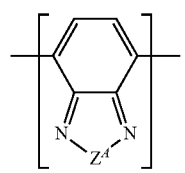
(Z-212)
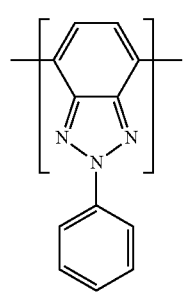
(Z-213)
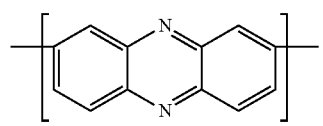
(Z-214)
-continued
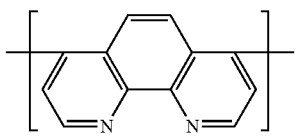
(Z-215)
[Chemical Formula 50]
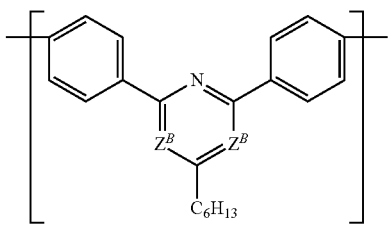
(Z-301)
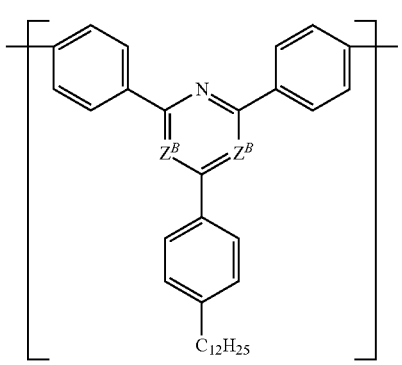
(Z-302)
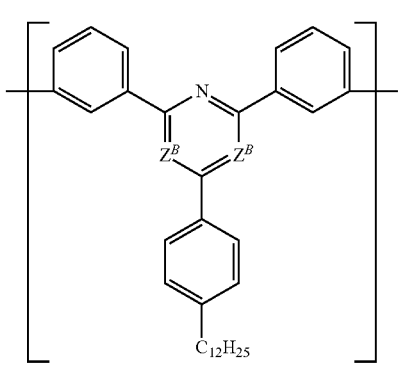
(Z-303)
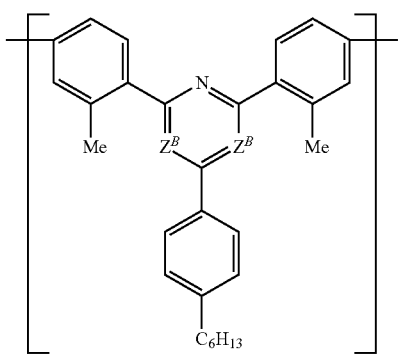
(Z-304)

-continued

[Chemical Formula 51]

(Z-305)
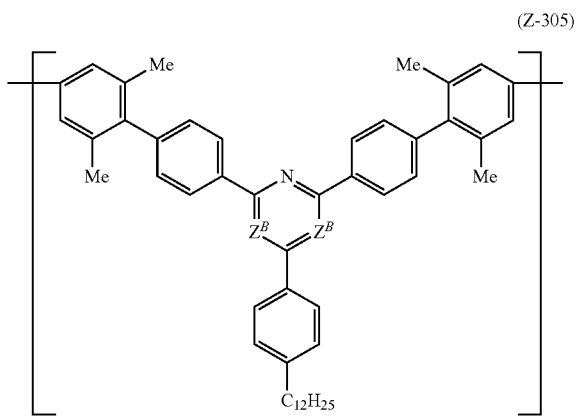

(Z-306)
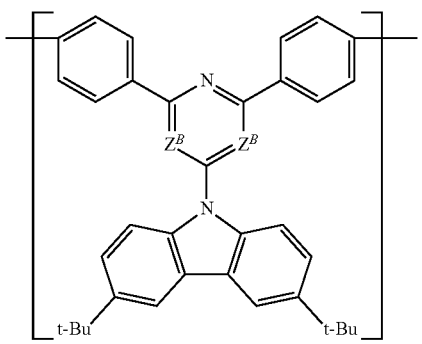

(Z-307)
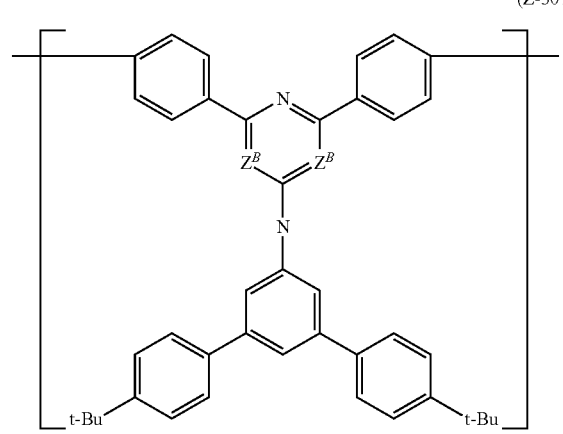

-continued

[Chemical Formula 52]

(Z-308)
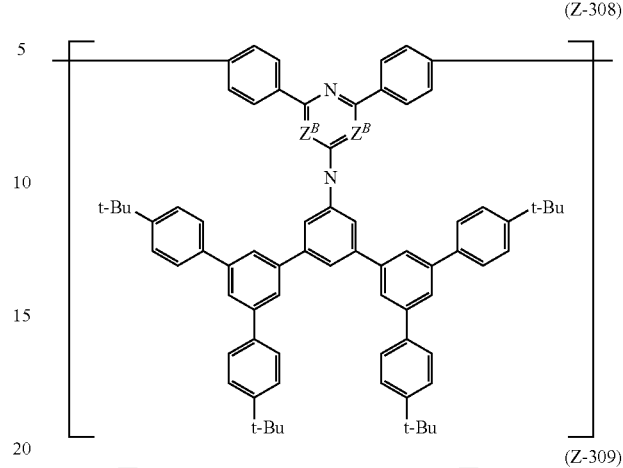

(Z-309)
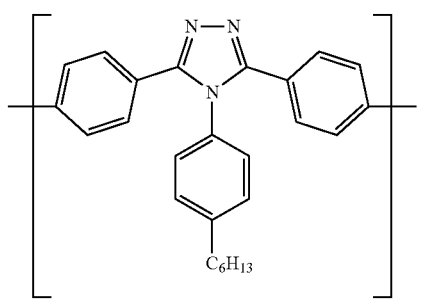

(Z-310)
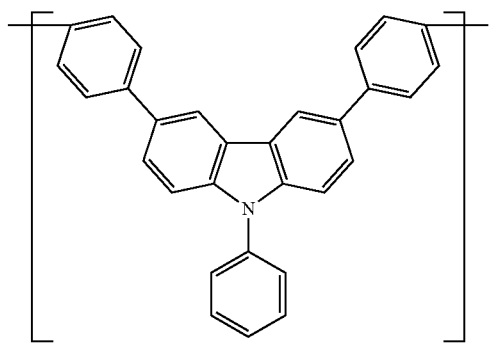

$Z^A$ represents a group represented by —O— or a group represented by —S—. When a plurality of $Z^A$ are present, they may be the same or different.

$Z^B$ represents a group represented by —CH= or a group represented by —N=. When a plurality of $Z^3$ are present, they may be the same or different.]

$Z^A$ is preferably a group represented by —O—. $Z^B$ is preferably a group represented by —N=.

<Explanation of Crosslinkable Group>

The block copolymer contained in the second organic layer according to the present invention (hereinafter, also referred to as "block copolymer according to the present invention") can contain a crosslinkable group.

When the block copolymer according to the present invention contains a crosslinkable group, the crosslinkable group is preferably a crosslinkable group represented by the formula (XL-1) to the formula (XL-4), the formula (XL-7) to the formula (XL-10) or the formula (XL-14) to the formula (XL-19), more preferably a crosslinkable group represented by the formula (XL-1), the formula (XL-3), the formula (XL-9), the formula (XL-10) or the formula (XL- 16) to the formula (XL-19), further preferably a crosslinkable group represented by the formula (XL-1) or the formula (XL-16) to the formula (XL-19), particularly preferably a crosslinkable group represented by the formula (XL-1) or the formula (XL-17), and especially preferably a crosslinkable group represented by the formula (XL-17), because the block copolymer according to the present invention is excellent in crosslinkability.

In the block copolymer according to the present invention, the crosslinkable group may be contained only singly or in combination of two or more.

Examples and preferable examples of the substituent which crosslinkable groups in the above Group A optionally have are the same as the examples and preferable examples of the substituent which the groups represented by $Ar^{X1}$ to $Ar^{X4}$ and $R^{X1}$ to $R^{X3}$ optionally have.

When the block copolymer according to the present invention contains a crosslinkable group, the block copolymer according to the present invention preferably contains a crosslinkable group as a constitutional unit having a crosslinkable group, and more preferably contains a constitutional unit having at least one crosslinkable group selected from the group consisting of a constitutional unit represented by the above-described formula (2) and a constitutional unit represented by the above-described formula (2').

That is, the constitutional unit having a crosslinkable group is preferably a constitutional unit represented by the formula (2) or a constitutional unit represented by the above-described formula (2'). As a result, the block copolymer according to the present invention tends to have excellent crosslinkability.

[Constitutional Unit Represented by the Formula (2)]

From the standpoint of improving the luminance life of the light emitting device according to the present invention, nA is preferably an integer of 0 or more and 3 or less, more preferably an integer of 0 or more and 2 or less, and further preferably 0 or 1.

From the standpoint of improving the luminance life of the light emitting device according to the present invention, n is preferably an integer of 1 or more and 3 or less, more preferably 1 or 2, and further preferably 2.

In the above-described formula (2), $Ar^3$ represents an aromatic hydrocarbon group or a heterocyclic group, and the foregoing groups optionally have a substituent. $Ar^3$ is preferably an aromatic hydrocarbon group which optionally has a substituent, from the standpoint of improving the luminance life of the light emitting device according to the present invention.

The number of carbon atoms of the aromatic hydrocarbon group represented by $Ar^3$, not including the number of carbon atoms of the substituent, is usually 6 or more and 60 or less, preferably 6 or more and 30 or less, and more preferably 6 or more and 18 or less.

Examples and preferable range of the arylene group portion obtained by removing n substituents from the aromatic hydrocarbon group represented by $Ar^3$ are the same as the examples and preferable examples of the group represented by $Ar^{Y1}$.

The arylene group portion obtained by removing n substituents from the aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and the foregoing groups optionally have a substituent, from the standpoint of improving the luminance life of the light emitting device according to the present invention.

The number of carbon atoms of the heterocyclic group represented by $Ar^3$, not including the number of carbon atoms of the substituent, is usually 2 or more and 60 or less, preferably 3 or more and 30 or less, and more preferably 4 or more and 18 or less.

Examples and preferable range of the divalent heterocyclic group portion obtained by removing n substituents from the heterocyclic group represented by $Ar^3$ are the same as the examples and preferable examples of the group represented by $Ar^2$.

The divalent heterocyclic group portion obtained by removing n substituents from the heterocyclic group represented by $Ar^3$ is preferably a group represented by the formula (AA-1) to the formula (AA-34), from the standpoint of improving the luminance life of the light emitting device according to the present invention.

The substituent which the aromatic hydrocarbon group and the heterocyclic group represented by $Ar^3$ optionally have is preferably an alkyl group, a cycloalkyl group, an alkoxy group, a cycloalkoxy group, an aryl group, an aryloxy group, a halogen atom, a monovalent heterocyclic group or a cyano group, more preferably an alkyl group, a cycloalkyl group, an aryl group, a monovalent heterocyclic group or a substituted amino group, and further preferably an alkyl group, a cycloalkyl group or an aryl group, and the foregoing groups optionally further have a substituent.

Examples and preferable examples of the aryl group, the monovalent heterocyclic group and the substituted amino group as the substituent which the group represented by $Ar^3$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^3$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

The number of carbon atoms of the alkylene group represented by $L^4$, not including the number of carbon atoms of the substituent, is usually 1 or more and 20 or less, preferably 1 or more and 15 or less, and more preferably 1 or more and 10 or less. The number of carbon atoms of the cycloalkylene group represented by $L^4$, not including the number of carbon atoms of the substituent, is usually 3 or more and 20 or less.

The alkylene group and the cycloalkylene group optionally have a substituent. The alkylene group and the cycloalkylene group include, for example, a methylene group, an ethylene group, a propylene group, a butylene group, a hexylene group, a cyclohexylene group, and an octylene group.

The substituent which the alkylene group and the cycloalkylene group represented by $L^4$ optionally have is preferably an alkyl group, a cycloalkyl group, an alkoxy group, a cycloalkoxy group, a halogen atom or a cyano group, and the foregoing groups optionally further have a substituent.

The arylene group represented by $L^4$ optionally has a substituent. Examples and preferable examples of the arylene group represented by $L^4$ are the same as the examples and preferable examples of the group represented by $Ar^{Y1}$, and it is preferably a phenylene group or a fluorenediyl group, more preferably a m-phenylene group, a p-phenylene, a fluorene-2,7-diyl group or a fluorene-9,9-diyl group, and the foregoing groups optionally have a substituent.

The substituent which the arylene group represented by $L^A$ optionally has is preferably an alkyl group, a cycloalkyl group, an alkoxy group, a cycloalkoxy group, an aryl group, an aryloxy group, a monovalent heterocyclic group, a halogen atom, a cyano group or a crosslinkable group (preferably a crosslinkable group selected from the above Group A), and the foregoing groups optionally further have a substituent.

Examples and preferable examples of the divalent heterocyclic group represented by $L^A$ are the same as the examples and preferable examples of the group represented by $Ar^Z$.

The divalent heterocyclic group represented by $L^A$ is preferably a group represented by the formula (AA-1) to the formula (AA-34).

$L^A$ is preferably an arylene group or an alkylene group, more preferably a phenylene group, a fluorenediyl group or an alkylene group, and further preferably an alkylene group, and the foregoing groups optionally have a substituent, from the standpoint of easy production of the block copolymer according to the present invention.

Examples and preferable examples of the substituent which the group represented by $L^A$ optionally has are the same as the examples and preferable examples of the substituent which the group represented by $Ar^3$ optionally has.

R' is preferably an aryl group or a monovalent heterocyclic group, more preferably an aryl group, and the foregoing groups optionally have a substituent.

Examples and preferable examples of the substituent which the group represented by R' optionally has are the same as the examples and preferable examples of the substituent which the substituent which the groups represented by $Ar^{X1}$ to $Ar^{X4}$ and $R^{X1}$ to $R^{X3}$ optionally have optionally further has.

In the above-described formula (2), X is preferably a crosslinkable group selected from the above Group A. When a plurality of X are present, they may be the same or different.

The crosslinkable group represented by X is preferably a crosslinkable group represented by the formula (XL-1) to the formula (XL-4), the formula (XL-7) to the formula (XL-10), or the formulae (XL-14) to (XL-19), more preferably a crosslinkable group represented by the formula (XL-1), the formula (XL-3), the formula (XL-9), the formula (XL-10), or the formula (XL-16) to the formula (XL-19), further preferably a crosslinkable group represented by the formula (XL-1) or the formula (XL-16) to the formula (XL-19), particularly preferably a crosslinkable group represented by the formula (XL-1) or the formula (XL-17), and especially preferably a crosslinkable group represented by the formula (XL-17), because the block copolymer is excellent in crosslinkability.

[Constitutional Unit Represented by the Formula (2')]

mA is preferably an integer of 0 or more and 3 or less, more preferably an integer of 0 or more and 2 or less, further preferably 0 or 1, and particularly preferably 0, from the standpoint of improving the luminance life of the light emitting device according to the present invention.

m is preferably an integer of 1 or more and 3 or less, more preferably 1 or 2, and further preferably 2, from the standpoint of improving the luminance life of the light emitting device according to the present invention.

c is preferably 0, from the standpoint of easy production of the block copolymer according to the present invention and from the standpoint of improving the luminance life of the light emitting device according to the present invention.

$Ar^5$ is preferably an aromatic hydrocarbon group optionally having a substituent, from the standpoint of improving the luminance life of the light emitting device according to the present invention.

The definition and examples of the arylene group portion obtained by removing m substituents from the aromatic hydrocarbon group represented by $Ar^5$ are the same as the definition and examples of the arylene group represented by $Ar^{X2}$ in the above-described formula (X).

The definition and examples of the divalent heterocyclic group portion obtained by removing m substituents from the heterocyclic group represented by $Ar^5$ are the same as the definition and examples of the divalent heterocyclic group portion represented by $Ar^{X2}$ in the above-described formula (X).

The definition and examples of the divalent group obtained by removing m substituents from the group in which at least one aromatic hydrocarbon ring and at least one hetero ring are directly bonded represented by $Ar^5$ are the same as the definition and examples of the divalent group in which at least one arylene group and at least one divalent heterocyclic group are bonded directly represented by $Ar^{X2}$.

$Ar^4$ and $Ar^6$ are preferably arylene groups optionally having a substituent, from the standpoint of improving the luminance life of the light emitting device according to the present invention.

The definition and examples of the arylene group represented by $Ar^4$ and $Ar^6$ are the same as the definition and examples of the arylene group represented by $Ar^{X1}$ and $Ar^{X3}$ in the above-described formula (X).

The definition and examples of the divalent heterocyclic group represented by $Ar^4$ and $Ar^6$ are the same as the definition and examples of the divalent heterocyclic group represented by $Ar^{X1}$ and $Ar^{X3}$ in the above-described formula (X).

The substituent which $Ar^4$, $Ar^5$ and $Ar^6$ optionally have is preferably an alkyl group, a cycloalkyl group, an alkoxy group, a cycloalkoxy group, an aryl group, an aryloxy group, a halogen atom, a monovalent heterocyclic group or a cyano group, more preferably an alkyl group, a cycloalkyl group, an aryl group, a monovalent heterocyclic group or a substituted amino group, further preferably an alkyl group, a cycloalkyl group or an aryl group, and particularly preferably an alkyl group, and the foregoing groups optionally further have a substituent.

Examples and preferable examples of the aryl group, the monovalent heterocyclic group and the substituted amino group as the substituent which the groups represented by $Ar^4$ to $Ar^6$ optionally have are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have.

Examples and preferable examples of the substituent which the substituent which the groups represented by $Ar^4$ to $Ar^6$ optionally have optionally further has are the same as the examples and preferable examples of the substituent which the substituent which the groups represented by $Ar^{X1}$ to $Ar^{X4}$ and $R^{X1}$ to $R^{X3}$ optionally have optionally further has.

Definition and examples of the alkylene group, the cycloalkylene group, the arylene group and the divalent heterocyclic group represented by $K^A$ are the same as the definition and examples of the alkylene group, the cycloalkylene group, the arylene group and the divalent heterocyclic group represented by $L^A$ in the above-described formula (2).

Examples and preferable examples of $K^A$ are the same as the examples and preferable examples of $L^A$, and $K^A$ is preferably a phenylene group or a methylene group, and the foregoing groups optionally have a substituent, from the standpoint of easy production of the block copolymer according to the present invention.

Examples and preferable examples of the substituent which the group represented by $K^A$ optionally has are the same as the examples and preferable examples of the substituent which the group represented by $L^A$ optionally has.

Examples and preferable examples of R" are the same as the examples and preferable examples of R'.

X' is preferably a crosslinkable group, an aryl group or a monovalent heterocyclic group, more preferably a crosslinkable group or an aryl group, and the foregoing groups optionally have a substituent.

Examples and preferable examples of the aryl group and the monovalent heterocyclic group represented by X' are the same as the examples and preferable examples of the aryl group and the monovalent heterocyclic group as the substituent which the groups represented by $Ar^{X1}$ to $Ar^{X4}$ and $R^{X1}$ to $R^{X3}$ optionally have, respectively.

Examples and preferable examples of the substituent which the group represented by X' optionally has are the same as the examples and preferable examples of the substituent which the groups represented by $Ar^{X1}$ to $Ar^{X4}$ and $R^{X1}$ to $R^{X3}$ optionally have.

In the above-described formula (2'), at least one X' is a crosslinkable group, preferably a crosslinkable group selected from the above Group A.

The definition and examples of the crosslinkable group represented by X' are the same as the definition and examples of the crosslinkable group represented by X in the above-described formula (2).

Specific Example of Constitutional Unit Represented by the Formula (2) or (2')

The constitutional unit represented by the formula (2) includes, for example, constitutional units represented by the following formula (2-1) to the formula (2-30), and the constitutional unit represented by the formula (2') includes, for example, constitutional units represented by the following formula (2'-1) to the formula (2'-9). Of them, the constitutional unit having a crosslinkable group is preferably a constitutional unit represented by the formula (2-1) to the formula (2-30), more preferably a constitutional unit represented by the formula (2-1) to the formula (2-15), the formula (2-19), the formula (2-20), the formula (2-23), the formula (2-25) or the formula (2-30), and further preferably a constitutional unit represented by the formula (2-1) to the formula (2-9) or the formula (2-30), from the standpoint of improving the crosslinkability of the block copolymer according to the present invention.

[Chemical Formula 53]

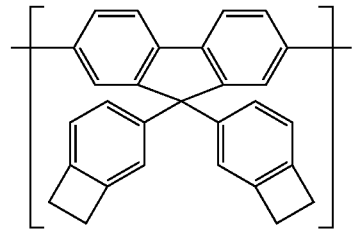

(2-1)

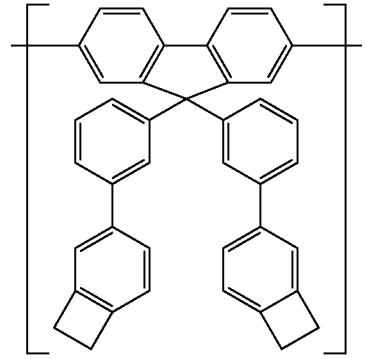

(2-2)

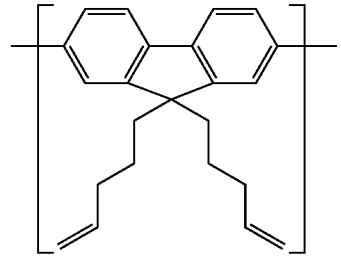

(2-3)

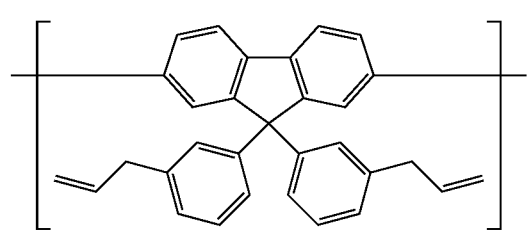

(2-4)

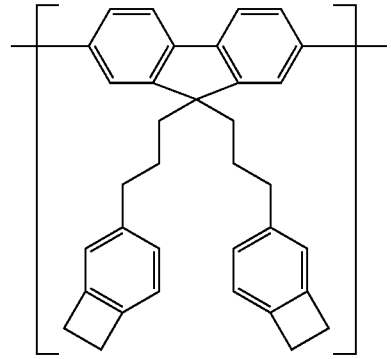

(2-5)

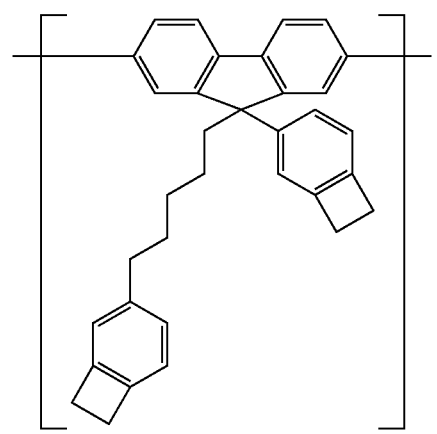
(2-6)
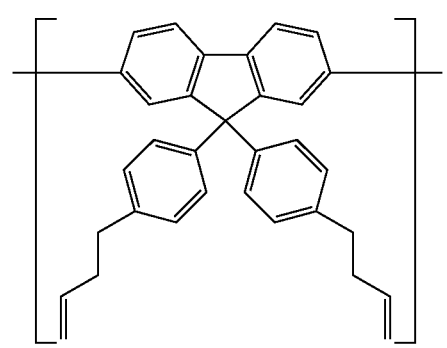
(2-7)
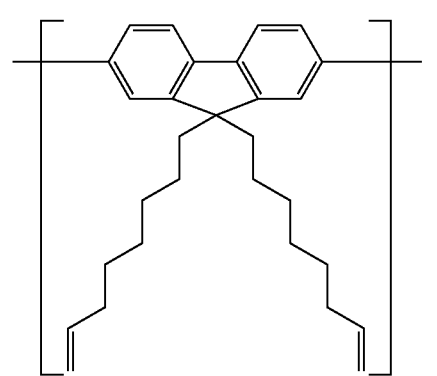
(2-8)
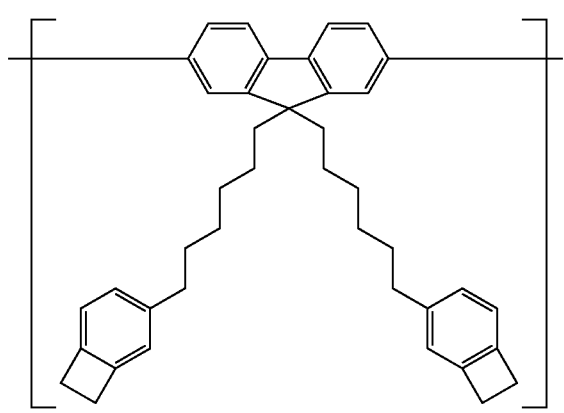
(2-9)
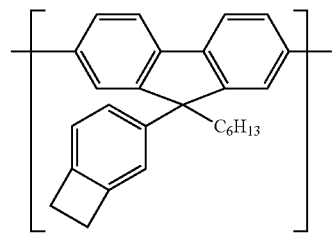
(2-10)
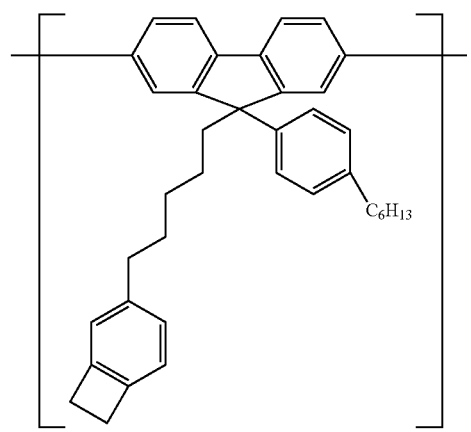
(2-11)
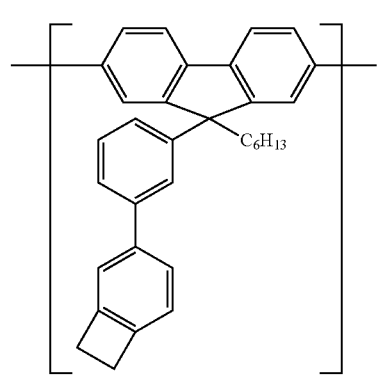
(2-12)
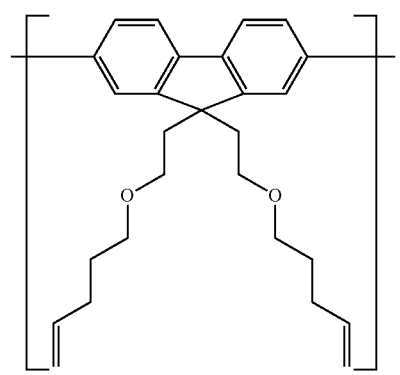
(2-13)

(2-14)
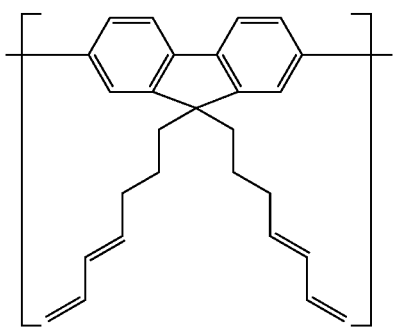
(2-15)
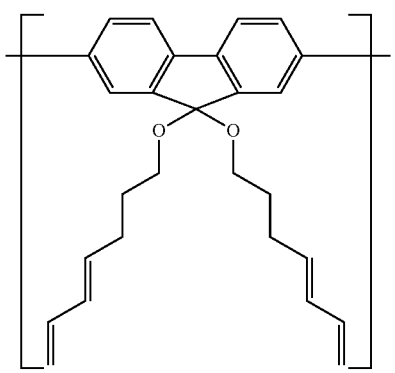
[Chemical Formula 54]
(2-16)
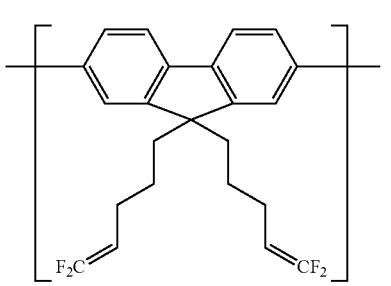
(2-17)
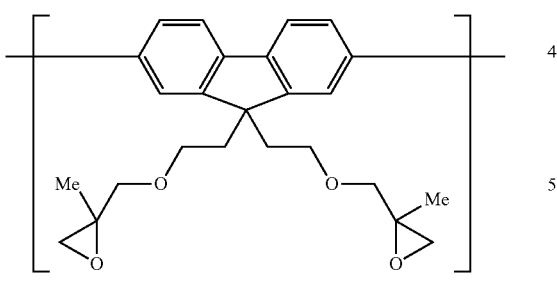
(2-18)
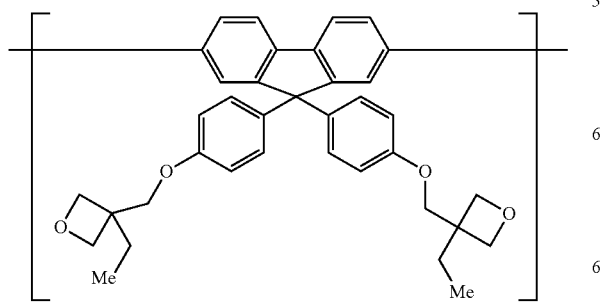
(2-19)
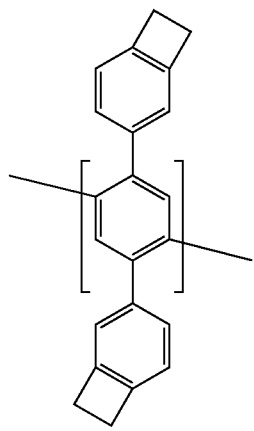
(2-20)
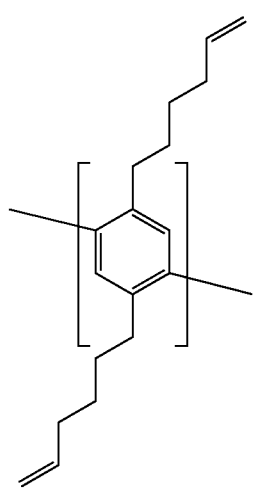
[Chemical Formula 55]
(2-21)
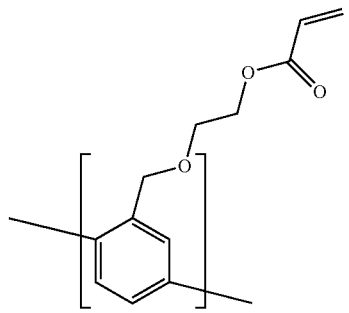

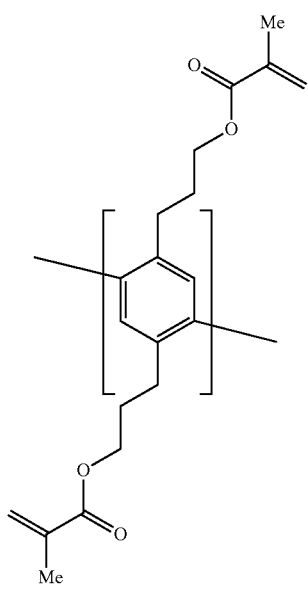
(2-22)
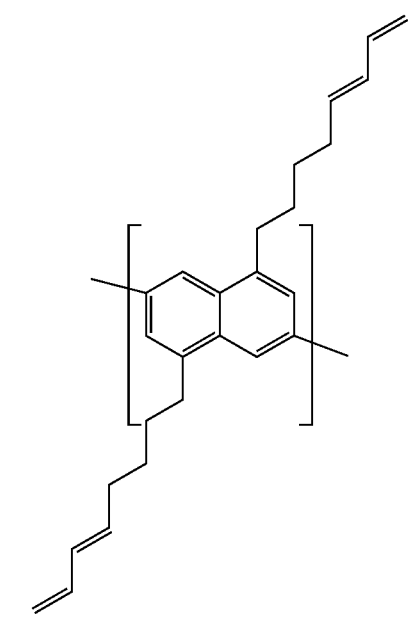
(2-24)
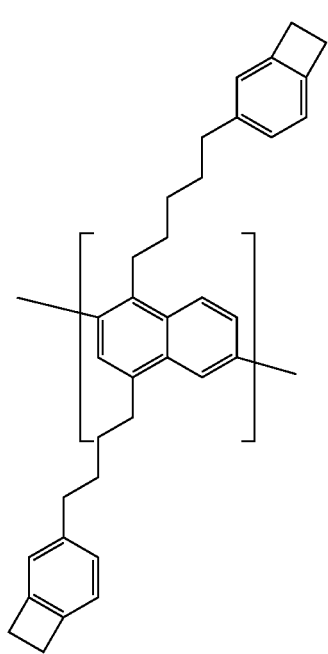
(2-23)
(2-25)

(2-26)
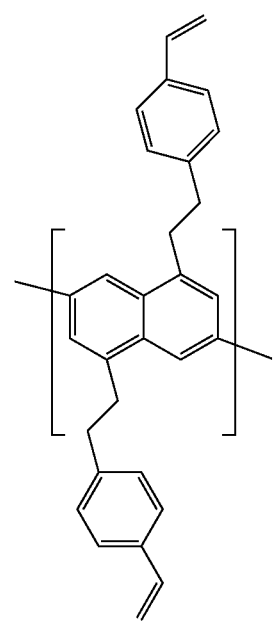
(2-27)
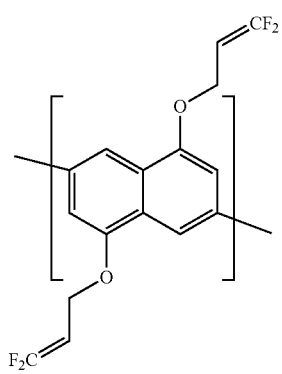
(2-28)
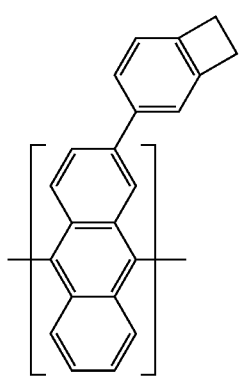
(2-29)
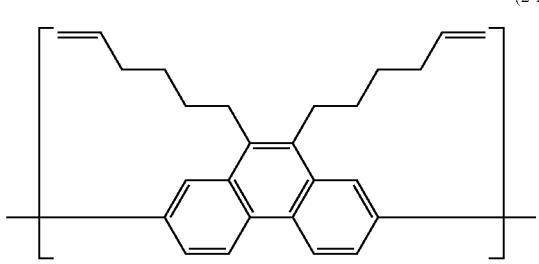
(2-30)
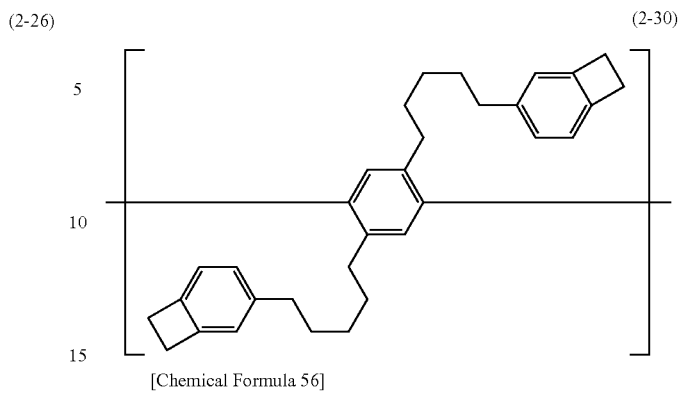
[Chemical Formula 56]
(2'-1)
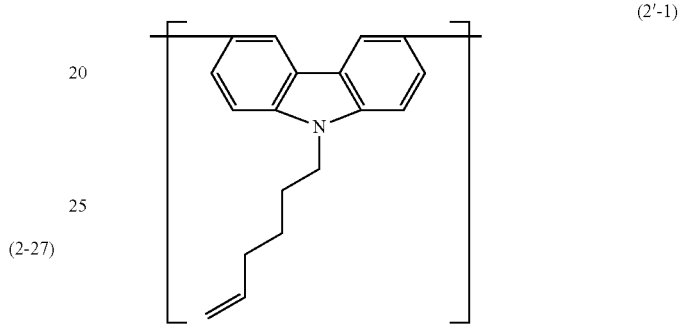
(2'-2)
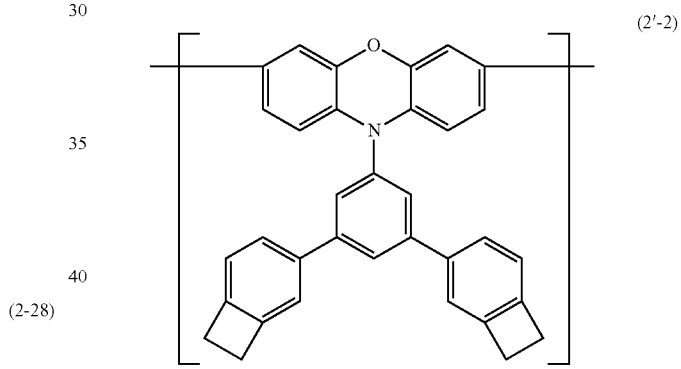
(2'-3)
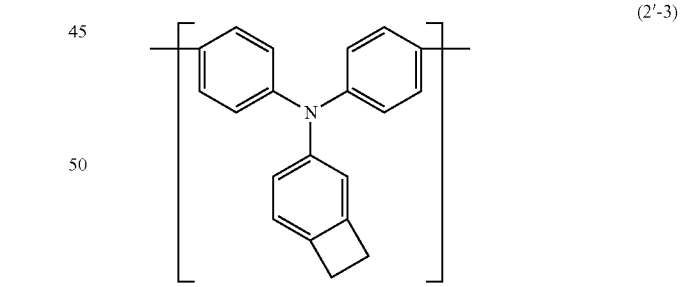
(2'-4)
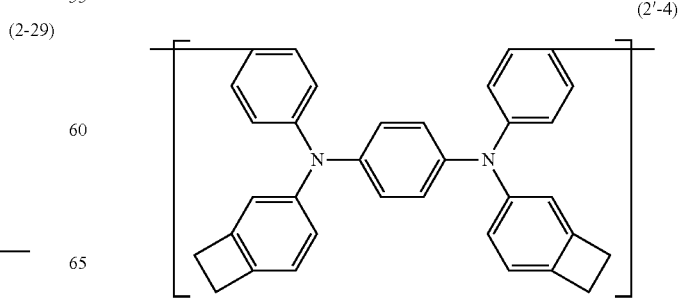

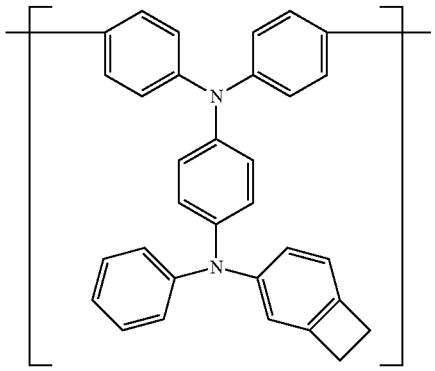
(2'-5)

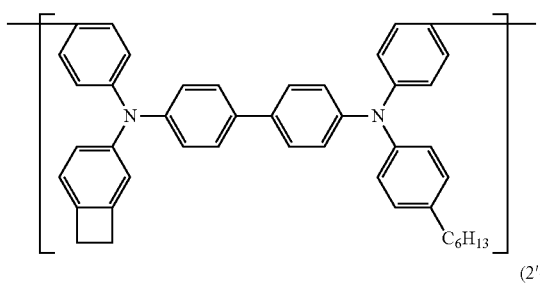
(2'-6)

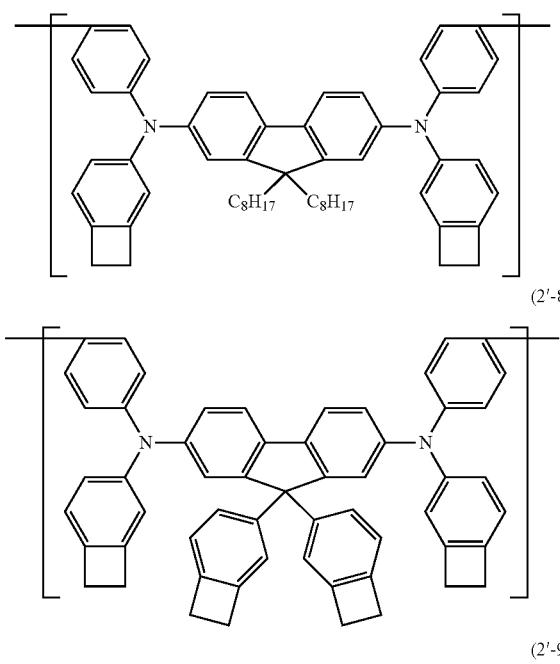
(2'-7)

(2'-8)

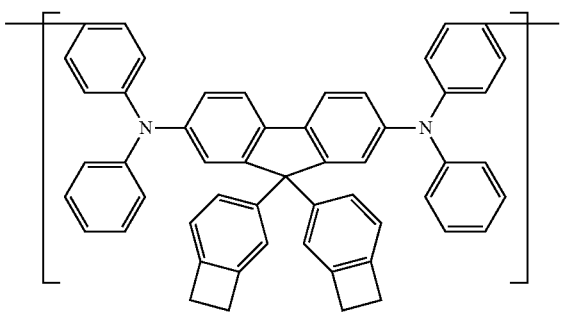
(2'-9)

[Other Constitutional Unit Having Crosslinkable Group]

When the block copolymer according to the present invention contains a crosslinkable group, the block copolymer according to the present invention may contain a crosslinkable group by containing a constitutional unit other than the above-described constitutional unit represented by the formula (2) and the above-described constitutional unit represented by the formula (2').

That is, the constitutional unit having a crosslinkable group may be a constitutional unit having a crosslinkable group other than the constitutional unit represented by the formula (2) and the constitutional unit represented by the formula (2'). The constitutional unit having a crosslinkable group other than the constitutional unit represented by the formula (2) and the constitutional unit represented by the formula (2') includes, for example, constitutional units represented by the following formulae.

[Chemical Formula 57]

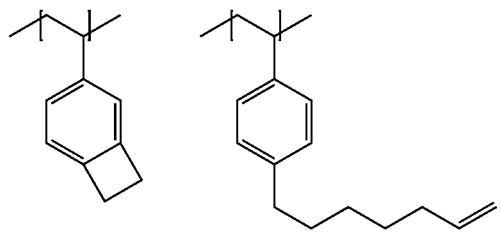

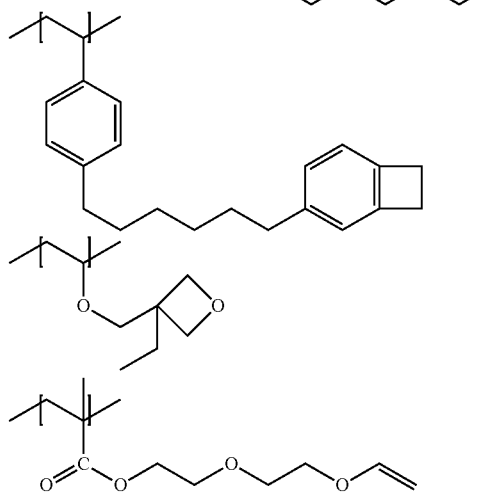

<Constitutional Unit Represented by the Formula (Y)>

The constitutional unit represented by the formula (Y) is a non-crosslinkable constitutional unit.

The group represented by $Ar^{Y1}$ is preferably a phenylene group, a naphthalenediyl group, an anthracenediyl group, a phenanthrendiyl group, a dihydrophenanthrenediyl group, a pyrenediyl group, a fluorenediyl group or a dibenzocycloheptanediyl group, more preferably a phenylene group, a naphthalenediyl group, an anthracenediyl group, a phenanthrenediyl group, a dihydrophenanthrenediyl group or a fluorenediyl group, and further preferably a phenylene group, an anthracenediyl group or a fluorenediyl group, and the foregoing groups optionally have a substituent, from the standpoint of advantage for an improvement in the luminance life of the light emitting device.

The substituent which the group represented by $Ar^{Y1}$ optionally has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group, a monovalent heterocyclic group or a substituted amino group, further preferably an alkyl group, a cycloalkyl group or an aryl group, and particularly preferably an alkyl group or an aryl group, and the foregoing group optionally further have a substituent.

Examples and preferable examples of the aryl group, the monovalent heterocyclic group and the substituted amino group as the substituent which the group represented by $Ar^{Y1}$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^{Y1}$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

From the standpoint of improving the luminance life of the light emitting device according to the present invention, the constitutional unit represented by the formula (Y) includes preferably, for example, constitutional units represented by the following formulae (Y-1) to (Y-4), and is more preferably a constitutional unit represented by the formula (Y-1), the formula (Y-2) or the formula (Y-4), and further preferably a constitutional unit represented by the formula (Y-2).

[Chemical Formula 58]

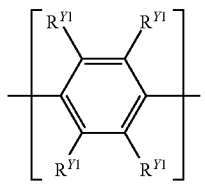
(Y-1)

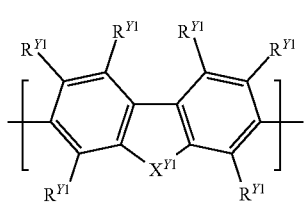
(Y-2)

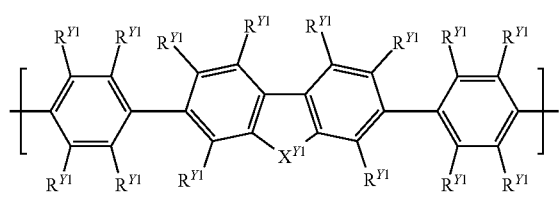
(Y-3)

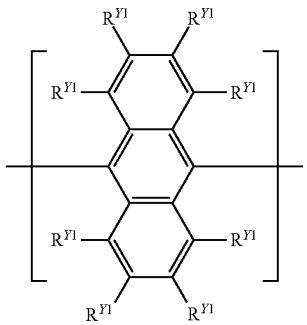
(Y-4)

[wherein, $R^{Y1}$ represents the same meaning as described above.

$X^{Y1}$ represents a group represented by —C($R^{Y2}$)$_2$—, C($R^{Y2}$)=C($R^{Y2}$)— or —C($R^{Y2}$)$_2$—C($R^{Y2}$)$_2$—. $R^{Y2}$ represents a hydrogen atom, a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y2}$ may be the same or different, and groups $R^{Y2}$ may be combined together to form a ring together with carbon atoms to which they are attached.]

$R^{Y2}$ is preferably an alkyl group, a cycloalkyl group, an aryl group, a monovalent heterocyclic group or a substituted amino group, and more preferably an alkyl group, a cycloalkyl group or an aryl group, and the foregoing groups optionally have a substituent.

Examples and preferable examples of the aryl group, the monovalent heterocyclic group and the substituted amino group as the group represented by $R^{Y2}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which $R^{Y2}$ optionally has optionally further has are the same as the examples and preferable examples of the substituent which the groups represented by $Ar^{X1}$ to $Ar^{X4}$ and $R^{X1}$ to $R^{X3}$ optionally have.

The combination of two groups $R^{Y2}$ in the group represented by —C($R^{Y2}$)$_2$— as $X^{Y1}$ is preferably a combination in which both represent an alkyl group or a cycloalkyl group, both represent an aryl group, both represent a monovalent heterocyclic group, or one represents an alkyl group or a cycloalkyl group and the other represents an aryl group or a monovalent heterocyclic group, more preferably a combination in which both represent an alkyl group or a cycloalkyl group, both represent an aryl group, or one represents an alkyl group or a cycloalkyl group and the other represents an aryl group, and further preferably a combination in which one represents an alkyl group or a cycloalkyl group and the other represents an aryl group, and the foregoing groups optionally have a substituent.

Two groups $R^{Y2}$ may be combined together to form a ring together with atoms to which they are attached, and when $R^{Y2}$ forms a ring, the group represented by —C($R^{Y2}$)$_2$— is preferably a group represented by the formula (Y-A1) to the formula (Y-A5), and more preferably a group represented by the formula (Y-A4), and the foregoing groups optionally have a substituent.

[Chemical Formula 59]

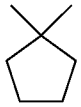
(Y-A1)

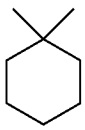
(Y-A2)

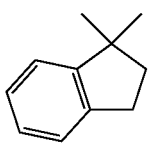
(Y-A3)

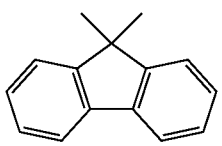
(Y-A4)

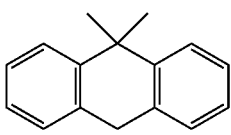
(Y-A5)

The combination of two groups $R^{Y2}$ in the group represented by —C($R^{Y2}$)=C($R^{Y2}$)— as $X^{Y1}$ is preferably a combination in which both represent an alkyl group or a cycloalkyl group, or one represents an alkyl group or a cycloalkyl group and the other represents an aryl group, and the foregoing groups optionally have a substituent.

Four groups $R^{Y2}$ in the group represented by —C($R^{Y2}$)$_2$—C($R^{Y2}$)$_2$— as $X^{Y1}$ represent preferably an alkyl group optionally having a substituent or a cycloalkyl group optionally having a substituent.

A plurality of $R^{Y2}$ may be combined together to form a ring together with atoms to which they are attached, and when $R^{Y2}$ forms a ring, the group represented by —C($R^{Y2}$)$_2$—C($R^{Y2}$)$_2$— is preferably a group represented by the following formula (Y-B1) to formula (Y-B5), and more preferably a group represented by the formula (Y-B3), and the foregoing groups optionally have a substituent.

[Chemical Formula 60]

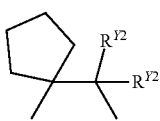
(Y-B1)

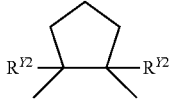
(Y-B2)

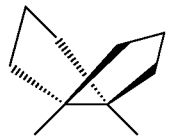
(Y-B3)

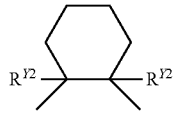
(Y-B4)

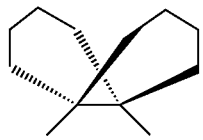
(Y-B5)

[wherein, $R^{Y2}$ represents the same meaning as described above.]

$X^{Y1}$ is preferably a group represented by —C($R^{Y2}$)$_2$—. The constitutional unit represented by the formula (Y-1) is preferably a constitutional unit represented by the following formula (Y-1'). The constitutional unit represented by the formula (Y-2) is preferably a constitutional unit represented by the following formula (Y-2'). The constitutional unit represented by the formula (Y-3) is preferably a constitutional unit represented by the following formula (Y-3*). The constitutional unit represented by the formula (Y-4) is preferably a constitutional unit represented by the following formula (Y-4').

[Chemical Formula 61]

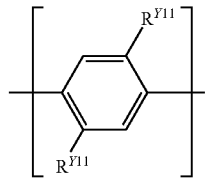
(Y-1')

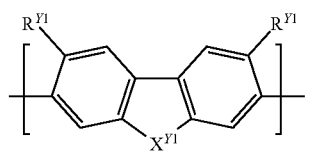
(Y-2')

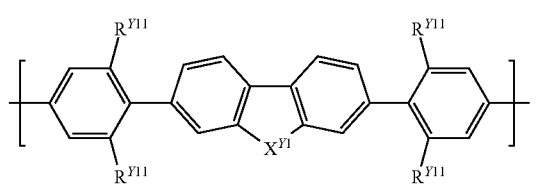
(Y-3')

(Y-4')

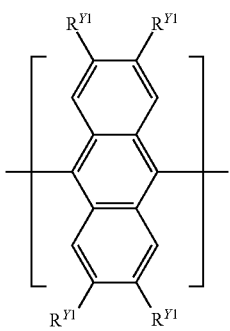

[wherein, $R^{Y1}$ and $X^{Y1}$ represent the same meaning as described above.

$R^{Y11}$ represents a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y11}$ may be the same or different.]

$R^m$ is preferably an alkyl group, a cycloalkyl group, an aryl group or a monovalent heterocyclic group, more preferably an alkyl group, a cycloalkyl group or an aryl group, and further preferably an alkyl group or a cycloalkyl group, and the foregoing groups optionally have a substituent.

Examples and preferable examples of the aryl group, the monovalent heterocyclic group and the substituted amino group as the group represented by $R^{Y11}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which $R^{Y11}$ optionally has are the same as the examples and preferable examples of the substituent which the groups represented by $Ar^{X1}$ to $Ar^{X4}$ and $R^{X1}$ to $R^{X3}$ optionally have.

The constitutional unit represented by the formula (Y) includes, for example, constitutional units represented by the formula (Y-11) to the formula (Y-49).

[Chemical Formula 62]

(Y-11)

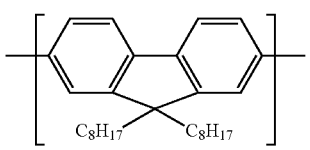

(Y-12)

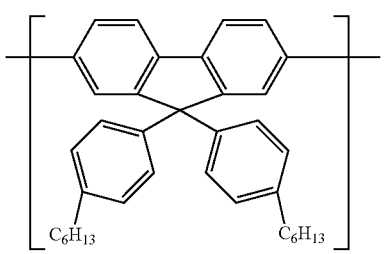

(Y-13)

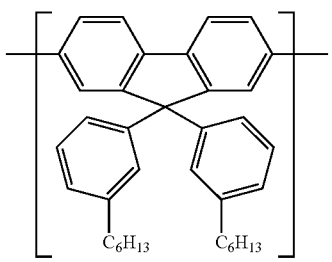

[Chemical Formula 63]

(Y-14)

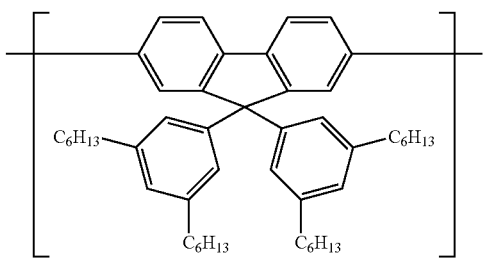

(Y-15)

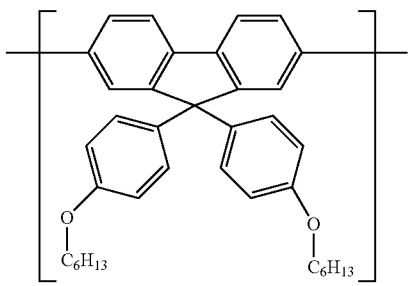

(Y-16)

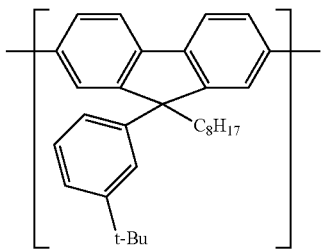

[Chemical Formula 64]

(Y-17)

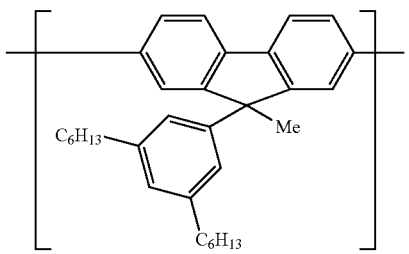

(Y-18)
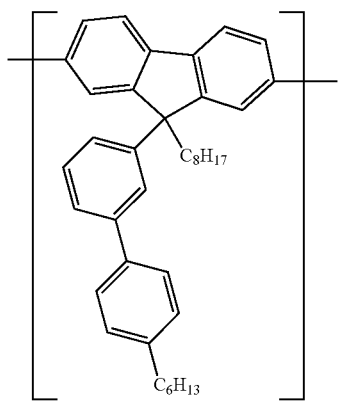
(Y-19)
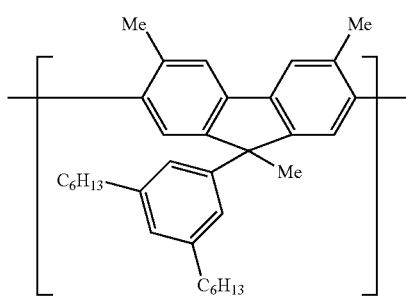
[Chemical Formula 65]
(Y-20)
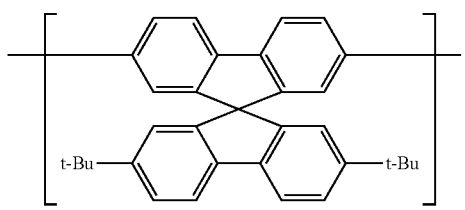
(Y-21)
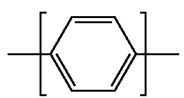
(Y-22)
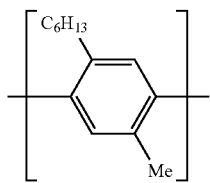
(Y-23)
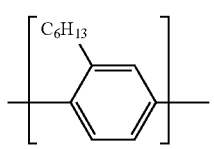
[Chemical Formula 66]
(Y-24)
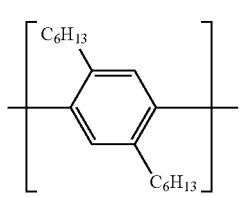
(Y-25)
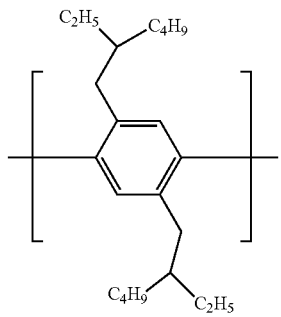
(Y-26)
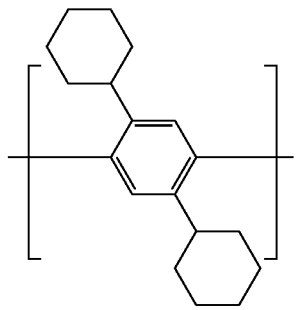
(Y-27)
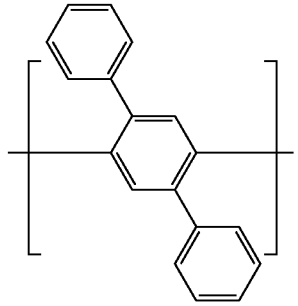
[Chemical Formula 67]
(Y-28)
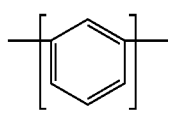
(Y-29)
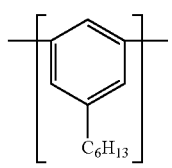
(Y-30)
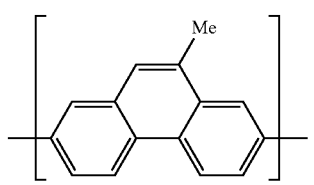
(Y-31)
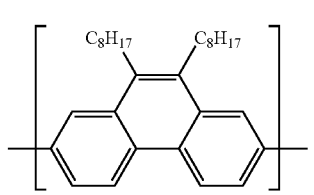

[Chemical Formula 68]
(Y-32)
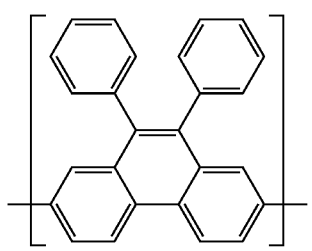
(Y-33)
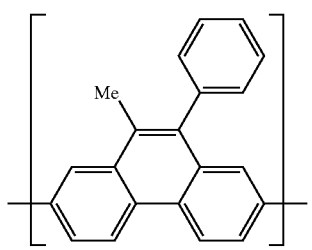
(Y-34)
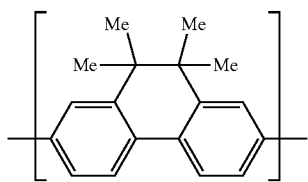
(Y-35)
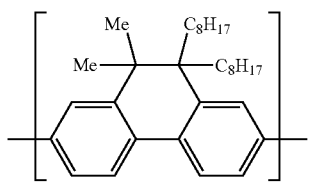
[Chemical Formula 69]
(Y-36)
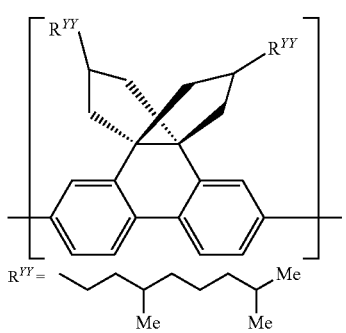
(Y-37)
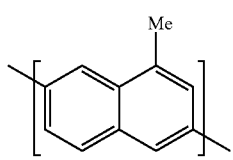
(Y-38)
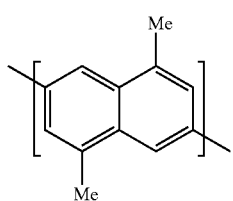
(Y-39)
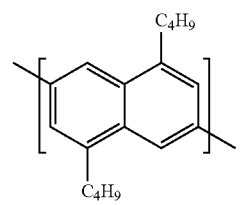
[Chemical Formula 70]
(Y-40)
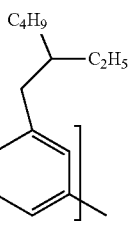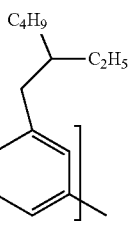
(Y-41)
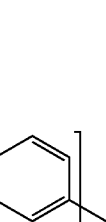
(Y-42)
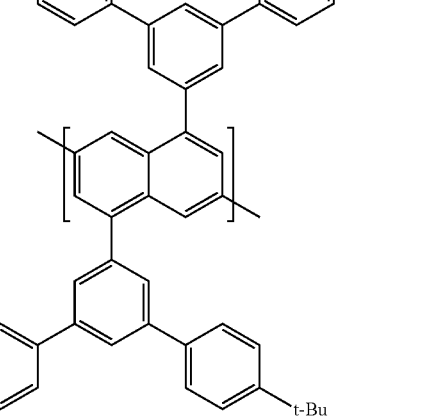
(Y-43)
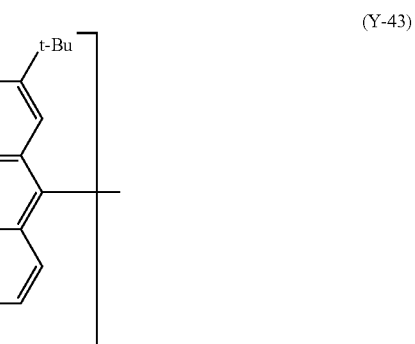

-continued (Y-44)

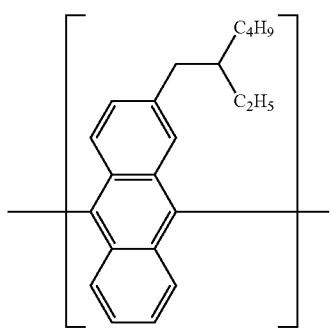

[Chemical Formula 71]

(Y-45)

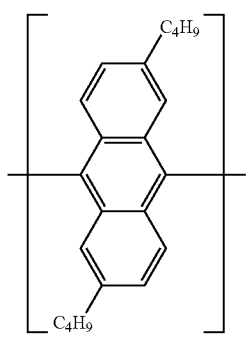

(Y-46)

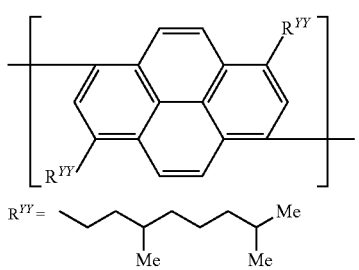

[Chemical Formula 72]

(Y-47)

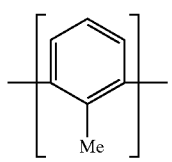

(Y-48)

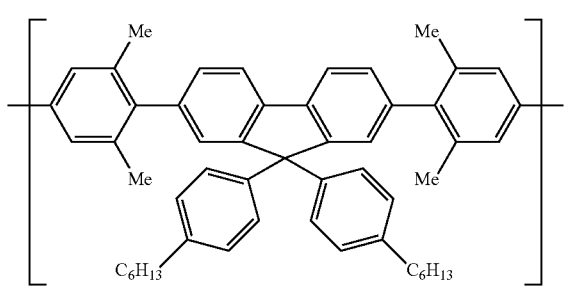

(Y-49)

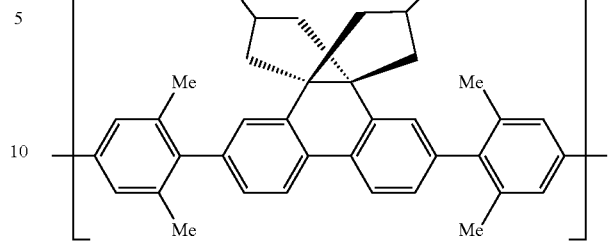

<Phosphorescent Compound>

The phosphorescent compound contained in the first organic layer in the light emitting device according to the present invention will be described.

The phosphorescent compound usually means a compound exhibiting a phosphorescent property at room temperature (25° C.), and is preferably a metal complex which emits light from the triplet excited state at room temperature. This metal complex which emits light from the triplet excited state has a central metal atom and a ligand.

The central metal atom includes, for example, a metal atom having an atomic number of 40 or more, which has spin-orbit interaction in the complex and can cause inter-system crossing between the singlet state and the triplet state. The metal atom includes, for example, a ruthenium atom, a rhodium atom, a palladium atom, an iridium atom and a platinum atom, and from the standpoint of advantage for an improvement in the luminance life of the light emitting device according to the present invention, is preferably an iridium atom or a platinum atom The ligand includes, for example, a neutral or anionic monodentate ligand or a neutral or anionic polydentate ligand, which forms at least one bond selected from the group consisting of a coordination bond and a covalent bond, between the central metal atom. The bond between the central metal atom and the ligand includes, for example, a metal-nitrogen bond, a metal-carbon bond, a metal-oxygen bond, a metal-phosphorus bond, a metal-sulfur bond and a metal-halogen bond. The polydentate ligand usually means a bidentate or more and 6-dentate or less ligand.

[Phosphorescent Compound Represented by the Formula (1)]

The phosphorescent compound is preferably a phosphorescent compound represented by the above-described formula (1) from the standpoint of advantage for an improvement in the luminance life of the light emitting device according to the present invention.

M is preferably an iridium atom or a platinum atom, and more preferably an iridium atom from the standpoint of advantage for an improvement in the luminance life of the light emitting device according to the present invention.

When M is a ruthenium atom, a rhodium atom or an iridium atom, $n^1$ is preferably 2 or 3, and more preferably 3.

When M is a palladium atom or a platinum atom, $n^1$ is preferably 2.

(Ring $L^1$ and Ring $L^2$)

$E^1$ contained in Ring $L^1$ and $E^2$ contained in Ring $L^2$ are preferably carbon atoms.

The number of carbon atoms of the aromatic hetero ring represented by Ring $L^1$, not including the number of carbon atoms of the substituent, is usually 2 or more and 60 or less, preferably 3 or more and 30 or less, and more preferably 4 or more and 15 or less. Ring $L^1$ is preferably a 5-membered aromatic hetero ring or a 6-membered aromatic hetero ring, and more preferably a 5-membered aromatic hetero ring having 2 or more and 4 or less nitrogen atoms as the constituent atom or a 6-membered aromatic hetero ring having 1 or more and 4 or less nitrogen atoms as the constituent atom, and the foregoing rings optionally have a substituent. However, when Ring $L^1$ is a 6-membered aromatic hetero ring, $E^1$ is preferably a carbon atom.

Ring $L^1$ includes, for example, a diazole ring, a triazole ring, a tetrazole ring, a pyridine ring, a diazabenzene ring, a triazine ring, an azanaphthalene ring and a diazanaphthalene ring, and is preferably a pyridine ring, a diazabenzene ring, an azanaphthalene ring, a diazanaphthalene ring, a triazole ring or a diazole ring, more preferably a pyridine ring, a diazabenzene ring, an azanaphthalene ring, a diazanaphthalene ring or a diazole ring, further preferably a pyridine ring, a diazabenzene ring, an azanaphthalene ring or a diazanaphthalene ring, and particularly preferably a pyridine ring, a quinoline ring or an isoquinoline ring, and the foregoing rings optionally have a substituent.

The number of carbon atoms of the aromatic hydrocarbon ring represented by Ring $L^2$, not including the number of carbon atoms of the substituent, is usually 6 to 60, preferably 6 to 30, and more preferably 6 to 18.

The aromatic hydrocarbon ring represented by Ring $L^2$ includes, for example, a benzene ring, a naphthalene ring, an indene ring, a fluorene ring, a phenanthrene ring, a dihydrophenanthrene ring, and a ring in which two or more and five or less of these rings are condensed, and is preferably a benzene ring, a naphthalene ring, a fluorene ring, a phenanthrene ring or a dihydrophenanthrene ring, more preferably a benzene ring, a fluorene ring or a dihydrophenanthrene ring, and further preferably a benzene ring, and the foregoing rings optionally have a substituent, from the standpoint of advantage for an improvement in the luminance life of the light emitting device according to the present invention.

The number of carbon atoms of the aromatic hetero ring represented by Ring $L^2$, not including the number of carbon atoms of the substituent, is usually 2 to 60, preferably 3 to 30, and more preferably 4 to 15.

The aromatic hetero ring represented by Ring $L^2$ includes, for example, a pyrrole ring, a diazole ring, a furan ring, a thiophene ring, a pyridine ring, a diazabenzene ring, and a ring in which one or more and five or less aromatic rings are condensed with these rings, and is preferably a pyridine ring, a diazabenzene ring, an azanaphthalene ring, a diazanaphthalene ring, an indole ring, a benzofuran ring, a benzothiophene ring, a carbazole ring, an azacarbazole ring, a diazacarbazole ring, a dibenzofuran ring or a dibenzothiophene ring, more preferably a pyridine ring, a diazabenzene ring, a carbazole ring, a dibenzofuran ring or a dibenzothiophene ring, and further preferably a pyridine ring or a diazabenzene ring, and the foregoing rings optionally have a substituent, from the standpoint of advantage for an improvement in the luminance life of the light emitting device. When Ring $L^2$ is a 6-membered aromatic hetero ring, $E^2$ is preferably a carbon atom.

Ring $L^2$ is preferably a benzene ring, a fluorene ring, a dihydrophenanthrene ring, a pyridine ring, a diazabenzene ring, a carbazole ring, a dibenzofuran ring or a dibenzothiophene ring, more preferably a benzene ring, a pyridine ring or a diazabenzene ring, and further preferably a benzene ring, and the foregoing rings optionally have a substituent, from the standpoint of advantage for an improvement in the luminance life of the light emitting device according to the present invention.

The substituent which Ring $L^1$ and Ring $L^2$ optionally have is preferably an alkyl group, a cycloalkyl group, an alkoxy group, a cycloalkoxy group, an aryl group, an aryloxy group, a monovalent heterocyclic group, a substituted amino group or a halogen atom, more preferably an alkyl group, a cycloalkyl group, an aryl group, a monovalent heterocyclic group or a substituted amino group, further preferably an alkyl group, an aryl group or a monovalent hetero group, and particularly preferably an aryl group, and the foregoing groups optionally further have a substituent.

In the phosphorescent compound represented by the formula (1), at least one of Ring $L^1$ and Ring $L^2$ preferably has a substituent, from the standpoint of advantage for an improvement in the luminance life of the light emitting device according to the present invention.

The aryl group as the substituent which Ring $L^1$ and Ring $L^2$ optionally have is preferably a phenyl group, a naphthyl group, a phenanthrenyl group, a dihydrophenanthrenyl group or a fluorenyl group, more preferably a phenyl group or a fluorenyl group, and further preferably a phenyl group, and the foregoing groups optionally have a substituent.

The monovalent heterocyclic group as the substituent which Ring $L^1$ and Ring $L^2$ optionally have is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a dibenzofuranyl group, a dibenzothienyl group or a carbazolyl group, and further preferably a pyridyl group, a pyrimidinyl group or a triazinyl group, and the foregoing groups optionally have a substituent.

The substituent which the amino group has in the substituted amino group as the substituent which Ring $L^1$ and Ring $L^2$ optionally have is preferably an aryl group or a monovalent heterocyclic group, and more preferably an aryl group, and the foregoing groups optionally further have a substituent. The examples and preferable examples of the aryl group as the substituent which the amino group has are the same as the examples and the preferable examples of the aryl group as the substituent which Ring $L^1$ and Ring $L^2$ optionally have. Examples and preferable examples of the monovalent heterocyclic group as the substituent which the amino group has are the same as the examples and preferable examples of the monovalent heterocyclic group as the substituent which Ring $L^1$ and Ring $L^2$ optionally have.

The substituent which the substituent which Ring $L^1$ and Ring $L^2$ optionally have optionally further has is preferably an alkyl group, a cycloalkyl group, an aryl group, a monovalent heterocyclic group or a substituted amino group, more preferably an alkyl group, a cycloalkyl group or an aryl group, and further preferably an alkyl group, and the foregoing groups optionally further have a substituent.

Examples and preferable examples of the aryl group, the monovalent heterocyclic group and the substituted amino group as the substituent which the substituent which Ring $L^1$ and Ring $L^2$ optionally have optionally further has are the same as the examples and preferable examples of the aryl group, the monovalent heterocyclic group and the substituted amino group as the substituent which $L^1$ and Ring $L^2$ optionally have.

The aryl group, the monovalent heterocyclic group or the substituted amino group as the substituent which Ring $L^1$ and Ring $L^2$ optionally have is preferably a group represented by the formula (D-A), the formula (D-B) or the formula (D-C), more preferably a group represented by the formula (D-A) or the formula (D-B), and further preferably a group represented by the formula (D-A), from the standpoint of advantage for an improvement in the luminance life of the light emitting device.

[Chemical Formula 73]

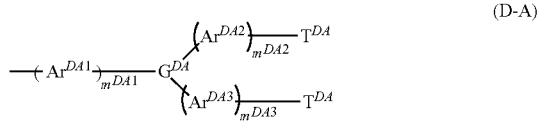

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and the foregoing groups optionally have a substituent.

$Ar^{DA1}$, $Ar^{DA2}$ and $Ar^{DA3}$ each independently represent an arylene group or a divalent heterocyclic group, and the foregoing groups optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and the foregoing groups optionally have a substituent. The plurality of $T^{DA}$ may be the same or different.]

[Chemical Formula 74]

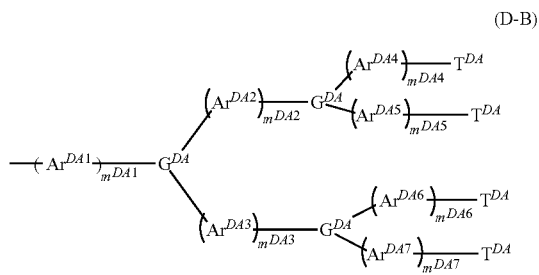

(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and the foregoing groups optionally have a substituent. The plurality of $G^{DA}$s may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and the foregoing groups optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and the foregoing groups optionally have a substituent. The plurality of $T^{DA}$ may be the same or different.]

[Chemical Formula 75]

(D-C)

[wherein, $m^{DA1}$ represents an integer of 0 or more.

$Ar^{DA1}$ represents an arylene group or a divalent heterocyclic group, and the foregoing groups optionally have a substituent. When a plurality of $Ar^{DA1}$ are present, they may be the same or different.

$T^{DA}$ represents an aryl group or a monovalent heterocyclic group, and the foregoing groups optionally have a substituent.]

$m^{DA1}$, $m^{DA2}$, $m^{DA3}$, $m^{DA4}$, $m^{DA5}$, $m^{DA6}$ and $m^{DA7}$ are usually integers of 10 or less, preferably 5 or less, more preferably 2 or less, and further preferably 0 or 1. $m^{DA2}$, $m^{DA3}$, $m^{DA4}$, $m^{DA5}$, $m^{DA6}$ and $m^{DA7}$ are preferably the same integers, and $m^{DA1}$, $m^{DA2}$, $m^{DA3}$, $m^{DA4}$, $m^{DA5}$, $m^{DA6}$ and $m^{DA7}$ are more preferably the same integer.

$G^{DA}$ is preferably an aromatic hydrocarbon group or a heterocyclic group, more preferably a group obtained by removing from a benzene ring, a pyridine ring, a pyrimidine ring, a triazine ring or a carbazole ring three hydrogen atoms bonding directly to carbon atoms or nitrogen atoms constituting the ring, and the foregoing groups optionally have a substituent.

The substituent which $G^{CA}$ optionally has is preferably an alkyl group, a cycloalkyl group, an alkoxy group, a cycloalkoxy group, an aryl group, an aryloxy group, a monovalent heterocyclic group, a substituted amino group or a halogen, more preferably an alkyl group, a cycloalkyl group, an alkoxy group, a cycloalkoxy group, an aryl group or a monovalent heterocyclic group, further preferably an alkyl group, a cycloalkyl group, an alkoxy group or a cycloalkoxy, and particularly preferably an alkyl group or a cycloalkyl group, and the foregoing groups optionally have a substituent.

Examples and preferable examples of the aryl group, the monovalent heterocyclic group and the substituted amino group as the substituent which $G^{DA}$ optionally has are the same as the examples and preferable examples of the aryl group, the monovalent heterocyclic group and the substituted amino group as the substituent which Ring $L^1$ and Ring $L^2$ optionally have, respectively.

The substituent which the substituent which $G^{DA}$ optionally has further has preferably an alkyl group, a cycloalkyl group, an aryl group, a monovalent heterocyclic group or a substituted amino group, more preferably an alkyl group or a cycloalkyl group, and the foregoing groups optionally further have a substituent, but it is preferable that they do not further have a substituent.

Examples and preferable examples of the aryl group, the monovalent heterocyclic group and the substituted amino group as the substituent which the substituent which $G^{DA}$ optionally has optionally further has are the same as the examples and preferable examples of the aryl group, the monovalent heterocyclic group and the substituted amino group as the substituent which Ring $L^1$ and Ring $L^2$ optionally have, respectively.

$G^{DA}$ is preferably a group represented by the following formula (GDA-11) to formula (GDA-15), more preferably a group represented by the following formula (GDA-11) to formula (GDA-14), further preferably a group represented by the following formula (GDA-11) or formula (GDA-14), particularly preferably a group represented by the following formula (GDA-11).

[Chemical Formula 76]

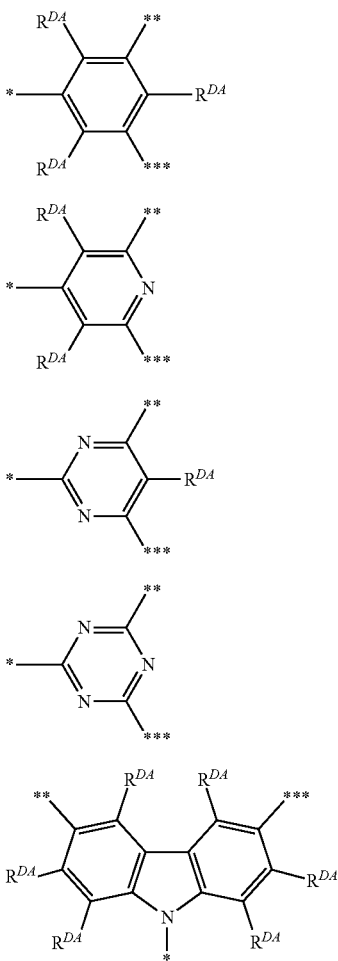

(GDA-11)
(GDA-12)
(GDA-13)
(GDA-14)
(GDA-15)

[wherein,
* represents a bond with $Ar^{DA1}$ in the formula (D-A), $Ar^{DA1}$ in the formula (D-B), $Ar^{DA2}$ in the formula (D-B) or $Ar^{DA3}$ in the formula (D-B).
** represents a bond with $Ar^{DA2}$ in the formula (D-A), $Ar^{DA2}$ in the formula (D-B), $Ar^{DA4}$ in the formula (D-B) or $Ar^{DA6}$ in the formula (D-B).
*** represents a bond with $Ar^{DA3}$ in the formula (D-A), $Ar^{DA3}$ in the formula (D-B), $Ar^{DA5}$ in the formula (D-B) or $Ar^{DA7}$ in the formula (D-B).
$R^{DA}$ represents a hydrogen atom, an alkyl group, a cycloalkyl group, an alkoxy group, a cycloalkoxy group, an aryl group or a monovalent heterocyclic group, and the foregoing groups optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or a cycloalkyl group, and the foregoing groups optionally have a substituent.

Examples and preferable examples of the aryl group and the monovalent heterocyclic group represented by $R^{DA}$ are the same as the examples and preferable examples of the aryl group and the monovalent heterocyclic group as the substituent which Ring $L^1$ and Ring $L^2$ optionally have, respectively.

Examples and preferable examples of the substituent which $R^{DA}$ optionally has are the same as the examples and preferable examples of the substituent which the substituent which $G^{DA}$ optionally has optionally further has.

$Ar^{DA1}$, $Ar^{DA2}$, $Ar^{DA3}$, $Ar^{DA4}$, $Ar^{DA5}$, $Ar^{DA6}$ and $Ar^{DA7}$ are each preferably a phenylene group, a fluorenediyl group or a carbazolediyl group, more preferably a group represented by the following formula (ArDA-1) to formula (ArDA-5), further preferably a group represented by the following formula (ArDA-1) to formula (ArDA-3), and particularly preferably a group represented by the following formula (ArDA-2), and the foregoing groups optionally have a substituent.

[Chemical Formula 77]

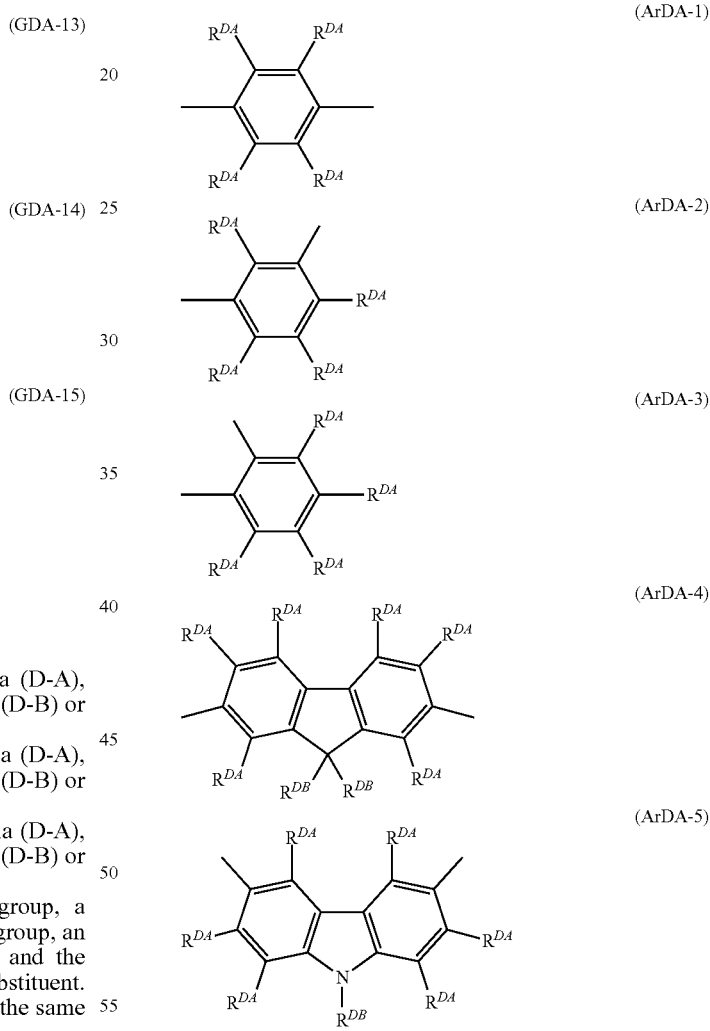

(ArDA-1)
(ArDA-2)
(ArDA-3)
(ArDA-4)
(ArDA-5)

[wherein,
$R^{DA}$ represents the same meaning as described above.
$R^{DB}$ represents a hydrogen atom, an alkyl group, a cycloalkyl group, an aryl group or a monovalent heterocyclic group, and the foregoing groups optionally have a substituent. When a plurality of $R^{DB}$ are present, they may be the same or different.]

$R^{DB}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

Examples and preferable examples of the aryl group and the monovalent heterocyclic group represented by $R^{DB}$ are the same as the examples and preferable examples of the aryl group and the monovalent heterocyclic group as the substituent which Ring $L^1$ and Ring $L^2$ optionally have, respectively.

Examples and preferable examples of the substituent which $R^{DB}$ optionally has are the same as the examples and preferable examples of the substituent which the substituent which $G^{DA}$ optionally has optionally further has.

Examples and preferable examples of the substituent which $Ar^{DA1}$, $Ar^{DA2}$, $Ar^{DA3}$, $Ar^{DA4}$, $Ar^{DA5}$, $Ar^{DA6}$ and $Ar^{DA7}$ optionally have are the same as the examples and preferable examples of the substituent which optionally has.

Examples and preferable examples of the aryl group and the monovalent heterocyclic group represented by $T^{DA}$ are the same as the examples and preferable examples of the aryl group and the monovalent heterocyclic group as the substituent which Ring $L^1$ and Ring $L^2$ optionally have, respectively.

Examples and preferable examples of the substituent which $T^{DA}$ optionally has are the same as the examples and the preferable examples of the substituent which $G^{DA}$ optionally has.

$T^{DA}$ is preferably a group represented by the following formula (TDA-1) to formula (TDA-3), and more preferably a group represented by the following formula (TDA-1).

[Chemical Formula 78]

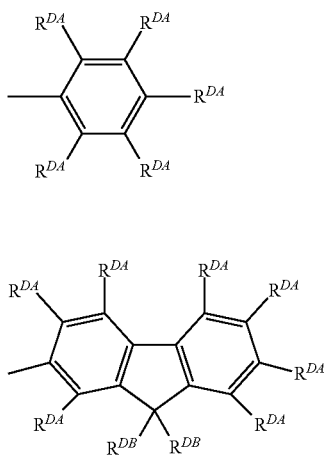

[wherein, $R^{DA}$ and $R^{DB}$ represent the same meaning as described above.]

The group represented by the formula (D-A) is preferably a group represented by the following formula (D-A1) to formula (D-A5), more preferably a group represented by the following formula (D-A1) or the formula (D-A3) to the formula (D-A5), and further preferably a group represented by the following formula (D-A1).

[Chemical Formula 79]

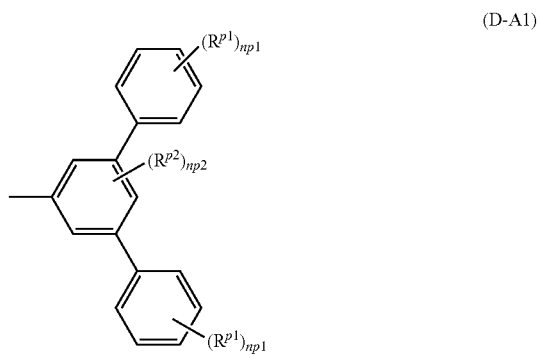

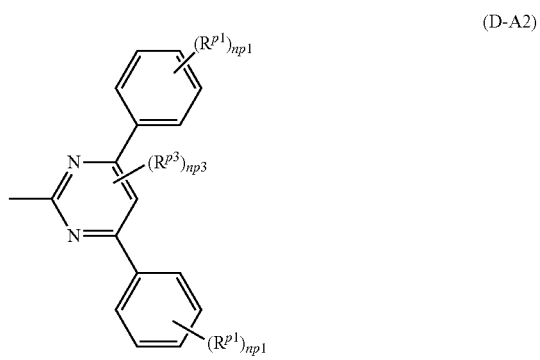

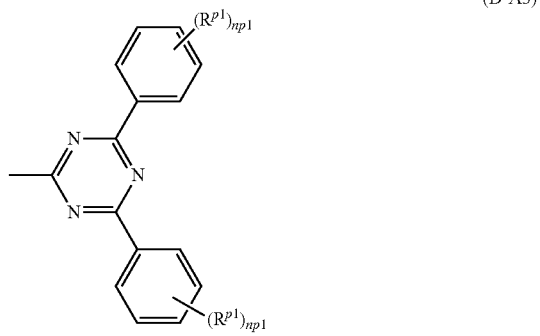

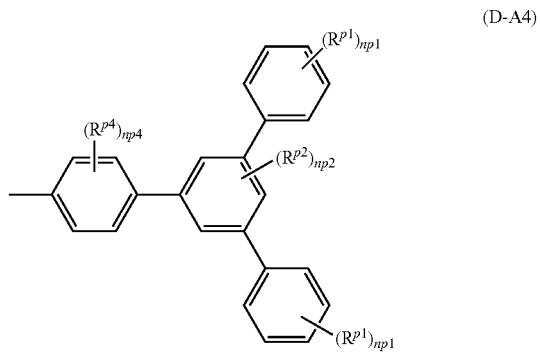

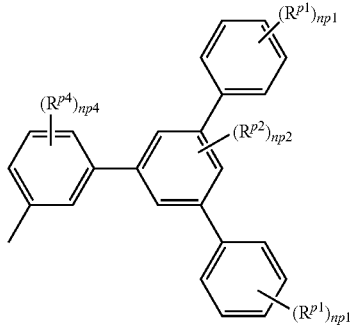
(D-A5)

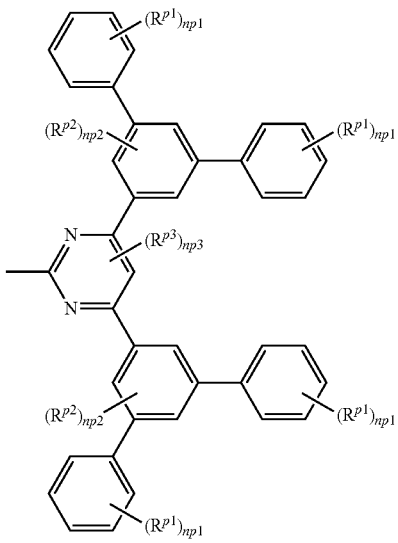
(D-B2)

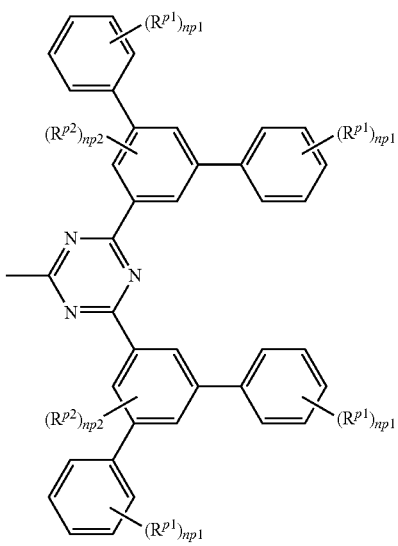
(D-B3)

[wherein, $R^{p1}$, $R^{p2}$, $R^{p3}$ and $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 or more and 5 or less, np2 represents an integer of 0 or more and 3 or less, np3 represents 0 or 1, and np4 represents an integer of 0 or more and 4 or less. A plurality of np1 may be the same or different.]

The group represented by the formula (D-B) is preferably a group represented by the following formula (D-B1) to formula (D-B3), more preferably a group represented by the following formula (D-B1).

[Chemical Formula 80]

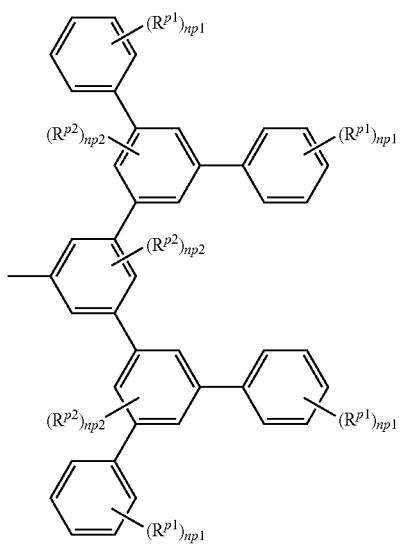
(D-B1)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 or more and 5 or less, np2 represents an integer of 0 or more and 3 or less, and np3 represents 0 or 1. When a plurality of np1 and np2 are present, they may be the same or different at each occurrence.]

The group represented by the formula (D-C) is preferably a group represented by the following formula (D-C1) to formula (D-C4), more preferably a group represented by the following formula (D-C1) to formula (D-C3), and further preferably a group represented by the formula (D-C1).

[Chemical Formula 81]

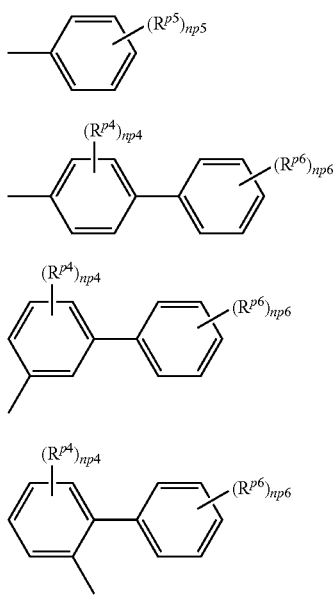

(D-C1)
(D-C2)
(D-C3)
(D-C4)

[wherein,
$R^{p4}$, $R^{p5}$ and $R^{p6}$ each independently represent an alkyl group, a cycloalkyl group, an alkoxy group, a cycloalkoxy group or a halogen atom. When a plurality of $R^{p4}$, $R^{p5}$ and $R^{p6}$ are present, they may be the same or different at each occurrence.

np4 represents an integer of 0 or more and 4 or less, np5 represents an integer of 0 or more and 5 or less, and np6 represents an integer of 0 or more and 5 or less.]

np1 is preferably an integer of 0 or more and 2 or less, and more preferably 1. np2 is preferably 0 or 1, and more preferably 0. np3 is preferably 0.

np4 is preferably an integer of 0 or more and 2 or less, and more preferably 0. np5 is preferably an integer of 0 or more and 3 or less, and more preferably 0 or 1. np6 is preferably an integer of 0 or more and 2 or less, and more preferably 0 or 1.

The alkyl group or the cycloalkyl group represented by $R^{p1}$, $R^{p2}$, $R^{p3}$, $R^{p4}$, $R^{p5}$, and $R^{p6}$ is preferably a methyl group, an ethyl group, an isopropyl group, a tert-butyl group, a hexyl group, a 2-ethylhexyl group, a cyclohexyl group or a tert-octyl group.

The alkoxy group or cycloalkoxy group represented by $R^{p1}$, $R^{p2}$, $R^{p3}$, $R^{p4}$, $R^{p5}$ and $R^{p6}$ is preferably a methoxy group, a 2-ethylhexyloxy group or a cyclohexyloxy group.

$R^{p1}$, $R^{p2}$, $R^{p3}$, $R^{p4}$, $R^{p5}$ and $R^{p6}$ are each preferably an alkyl group which optionally has a substituent or a cycloalkyl group which optionally has a substituent, more preferably an alkyl group which optionally has a substituent, and further preferably a methyl group, an ethyl group, an isopropyl group, a tert-butyl group, a hexyl group, a 2-ethylhexyl group or a tert-octyl group.

When a plurality of substituents which Ring $L^1$ optionally has are present, it is preferable that they are not combined together to form a ring together with atoms to which they are attached. When a plurality of substituents which Ring $L^2$ optionally has are present, it is preferable that they are not combined together to form a ring together with atoms to which they are attached. It is preferable that the substituent which Ring $L^1$ optionally has and the substituent which Ring $L^2$ optionally has are not combined together to form a ring together with atoms to which they are attached.

(Anionic Bidentate Ligand)

The anionic bidentate ligand represented by $A^1$-$G^1$-$A^2$ in the formula (1) includes, for example, ligands represented by the following formulae. However, the anionic bidentate ligand represented by $A^1$-$G^1$-$A^2$ is different from the ligand whose number is defined by the subscript $n^1$.

[Chemical Formula 82]

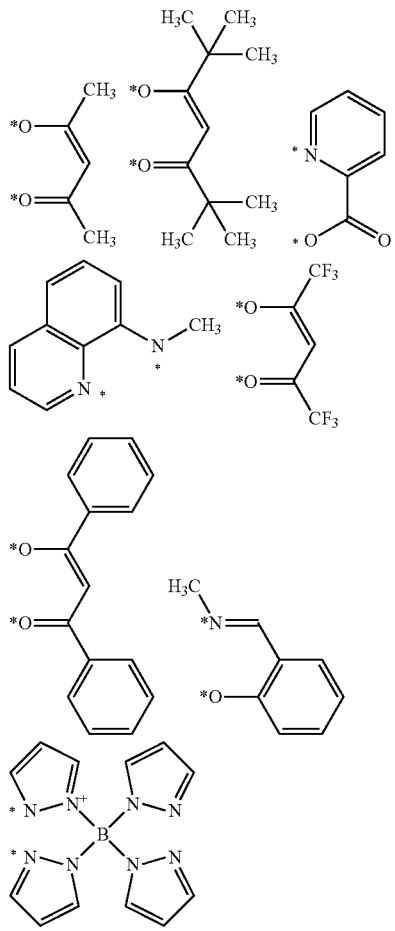

[wherein, * represents a site binding to M.]

[Phosphorescent Compound Represented by the Formula (1-A)]

The phosphorescent compound represented by the formula (1) is preferably a phosphorescent compound represented by the above-described formula (1-A), from the standpoint of advantage for an improvement in the luminance life of the light emitting device according to the present invention.

Ring $L^{14}$ is preferably a pyridine ring, a diazabenzene ring, an azanaphthalene ring, a diazanaphthalene ring or a diazole ring, more preferably a pyridine ring, a diazabenzene ring, an azanaphthalene ring or a diazanaphthalene ring, and further preferably a pyridine ring, a quinoline ring or an isoquinoline ring, and the foregoing rings optionally have a substituent, from the standpoint of advantage for an improvement in the luminance life of the light emitting device according to the present invention.

Examples and preferable examples of the substituent which the Ring $L^{14}$ optionally has are the same as the examples and preferable examples of the substituent which Ring $L^1$ and Ring $L^2$ optionally have.

When a plurality of substituents which Ring $L^{1A}$ optionally has are present, it is preferable that they are not combined together to form a ring together with atoms to which they are attached.

When Ring $L^{2A}$ is a pyridine ring, preferable is a pyridine ring in which $E^{21A}$ is a nitrogen atom, a pyridine ring in which $E^{22A}$ is a nitrogen atom or a pyridine ring in which $E^{23A}$ is a nitrogen atom, and more preferable is a pyridine ring in which $E^{22A}$ is a nitrogen atom.

When Ring $L^{2A}$ is a diazabenzene ring, preferable is a pyrimidine ring in which $E^{21A}$ and $E^{23A}$ are nitrogen atoms or a pyrimidine ring in which $E^{22A}$ and $E^{24A}$ are nitrogen atoms, and more preferable is a pyrimidine ring in which $E^{22A}$ and $E^{24A}$ are nitrogen atoms.

Ring $L^{2A}$ is preferably a benzene ring.

$E^{21A}$, $E^{22A}$, $E^{23A}$ and $E^{24A}$ are preferably carbon atoms.

$R^{21A}$, $R^{22A}$, $R^{23A}$, and $R^{24A}$ are each preferably a hydrogen atom, an alkyl group, a cycloalkyl group, an aryl group, a monovalent heterocyclic group or a substituted amino group, more preferably a hydrogen atom, an aryl group, a monovalent heterocyclic group or a substituted amino group, and further preferably a hydrogen atom or an aryl group, and the foregoing groups optionally have a substituent, from the standpoint of advantage for an improvement in the luminance life of the light emitting device.

$R^{21A}$, $R^{23A}$ and $R^{24A}$ are particularly preferably hydrogen atoms.

In the phosphorescent compound represented by the formula (1-A), it is preferable that at least one Ring $L^{1A}$ has a substituent or at least one of $R^{21A}$, $R^{22A}$, $R^{23A}$ and $R^{24A}$ is an alkyl group, a cycloalkyl group, an alkoxy group, a cycloalkoxy group, an aryl group, an aryloxy group, a monovalent heterocyclic group, a substituted amino group or a halogen atom, from the standpoint of advantage for an improvement in the luminance life of the light emitting device according to the present invention.

Examples and preferable examples of the aryl group, the monovalent heterocyclic group and the substituted amino group represented by $R^{21A}$, $R^{22A}$, $R^{23A}$ and $R^{24A}$ are the same as the examples and preferable examples of the aryl group, the monovalent heterocyclic group and the substituted amino group as the substituent which Ring $L^1$ and Ring $L^2$ optionally have, respectively.

Examples and preferable examples of the substituent which $R^{21A}$, $R^{22A}$, $R^{23A}$ and $R^{24A}$ optionally have are the same as the examples and preferable examples of the substituent which the substituent which Ring $L^1$ and Ring $L^2$ optionally have optionally further has.

It is preferable that $R^{21A}$ and $R^{22A}$, $R^{22A}$ and $R^{23A}$, $R^{23A}$ and $R^{24A}$, and the substituent which Ring $L^{1A}$ optionally has and $R^{21A}$ each are not combined together to form a ring together with atoms to which they are attached.

[Phosphorescent Compound Represented by the Formula (1-A1) to the Formula (1-A4) and the Formula (1-B1) to the Formula (1-B5)]

The phosphorescent compound represented by the formula (1-A) is preferably a phosphorescent compound represented by the above-described formula (1-A1) to formula (1-A4) (preferably a phosphorescent compound represented by the above-described formula (1-A1) or formula (1-A3), and more preferably a phosphorescent compound represented by the above-described formula (1-A1)) or a phosphorescent compound represented by the above-described formula (1-B1) to formula (1-B5) (preferably a phosphorescent compound represented by the above-described formula (1-B1) to formula (1-B3), more preferably a phosphorescent compound represented by the above-described formula (1-B1) to formula (1-B5), further preferably a phosphorescent compound represented by the above-described formula (1-B1) to formula (1-B3), and particularly preferably a phosphorescent compound represented by the above-described formula (1-B1), from the standpoint of advantage for an improvement in the luminance life of the light emitting device according to the present invention.

[Phosphorescent Compound Represented by the Formula (1-A1) to the Formula (1-A4)]

In the formula (1-A1) and the formula (1-A3), $R^{11A}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

In the formula (1-A3), $R^{12A}$ is preferably a hydrogen atom, an alkyl group, a cycloalkyl group, an aryl group, a monovalent heterocyclic group or a substituted amino group, more preferably a hydrogen atom, an alkyl group or an aryl group, and further preferably a hydrogen atom, and the foregoing groups optionally have a substituent.

In the formula (1-A2) and the formula (1-A4), $R^{12A}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

In the formula (1-A4), $R^{11A}$ is preferably a hydrogen atom, an alkyl group, a cycloalkyl group, an aryl group, a monovalent heterocyclic group or a substituted amino group, more preferably a hydrogen atom, an alkyl group or an aryl group, and further preferably a hydrogen atom, and the foregoing groups optionally have a substituent.

In the formula (1-A1) to the (1-A4), $R^{13A}$ is preferably a hydrogen atom, an alkyl group, a cycloalkyl group, an aryl group, a monovalent heterocyclic group or a substituted amino group, more preferably a hydrogen atom, an alkyl group or an aryl group, and further preferably a hydrogen atom, and the foregoing groups optionally have a substituent.

Examples and preferable examples of the aryl group, the monovalent heterocyclic group and the substituted amino group represented by $R^{11A}$, $R^{12A}$ and $R^{13A}$ are the same as the examples and preferable examples of the aryl group, the monovalent heterocyclic group and the substituted amino group as the substituent which Ring $L^1$ and Ring $L^2$ optionally have, respectively.

Examples and preferable examples of the substituent which $R^{11A}$, $R^{12A}$ and $R^{13A}$ optionally have are the same as the examples and preferable examples of the substituent which the substituent which Ring $L^1$ and Ring $L^2$ optionally have optionally further has.

In the formula (1-A1) to the formula (1-A4), it is preferable that $R^{11A}$ and $R^{12A}$, $R^{12A}$ and $R^{13A}$, and $R^{11A}$ and $R^{21A}$ each are not combined together to form a ring together with atoms to which they are attached.

[Phosphorescent Compound Represented by the Formula (1-B1) to the Formula (1-B5)]

$R^{11B}$, $R^{12B}$, $R^{13B}$, $R^{14B}$, $R^{15B}$, $R^{16B}$, $R^{17B}$ and $R^{13B}$ are each preferably a hydrogen atom, an alkyl group, a cycloalkyl group, an aryl group, a monovalent heterocyclic group or a substituted amino group, and more preferably a hydrogen atom, an alkyl group, an aryl group or a monovalent heterocyclic group, and the foregoing groups optionally have a substituent, from the standpoint of advantage for an improvement in the luminance life of the light emitting device according to the present invention.

$R^{11B}$, $R^{14B}$, $R^{15B}$, $R^{16B}$, $R^{17B}$ and $R^{18B}$ are each preferably a hydrogen atom or an alkyl group, and more preferably a hydrogen atom, and the foregoing groups optionally have a substituent, from the standpoint of advantage for an improvement in the luminance life of the light emitting device according to the present invention.

$R^{12B}$ and $R^{13B}$ are each preferably a hydrogen atom, an aryl group or a monovalent heterocyclic group, more preferably a hydrogen atom or a monovalent heterocyclic group, and further preferably a hydrogen atom, and the foregoing groups optionally have a substituent, from the standpoint of advantage for an improvement in the luminance life of the light emitting device according to the present invention.

Examples and preferable examples of the aryl group, the monovalent heterocyclic group and the substituted amino group represented by $R^{11B}$, $R^{12B}$, $R^{13B}$, $R^{14B}$, $R^{15B}$, $R^{16B}$, $R^{17B}$ and $R^{18B}$ are the same as the examples and preferable examples of the aryl group, the monovalent heterocyclic group and the substituted amino group as the substituent which Ring $L^1$ and Ring $L^2$ optionally have, respectively.

Examples and preferable examples of the substituent which $R^{11B}$, $R^{12B}$, $R^{13B}$, $R^{14B}$, $R^{15B}$, $R^{16B}$, $R^{17B}$ and $R^{18B}$ optionally have are the same as the examples and preferable examples of the substituent which the substituent which Ring $L^1$ and Ring $L^2$ optionally have optionally further has.

In the formula (1-B1) to the formula (1-B5), at least one of $R^{11B}$, $R^{12B}$, $R^{13B}$, $R^{14B}$, $R^{11B}$, $R^{12B}$, $R^{13B}$, $R^{14B}$, $R^{15B}$, $R^{16B}$, $R^{17B}$, $R^{18B}$, $R^{21A}$, $R^{22A}$, $R^{23A}$ and $R^{24A}$ is preferably an alkyl group, a cycloalkyl group, an alkoxy group, a cycloalkoxy group, and aryl group, an aryloxy group, a monovalent heterocyclic group, a substituted amino group or a halogen atom, at least one of $R^{12B}$, $R^{13B}$, $R^{22A}$ and $R^{23A}$ is more preferably an alkyl group, a cycloalkyl group, an alkoxy group, a cycloalkoxy group, an aryl group, an aryloxy group, a monovalent heterocyclic group, a substituted amino group or a halogen atom, at least one of $R^{13B}$ and $R^{22A}$ is further preferably an alkyl group, a cycloalkyl group, an aryl group, a monovalent heterocyclic group or a substituted amino group, and at least one $R^{22A}$ is particularly preferably an alkyl group, a cycloalkyl group, an aryl group, a monovalent heterocyclic group or a substituted amino group, and the foregoing groups optionally have a substituent, from the standpoint of advantage for an improvement in the luminance life of the light emitting device according to the present invention.

In the formula (1-B1) to the formula (1-B5), it is preferable that $R^{11B}$ and $R^{12B}$, $R^{12B}$ and $R^{13B}$, $R^{13B}$ and $R^{14B}$, $R^{11B}$ and $R^{21A}$, $R^{133}$ and $R^{15B}$, $R^{15B}$ and $R^{16B}$, $R^{16B}$ and $R^{17B}$, $R^{17B}$ and $R^{18B}$, $R^{18B}$ and $R^{21A}$, $R^{11B}$ and $R^{13B}$, $R^{14B}$ and $R^{15B}$, and $R^{12B}$ and $R^{18B}$ each are not combined together to form a ring together with atoms to which they are attached.

Specific Examples of Phosphorescent Compound

The phosphorescent compound includes, for example, phosphorescent compounds represented by the following formulae.

[Chemical Formula 83]

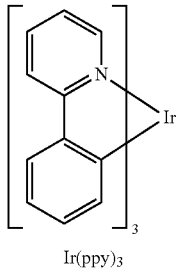

Ir(ppy)₃

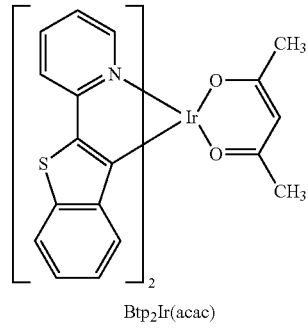

Btp₂Ir(acac)

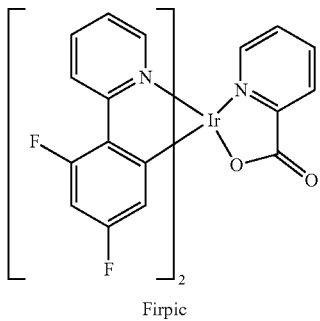

Firpic

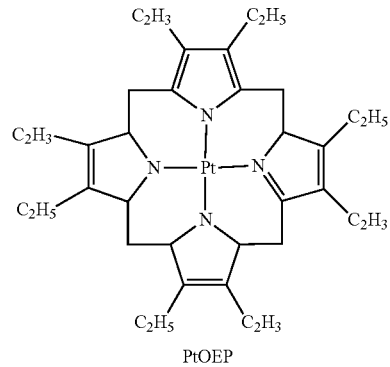

PtOEP

-continued
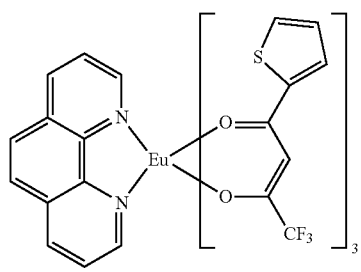
Eu(TTA)₃phen
[Chemical Formula 84]
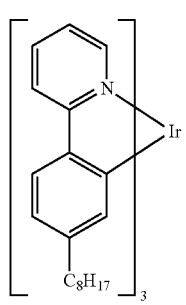
COM-1
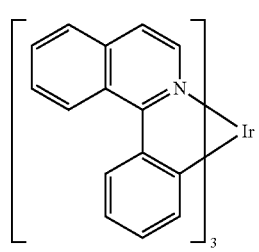
COM-2
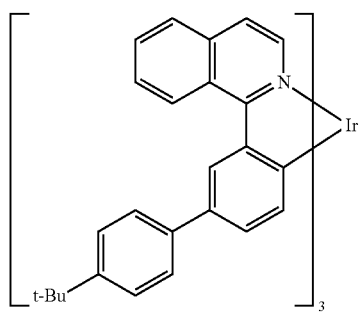
COM-3
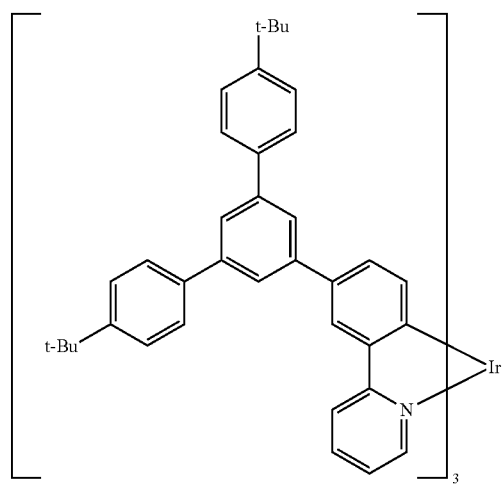
COM-4
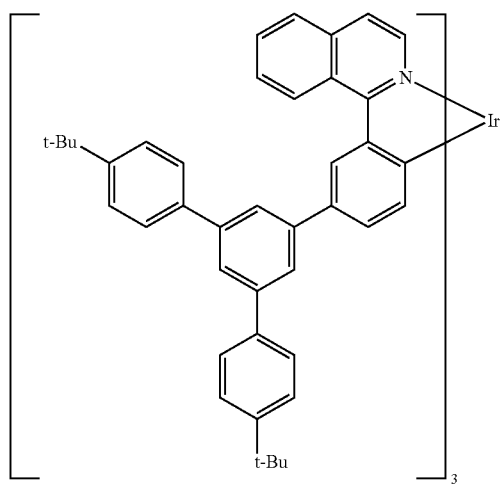
COM-5

-continued
[Chemical Formula 85]
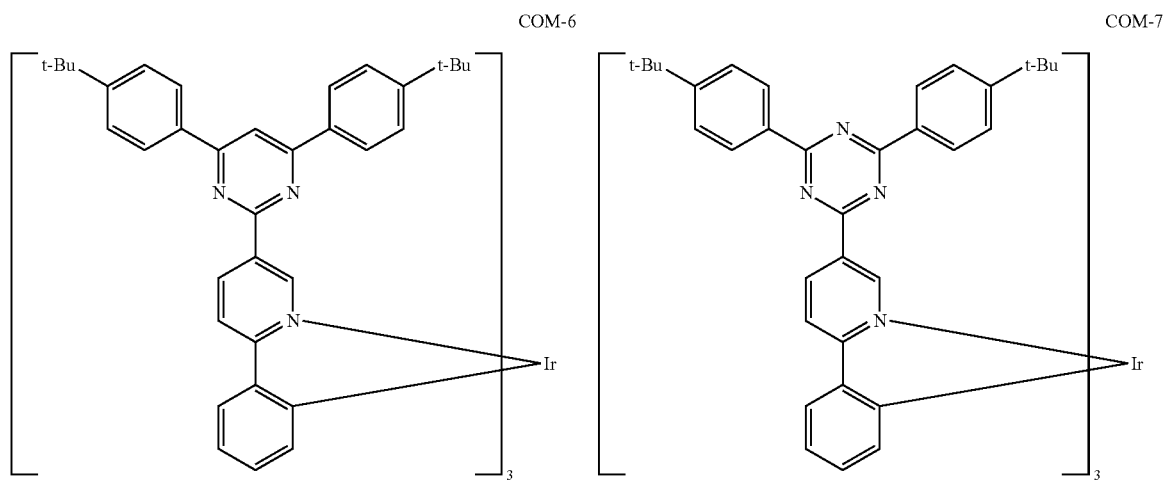
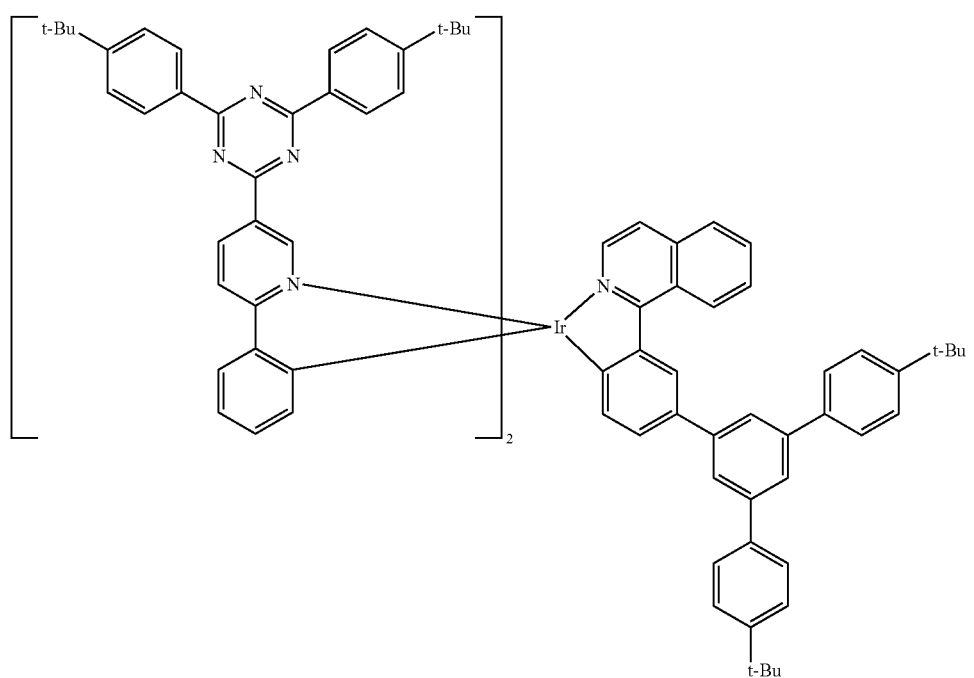

[Chemical Formula 86]
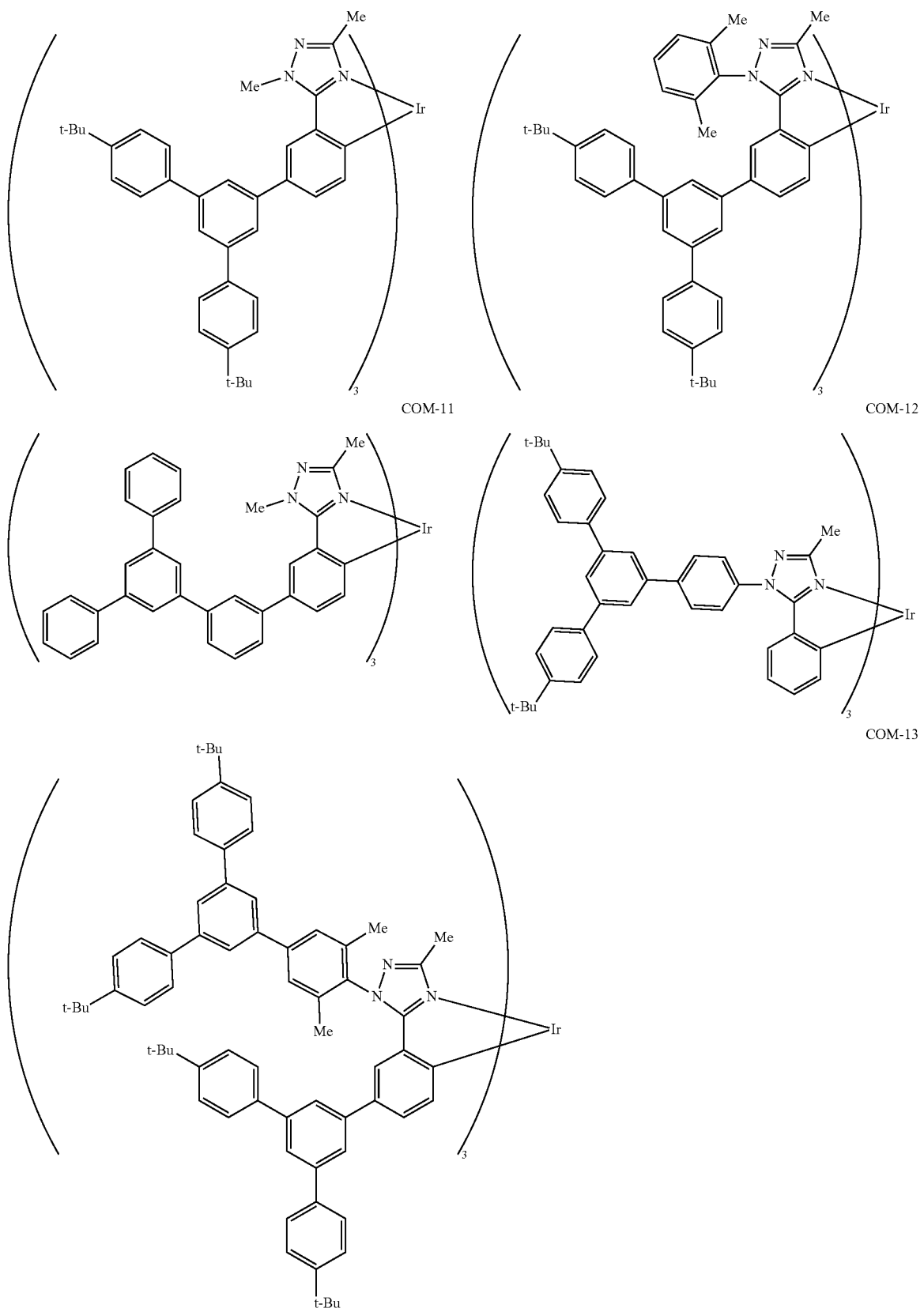

-continued
[Chemical Formula 87]
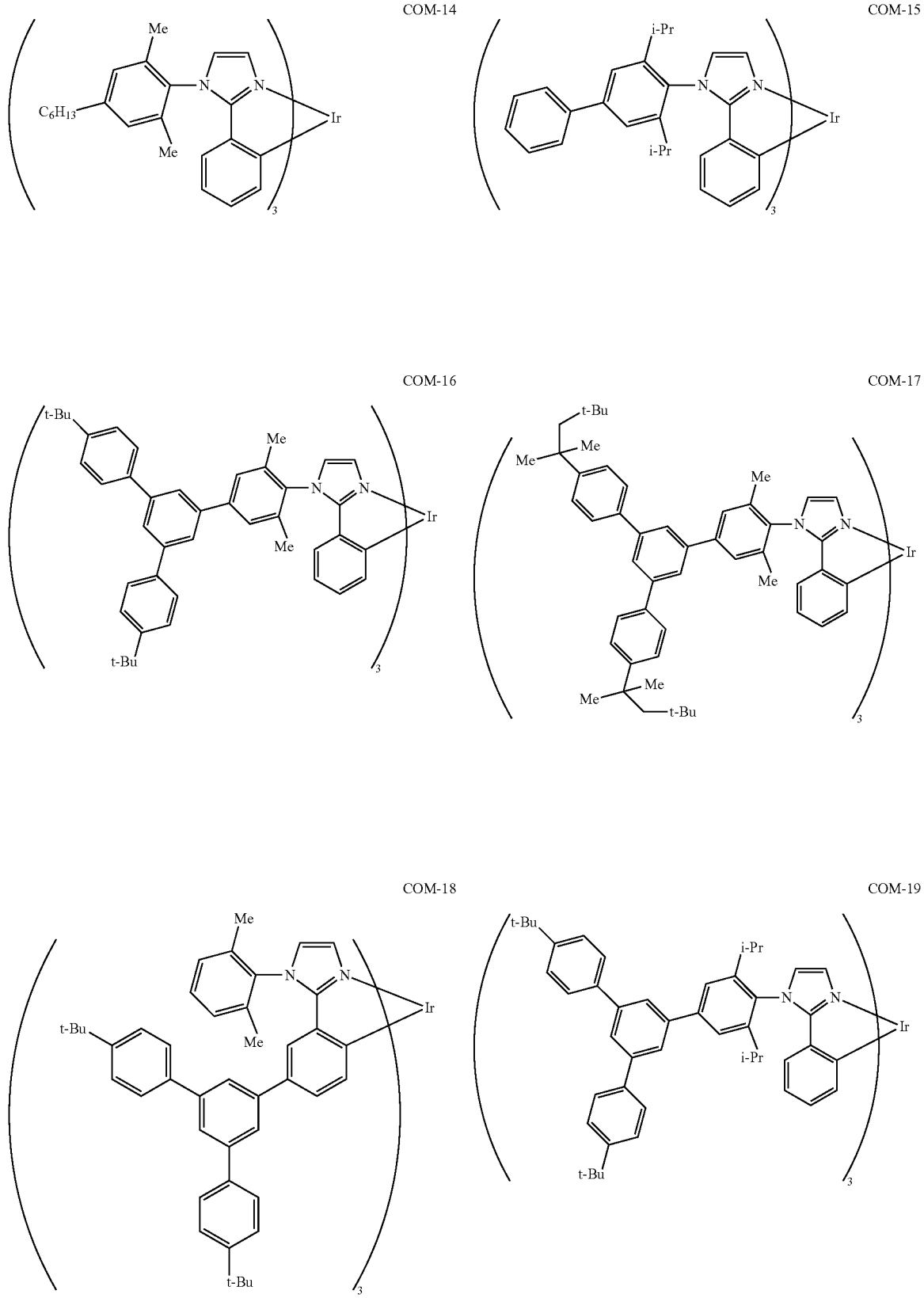

-continued

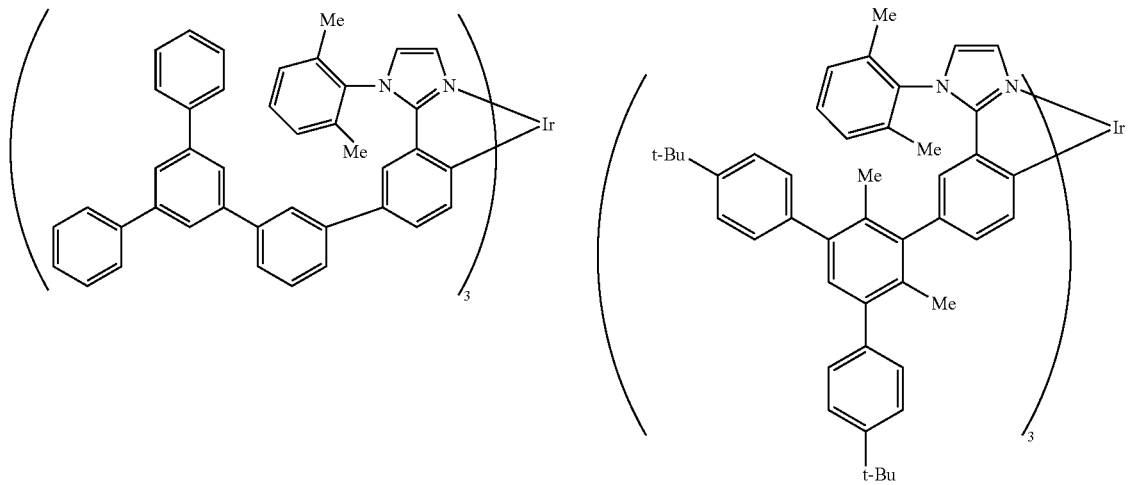

The phosphorescent compounds are available from Aldrich, Luminescence Technology Corp., American Dye Source, and the like.

In addition, the phosphorescent compounds can also be produced by known methods described in literatures such as "Journal of the American Chemical Society, Vol. 107, 1431-1432 (1985)", "Journal of the American Chemical Society, Vol. 106, 6647-6653 (1984)", Japanese Translation of International Publication (JP-T) No. 2004-530254, JP-A No. 2008-179617, JP-A No. 2011-105701, JP-T No. 2007-504272, International Publication WO 2006/121811, JP-A No. 2013-147450, JP-A No. 2014-224101, and the like.

<Block Copolymer>

The block copolymer according to the present invention is a block copolymer containing an end group, a block that binds to the end group (hereinafter, also referred to as "terminal block"), and a block that does not bind to the end group (hereinafter, also referred to as "non-terminal block"). That is, the block copolymer according to the present invention is a block copolymer containing an end group, a terminal block and a non-terminal block in this order.

The block copolymer according to the present invention preferably contains an end group, a terminal block, a non-terminal block, a terminal block and an end group in this order. In the block copolymer according to the present invention, the two end groups may be the same or different, but from the standpoint of easiness of production of the block copolymer according to the present invention, it is preferable that they are the same. In the block copolymer according to the present invention, the two terminal blocks may be the same or different, but it is preferable that they are the same from the standpoint of easy production of the block copolymer according to the present invention.

The block copolymer according to the present invention may contain a constitutional unit other than an end group, a terminal block and a non-terminal block, but from the standpoint of easiness of production of the block copolymer according to the present invention, it is preferable that the block copolymer according to the present invention is composed only of an end group, a terminal block and a non-terminal block.

Examples of the constitutional unit other than the end group, the terminal block and the non-terminal block include a joining unit and a branching unit.

The block copolymer according to the present invention may or may not contain a crosslinkable group, but the block copolymer according to the present invention preferably contains a crosslinkable group, since the light emitting device according to the present invention can be formed by a wet method, and in production of the light emitting device, lamination of layers is easy.

The polystyrene-equivalent number-average molecular weight (Mn) of the block copolymer according to the present invention is, for example, $2\times10^3$ or more and $5\times10^6$ or less, preferably $5\times10^3$ or more and $1\times10^6$ or less, more preferably $1\times10^4$ or more and $5\times10^5$ or less, and further preferably $2\times10^4$ or more and $1\times10^5$ or less.

The polystyrene-equivalent weight-average molecular weight (Mw) of the block copolymer according to the present invention is, for example, $5\times10^3$ or more and $1\times10^7$ or less, preferably $1\times10^4$ or more and $5\times10^6$ or less, more preferably $5\times10^4$ or more and $1\times10^6$ or less, further preferably $1\times10^5$ or more and $5\times10^5$ or less, and particularly preferably $1\times10^5$ or more and $3\times10^5$ or less.

[End group]

The "end group" is a group that is arranged at the end of the block copolymer according to the present invention and bonded directly to the terminal block, and is preferably an atomic group as a residue in the reagent (end-capping agent) used when introducing the end group into the block copolymer according to the present invention after the reagent is introduced.

From the standpoint of the stability of the block copolymer according to the present invention, the end groups are preferably arranged at all ends of the block copolymer. When a plurality of end groups are present, they may be the same or different, but are preferably the same from the standpoint of easiness of production of the block copolymer according to the present invention.

From the standpoint of the stability of the block copolymer according to the present invention, the end group is preferably an aryl group or a monovalent heterocyclic group, more preferably an aryl group. At the end group, the aryl group and the monovalent heterocyclic group optionally have a substituent, but preferably, have no substituent.

Since the crosslinkability of the block copolymer according to the present invention can be enhanced, the end group preferably contains a crosslinkable group, and more preferably is a crosslinkable group. Examples and preferable examples of the crosslinkable group are the same as the examples and preferable examples mentioned in the explanation for the above-described crosslinkable group.

Examples and preferable examples of the aryl group and monovalent heterocyclic group in the end group are the same as the examples and preferable examples of the aryl group and monovalent heterocyclic group represented by $R^{X1}$ to $R^{X3}$, respectively.

The substituent which the aryl group and the monovalent heterocyclic group in the end group optionally have is preferably an alkyl group, a cycloalkyl group, an aryl group, a monovalent heterocyclic group or a crosslinkable group, more preferably an alkyl group, a cycloalkyl group, an aryl group or a crosslinkable group, further preferably an alkyl group or a crosslinkable group, particularly preferably an alkyl group, and the foregoing groups optionally further have a substituent, but it is especially preferable that it has no further substituent.

Examples and preferable examples of the aryl group and the monovalent heterocyclic group as the substituent which the aryl group and the monovalent heterocyclic group at the end group optionally have are the same as the examples and preferable examples of the aryl group and the monovalent heterocyclic group represented by $R^{X1}$ to $R^{X3}$, respectively.

Examples and preferable examples of the crosslinkable group as the substituent which the aryl group and the monovalent heterocyclic group at the end group optionally have are the same as the examples and preferable examples mentioned in the explanation for the above-described crosslinkable group.

[Non-Terminal Block]

The non-terminal block is a block that does not bind directly to the end group, and consisting of one or more constitutional units. The number of the type of the constitutional unit contained in the non-terminal block is usually 1 or more and 10 or less, and from the standpoint of easy synthesis of the block copolymer according to the present invention, preferably 1 or more and 7 or less, more preferably 2 or more and 5 or less, further preferably 2 or more and 4 or less, and particularly preferably 3 or 4.

In the block copolymer according to the present invention, only one type of non-terminal block may be contained, or two or more types may be contained. The number of the type of the non-terminal block contained in the block copolymer according to the present invention is usually 1 or more and 10 or less, and from the standpoint of easy production of the block copolymer according to the present invention, preferably 1 or more and 5 or less, more preferably 1 or more and 3 or more, further preferably 1 or 2, and particularly preferably 1.

Cases wherein the types of the non-terminal blocks are different include, for example, a case wherein the types of the constitutional units constituting the block are different and a case wherein the content ratios and chain distributions of constitutional units are different. When a plurality of non-terminal blocks are present, they may be the same or different.

It is preferable that at least one non-terminal block is a block formed before forming the terminal block in production of the block copolymer according to the present invention.

The non-terminal block contains at least one constitutional unit selected from the group consisting of constitutional units represented by the formula (X) and the constitutional units represented by the formula (Z). In the non-terminal block, each of the constitutional unit represented by the formula (X) and the constitutional unit represented by the formula (Z) may be contained singly or in combination of two or more, and one or more constitutional units represented by the formula (X) and one or more constitutional units represented by the formula (Z) may be contained.

The non-terminal block preferably contains a constitutional unit represented by the formula (X).

The non-terminal block preferably further contains at least one constitutional unit selected from the group consisting of a constitutional unit represented by the formula (Y) and a constitutional unit having a crosslinkable group, more preferably further contains a constitutional unit represented by the formula (Y), or a constitutional unit represented by the formula (Y) and a constitutional unit having a crosslinkable group, and further preferably further contains only a constitutional unit represented by the formula (Y), or only a constitutional unit represented by the formula (Y) and a constitutional unit having a crosslinkable group, from the standpoint of improving the luminance life of the light emitting device according to the present invention. In the non-terminal block, each of the constitutional unit represented by the formula (Y) and the constitutional unit having a crosslinkable group may be contained singly or in combination of two or more.

From the standpoint of improving the luminance life of the light emitting device according to the present invention, it is preferable that at least one of constitutional units contained in the terminal block is not contained in the non-terminal block and/or at least one of constitutional units contained in the non-terminal block is not contained in the terminal block, and it is more preferable that at least one of constitutional units contained in the terminal block is not contained in the first non-terminal block and at least one of constitutional units contained in the non-terminal block is not contained in the terminal block, in the block copolymer according to the present invention.

The polystyrene-equivalent number-average molecular weight (Mn) of the non-terminal block contained in the block copolymer according to the present invention is, for example, $1 \times 10^3$ or more and $1 \times 10^6$ or less, preferably $2 \times 10^3$ or more and $5 \times 10^5$ or less, more preferably $3 \times 10^3$ or more and $1 \times 10^5$ or less, and further preferably $5 \times 10^3$ or more and $5 \times 10^4$ or less.

The polystyrene-equivalent weight-average molecular weight (Mw) of the non-terminal block contained in the block copolymer according to the present invention is, for example, $2 \times 10^3$ or more and $2 \times 10^6$ or less, preferably $3 \times 10^3$ or more and $1 \times 10^6$ or less, more preferably $5 \times 10^3$ or more and $5 \times 10^3$ or less, and further preferably $1 \times 10^4$ or more and $2 \times 10^5$ or less.

[Terminal Block]

The terminal block is a block that binds directly to the end group and consisting of one or more constitutional units. The number of the type of the constitutional unit contained in the terminal block is usually 1 or more and 10 or less, and from the standpoint of easy production of the block copolymer according to the present invention and from the standpoint of improving the luminance life of the light emitting device according to the present invention, preferably 1 or more and 7 or less, more preferably 2 or more and 5 or less, and further preferably 2 or 3.

In the block copolymer according to the present invention, only one type of terminal block may be contained, or two or more types thereof may be contained. The number of the type of the terminal block contained in the block copolymer according to the present invention is generally 1 or more and 10 or less, and from the standpoint of easiness of production of the block copolymer according to the present invention, preferably 1 or more and 5 or less, more preferably 1 or more and 3 or less, and further preferably 1.

Examples of cases wherein the types of terminal blocks are different are the same as the examples wherein the types of non-terminal blocks are different.

The terminal block is preferably a block formed, in the production of the block copolymer according to the present invention, before forming the end group (preferably, before reacting with the end-capping agent).

The terminal block preferably contain at least one constitutional unit selected from the group consisting of a constitutional unit represented by the formula (X), a constitutional unit represented by the formula (Y), a constitutional unit represented by the formula (Z) and a constitutional unit having a crosslinkable group, more preferably contains at least one constitutional unit selected from the group consisting of a constitutional unit represented by the formula (X), a constitutional unit represented by the formula (Y) and a constitutional unit having a crosslinkable group, further preferably contains at least one constitutional unit selected from the group consisting of a constitutional unit represented by the formula (Y) and a constitutional unit having a crosslinkable group, particularly preferably contains a constitutional unit represented by the formula (Y), or a constitutional unit represented by the formula (Y) and a constitutional unit having a crosslinkable group, and especially preferably contains only a constitutional unit represented by the formula (Y), or only a constitutional unit represented by the formula (Y) and a constitutional unit having a crosslinkable group, from the standpoint of improving the luminance life of the light emitting device according to the present invention.

In the terminal block, the constitutional unit represented by the formula (X), the constitutional unit represented by the formula (Y), and the constitutional unit represented by the formula (Z) and the constitutional unit having a crosslinkable group may each be contained singly or in combination of two or more.

The terminal block preferably does not contain a constitutional unit represented by the formula (X) or does not contain a constitutional unit represented by the formula (Z), more preferably does not contain a constitutional unit represented by the formula (Z), and further preferably does not contain a constitutional unit represented by the formula (X) and a constitutional unit represented by the formula (Z), from the standpoint of improving the luminance life of the light emitting device according to the present invention.

In the block copolymer according to the present invention, the terminal block and the non-terminal block each independently may be any of a homopolymer, a block copolymer, a random copolymer, an alternating copolymer and a graft copolymer, or may be other form, but are preferably copolymers.

The block copolymer according to the present invention contains at least one constitutional unit selected from the group consisting of a non-crosslinkable constitutional unit represented by the formula (X) and a non-crosslinkable constitutional unit represented by the formula (Z).

The block copolymer according to the present invention is preferably a block copolymer containing 2 or more and 15 or less constitutional units selected from the group consisting of a constitutional unit represented by the formula (X), a constitutional unit represented by the formula (Y), a constitutional unit represented by the formula (Z) and a constitutional unit having a crosslinkable group, more preferably a block copolymer containing 2 or more and 10 or less constitutional units, further preferably a block copolymer containing 3 or more and 7 or less constitutional units, and particularly preferably a block copolymer containing 4 or more and 6 or less constitutional units, from the standpoint of easy production of the block copolymer and from the standpoint of improving the luminance life of the light emitting device according to the present invention.

In the block copolymer according to the present invention, the constitutional unit represented by the formula (X), the constitutional unit represented by the formula (Z), the constitutional unit represented by the formula (Y) and the constitutional unit having a crosslinkable group may each be contained singly or in combination of two or more.

The block copolymer according to the present invention preferably contains a constitutional unit represented by the formula (Y) from the standpoint of improving the luminance life of the light emitting device according to the present invention.

The block copolymer according to the present invention is preferably a block copolymer containing a constitutional unit represented by the formula (Y) and at least one constitutional unit selected from the group consisting of a constitutional unit represented by the formula (X) and a constitutional unit represented by the formula (Z), and more preferably a block copolymer containing a constitutional unit represented by the formula (Y) and a constitutional unit represented by the formula (X), from the standpoint of improving the luminance life of the light emitting device according to the present invention.

The sum of the types of constitutional units contained in the block copolymer according to the present invention is preferably 2 or more and 20 or less, more preferably 2 or more and 15 or less, further preferably 2 or more and 10 or less, particularly preferably 3 or more and 7 or less, and especially preferably 4 or more and 6 or less, from the standpoint of easy production of the block copolymer and from the standpoint of improving the luminance life of the light emitting device according to the present invention.

[Crosslinked Product of Block Copolymer]

In the light emitting device according to the present invention, when the second organic layer contains a crosslinked product of the block copolymer according to the present invention, the light emitting device according to the present invention can be formed by a wet method, and in production of the light emitting device according to the present invention, lamination of layers is easy. The crosslinked product of the block copolymer according to the present invention is a crosslinked product of the block copolymer containing a crosslinkable group.

When the block copolymer according to the present invention is a block copolymer further containing a crosslinkable group, the block copolymer according to the present invention is preferably a block copolymer containing at least one constitutional unit selected from the group consisting of a constitutional unit represented by the formula (X) and a polymer compound represented by the formula (Z) (preferably a constitutional unit represented by the formula (X)), and a crosslinkable group, more preferably a block copolymer containing at least one constitutional unit selected from the group consisting of a constitutional unit represented by the formula (X) and a polymer compound represented by the formula (Z) (preferably a constitutional unit represented by the formula (X)), and a constitutional unit having a crosslinkable group, further preferably a block copolymer containing at least one constitutional unit selected from the group consisting of a constitutional unit represented by the formula (X) and a polymer compound represented by the formula (Z) (preferably a constitutional unit represented by the formula (X)), and a constitutional unit having a crosslinkable group, and a constitutional unit represented by the formula (Y), and particularly preferably a block copolymer containing a constitutional unit represented by the formula (X), a constitutional unit having a crosslinkable group and a constitutional unit represented by the formula (Y).

When the block copolymer according to the present invention is a block copolymer further containing a crosslinkable group, at least one selected from the group consisting of an end group, a terminal block and a non-terminal block preferably contains a crosslinkable group, at least one selected from the group consisting of a terminal block and a non-terminal block more preferably contains a crosslinkable group, and at least one selected from the group consisting of a terminal block and a non-terminal block further preferably contains a constitutional unit having a crosslinkable group. This makes it easier to increase the introduction amount of the crosslinkable group, and thus, the crosslinkability of the block copolymer according to the present invention can be easily increased to a sufficient extent.

Examples and preferable ranges of the block copolymer in the crosslinked product of the block copolymer according to the present invention are the same as the examples and preferable ranges explained in the section of the block copolymer according to the present invention.

[Total Number of Constitutional Unit]

In this specification, the total number of the constitutional units contained in the polymer compound means the average number of the constitutional units per 1000 of the molecular weight of the polymer compound. The total number of the crosslinkable groups contained in the polymer compound means the average number of the crosslinkable groups per 1000 of the molecular weight the polymer compound.

The total number of each constitutional units and crosslinkable groups contained in the polymer compound can be determined, for example, by the following method.

For each constitutional unit constituting the polymer compound, if the sum of the values obtained by multiplying the molar ratio of the constitutional unit to the total moles of all the constitutional units excluding the end group and the molecular weight of the constitutional unit is expressed as $D_2$, the sum of the molar ratios determined for each constitutional unit is expressed as $E_3$, and the sum of the values obtained by multiplying the molar ratio and the number of crosslinkable groups of the constituent unit is expressed as $E_4$, then, the total number of the respective constitutional units contained in the polymer compound shall be $(E_3 \times 1000)/D_2$, and the total number of the crosslinkable group contained in the polymer compound shall be $(E_4 \times 1000)/D_2$.

The molecular weight of each of the constitutional units constituting the polymer compound can be calculated using, for example, the value of Molecular Weight according to ChemDraw (manufactured by HULINKS INC.).

Specific methods for calculating the total number of each constitutional unit and the total number of the crosslinkable group will be described in detail by taking the block copolymer HTL-1 synthesized in Synthesis Example 1 as an example.

The block copolymer HTL-1 has a non-terminal block containing a constitutional unit derived from the compound M1, a constitutional unit derived from the compound M2, and a constitutional unit derived from the compound M3 at a molar ratio of 40:30:2.5, and a terminal block containing a constitutional unit derived from the compound M1, a constitutional unit derived from the compound M4, and a constitutional unit derived from the compound M5 at a molar ratio of 10:10:7.5.

The molecular weight of a constitutional unit derived from the compound M1 is 653.05, the molecular weight of a constitutional unit derived from the compound M2 is 751.12, the molecular weight of a constitutional unit derived from the compound M3 is 388.64, the molecular weight of a constitutional unit derived from the compound M4 is 176.22, and the molecular weight of a constitutional unit derived from the compound M5 is 368.48.

The number of the crosslinkable group contained in a constitutional unit derived from the compound M1 is 0, the number of the crosslinkable group contained in a constitutional unit derived from the compound M2 is 0, the number of the crosslinkable group contained in a constitutional unit derived from the compound M3 is 0, the number of the crosslinkable group contained in a constitutional unit derived from the compound M4 is 0, and the number of the crosslinkable group contained in a constitutional unit derived from the compound M5 is 2.

A constitutional unit derived from the compound M1 is a constitutional unit represented by the formula (Y), a constitutional unit derived from the compound M2 is a constitutional unit represented by the formula (X), a constitutional unit derived from the compound M3 is a constitutional unit represented by the formula (Y), a constitutional unit derived from the compound M4 is a constitutional unit represented by the formula (Y), and a constitutional unit derived from the compound M5 is a constitutional unit having a crosslinkable group.

$D_2$ is determined as follows.

$(653.05 \times 0.40)+(751.12*0.30)+(388.64 \times 0.025)+(653.05 \times 0.10)+(176.22*0.10)+(368.48 \times 0.075)=606.835$ In the block copolymer HTL-1, $E_3$ of each constitutional unit is determined as follows.

($E_3$ of the constitutional unit represented by the formula (Y) in the non-terminal block)=0.40+0.025=0.425

($E_3$ of the constitutional unit represented by the formula (X) in the non-terminal block)=0.30

($E_3$ of the constitutional unit represented by the formula (Z) in the non-terminal block)=0

($E_3$ of the constitutional unit represented by the formula (X) and the constitutional unit represented by the formula (Z) in the non-terminal block)=0.30+0=0.30

($E_3$ of the constitutional unit having a crosslinkable group in the non-terminal block)=0

($E_3$ of the constitutional unit represented by the formula (Y) in the terminal block)=0.10+0.10=0.20

($E_3$ of the constitutional unit represented by the formula (X) in the terminal block)=0

($E_3$ of the constitutional unit represented by the formula (Z) in the terminal block)=0

($E_3$ of the constitutional unit represented by the formula (X) and the constitutional unit represented by the formula (Z) in the terminal block)=0

($E_3$ of the constitutional unit having a crosslinkable group in the terminal block)=0.075

($E_3$ of the constitutional unit represented by the formula (Y) in the block copolymer)=0.40+0.025+0.10+0.10=0.625

($E_3$ of the constitutional unit represented by the formula (X) in the block copolymer)=0.30

($E_3$ of the constitutional unit represented by the formula (Z) in the block copolymer)=0

($E_3$ of the constitutional unit represented by the formula (X) and the constitutional unit represented by the formula (Z) in the block copolymer)=0.30+0=0.30

($E_3$ of the constitutional unit having a crosslinkable group in the block copolymer)=0.075

$E_4$ is determined as follows.

($E_4$ in non-terminal block) (0.40×0)+(0.30×0)+(0.025×0)=0

($E_4$ in terminal block)=(0.10×0)+(0.10×0)+(0.075×2)=0.15

($E_4$ in block copolymer) (0.40×0)+(0.30×0)+(0.025×0)+(0.10×0)+(0.10×0)+(0.075×2)=0.15

In the block copolymer HTL-1, the total number of each constitutional unit and crosslinkable group is determined as follows.

(Total number of the constitutional unit represented by the formula (Y) in the non-terminal block)=(0.425×1000)/606.835=0.700

(Total number of the constitutional unit represented by the formula (X) in the non-terminal block)=$X_I$=(0.30×1000)/606.835=0.494

(Total number of the constitutional unit represented by the formula (Z) in the non-terminal block)=$Z_I$=(0×1000)/606.835=0

(Total number of the constitutional unit represented by the formula (X) and the constitutional unit represented by the formula (Z) in the non-terminal block)=$X_I$+$Z_I$=(0.30×1000)/606.835=0.494

(Total number of the constitutional unit having a crosslinkable group in the non-terminal block) (0×1000)/606.835=0

(Total number of the crosslinkable group in the non-terminal block)=(0×1000)/606.835=0

(Total number of the constitutional unit represented by the formula (Y) in the terminal block) (0.20×1000)/606.835=0.330

(Total number of the constitutional unit represented by the formula (X) in the terminal block)=$X_{II}$=(0×1000)/606.835=0

(Total number of the constitutional unit represented by the formula (Z) in the terminal block)=$Z_{II}$=(0×1000)/606.835=0

(Total number of the constitutional unit represented by the formula (X) and the constitutional unit represented by the formula (Z) in the terminal block)=$X_{II}$+$Z_{II}$=(0×1000)/606.835=0

(Total number of the constitutional unit having a crosslinkable group in the terminal block) (0.075×1000)/606.835=0.124

(Total number of the crosslinkable group in the terminal block)=(0.15×1000)/606.835=0.247

(Total number of the constitutional unit represented by the formula (Y) in the block copolymer) (0.625×1000)/606.835=1.030

(Total number of the constitutional unit represented by the formula (X) in the block copolymer) (0.30×1000)/606.835=0.494

(Total number of the constitutional unit represented by the formula (Z) in the block copolymer)=(0×1000)/606.835=0

(Total number of the constitutional unit represented by the formula (X) and the constitutional unit represented by the formula (Z) in the block copolymer)=(0.30×1000)/606.835=0.494

(Total number of the constitutional unit having a crosslinkable group in the block copolymer)=(0.075×1000)/606.835=0.124

(Total number of the crosslinkable group in the block copolymer)=(0.15×1000)/606.835=0.247

In the block copolymer according to the present invention, the total number of the constitutional unit represented by the formula (Y) contained in the non-terminal block is usually 0 or more and 50 or less. In the block copolymer according to the present invention, when the non-terminal block contains a constitutional unit represented by the formula (Y), the total number of the constitutional unit represented by the formula (Y) contained in the non-terminal block is preferably 0.01 or more and 20 or less, more preferably 0.05 or more and 10 or less, further preferably 0.1 or more and 5 or less, particularly preferably 0.1 or more and 3 or less, especially preferably 0.1 or more and 2 or less, and may also be 0.5 or more and 2 or less, from the standpoint of improving the luminance life of the light emitting device according to the present invention.

In the block copolymer according to the present invention, the total number ($X_I$) of the constitutional unit represented by the formula (X) contained in the non-terminal block is usually 0 or more and 50 or less. In the block copolymer according to the present invention, when the non-terminal block contains the constitutional unit represented by the formula (X), the total number ($X_I$) of the constitutional unit represented by the formula (X) contained in the non-terminal block is preferably 0.01 or more and 20 or less, more preferably 0.05 or more and 10 or less, further preferably 0.1 or more and 3 or less, particularly preferably 0.2 or more and 2 or less, especially preferably 0.3 or more and 2 or less, and may also be 0.2 or more and 1 or less, from the standpoint of improving the luminance life of the light emitting device according to the present invention.

In the block copolymer according to the present invention, the total number ($Z_I$) of the constitutional unit represented by the formula (Z) contained in the non-terminal block is usually 0 or more and 50 or less. In the block copolymer according to the present invention, when the non-terminal block contains the constitutional unit represented by the formula (Z), the total number ($Z_I$) of the constitutional unit represented by the formula (Z) contained in the non-terminal block is preferably 0 or more and 20 or less, more preferably 0 or more and 3 or less, further preferably 0 or more and 1 or less, and particularly preferably 0, from the standpoint of improving the luminance life of the light emitting device according to the present invention.

In the block copolymer according to the present invention, the total number ($X_I$+$Z_I$) of the constitutional unit represented by the formula (X) and the constitutional unit represented by the formula (Z) contained in the non-terminal block is usually 0.001 or more and 50 or less, and from the standpoint of improving the luminance life of the light emitting device according to the present invention, preferably 0.01 or more and 20 or less, more preferably 0.05 or more and 10 or less, further preferably 0.1 or more and 3 or less, particularly preferably 0.2 or more and 3 or less, especially preferably 0.3 or more and 2 or less, and may also be 0.2 or more and 1 or less.

In the block copolymer according to the present invention, the total number of the constitutional unit having a crosslinkable group contained in the non-terminal block is usually 0 or more and 50 or less. In the block copolymer according to the present invention, when the non-terminal block contains a constitutional unit having a crosslinkable group, the total number of the constitutional unit having a crosslinkable group contained in the non-terminal block is preferably 0.001 or more and 20 or less, more preferably 0.005 or more and 10 or less, further preferably 0.01 or more and 5 or less, further preferably 0.01 or more and 2 or less, especially preferably 0.05 or more and 1 or less, and especially more preferably 0.05 or more and 0.5 or less, from the standpoint of improving the luminance life of the light emitting device according to the present invention and from the standpoint of improving the crosslinkability of the block copolymer according to the present invention.

In the block copolymer according to the present invention, the total number of the crosslinkable group contained in the non-terminal block is usually 0 or more and 50 or less. In the block copolymer according to the present invention, when the non-terminal block contains a crosslinkable group, the total number of the crosslinkable group contained in the non-terminal block is preferably 0.001 or more and 20 or less, more preferably 0.01 or more and 10 or less, further preferably 0.05 or more and 5 or less, particularly preferably 0.1 or more and 2 or less, and especially preferably 0.1 or more and 1 or less, from the standpoint of improving the luminance life of the light emitting device according to the present invention and from the standpoint of improving the crosslinkability of the block copolymer according to the invention.

In the block copolymer according to the present invention, the total number of the constitutional unit represented by the formula (Y) contained in the terminal block is usually 0 or more and 50 or less. In the block copolymer according to the present invention, when the terminal block contains the constitutional unit represented by the formula (Y), the total number of the constitutional unit represented by the formula (Y) contained in the terminal block (Y) is preferably 0.005 or more and 20 or less, more preferably 0.01 or more and 10 or less, further preferably 0.05 or more and 5 or less, and particularly preferably 0.1 or more and 1 or less, from the standpoint of improving the luminance life of the light emitting device according to the present invention.

In the block copolymer according to the present invention, the total number ($X_{II}$) of the constitutional units represented by the formula (X) contained in the terminal block is usually 0 or more and 10 or less, and from the standpoint of improving the luminance life of the light emitting device according to the present invention, it is preferably 0 or more and 5 or less, more preferably 0 or more and 1 or less, further preferably 0 or more and 0.5 or less, particularly preferably 0 or more and 0.3 or less, may be 0 or more and 0.1 or less, and particularly preferably may also be 0.

In the block copolymer according to the present invention, the total number (Zn) of the constitutional unit represented by the formula (Z) contained in the terminal block is usually 0 or more and 10 or less, and from the standpoint of improving the luminance life of the light emitting device according to the present invention, it is preferably 0 or more and 5 or less, more preferably 0 or more and 1 or less, further preferably 0 or more and 0.1 or less, and particularly preferably 0.

In the block copolymer according to the present invention, the total number ($X_{II}+Z_{II}$) of the constitutional unit represented by the formula (X) and the constitutional unit represented by the formula (Z) contained in the terminal block is usually 0 or more and 10 or less, and from the standpoint of improving the luminance life of the light emitting device according to the present invention, it is preferably 0 or more and 5 or less, more preferably 0 or more and 1 or less, further preferably 0 or more and 0.5 or less, particularly preferably 0 or more and 0.3 or less, may be 0 or more and 0.1 or less, and may also be 0.

In the block copolymer according to the present invention, the total number of the constitutional unit having the crosslinkable group contained in the terminal block is usually 0 or more and 50 or less. In the block copolymer according to the present invention, when the terminal block contains a constitutional unit having a crosslinkable group, the total number of the constitutional unit having a crosslinkable group contained in the terminal block is preferably 0.01 or more and 20 or less, more preferably 0.005 or more and 10 or less, further preferably 0.01 or more and 5 or less, particularly preferably 0.01 or more and 2 or less, especially preferably 0.05 or more and 1 or less, especially more preferably 0.05 or more and 0.5 or less, and especially further preferably 0.1 or more and 0.5 or less, from the standpoint of improving the luminance life of the light emitting device according to the present invention and from the standpoint of improving the crosslinkability of the block copolymer according to the present invention.

In the block copolymer according to the present invention, the total number of the crosslinkable group contained in the terminal block is usually 0 or more and 50 or less. In the block copolymer according to the present invention, when the terminal block contains a crosslinkable group, the total number of the crosslinkable group contained in the terminal block is preferably 0.001 or more and 20 or less, more preferably 0.01 or more and 10 or less, further preferably 0.05 or more and 5 or less, particularly preferably 0.1 or more and 3 or less, especially preferably 0.1 or more and 1 or less, and especially more preferably 0.2 or more and 1 or less, from the standpoint of improving the luminance life of the light emitting device according to the present invention and from the standpoint of improving the crosslinkability of the block copolymer according to the present invention.

The total number of the constitutional unit represented by the formula (Y) contained in the block copolymer according to the present invention is usually 0 or more and 50 or less, and when the block copolymer according to the present invention contains the constitutional unit represented by the formula (Y), the total number of the constitutional unit represented by the formula (Y) contained in the block copolymer according to the present invention is preferably 0.01 or more and 20 or less, more preferably 0.05 or more and 10 or less, further preferably 0.1 or more and 5 or less, particularly preferably 0.1 or more and 3 or less, and may also be 0.5 or more and 2 or less, from the standpoint of improving the luminance life of the light emitting device according to the present invention.

The total number of the constitutional unit represented by the formula (X) contained in the block copolymer according to the present invention is usually 0 or more and 50 or less. When the block copolymer according to the present invention contains the constitutional unit represented by the formula (X), the total number of the constitutional unit represented by the formula (X) contained in the block copolymer according to the present invention is preferably 0.01 or more and 20 or less, more preferably 0.05 or more and 10 or less, further preferably 0.1 or more and 5 or less, particularly preferably 0.1 or more and 3 or less, especially preferably 0.2 or more and 2 or less, and may also be 0.2 or more and 1 or less, from the standpoint of improving the luminance life of the light emitting device according to the present invention.

The total number of the constitutional unit represented by the formula (Z) contained in the block copolymer according to the present invention is usually 0 or more and 50 or less, and from the standpoint of improving the luminance life of the light emitting device according to the present invention, it is preferably 0 or more and 20 or less, more preferably 0 or more and 3 or less, further preferably 0 or more and 1 or less, and particularly preferably 0, from the standpoint of improving the luminance life of the light emitting device according to the present invention.

The total number of the constitutional unit represented by the formula (X) and the constitutional units represented by the formula (Z) contained in the block copolymer according to the present invention is usually 0.01 or more and 50 or less, and from the standpoint of improving the luminance life of the light emitting device according to the present invention, it is preferably 0.01 or more and 20 or less, more preferably 0.05 or more and 10 or less, further preferably 0.1 or more and 5 or less, particularly preferably 0.1 or more and 3 or less, especially preferably 0.2 or more and 2 or less, and may also be 0.2 or more and 1 or less.

The total number of the constitutional unit having the crosslinkable group contained in the block copolymer according to the present invention is usually 0 or more and 50 or less. When the block copolymer according to the present invention contains a constitutional unit having a crosslinkable group, the total number of the constitutional unit having a crosslinkable group contained in the block copolymer according to the present invention is preferably 0.001 or more and 20 or less, more preferably 0.005 or more and 10 or less, further preferably 0.01 or more and 5 or less, particularly preferably 0.01 or more and 2 or less, especially preferably 0.05 or more and 1 or less, especially more preferably 0.1 or more and 1 or less, and may also be 0.05 or more and 0.5 or less, from the standpoint of improving the luminance life of the light emitting device according to the present invention and from the standpoint of improving the crosslinkability of the block copolymer according to the present invention.

The total number of the crosslinkable group contained in the block copolymer according to the present invention is usually 0 or more and 50 or less. When the block copolymer according to the present invention contains a crosslinkable group, the total number of the crosslinkable group contained in the block copolymer according to the present invention is preferably 0.001 or more and 20 or less, more preferably 0.01 or more and 10 or less, further preferably 0.05 or more and 5 or less, particularly preferably 0.1 or more and 3 or less, especially preferably 0.1 or more and 2 or less, and may also be 0.1 or more and 1 or less, from the standpoint of improving the luminance life of the light emitting device according to the present invention and from the standpoint of improving the crosslinkability of the block copolymer according to the present invention.

When the block copolymer according to the present invention satisfies at least one of the formulae (i) to (iii), it is possible to obtain a light emitting device excellent in luminance life. It is preferable for the block copolymer according to the present invention to satisfy at least two of the formulae (i) to (iii), from the standpoint of improving the luminance life of the light emitting device according to the present invention.

Further, the block copolymer according to the present invention preferably satisfies the formula (i) or the formula (iii), more preferably satisfies the formula (i), further preferably satisfies the formula (i) and the formula (ii), or the formula (i) and the formula (iii), particularly preferably satisfies the formula (i) and the formula (iii), from the standpoint of improving the luminance life of the light emitting device according to the present invention.

<Production Method of Block Copolymer>

The block copolymer according to the present invention can be suitably produced by a method including the following steps.

[a] A step of polymerizing one or more compounds (monomers) forming a non-terminal block, to form a non-terminal block,

[b] A step of polymerizing one or more compounds (monomers) forming a terminal block, in the presence of the non-terminal block, to bond the terminal block to the non-terminal block, and

[c] A step of reacting a reagent (end-capping agent) for introducing an end group with the terminal block, to introduce the end group into the terminal block.

The above-described step [a] preferably includes a step of polymerizing at least one selected from the group consisting of a compound represented by the formula (M-5) described below and a compound represented by the formula (M-1) described below to form a non-terminal block, more preferably includes a step of polymerizing at least one selected from the group consisting of a compound represented by the formula (M-2) described below, a compound represented by the formula (M-3) described below and a compound represented by the formula (M-4) described below and at least one selected from the group consisting of a compound represented by the formula (M-5) described below and a compound represented by the formula (M-1) described below to form a non-terminal block, further preferably includes a step of polymerizing at least one selected from the group consisting of a compound represented by the formula (M-2) described below and a compound represented by the formula (M-4) described below and at least one selected from the group consisting of a compound represented by the formula (M-5) described below and a compound represented by the formula (M-1) described below to form a non-terminal block, and particularly preferably includes a step of polymerizing at least one selected from the group consisting of a compound represented by the formula (M-2) described below and a compound represented by the formula (M-4) described below and at least one compound represented by the formula (M-5) described below to form a non-terminal block.

In the above step [a], when the non-terminal block of the block copolymer according to the present invention contains a crosslinkable group, a non-terminal block containing a crosslinkable group can be formed by polymerizing at least one selected from the group consisting of a compound represented by the formula (M-2) described below and a compound represented by the formula (M-3) described below.

When the non-terminal block of the block copolymer according to the present invention contains a crosslinkable group, the above-described step [a] preferably includes a step of polymerizing at least one selected from the group consisting of a compound represented by the formula (M-5) described below and a compound represented by the formula (M-1) described below and at least one selected from the group consisting of a compound represented by the formula (M-2) described below and a compound represented by the formula (M-3) described below, to form a non-terminal block, more preferably includes a step of polymerizing at least one compound represented by the formula (M-5) described below and at least one selected from the group consisting of a compound represented by the formula (M-2) described below and a compound presented by the formula (M-3) described below, to form a non-terminal block, further preferably includes a step of polymerizing at least one compound represented by the formula (M-5) described below, at least one selected from the group consisting of a compound presented by the formula (M-2) described below a compound represented by the formula (M-3) described below, and at least one compound represented by the formula (M-4) described below, to form a non-terminal block, and particularly preferably includes a step of polymerizing at least one compound represented by the formula (M-5) described below, at least one compound represented by the formula (M-2) described below and at least one compound represented by the formula (M-4) described below, to form a non-terminal block.

The above-described step [b] preferably includes a step of polymerizing, in the presence of the non-terminal block, at least one selected from the group consisting of a compound represented by the formula (M-1) described below, a compound represented by the formula (M-2) described below, a compound represented by the formula (M-3) described below, a compound represented by the formula (M-4) described below and a compound represented by the formula (M-5) described below to bind the terminal block to the non-terminal block, and more preferably includes a step of polymerizing, in the presence of the non-terminal block, at least one selected from the group consisting of a compound represented by the formula (M-2) described below, a compound represented by the formula (M-3) described below, a compound represented by the formula (M-4) described below and a compound represented by the formula (M-5) described below to bind the terminal block to the non-terminal block.

In the above-described step [b], when the terminal block of the block copolymer according to the present invention contains a crosslinkable group, it is possible to polymerize at least one selected from the group consisting of a compound represented by the formula (M-2) described below and a compound represented by the formula (M-3) described below to form a terminal block containing a crosslinkable group.

When the terminal block of the block copolymer according to the present invention contains a crosslinkable group, the above-described step [b] preferably includes a step of polymerizing, in the presence of the non-terminal block, at least one selected from the group consisting of a compound represented by the formula (M-2) described below and a compound represented by the formula (M-3) described below to bind the terminal block to the non-terminal block, more preferably includes a step of polymerizing at least one selected from the group consisting of a compound represented by the formula (M-2) described below and a compound represented by the formula (M-3) described below and at least one selected from the group consisting of a compound represented by the formula (M-1) described below, a compound represented by the formula (M-4) described below and a compound represented by the formula (M-5) described below to bind the terminal block to the non-terminal block, and further preferably includes a step of polymerizing at least one selected from the group consisting of a compound represented by the formula (M-2) described below and a compound represented by the formula (M-3) described below and at least one selected from the group consisting of a compound represented by the formula (M-4) described below and a compound represented by the formula (M-5) described below to bind the terminal block to the non-terminal block.

The above-described step [c] preferably includes a step of reacting a compound (end-capping agent) represented by the formula (M-6) described below with the terminal block to introduce the end group into the terminal block. In the above-described step [c], when the end group of the block copolymer according to the present invention contains a crosslinkable group, for example, a compound having a crosslinkable group among compounds (end-capping agents) represented by the formula (M-6) described below (preferably, a compound represented by the formula (M-6) described below in which $Ar^T$ is a crosslinkable group) can be reacted with the terminal block to form an end group containing the crosslinkable group.

In the present specification, the compounds used for producing the block copolymer according to the present invention are collectively referred to as "raw material monomer" in some cases.

In each of the above steps, the raw material monomers, that is, the compound forming the non-terminal block, the compound forming the terminal block, and the end capping agent can be selected, respectively, so that each block contains a desired constitutional unit and the end group is constituted of a desired group, in the light of the description in the above section [Production method of block copolymer].

In one embodiment of the method for producing a block copolymer according to the present invention, the above-described step [a] is a step of polymerizing at least one compound represented by the formula (M-4) described below and at least one selected from the group consisting of a compound represented by the formula (M-5) described below and a compound represented by the formula (M-1) to form a non-terminal block, the above-described step [b] is a step of polymerizing, in the presence of the non-terminal block, at least one compound represented by the formula (M-4) described below, to bind the terminal block to the non-terminal block, and the above-described step [c] is a step of reacting a compound (end-capping agent) represented by the formula (M-6) described below with the terminal block to introduce the end group into the terminal block.

When the non-terminal block contains a crosslinkable group, in the above-described step [a] in the production method according to the above-described one embodiment, a non-terminal block containing a crosslinkable group can be formed by polymerizing at least one compound represented by the formula (M-4) described below, at least one selected from the group consisting of a compound represented by the formula (M-5) described below and a compound represented by the formula (M-1) describe below, and at least one selected from the group consisting of a compound represented by the formula (M-2) described below and a compound represented by the formula (M-3) described below. When the terminal block contains a crosslinkable group, in the above-described step [b] in the production method according to the above-described one embodiment, a terminal block containing a crosslinkable group can be formed by polymerizing at least one compound presented by the formula (M-4) described below, and at least one selected from the group consisting of a compound represented by the formula (M-2) described below and a compound represented by the formula (M-3) described below. When the end group contains a crosslinkable group, in the above-described step [c] in the production method according to the above-described one embodiment, an end group containing a crosslinkable group can be formed by reacting a compound represented by the following formula (M-6) in which $Ar^T$ is a crosslinkable group with a terminal block.

[Chemical Formula 88]

$$Z^{C1}\text{—}Ar^Z\text{—}Z^{C2} \tag{M-1}$$

-continued

[Chemical Formula 89]

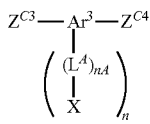
(M-2)

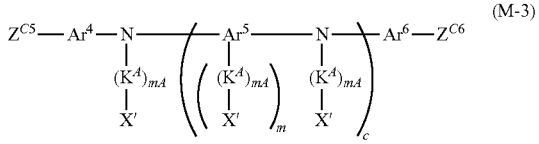
(M-3)

[Chemical Formula 90]

(M-4)

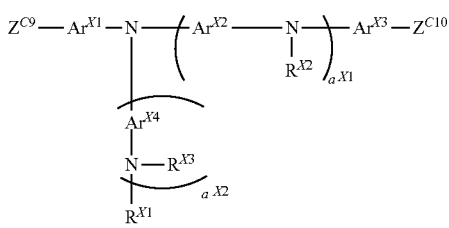
(M-5)

[Chemical Formula 91]

(M-6)

$Ar^2$, $Ar^3$, $L^A$, nA, X, n, $Ar^4$, $Ar^5$, $Ar^6$, $K^A$, mA, X', m, c, $Ar^{Y1}$, $Ar^{X1}$, $Ar^{X2}$, $Ar^{X3}$, $Ar^{X4}$, $R^{X1}$, $R^{X2}$, $R^{X3}$, $a^{X1}$ and $a^{X2}$ represent the same meaning as described above.

$Ar^T$ represents an aryl group, a monovalent heterocyclic group or a crosslinkable group, and the foregoing groups optionally have a substituent.

$Z^{C1}$ to $Z^{C11}$ are each a reactive group, and each independently represent a group selected from the group consisting of Group B and Group C.].

The compound represented by the formula (M-1) is a compound capable of forming the constitutional unit represented by the formula (Z).

The compound represented by the formula (M-2) is a compound capable of forming the constitutional unit represented by the formula (2).

The compound represented by the formula (M-3) is a compound capable of forming the constitutional unit represented by the formula (2').

The compound represented by the formula (M-4) is a compound capable of forming the constitutional unit represented by the formula (Y).

The compound represented by the formula (M-5) is a compound capable of forming the constitutional unit represented by the formula (X).

The compound represented by the formula (M-6) is a compound capable of forming an end group.

From the standpoint of stability of the block copolymer, $Ar^T$ is preferably an aryl group or a monovalent heterocyclic group, and more preferably an aryl group, and the foregoing groups optionally have a substituent. Further, $Ar^T$ is preferably a crosslinkable group because the crosslinkability of the block copolymer can be enhanced.

Examples and preferable examples of the aryl group and the monovalent heterocyclic group represented by $Ar^T$ are the same as the examples and preferable examples of the aryl group and the monovalent heterocyclic group in the end group.

Examples and preferable examples of the crosslinkable group represented by $Ar^{rT}$ are the same as the examples and the preferable examples of the crosslinkable group in the end group.

Group B and Group C are as follows, respectively.
(Group B)

A chlorine atom, a bromine atom, an iodine atom, a group represented by $-O-S(=O)_2R^{C1}$ (wherein, $R^{C1}$ represents an alkyl group, a cycloalkyl group or an aryl group, and the foregoing groups optionally have a substituent.).
(Group C)

A group represented by $-B(OR^{C2})_2$ (wherein, $R^{C2}$ represents a hydrogen atom, an alkyl group, a cycloalkyl group or an aryl group, and the foregoing groups optionally have a substituent. A plurality of $R^{C2}$ may be the same or different, and may be combined together to form a ring structure together with oxygen atoms to which they are attached);

a group represented by $-BF_3Q'$ (wherein, Q' represents Li, Na, K, Rb or Cs);

a group represented by $-MgY'$ (wherein, Y' represents a chlorine atom, a bromine atom or an iodine atom);

a group represented by $-ZnY''$ (wherein, Y'' represents a chlorine atom, a bromine atom or an iodine atom); and a group represented by $-Sn(R^{C3})_3$ (wherein, $R^{C3}$ represents a hydrogen atom, an alkyl group, a cycloalkyl group or an aryl group, and the foregoing groups optionally have a substituent. A plurality of $R^{C3}$ may be the same or different, and may be combined together to form a ring structure together with tin atoms to which they are attached.).

Examples of the group represented by $-B(OR^{C2})_2$ include groups represented by the following formulae in addition to $-B(OH)_2$.

[Chemical Formula 92]

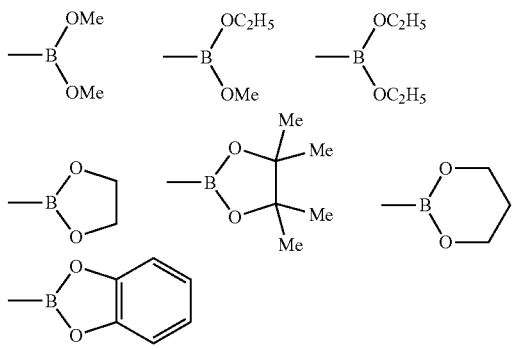

The raw material monomers for forming each block can have two reactive groups selected from Group B or Group C, as is the case with the compounds represented by the formulae (M-1) to (M-5) described above. It is preferable that the two reactive groups which each of the raw material monomer for forming each block has are both selected from Group B or both selected from Group C, since production of the raw material monomer is easy.

For example, a compound having a group selected from Group B and a compound having a group selected from Group C are subjected to a known coupling reaction, to generate a bond between a carbon atom bonded to a group selected from Group B and a carbon atom bonded to a group selected from Group C. Hence, if a compound having two groups selected from Group B and a compound having two groups selected from Group C are subjected to a known coupling reaction, a condensation polymer of these compounds can be obtained by condensation polymerization.

By the condensation polymerization, formation of a non-terminal block and binding of a terminal block to a non-terminal block (formation of a terminal block) can be performed.

When the production method according to the above-mentioned embodiment is taken as an example, for example, when $Z^{C1}$, $Z^{C2}$, $Z^{C3}$, $Z^{C4}$, $Z^{C5}$, $Z^{C6}$, $Z^{C9}$, and $Z^{C10}$ are groups selected from Group B, if a group selected from Group C is selected as $Z^{C7}$ and $Z^{C8}$, formation of a non-terminal block and binding of a terminal block to a non-terminal block (formation of a terminal block) can be performed by condensation polymerization. When $Z^{C1}$, $Z^{C2}$, $Z^{C3}$, $Z^{C4}$, $Z^{C5}$, $Z^{C6}$, $Z^{C9}$ and $Z^{C10}$ are groups selected from the C group, if a group selected from Group B is selected as $Z^{C7}$ and $Z^{C8}$, formation of a non-terminal block and binding of a terminal block to a non-terminal block (formation of a terminal block) can be performed by condensation polymerization.

Further, one embodiment in which two or more compounds represented by the formula (M-1) to the formula (M-5) are used in the production method according to the above-mentioned embodiment will be explained with reference to the case where two or more compounds represented by the formula (M-4) are used. For example, when performing formation of a terminal block using two or more compounds represented by the formula (M-4), if $Z^{C7}$ and $Z^{C8}$ of any at least one compound among at least two compounds represented by the formula (M-4) are selected from Group C and $Z^{C7}$ and $Z^{C8}$ of the other compound are selected from Group B, formation of a terminal block can be performed by condensation polymerization.

Introduction of an end group into a terminal block can be carried out by utilizing the same reaction. That is, when the end of the terminal block is a group selected from Group B, an end group can be introduced by a coupling reaction if a group selected from Group C is selected as $Z^{C11}$. When the end of a terminal block is a group selected from Group C, an end group can be introduced by a coupling reaction if a group selected from Group B is selected as $Z^{C11}$.

In the case of producing a block copolymer by the above condensation polymerization in which a non-terminal block and a terminal block are each formed using a compound having two groups selected from Group B and a compound having two groups selected from Group C as raw material monomers, it is preferable to appropriately control the amount ratio of the raw material monomers used in each of the step of forming a non-terminal block (step [a] described above) and the step of forming a terminal block (step [b] described above).

That is, in the step [a], it is preferable to use one of the compound having two groups selected from Group B and the compound having two groups selected from Group C in excess on a molar basis. This makes it possible to reliably produce a non-terminal block having a group selected from Group B or a group selected from Group C at the end. When the compound used in excess is a compound having two groups selected from Group B, a non-terminal block having a group selected from Group B at the end is produced, while when the compound used in excess is a compound having two groups selected from Group C, a non-terminal block having a group selected from Group C at the end is produced.

In the subsequent step [b], it is preferable that a compound not used in excess in the step [a], among the compound having two groups selected from Group B and the compound having two groups selected from Group C, is used in excess on a molar basis. This makes it possible to reliably produce a terminal block which is bonded to the non-terminal block and has a group selected from Group C or a group selected from Group B at the end. When the compound used in excess is a compound having two groups selected from Group B, a terminal block having a group selected from Group B at the end is produced, while when the compound used in excess is a compound having two groups selected from Group C, a terminal block having a group selected from Group C at the end is produced.

When a terminal block having a group selected from Group B at the end is produced in the step [b], an end-capping agent having a group selected from Group C is used in the step [c]. In the step [b], when a terminal block having a group selected from Group C at the end is produced, an end-capping agent having a group selected from Group B is used in the step [c].

The control of the use amount ratio of the raw material monomer in production of the block copolymer according to the present invention will be described in detail with reference to the block copolymer HTL-1 fabricated in Synthesis Example 1 in the examples.

In Synthesis Example 1, the mixture HTL-1a was used for the formation of a non-terminal block, and this mixture contains a compound M1 which is a compound having two groups selected from Group C, a compound M2 which is a compound having two groups selected from Group B and a compound M3 which is a compound having two groups selected from Group B at a molar ratio of 40:30:2.5. As described, for the mixture HTL-1a, the use amount ratio is controlled so that the compound having two groups selected from Group C is excess on a molar basis. Hence, the non-terminal block to be formed has a group selected from Group C at the end.

Further, the mixture HTL-1b is used for forming a terminal block, and this mixture contains a compound M1 which is a compound having two groups selected from Group C, a compound M4 which is a compound having two groups selected from Group B and a compound M5 which is a compound having two groups selected from Group B at a molar ratio of 10:10:7.5. As described above, for the mixture HTL-1b, the use amount ratio is controlled so that the compound having two groups selected from Group B is in excess on a molar basis. Thus, a terminal block which binds to a non-terminal block having a group selected from Group C at the end, and has a group selected from Group B at the end, is formed.

Phenylboronic acid, which is the end-capping agent used in Synthesis Example 1, is a compound having one group selected from Group C. Therefore, phenylboronic acid is bonded to a terminal block having a group selected from Group B at the end, to seal the end of the block copolymer and to form a phenyl group as the end group.

The above-described condensation polymerization (coupling reaction) is usually carried out in the presence of a catalyst, a base and a solvent, but it may be carried out in the co-existence of a phase transfer catalyst, if necessary.

The catalyst includes, for example, transition metal complexes such as palladium complexes such as bis(triphenylphosphine)palladium(II) dichloride, bis(tris-o-methoxyphenylphosphine)palladium(II) dichloride, tetrakis(triphenylphosphine)palladium(0), tris(dibenzylideneacetone)dipalladium(0), palladium acetate and the like, nickel complexes such as tetrakis(triphenylphosphine)nickel(0), [1,3-bis(diphenylphosphino)propane)nickel(II) dichloride, bis(1,4-cyclooctadiene)nickel(0) and the like; these transition metal complexes further having a ligand such as triphenylphosphine, tri(o-tolyl)phosphine, tri(tert-butyl)phosphine, tricyclohexylphosphine, 1,3-bis(diphenylphosphino)propane, bipyridyl and the like. The catalyst may be used singly or in combination of two or more.

The amount of the catalyst used is usually 0.00001 molar equivalent or more and 3 molar equivalent or less as the amount of the transition metal with respect to the sum of the number of moles of the raw material monomers.

The base and the phase transfer catalyst include, for example, inorganic bases such as sodium carbonate, potassium carbonate, cesium carbonate, potassium fluoride, cesium fluoride, tripotassium phosphate and the like; organic bases such as tetrabutylammonium fluoride, tetraethylammonium hydroxide, tetrabutylammonium hydroxide and the like; phase transfer catalysts such as tetrabutylammonium chloride, tetrabutylammonium bromide and the like. The base and the phase transfer catalyst may each be used singly or in combination of two or more.

Each of the use amounts of the base and the phase transfer catalyst is usually 0.001 molar equivalent or more and 100 molar equivalent or less with respect to the total number of moles of the raw material monomers.

The solvent includes, for example, organic solvents such as toluene, xylene, mesitylene, tetrahydrofuran, 1,4-dioxane, dimethoxyethane, N,N-dimethylacetamide, N,N-dimethylformamide and the like, and water. The solvent may be used singly or in combination of two or more.

The amount of the solvent used is usually 10 parts by mass or more and 100000 parts by mass or less with respect to 100 parts by mass of the sum of the raw material monomers.

The reaction temperature of the condensation polymerization is usually −100° C. or higher and 200° C. or lower. The reaction time of the condensation polymerization is usually 1 hour or more.

For the post-treatment of the condensation polymerization reaction (coupling reaction), known methods, for example, a method for removing water-soluble impurities by liquid separation, a method in which the reaction liquid after the reaction is added to a lower alcohol such as methanol or the like, the deposited precipitate is filtered, then, dried, and other methods, can be used singly or in combination.

When the purity of the block copolymer according to the present invention is low, it can be purified by a usual method such as, for example, crystallization, reprecipitation, continuous extraction with a Soxhlet extractor, column chromatography and the like.

<Light Emitting Device>

The light emitting device according to the present invention is a light emitting device having an anode, a cathode, and a first organic layer and a second organic layer provided between the anode and the cathode, wherein the first organic layer is a layer containing a phosphorescent compound, the second organic layer is a layer containing at least one of a block copolymer containing an end group, a block that binds to the end group and a block that does not bind to the end group, and a crosslinked product of the block copolymer, the block that does not bind to the end group contains at least one constitutional unit selected from the group consisting of a non-crosslinkable constitutional unit represented by the formula (X) and a non-crosslinkable constitutional unit represented by the formula (Z), and at least one of the above-described formulae (i) to (iii) is satisfied.

The method for forming the first organic layer and the second organic layer includes, for example, dry methods such as a vacuum vapor-deposition method and the like, and wet methods such as a spin coating method, an inkjet printing method and the like, and wet methods are preferable.

When the first organic layer is formed by a wet method, it is preferable to use a first ink described later.

When the second organic layer is formed by a wet method, it is preferable to use a second ink or a 2'-nd ink described later, and it is more preferable to use a 2'-nd ink.

When the block copolymer according to the present invention contains a crosslinkable group, the block copolymer according to the present invention containing a crosslinkable group contained in the second organic layer can be crosslinked by heating or irradiating with light (preferably, heating) after forming the second organic layer. Since the block copolymer according to the present invention containing a crosslinkable group is contained in a crosslinked state [in the form of a crosslinked product of the block copolymer according to the present invention containing a crosslinkable group] in this second organic layer, the second organic layer is substantially insolubilized in a solvent. Hence, such a second organic layer can be suitably used for laminating layers in production of a light emitting device.

In a preferable embodiment of the light emitting device according to the present invention, the second organic layer contains a crosslinked product of the block copolymer according to the present invention.

The heating temperature for crosslinking the film is usually 25° C. or higher and 300° C. or lower, preferably 50° C. or higher and 260° C. or lower, more preferably 130° C. or higher and 230° C. or lower, and further preferably 180° C. or higher and 210° C. or lower.

The time of heating is usually 0.1 minutes or more and 1000 minutes or less, preferably 0.5 minutes or more and 500 minutes or less, more preferably 1 minute or more and 120 minutes or less, and further preferably 10 minutes or more and 60 minutes or less.

The type of the light used for light irradiation is, for example, ultraviolet light, near-ultraviolet light, or visible light.

The method for analyzing the components contained in the first organic layer or the second organic layer includes, for example, chemical separation and analysis methods such as extraction and the like, instrumental analysis methods such as infrared spectroscopy (IR), nuclear magnetic resonance spectroscopy (NMR), mass spectrometry (MS) and the like, and analytical methods in which a chemical separation and analysis method and an instrumental analysis method are combined.

By performing solid-liquid extraction using an organic solvent such as toluene, xylene, chloroform, tetrahydrofuran and the like on the first organic layer or the second organic layer, the components can be separated into components substantially insoluble in an organic solvent (insoluble component) and components soluble in an organic solvent (soluble component). The insoluble components can be analyzed by infrared spectroscopy or nuclear magnetic resonance spectroscopy, and the soluble components can be analyzed by nuclear magnetic resonance spectroscopy or mass spectrometry.

[First Organic Layer]

The first organic layer may contain one type of the phosphorescent compound alone or two or more types of the phosphorescent compounds.

The content of the phosphorescent compound in the first organic layer may be within the range in which the function as the first organic layer is performed. For example, the total content of the phosphorescent compound may be 0.01 to 100% by mass, preferably 0.1 to 70% by mass, more preferably 1 to 50% by mass, further preferably 5 to 45% by mass, and particularly preferably 10 to 40% by mass, based on the total amount of the first organic layer.

The first organic layer is preferably a layer containing a phosphorescent compound and a host material having at least one function selected from hole injectability, hole transportability, electron injectability and electron transportability, since the light emitting device of the present invention is more excellent in luminance life. The first organic layer may contain one type of the host material alone or two or more types of the host materials.

When the first organic layer is a layer containing a phosphorescent compound and a host material, the content of the host material is usually 1 to 99 parts by mass, preferably 5 to 98 parts by mass, more preferably 10 to 97 parts by mass, further preferably 30 to 96 parts by mass, and particularly preferably 50 to 95 parts by mass, when the sum of the phosphorescent compound and the host material is taken as 100 parts by mass. When the first organic layer is a layer containing a phosphorescent compound and a host material, the content of the host material may be 10 to 90 parts by mass, may be 30 to 85 parts by mass, may be 50 to 80 parts by mass when the sum of the phosphorescent compound and the host material is taken as 100 parts by mass.

It is preferable that the lowest excited triplet state (Ti) of the host material has higher energy level than the lowest excited triplet state (Ti) of the phosphorescent compound, since the light emitting device according to the present invention is more excellent in luminance life.

The host material is preferably one which exhibits solubility in a solvent capable of dissolving the phosphorescent compound since the light emitting device according to the present invention can be produced by a wet method.

The host material is classified into a low molecular weight compound (hereinafter, also referred to as "low molecular weight host") and a polymer compound (hereinafter, also referred to as "polymer host"), and the first organic layer may contain any host material. As the host material that may be contained in the first organic layer, a polymer host is preferable.

[Low Molecular Weight Host]

The low molecular weight host is preferably a compound represented by the formula (H-1).

$Ar^{H1}$ and $Ar^{H2}$ are each preferably a phenyl group, a fluorenyl group, a spirobifluorenyl group, a pyridyl group, a pyrimidinyl group, a triazinyl group, a quinolinyl group, an isoquinolinyl group, a thienyl group, a benzothienyl group, a dibenzothienyl group, a furyl group, a benzofuryl group, a dibenzofuryl group, a pyrrolyl group, an indolyl group, an azaindolyl group, a carbazolyl group, an azacarbazolyl group, a diazacarbazolyl group, a phenoxazinyl group or a phenothiazinyl group, more preferably a phenyl group, a fluorenyl group, a spirobifluorene group, a pyridyl group, a pyrimidinyl group, a triazinyl group, a dibenzothienyl group, a dibenzofuryl group, a carbazolyl group or an azacarbazolyl group, further preferably a fluorenyl group, a spirobifluorenyl group, a dibenzothienyl group, a dibenzofuryl group or a carbazolyl group, and particularly preferably a group represented by the formula (TDA-3), and the foregoing groups optionally have a substituent.

The substituent which $Ar^{H1}$ and $Ar^{K2}$ optionally have is preferably a halogen atom, an alkyl group, a cycloalkyl group, an alkoxy group, a cycloalkoxy group, an aryl group or a monovalent heterocyclic group, more preferably an alkyl group, a cycloalkoxy group, an alkoxy group or a cycloalkoxy group, and further preferably an alkyl group or a cycloalkoxy group, and the foregoing groups optionally further have a substituent.

$n^{H1}$ is preferably 1. $n^{H2}$ is preferably 0.

$n^{H3}$ is generally an integer of 0 or more and 10 or less, preferably an integer of 0 or more and 5 or less, more preferably an integer of 1 or more and 3 or less, and particularly preferably 1.

$n^{H11}$ is preferably an integer of 1 or more and 5 or less, more preferably an integer of 1 or more and 3 or less, and further preferably 1.

$R^{H11}$ is preferably a hydrogen atom, an alkyl group, a cycloalkyl group, an aryl group or a monovalent heterocyclic group, more preferably a hydrogen atom, an alkyl group or a cycloalkyl group, and further preferably a hydrogen atom or an alkyl group, and the foregoing groups optionally have a substituent.

$L^{H1}$ is preferably an arylene group or a divalent heterocyclic group, and the foregoing groups optionally further have a substituent.

$L^{H1}$ is preferably a group represented by the formula (A-1) to the formula (A-3), the formula (A-8) to the formula (A-10), the formula (AA-1) to the formula (AA-6), the formula (AA-10) to the formula (AA-21) or the formula (AA-24) to the formula (AA-34), more preferably a group represented by the formula (A-1), the formula (A-2), the formula (A-8), the formula (A-9), the formula (AA-1) to the formula (AA-4), the formula (AA-10) to the formula (AA-15), the formula (AA-33) or the formula (AA-34), further preferably a group represented by the formula (A-1), the formula (A-2), the formula (A-8), the formula (AA-2), the formula (AA-4), the formula (AA-10), the formula (AA-12), the formula (AA-14) or the (AA-33), particularly preferably a group represented by the formula (A-8), the formula (AA-10), the formula (AA-12) or the formula (AA-14), and especially preferably a group represented by the formula (AA-14).

The substituent which $L^{H1}$ optionally has is preferably a halogen atom, an alkyl group, a cycloalkyl group, an alkoxy group, a cycloalkoxy group, an aryl group or a monovalent heterocyclic group, more preferably an alkyl group, an alkoxy group, an aryl group or a monovalent heterocyclic group, further preferably an alkyl group, an aryl group or a monovalent heterocyclic group, and particularly preferably a monovalent heterocyclic group, and the foregoing groups optionally further have a substituent.

$L^{H21}$ is preferably a single bond or an arylene group, more preferably a single bond, and the arylene group optionally has a substituent.

The definition and examples of the arylene group or the divalent heterocyclic group represented by $L^{H21}$ are the same as the definition and examples of the arylene group or the divalent heterocyclic group represented by $L^{H1}$.

$R^{H21}$ is preferably an aryl group or a monovalent heterocyclic group, and the foregoing groups optionally have a substituent.

The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$.

The definition and examples of the substituent which $R^{H21}$ optionally has are the same as the definition and examples of the substituent which $Ar^{H1}$ and $Ar^{H2}$ optionally have.

The compound represented by the formula (H-1) is preferably a compound represented by the formula (H-2).

[Chemical Formula 93]
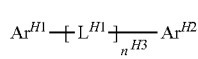
[wherein, $Ar^{H1}$, $Ar^{H2}$, $n^{H3}$ and $L^{H1}$ represent the same meaning as described above.]
The compound represented by the formula (H-1) includes, for example, compounds represented by the following formulae.
[Chemical Formula 94]
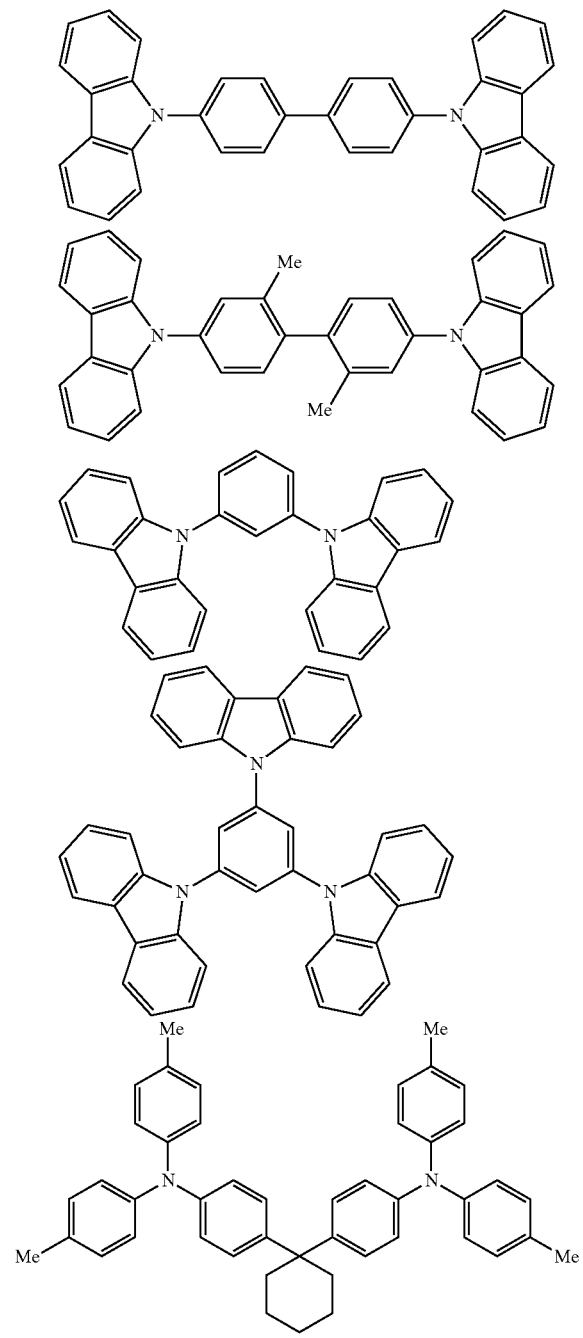
[Chemical Formula 95]
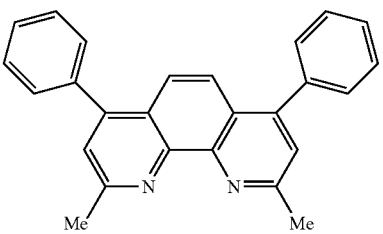
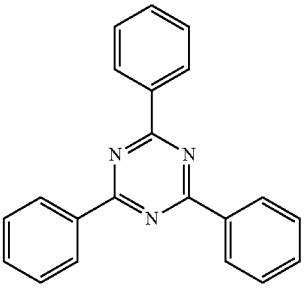
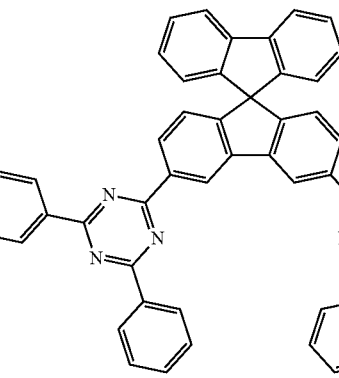
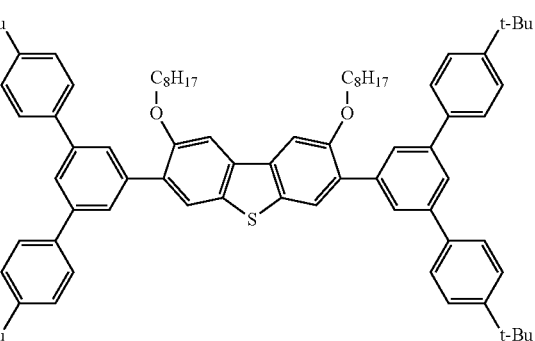
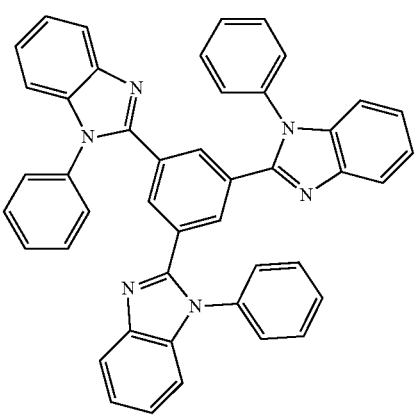

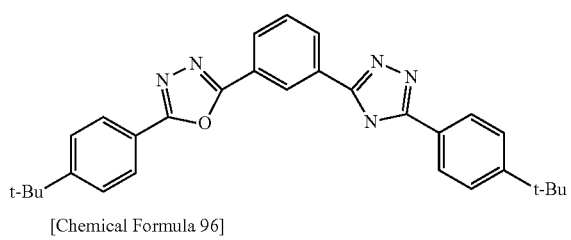

[Chemical Formula 96]

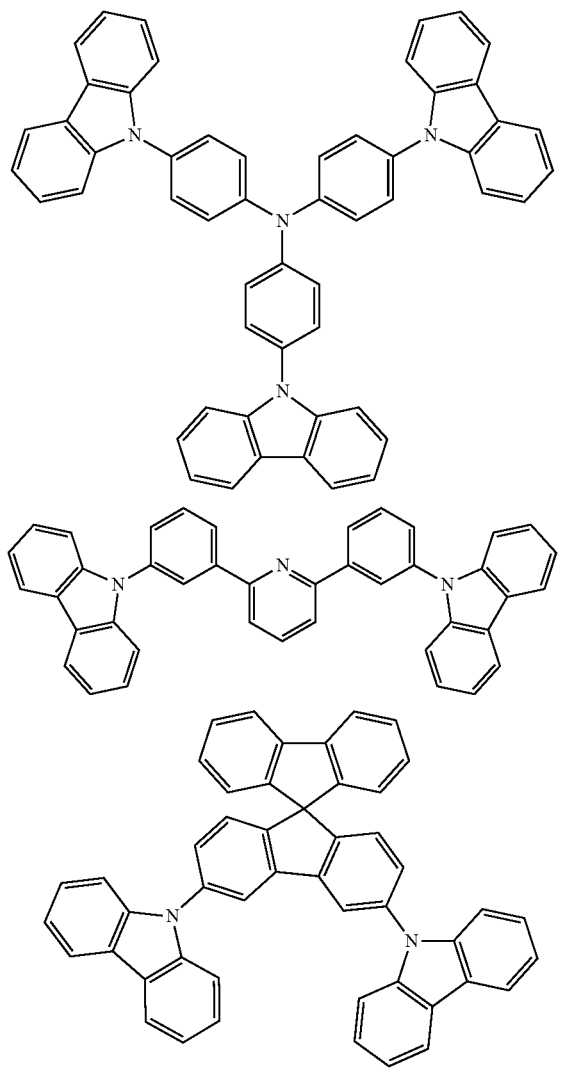

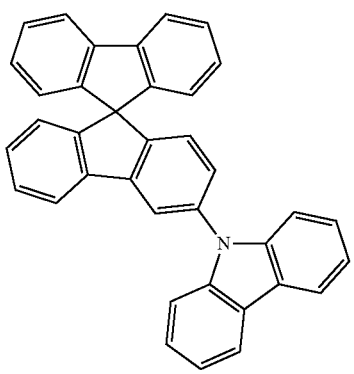

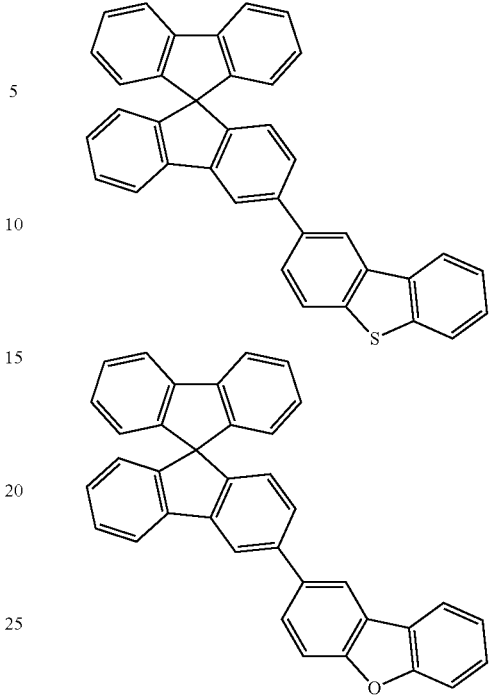

[Polymer Host]

The polymer host includes, for example, a polymer compound which is a hole transporting material described later, a polymer compound which is an electron transporting material described later, and the like.

The polymer host is preferably a polymer compound containing a constitutional unit represented by the formula (Y) and/or a constitutional unit represented by the formula (Z), and more preferably a polymer compound containing a constitutional unit represented by the formula (Y) and a constitutional unit represented by the formula (Z).

When the polymer host contains a constitutional unit represented by the formula (Y), the amount of the constitutional unit represented by the formula (Y) is preferably 1 to 99% by mol, more preferably 30 to 95% by mol, and further preferably 50 to 90% by mol with respect to the total amount of the constitutional unit contained in the polymer host, from the standpoint of improving the luminance life of the light emitting device according to the present invention.

When the polymer host contains a constitutional unit represented by the formula (Z), the amount of the constitutional unit represented by the formula (Z) is preferably 0.1 to 40% by mol, more preferably 1 to 30% by mol, and further preferably 5 to 20% by mol with respect to the total amount of the constitutional unit contained in the polymer host, from the standpoint of improving the luminance life of the light emitting device according to the present invention.

Each of the constitutional unit represented by the formula (Y) and the formula (Z) may be contained either singly or in combination of two or more in the polymer host.

It is preferable that the polymer host further contains a constitutional unit represented by the following formula (X) since it is excellent in charge transportability (especially, hole transportability).

When the polymer host contains a constitutional unit represented by the formula (X), the amount of the constitutional unit represented by the formula (X) is preferably 0.1 to 50% by mol, and more preferably 1 to 30% by mol with respect to the total amount of the constitutional unit contained in the polymer host since it is excellent in charge transportability (especially, hole transportability).

The constitutional unit represented by the formula (X) may be contained singly or in combination of two or more in the polymer host.

The polymer host containing a constitutional unit represented by the formula (Y) includes, for example, polymer compounds P-1 to P-6 shown in Table 1 and the like.

TABLE 1

| polymer compound | constitutional unit and molar ratio thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | others t |
| P-1 | 0.1-99.9 | 0.1-99.9 | 0 | 0 | 0-30 |
| P-2 | 0.1-99.9 | 0 | 0.1-99.9 | 0 | 0-30 |
| P-3 | 0.1-99.8 | 0.1-99.8 | 0 | 0.1-99.8 | 0-30 |
| P-4 | 0.1-99.8 | 0.1-99.8 | 0.1-99.8 | 0 | 0-30 |
| P-5 | 0.1-99.8 | 0 | 0.1-99.8 | 0.1-99.8 | 0-30 |
| P-6 | 0.1-99.7 | 0.1-99.7 | 0.1-99.7 | 0.1-99.7 | 0-30 |

[In the table, p, q, r, s and t represent the molar ratio of each constitutional unit, p+q+r+s+t=100 and 100≥p+q+r+s≥70. The other constitutional unit means a constitutional unit other than the constitutional unit represented by the formula (Y), the constitutional unit represented by the formula (Z) and the constitutional unit represented by the formula (X).]

The polymer host may be any of a block copolymer, a random copolymer, an alternating copolymer and a graft copolymer, or may be another mode.

The polystyrene-equivalent number-average molecular weight of the polymer host is preferably $2 \times 10^3$ to $1 \times 10^6$, more preferably $3 \times 10^3$ to $5 \times 10^5$, and further preferably $5 \times 10^3$ to $1.5 \times 10^5$.

The polystyrene-equivalent weight-average molecular weight of the polymer host is preferably $3 \times 10^3$ to $2 \times 10^6$, more preferably $5 \times 10^3$ to $1 \times 10^6$, and further preferably $1 \times 10^4$ to $5 \times 10^5$.

[Production Method of Polymer Host]

The polymer host can be produced by using a known polymerization method described in Chemical Review (Chem. Rev.), Vol. 109, pp. 897-1091 (2009) and the like, and exemplified are methods for polymerizing by a coupling reaction using a transition metal catalyst such as the Suzuki reaction, the Yamamoto reaction, the Buchwald reaction, the Stille reaction, the Negishi reaction, the Kumada reaction and the like.

In the above-described polymerization method, the method of charging monomers includes a method of charging the whole amount of monomers into the reaction system at once, a method of charging a part of monomers and reacting them, then, charging the remaining monomers at once, continuously or dividedly, a method of charging monomers continuously or dividedly, and the like.

The transition metal catalyst includes a palladium catalyst, a nickel catalyst and the like.

The post-treatment of the polymerization reaction is conducted by known methods, for example, a method of removing water-soluble impurities by liquid separation, a method of adding the reaction liquid after the polymerization reaction to a lower alcohol such as methanol and the like, filtrating the deposited precipitate, then, drying it, and the like, singly or in combination. When the purity of the polymer host is low, it can be purified by a usual method such as, for example, recrystallization, reprecipitation, continuous extraction with a Soxhlet extractor, column chromatography and the like.

[First Composition]

The first organic layer may be a layer containing a composition containing a phosphorescent compound and the other component other than the phosphorescent compound (hereinafter, also referred to as "first composition").

The other component is preferably at least one component selected from the group consisting of the host material, the hole transporting material, the hole injection material, the electron transporting material, the electron injection material, the light emitting material (but different from the phosphorescent compound) and the antioxidant described above.

[Hole Transporting Material]

The hole transporting material is classified into a low molecular weight compound and a polymer compound, and is preferably a polymer compound having a crosslinkable group.

The low molecular weight compound includes, for example, aromatic amine compounds such as triphenylamine and its derivatives, N,N'-di-1-naphthyl-N,N'-diphenylbenzidine (α-NPD), and N,N'-diphenyl-N,N'-di(m-tolyl)benzidine (TPD) and the like.

The polymer compound includes, for example, polyvinylcarbazole and its derivatives; and polyarylene having an aromatic amine structure in its side chain or main chain and its derivatives. The polymer compound may be a compound to which an electron accepting site such as fullerene, tetrafluorotetracyanoquinodimethane, tetracyanoethylene, trinitrofluorenone and the like is bonded.

In the first composition, the content of the hole transporting material is usually 1 to 400 parts by mass when the amount of the phosphorescent compound is taken as 100 parts by mass.

The hole transporting materials may be used singly or in combination of two or more.

[Electron Transporting Material]

The electron transporting material is classified into a low molecular weight compound and a polymer compound. The electron transporting material may have a crosslinkable group.

The low molecular weight compound includes, for example, a metal complex having 8-hydroxyquinoline as a ligand; oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the first composition, the content of the electron transporting material is usually 1 to 400 parts by mass when the amount of the phosphorescent compound is taken as 100 parts by mass.

The electron transporting material may be used singly or in combination of two or more.

[Hole Injection Material and Electron Injection Material]

The hole injection material and the electron injection material are each classified into a low molecular weight compound and a polymer compound. The hole injection material and the electron injection material may have a crosslinkable group.

The low molecular weight compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylene vinylene, polythienylene vinylene, polyquinoline and polyquinoxaline, and derivatives thereof; conductive polymers such as polymers containing an aromatic amine structure in its main chain or side chain.

In the first composition, the content of each of the hole injection material and the electron injection material is usually 1 to 400 parts by mass when the amount of the phosphorescent compound is taken as 100 parts by mass.

The hole injection material and the electron injection material may each be used singly or in combination of two or more.

[Ion Doping]

When the hole injection material or the electron injection material contains a conductive polymer, the electrical conductivity of the conductive polymer is preferably $1\times10^{-5}$ S/cm or more and $1\times10^{3}$ S/cm or less.

In order to set the electric conductivity of the conductive polymer within the above range, the conductive polymer can be doped with an appropriate amount of ions. The types of ions to be doped are anions for hole injection materials and cations for electron injection materials. The anion includes, for example, a polystyrenesulfonate ion, an alkylbenzenesulfonate ion and a camphorsulfonate ion. The cation includes, for example, a lithium ion, a sodium ion, a potassium ion, and a tetrabutylammonium ion.

The ions to be doped may be used singly or in combination of two or more.

[Light Emitting Material]

The light emitting material is classified into a low molecular weight compound and a polymer compound. The light emitting material may have a crosslinkable group.

The low molecular weight compound includes, for example, naphthalene and its derivatives, anthracene and its derivatives, and perylene and its derivatives.

The polymer compound includes, for example, polymer compounds containing an arylene group such as a phenylene group, a naphthalenediyl group, a fluorenediyl group, a phenanthrenediyl group, a dihydrophenanthrendiyl group, an anthracenediyl group, a pyrenediyl group or the like; an aromatic amine residue such as a group obtained by removing two hydrogen atoms from the aromatic amine, and the like; and a divalent heterocyclic group such as a carbazolediyl group, a phenoxazinediyl group, a phenothiazinediyl group and the like.

In the first composition, the content of the light emitting material is usually 1 to 400 parts by mass when the amount of the phosphorescent compound is taken as 100 parts by mass.

The light emitting material may be used only singly or in combination of two or more.

[Antioxidant]

The antioxidant may be a compound that is soluble in the same solvent as for the phosphorescent compound and does not inhibit light emission and charge transportation, and includes, for example, a phenol-based antioxidant and a phosphorus-based antioxidant.

In the first composition, the content of the antioxidant is usually 0.001 to 10 parts by mass when the amount of the phosphorescent compound is taken as 100 parts by mass.

The antioxidant may be used only singly or in combination of two or more.

[First Ink]

The composition containing a phosphorescent compound and a solvent (hereinafter, also referred to as "first ink") can be suitably used when the first organic layer is formed by a wet method such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, an inkjet printing method, a capillary coating method, a nozzle coating method and the like (hereinafter, also simply referred to as "wet method").

The viscosity of the first ink may be adjusted according to the type of the wet method, but when applied to a printing method in which a solution passes through an ejection device such as an inkjet printing method and the like, it is preferably 1 to 20 mPa·s at 25° C., since it is difficult for clogging and flight bending during discharge to occur.

The solvent contained in the ink is preferably a solvent capable of dissolving or uniformly dispersing the solid content in the ink. The solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-dodecane, bicyclohexyl and the like; ketone solvents such as acetone, methyl ethyl ketone, cyclohexanone, acetophenone and the like; ester solvents such as ethyl acetate, butyl acetate, ethyl cellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; amide solvents such as N-methyl-2-pyrrolidone, N,N-dimethylformamide and the like. The solvent may be used only singly or in combination of two or more.

In the first ink, the content of the solvent is usually 1000 to 100000 parts by mass, and preferably 2000 to 20000 parts by mass when the amount of the phosphorescent compound is taken as 100 parts by mass.

The first ink can further contain at least one component selected from the group consisting of the host material, the hole transporting material, the hole injection material, the electron transporting material, the electron injection material, the light emitting material and the antioxidant described above.

[Second Organic Layer]

In the second organic layer, the block copolymer according to the present invention may be contained singly or in combination of two or more. In the second organic layer, the crosslinked product of the block copolymer according to the present invention may be contained singly or in combination of two or more.

In the second organic layer, the total content of the block copolymer according to the present invention and the crosslinked product of the block copolymer according to the present invention may be within a range in which the function as the second organic layer is performed. For example, the total content of the block copolymer according to the present invention and the crosslinked product of the block copolymer according to the present invention may be 0.1% by mass or more and 100% by mass or less, and is preferably 10% by mass or more and 100% by mass or less, more preferably 30% by mass or more and 100% by mass or less, further preferably 50% by mass or more and 100% by mass or less, and particularly preferably 80% by mass or more and 100% by mass or less, based on the total amount of the second organic layer.

[Second Composition]

The second organic layer may be a layer containing the second composition.

The second composition contains at least one selected from the group consisting of the block copolymer according to the present invention and a crosslinked product of the block copolymer according to the present invention, and other components other than the block copolymer according to the present invention and the crosslinked product of the block copolymer according to the present invention.

The other component contained in the second composition is preferably at least one component selected from the group consisting of a hole transporting material, a hole injection material, an electron transporting material, an electron injection material, a light emitting material, an antioxidant and a solvent, and more preferably at least one component selected from the group consisting of a hole transporting material, a hole injection material, an electron transporting material, an electron injection material, a light emitting material and an antioxidant. The hole transporting material, the hole injection material, the electron transporting material, the electron injection material and the light emitting material herein referred to are different from the block copolymer according to the present invention and the crosslinked product of the block copolymer according to the present invention.

In the second composition, the block copolymer according to the present invention and the crosslinked product of the block copolymer according to the present invention may each be contained only singly or in combination of two or more.

Examples and preferable ranges of the hole transporting material, the electron transporting material, the hole injection material, the electron injection material and the light emitting material contained in the second composition are the same as the examples and preferable examples of the hole transporting material, the electron transporting material, the hole injection material, the electron injection material and the light emitting material contained in the first composition.

In the second composition, the content of each of the hole transporting material, the electron transporting material, the hole injection material, the electron injection material and the light emitting material is usually 1 to 400 parts by mass when the total amount of the block copolymer according to the present invention and the crosslinked product of the block copolymer according to the present invention is taken as 100 parts by mass.

The examples and preferable examples of the antioxidant contained in the second composition are the same as the examples and preferable examples of the antioxidant contained in the first composition. In the second composition, the content of the antioxidant is usually 0.001 parts by mass or more and 10 parts by mass or less when the total amount of the block copolymer according to the present invention and the crosslinked product of the block copolymer according to the present invention is taken as 100 parts by mass.

[Second Ink]

The composition containing the block copolymer according to the present invention and a solvent (hereinafter, also referred to as "second ink") can be suitably used for the wet method described in the section of the first ink. The preferable examples of the viscosity of the second ink are the same as the preferable examples of the viscosity of the first ink. Examples and preferable examples of the solvent contained in the second ink are the same as the examples and preferable examples of the solvent contained in the first ink.

When the second organic layer contains a crosslinked product of the block copolymer according to the present invention, the second organic layer containing a crosslinked product of the block copolymer according to the present invention can be formed by crosslinking the crosslinkable group contained in the block copolymer according to the present invention by the above-described conditions, methods and the like using a composition containing the block copolymer containing a crosslinkable group according to the present invention, and a solvent (hereinafter, also referred to as "2'-nd ink").

In the second ink, the content of the solvent is usually 1000 to 100000 parts by mass, and preferably 2000 to 20000 parts by mass when the amount of the block copolymer according to the present invention is taken as 100 parts by mass. In the 2'-nd ink, the content of the solvent is usually 1000 to 100000 parts by mass, preferably 2000 to 20000 parts by mass when the amount of the block copolymer according to the present invention containing a crosslinkable group is taken as 100 parts by mass.

The second and 2'-nd inks can further contain at least one component selected from the group consisting of the hole transporting material, the hole injection material, the electron transporting material, the electron injection material, the light emitting material and the antioxidant described above.

[Layer Constitution of Light Emitting Device]

The light emitting device according to the present invention is a light emitting device having an anode, a cathode, and a first organic layer and a second organic layer provided between the anode and the cathode, and, from the standpoint of improving the luminance life of the light emitting device according to the present invention, preferably a layer in which the second organic layer is provided between the anode and the first organic layer.

FIG. 1 shows a schematic cross-sectional view of a light emitting device according to one embodiment of the present invention. The light emitting device 10 has an electrode 11, an electrode 14, and a first organic layer 13 and a second organic layer 12 provided between the electrode 11 and the electrode 14.

The light emitting device 10 may have layers other than the electrode 11, the electrode 14, the first organic layer 13, and the second organic layer 12.

In the light emitting device 10, one of the electrode 11 and the electrode 14 is an anode and the other is a cathode. In the light emitting device 10, it is preferable that the electrode 11 is an anode and the electrode 14 is a cathode, from the standpoint of improving the luminance life of the light emitting device according to the present invention.

In the light emitting device 10, the first organic layer 13 is usually a light emitting layer (hereinafter, also referred to as "first light emitting layer").

In the light emitting device 10, when the electrode 11 is an anode, the second organic layer 12 is usually a hole transporting layer or a second light emitting layer, preferably a hole transporting layer.

In the light emitting device 10, when the electrode 11 is a cathode, the second organic layer 12 is an electron transporting layer or a second light emitting layer, and preferably an electron transporting layer.

In the light emitting device 10, the first organic layer 13 and the second organic layer 12 are preferably arranged adjacent to each other from the standpoint of improving the luminance life of the light emitting device according to the present invention.

In the light emitting device 10, the second organic layer 12 is more preferably a hole transporting layer or a second light emitting layer provided between the electrode 11 and the first organic layer 13, and further preferably a hole transporting layer provided between the electrode 11 and the first organic layer 13, from the standpoint of improving the luminance life of the light emitting device according to the present invention. In this case, the electrode 11 is an anode.

In the light emitting device 10, when the electrode 11 is an anode and the second organic layer 12 is a hole transporting layer provided between the electrode 11 and the first organic layer 13, it is preferable that a hole injection layer is further contained between the electrode 11 and the second organic layer 12, from the standpoint of improving the luminance life of the light emitting device according to the present invention. In contrast, when the electrode 11 is an anode and the second organic layer 12 is a hole transporting layer provided between the electrode 11 and the first organic layer 13, it is preferable that at least one of an electron injection layer and the electron transporting layer is further contained between the electrode 14 and the first organic layer 13, from the standpoint of improving the luminance life of the light emitting device according to the present invention.

In the light emitting device 10, when the electrode 11 is an anode and the second organic layer 12 is a second light emitting layer provided between the electrode 11 and the first organic layer 13, it is preferable that at least one of a hole injection layer and a hole transporting layer is further contained between the electrode 11 and the second organic layer 12, from the standpoint of improving the luminance life of the light emitting device according to the present invention. In contrast, when the electrode 11 is an anode and the second organic layer 12 is a second light emitting layer provided between the electrode 11 and the first organic layer 13, it is preferable that at least one of an electron injection layer and an electron transporting layer is further contained between the electrode 14 and the first organic layer 13, from the standpoint of improving the luminance life of the light emitting device according to the present invention.

In the light emitting device 10, when the electrode 11 is a cathode and the second organic layer 12 is an electron transporting layer provided between the electrode 11 and the first organic layer 13, it is preferable that at least one of a hole injection layer and a hole transporting layer is further contained between the electrode 14 and the first organic layer 13, from the standpoint of improving the luminance life of the light emitting device according to the present invention. In contrast, when the electrode 11 is a cathode and the second organic layer 12 is an electron transporting layer provided between the electrode 11 and the first organic layer 13, it is preferable that an electron injection layer is further contained between the electrode 11 and the second organic layer 12, from the standpoint of improving the luminance life of the light emitting device according to the present invention.

In the light emitting device 10, when the electrode 11 is a cathode and the second organic layer 12 is a second light emitting layer provided between the electrode 11 and the first organic layer 13, it is preferable that at least one of a hole injection layer and a hole transporting layer is further contained between the electrode 14 and the first organic layer 13, from the standpoint of improving the luminance life of the light emitting device according to the present invention. In contrast, when the electrode 11 is a cathode and the second organic layer 12 is a second light emitting layer provided between the electrode 11 and the first organic layer 13, it is preferable that at least one of an electron injection layer and an electron transporting layer is further contained between the electrode 11 and the second organic layer 12, from the standpoint of improving the luminance life of the light emitting device according to the present invention.

The specific layer constitution of the light emitting device according to the present invention includes, for example, layer constitutions represented by (D1) to (D15). The light emitting device according to the present invention usually has a substrate, and lamination may be performed on the substrate first from the anode, or may be performed on the substrate first from the cathode.

(D1) Anode/second light emitting layer (second organic layer)/first light emitting layer (first organic layer)/cathode (D2) Anode/hole transporting layer (second organic layer)/first light emitting layer (first organic layer)/cathode (D3) Anode/hole injection layer/second light emitting layer (second organic layer)/first light emitting layer (first organic layer)/cathode (D4) Anode/hole injection layer/second light emitting layer (second organic layer)/first light emitting layer (first organic layer)/electron transporting layer/cathode (D5) Anode/hole injection layer/second light emitting layer (second organic layer)/first light emitting layer (first organic layer)/electron injection layer/cathode (D6) Anode/hole injection layer/second light emitting layer (second organic layer)/first light emitting layer (first organic layer)/electron transporting layer/electron injection layer/cathode (D7) Anode/hole injection layer/hole transporting layer (second organic layer)/first light emitting layer (first organic layer)/cathode (D8) Anode/hole injection layer/hole transporting layer (second organic layer)/first light emitting layer (first organic layer)/electron transporting layer/cathode (D9) Anode/hole injection layer/hole transporting layer (second organic layer)/first light emitting layer (first organic layer)/electron injection layer/cathode (D10) Anode/hole injection layer/hole transporting layer (second organic layer)/first light emitting layer (first organic layer)/electron transporting layer/electron injection layer/cathode (D11) Anode/hole injection layer/hole transporting layer/second light emitting layer (second organic layer)/first light emitting layer (first organic layer)/electron transporting layer/electron injection layer/cathode (D12) Anode/hole injection layer/hole transporting layer (second organic layer)/first light emitting layer (first organic layer)/second light emitting layer/electron transporting layer/electron injection layer/cathode (D13) Anode/hole injection layer/hole transporting layer (second organic layer)/second light emitting layer/first light emitting layer (first organic layer)/electron transporting layer/electron injection layer/cathode (D14) Anode/hole injection layer/hole transporting layer/first light emitting layer (first organic layer)/electron transporting layer (second organic layer)/electron injection layer/cathode (D15) Anode/hole injection layer/hole transporting layer/first light emitting layer (first organic layer)/second light emitting layer (second organic layer)/electron transporting layer/electron injection layer/cathode In (D1) to (D15), "/" means that the layers before and after that are adjacently laminated. For example, "second light emitting layer (second organic layer)/first light emitting layer (first organic layer)" means that the second light emitting layer (second organic layer) and the first light emitting layer (first organic layer) are laminated adjacently.

From the standpoint of improving the luminance life of the light emitting device according to the present invention, layer constitutions represented by (D3) to (D12) are preferable, and layer constitutions represented by (D7) to (D10) are more preferable.

In the light emitting device according to the present invention, two or more layers of each of the anode, the hole injection layer, the hole transporting layer, the second light emitting layer, the electron transporting layer, the electron injection layer and the cathode may be provided, if necessary.

When a plurality of anodes, hole injection layers, hole transporting layers, second light emitting layers, electron transporting layers, electron injection layers and cathodes are present, they may be the same or different at each occurrence.

The thickness of each of the anode, the hole injection layer, the hole transporting layer, the first light emitting layer, the second light emitting layer, the electron transporting layer, the electron injection layer and the cathode is usually 1 nm or more and 1 µm or less, preferably 2 nm or more and 500 nm or less, and more preferably 5 nm or more and 150 nm or less.

In the light emitting device according to the present invention, the order, the number and the thickness of the layers to be laminated may be adjusted in consideration of the light emission efficiency, the driving voltage and the device life of the light emitting device.

[Second Light Emitting Layer]

The second light emitting layer is usually a layer containing a second organic layer or a light emitting material, and preferably a layer containing a light emitting material. When the second light emitting layer is a layer containing a light emitting material, the light emitting material contained in the second light emitting layer includes, for example, light emitting materials which the phosphorescent compound and the first composition described above may contain. The phosphorescent compound and the light emitting material contained in the second light emitting layer may be contained each singly or in combination of two or more.

When the light emitting device according to the present invention has a second light emitting layer and the hole transporting layer described later is not a second organic layer, it is preferable that the second light emitting layer is the second organic layer.

[Hole Transporting Layer]

The hole transporting layer is usually a layer containing a second organic layer or a hole transporting material, and preferably a second organic layer. When the hole transporting layer is a layer containing a hole transporting material, the hole transporting material includes, for example, hole transporting materials which the first composition described above may contain. The hole transporting material contained in the hole transporting layer may be contained singly or in combination of two or more.

When the light emitting device according to the present invention has a hole transporting layer and the above-described second light emitting layer is not a second organic layer, it is preferable that the hole transporting layer is the second organic layer.

[Electron Transporting Layer]

The electron transporting layer is usually a layer containing a second organic layer or an electron transporting material, preferably a layer containing an electron transporting material. When the electron transporting layer is a layer containing an electron transporting material, the electron transporting material contained in the electron transporting layer includes, for example, electron transporting materials which the first composition described above may contain. The electron transporting material contained in the electron transporting layer may be contained singly or in combination of two or more.

[Hole Injection Layer and Electron Injection Layer]

The hole injection layer is a layer containing a hole injection material. The hole injection material contained in the hole injection layer includes, for example, hole injection materials which the first composition described above may contain. The hole injection material contained in the hole injection layer may be contained singly or in combination of two or more.

The electron injection layer is a layer containing an electron injection material. The electron injection material contained in the electron injection layer includes, for example, electron injection materials which the first composition described above may contain. The electron injection material contained in the electron injection layer may be contained singly or in combination of two or more.

[Substrate/Electrode]

The substrate in the light emitting device may be a substrate that can form an electrode and does not chemically change when forming the organic layer, and is a substrate made of a material such as, for example, glass, plastic, silicon and the like. When an opaque substrate is used, it is preferable that the electrode farthest from the substrate is transparent or semitransparent.

The material for the anode includes, for example, conductive metal oxides and semitransparent metals, preferably, indium oxide, zinc oxide, tin oxide; conductive compounds such as indium·tin·oxide (ITO), indium·zinc·oxide, and the like; a complex of argentine, palladium and copper (APC); NESA, gold, platinum, silver, and copper.

The material of the cathode includes, for example, metals such as lithium, sodium, potassium, rubidium, cesium, beryllium, magnesium, calcium, strontium, barium, aluminum, zinc, indium and the like; alloys composed of two or more metals selected from the above metal group; alloys composed of one or more metals selected from the above metal group and one or more metals selected from the group consisting of silver, copper, manganese, titanium, cobalt, nickel, tungsten and tin; and graphite and graphite intercalation compounds.

The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The anode and the cathode each may take a laminated structure composed of two or more layers.

In the light emitting device according to the present invention, at least one of the anode and the cathode is usually transparent or semitransparent, but it is preferable that the anode is transparent or semitransparent.

The method for forming the anode and the cathode includes, for example, a vacuum vapor deposition method, a sputtering method, an ion plating method, a plating method and a laminating method.

[Production Method of Light Emitting Device]

The method of forming each layer such as a first light emitting layer, a second light emitting layer, a hole transporting layer, an electron transporting layer, a hole injection layer, an electron injection layer and the like in the light emitting device according to the present invention includes, for example, a vacuum vapor deposition method from a powder, and a method by film formation from a solution or melted state when a low molecular weight compound is used, and for example, a method by film formation from a solution or melted state when a polymer compound is used.

The first light emitting layer, the second light emitting layer, the hole transporting layer, the electron transporting layer, the hole injection layer and the electron injection layer can be formed by a wet method using inks containing the first ink, the second ink, the 2'-nd ink, and the light emitting material, the hole transporting material, the electron transporting material, the hole injection material and the electron injection material described above, respectively.

[Application of Light Emitting Device]

In order to obtain planar light emission using a light emitting device, a planar anode and a planar cathode are arranged so that they overlap with each other.

In order to obtain a patterned light emission, there are a method of providing a mask with a patterned window on the surface of a planar light emitting device, a method of forming a layer to be a non-light emitting portion with an extremely large thickness to make it substantially non-luminescent, and a method of forming an anode or a cathode, or both electrodes in a pattern.

By forming a pattern by any of the above-mentioned methods and arranging some electrodes so that they can be turned ON/OFF independently, a segment type display device capable of displaying numbers, characters and the like can be obtained.

In order to obtain a dot matrix display device, both the anode and the cathode may be formed in stripes and arranged so as to be orthogonal to each other.

Partial color display and multi-color display become possible by a method of separately coating a plurality of types of polymer compounds having different emission colors or a method of using a color filter or a fluorescence conversion filter.

The dot matrix display device can be passively driven or can be actively driven in combination with TFT or the like. These display devices can be used for displays of computers, televisions, mobile terminals and the like.

The planar light emitting device can be suitably used as a planar light source for a backlight of a liquid crystal display device or a planar light source for illumination. If a flexible substrate is used, it can be used as a curved light source and a curved display device.

EXAMPLES

Hereinafter, the present invention will be described in more detail with reference to examples, but the present invention is not limited to these examples.

In the examples, the polystyrene-equivalent number-average molecular weight (Mn) and the polystyrene-equivalent weight-average molecular weight (Mw) of the polymer compound and its intermediate were determined by the following size exclusion chromatography (SEC) using tetrahydrofuran as the mobile phase.

The polymer compound to be measured or its intermediate was dissolved in tetrahydrofuran at a concentration of about 0.05% by mass, and 10 µL of the solution was injected into SEC. The mobile phase was run at a flow rate of 1.0 mL/min. PLgel MIXED-B (manufactured by Polymer Laboratories Ltd.) was used as a column. A UV-VIS detector (manufactured by Tosoh Corporation, trade name: UV-8320GPC) was used as a detector.

In the present example, the molecular weight of the constitutional unit in the polymer compound was calculated using the value of Molecular Weight of ChemDraw Pro 13.0 (manufactured by HULINKS INC.).

<Synthesis Examples M1 to M25 and HM-1>
Synthesis and Acquisition of Compounds M1 to M25 and HM-1

The compound M1 was synthesized according to a method described in JP-A No. 2011-174062.

The compound M2 was synthesized according to a method described in WO 2005/049546.

The compound M3, the compound M7 and the compound M15 were synthesized according to a method described in WO 2002/045184.

As the compound M4 and the compound M21, commercially available products were used.

The compound M5 was synthesized according to a method described in JP-A No. 2008-106241.

The compounds M6 and M17 to M19 were synthesized according to a method described in JP-A No. 2010-189630.

The compound M8 was synthesized according to a method described in JP-A No. 2010-215886.

The compound M9 was synthesized according to a method described in WO 2011/049421.

The compound M10 was synthesized according to a method described in WO 2015/145871.

The compound M11 was synthesized according to a method described in WO 2009/157424.

The compound M12 was synthesized according to a method described in WO 2016/047536.

The compound M13 was synthesized according to a method described in WO 2013/191088.

The compound M14 and M20 were synthesized according to a method described in WO 2012/086671.

The compound M16 was synthesized according to a method described in JP-A No. 2003-226744.

The compound M22 was synthesized according to a method described in JP-A No. 2012-144722.

The compound M23 was synthesized according to a method described in JP-A No. 2004-143419.

The compound M24 was synthesized according to a method described in WO 2004/060970.

The compound M25 was synthesized according to a method described in JP-A No. 2012-33845.

The compound HM-1 was purchased from Luminescence Technology.

[Chemical Formula 97]
compound M1
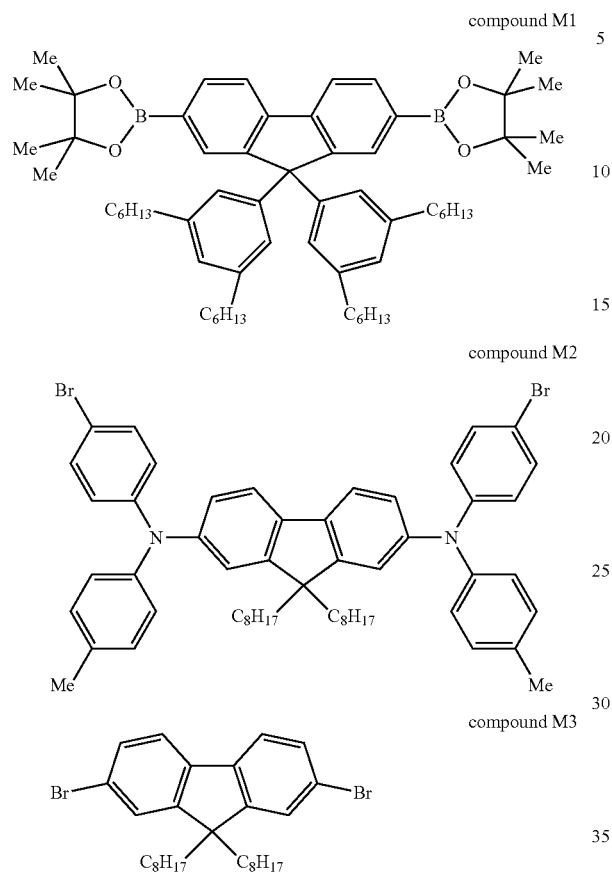
compound M2
compound M3
compound M4
[Chemical Formula 98]
compound M5
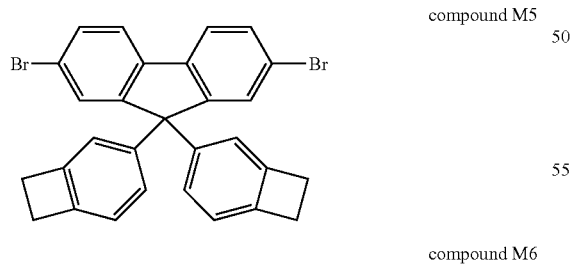
compound M6
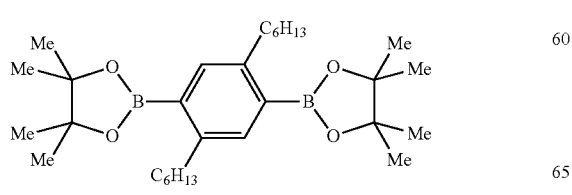
compound M7
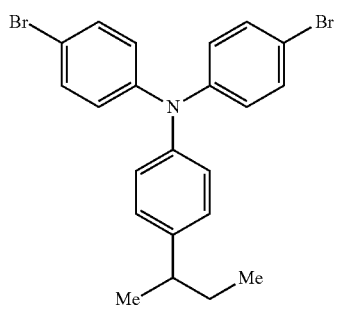
compound M8
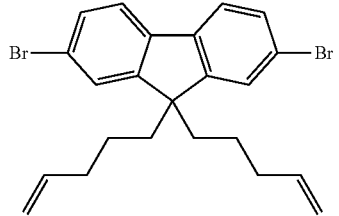
[Chemical Formula 99]
compound M9
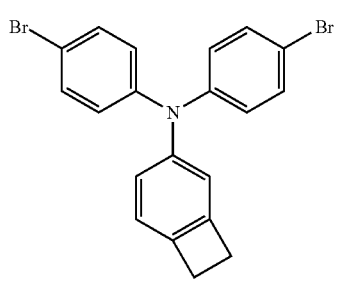
compound M10
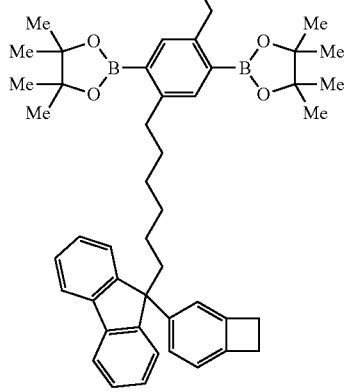

compound M11
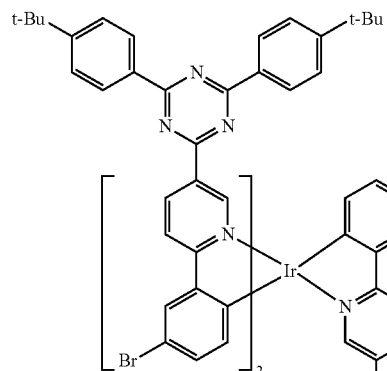
compound M13
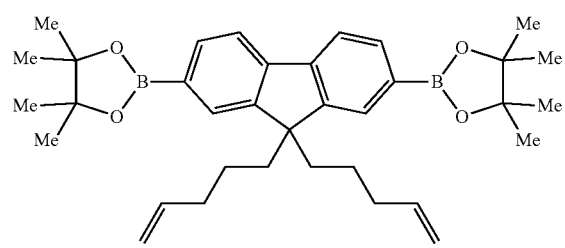
compound M12
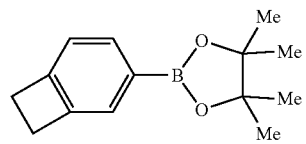
[Chemical Formula 100]
compound M14
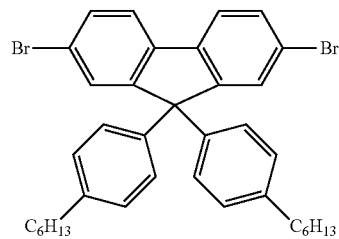
compound M15
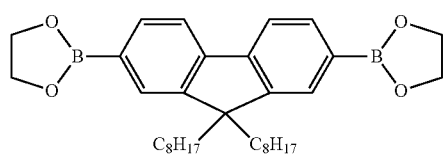
compound M16
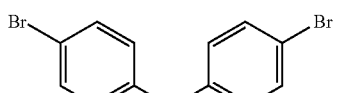
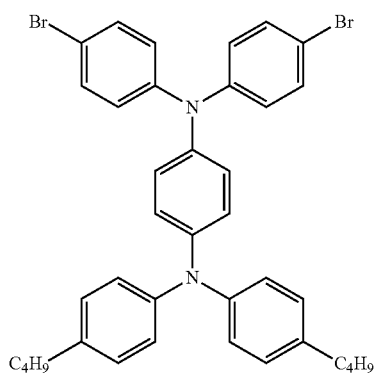
compound M17
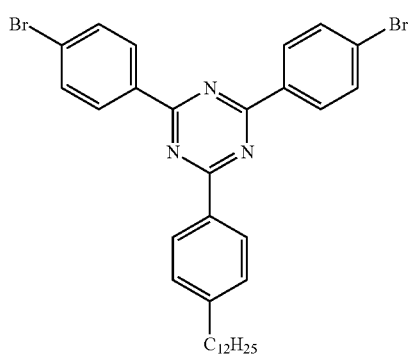
[Chemical Formula 101]
compound M18
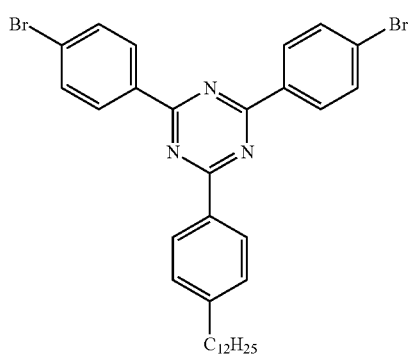
compound M19
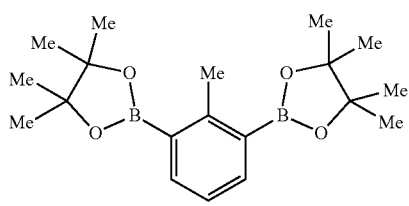
compound M20
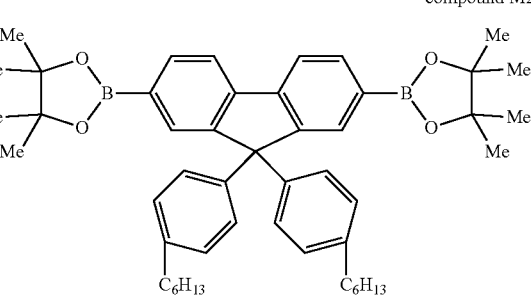

[Chemical Formula 102]

compound M21
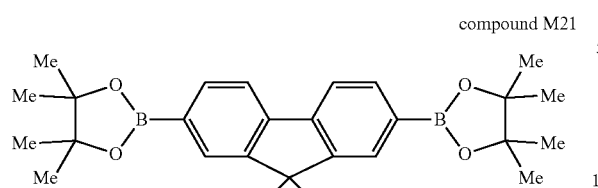

compound M22
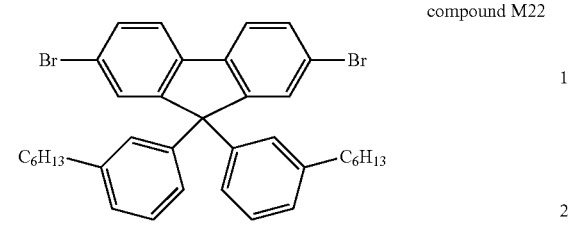

compound M23
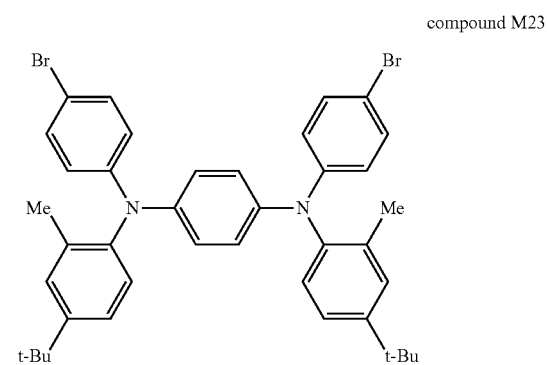

compound M24
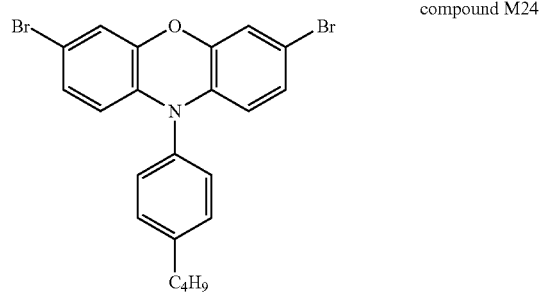

[Chemical Formula 103]

compound M25
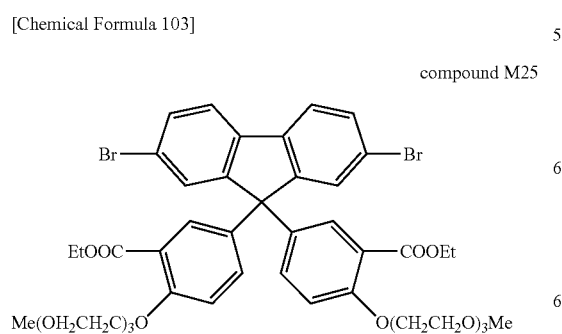

compound HM-1
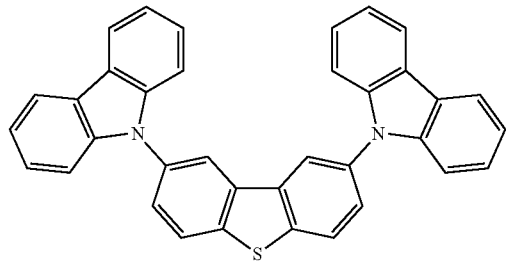

<Synthesis Examples B1, G1, R1 and R2>
Synthesis of Phosphorescent Compounds B1, G1, R1 and R2

The phosphorescent compound B1 was synthesized according to a method described in WO 2006/121811.

The phosphorescent compound G1 was synthesized according to a method described in WO 2009/131255.

The phosphorescent compound R1 was synthesized according to a method described in JP-A No. 2006-188673.

The phosphorescent compound R2 was synthesized according to a method described in JP-A No. 2008-179617.

The phosphorescent compounds B1, G1, R1 and R2 are represented by the following chemical formulae.

[Chemical Formula 104]

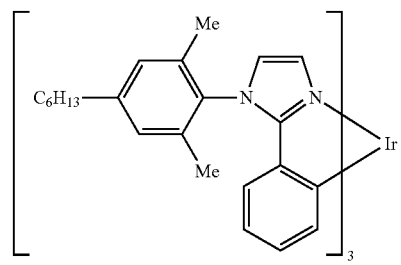

phosphorescent compound B1

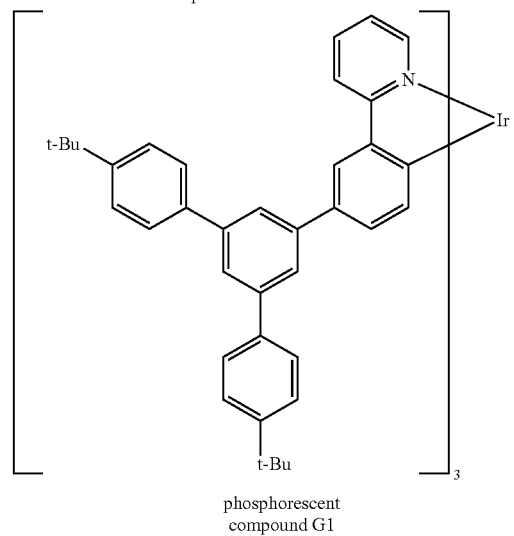

phosphorescent compound G1

-continued

[Chemical Formula 105]

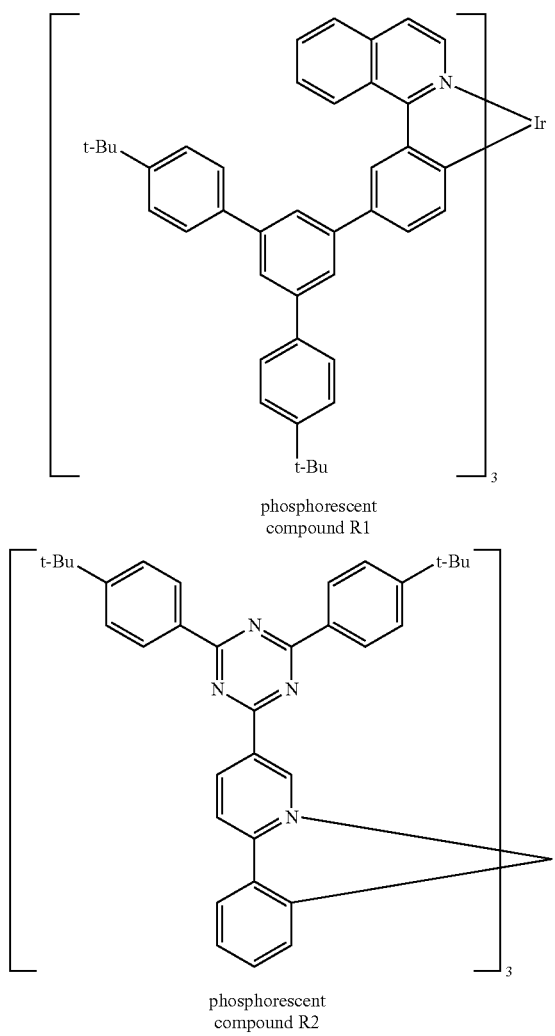

phosphorescent compound R1 phosphorescent compound R2

<Synthesis Example HTL-1> Synthesis of Block Copolymer HTL-1

(1) Formation of Non-Terminal Block

An inert gas atmosphere was prepared in the reaction vessel, then, a mixture HTL-1a [compound M1 (2.39 g), compound M2 (1.81 g) and compound M3 (91.4 mg)] shown in Table 2 below and toluene (23 mL) were added and the mixture was heated at 80° C. To this were added bis(tris-o-methoxyphenylphosphine)palladium (II) dichloride (1.9 mg) and a 20% by mass tetraethylammonium hydroxide aqueous solution (23.4 g), then, the mixture was heated at 100° C. and stirred under reflux for 2.5 hours, to form a non-terminal block.

The polymer compound (non-terminal block) present in the reaction liquid had an Mn of $7.6 \times 10^3$ and an Mw of $1.7 \times 10^4$.

(2) Formation of Terminal Block

To the reaction liquid obtained in the above-described (1) were added a mixture HTL-1b [compound M1 (0.45 g), compound M4 (0.22 g) and compound M5 (0.26 g)] shown in Table 2 below and toluene (22 mL) and a 20% by mass tetraethylammonium hydroxide aqueous solution (26.6 g), and the mixture was heated at 80° C. To this was added bis(tris-o-methoxyphenylphosphine)palladium (II) dichloride (1.0 mg), then, the mixture was heated at 100° C. and stirred under reflux for 4.5 hours, thereby binding the terminal block to the non-terminal block, to form a terminal block.

(3) Formation of End Group

To the reaction liquid obtained in the above-described (2) was added phenylboronic acid (160 mg) which is an end-capping agent, then, the mixture was heated at 100° C. and stirred under reflux for 16 hours, thereby introducing the end group into the terminal block, to form an end group.

(4) Post Treatment

The reaction liquid obtained in the above-described (3) was cooled to room temperature, the aqueous layer was removed, then, washed once with 10% by mass hydrochloric acid, once with a 3% by mass aqueous ammonia solution, and once with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a block copolymer HTL-1 (3.2 g).

The block copolymer HTL-1 had an Mn of $4.9 \times 10^4$ and an Mw of $1.4 \times 10^5$.

TABLE 2

| mixture | HTL-1a | | | HTL-1b | | |
|---|---|---|---|---|---|---|
| compound | M1 | M2 | M3 | M1 | M4 | M5 |
| molar ratio [% by mol] | 40 | 30 | 2.5 | 10 | 10 | 7.5 |

The block copolymer HTL-1 is a block copolymer having a non-terminal block containing a constitutional unit derived from the compound M1, a constitutional unit derived from the compound M2 and a constitutional unit derived from the compound M3 at a molar ratio of 40:30:2.5, having a terminal block containing a constitutional unit derived from the compound M1, a constitutional unit derived from the compound M4 and a constitutional unit derived from the compound M5 at a molar ratio of 10:10:7.5, and having a phenyl group as an end group, according to the theoretical values determined from the amounts of the charging raw materials.

The block copolymer HTL-1 contains an end group, a terminal block, a non-terminal block, a terminal block and an end group in this order. The block copolymer HTL-1 satisfies the above-described formulae (i) and (iii).

<Synthesis Example HTL-2> Synthesis of Block Copolymer HTL-2

The block copolymer HTL-2 was synthesized according to a method described in JP-A No. 2012-144722 using a mixture HTL-2a (compound M1, compound M2, compound M3 and compound M5) and a mixture HTL-2b (compound M1 and compound M4) shown in Table 3.

In the synthesis of the block copolymer HTL-2, the non-terminal block had an Mn of $4.1 \times 10^4$ and an Mw of $1.2 \times 10^5$.

The block copolymer HTL-2 had an Mn of $5.4 \times 10^4$ and an Mw of $1.8 \times 10^5$.

TABLE 3

| mixture | HTL-2a | | | | HTL-2b | |
|---|---|---|---|---|---|---|
| compound | M1 | M2 | M3 | M5 | M1 | M4 |
| molar ratio [% by mol] | 40 | 30 | 2.5 | 7.5 | 10 | 10 |

The block copolymer HTL-2 is a block copolymer having a non-terminal block containing a constitutional unit derived from the compound M1, a constitutional unit derived from the compound M2, a constitutional unit derived from the compound M3 and a constitutional unit derived from the compound M5 at a molar ratio of 40:30:2.5:7.5, having a terminal block containing a constitutional unit derived from the compound M1 and a constitutional unit derived from the compound M4 at a molar ratio of 10:10, and having a phenyl group as an end group, according to the theoretical values determined from the amounts of the charging raw materials.

The block copolymer HTL-2 contains an end group, a terminal block, a non-terminal block, a terminal block and an end group in this order. The block copolymer HTL-2 satisfies the above-described formulae (i) and (iii).

<Synthesis Example HTL-3> Synthesis of Block Copolymer HTL-3

(1) Formation of Non-Terminal Block

An inert gas atmosphere was prepared in the reaction vessel, then, a mixture HTL-3a [compound M6 (1.46 g) and compound M7 (1.20 g)] shown in Table 4 below, bis(tris-o-methoxyphenylphosphine)palladium(II) dichloride (2.3 mg) and toluene (30 mL) were added, and the mixture was heated at 80° C. To this was added a 16% by mass tetramethylammonium hydroxide aqueous solution (20.6 g), then, the mixture was stirred at 100° C. for 2.5 hours, to form a non-terminal block.

The polymer compound (non-terminal block) present in the reaction liquid had an Mn of $8.4 \times 10^3$ and an Mw of $1.8 \times 10^4$.

(2) Formation of Terminal Block

To the reaction liquid obtained in the above-described (1) were added a mixture HTL-3b [compound M6 (0.146 g), compound M5 (0.174 g) and compound M8 (0.150 g)] shown in Table 4 below, bis(tris-o-methoxyphenylphosphine)palladium (II) dichloride (0.57 mg) and toluene (10 mL), and the mixture was stirred at 100° C. for 4.5 hours, thereby binding the terminal block to the non-terminal block, to form a terminal block.

(3) Formation of End Group

To the reaction liquid obtained in the above-described (2) were added phenylboronic acid (160 mg) which is an end-capping agent and bis(tris-o-methoxyphenylphosphine)palladium(II) dichloride (2.9 mg), then, the mixture was heated at 100° C. and stirred under reflux for 16 hours, thereby introducing the end group into the terminal block, to form an end group.

(4) Post Treatment

The reaction liquid obtained in the above-described (3) was cooled to room temperature, the aqueous layer was removed, and washed once with 10% by mass hydrochloric acid, once with a 3% by mass aqueous ammonia solution, and once with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a block copolymer HTL-3 (0.81 g).

The block copolymer HTL-3 had an Mn of $5.5 \times 10^4$ and an Mw of $3.7 \times 10^5$.

TABLE 4

| mixture | HTL-3a | | HTL-3b | | |
|---|---|---|---|---|---|
| compound | M6 | M7 | M6 | M5 | M8 |
| molar ratio [% by mol] | 45 | 40 | 5 | 5 | 5 |

The block copolymer HTL-3 is a block copolymer having a non-terminal block containing a constitutional unit derived from the compound M6 and a constitutional unit derived from the compound M7 at a molar ratio of 45:40, having a terminal block containing a constitutional unit derived from compound M6, a constitutional unit derived from compound M5 and a constitutional unit derived from compound M8 at a molar ratio of 5:5:5, and having a phenyl group as an end group, according to the theoretical values determined from the amounts of the charging raw materials.

The block copolymer HTL-3 contains an end group, a terminal block, a non-terminal block, a terminal block and an end group in this order. The block copolymer HTL-3 satisfies the above-described formulae (i) and (iii).

<Synthesis Example HTL-4> Synthesis of Block Copolymer HTL-4

(1) Formation of Non-Terminal Block

An inert gas atmosphere was prepared in the reaction vessel, then, a mixture HTL-4a [compound M1 (2.08 g) and compound M2 (1.75 g)] shown in Table 5 below, bis(tris-o-methoxyphenylphosphine)palladium(II) dichloride (0.17 mg) and toluene (35 mL) were added, and the mixture was heated at 80° C. To this was added a 20% by mass tetraethylammonium hydroxide aqueous solution (23.4 g), then, the mixture was stirred at 100° C. for 2.5 hours, to form a non-terminal block.

The polymer compound (non-terminal block) present in the reaction liquid had an Mn of $7.4 \times 10^3$ and an Mw of $1.7 \times 10^4$.

(2) Formation of Terminal Block

To the reaction liquid obtained in the above-described (1) were added a mixture HTL-4b [compound M1 (1.35 g), compound M9 (0.328 g) and compound M2 (1.05 g)] shown in Table 5 below, bis(tris-o-methoxyphenylphosphine)palladium(II) dichloride (0.17 mg), a 20% by mass tetraethylammonium hydroxide aqueous solution (26.6 g) and toluene (40 mL), and the mixture was stirred at 100° C. for 4.5 hours, thereby binding the terminal block to the non-terminal block, to form a terminal block.

(3) Formation of End Group

To the reaction liquid obtained in the above-described (2) were added M12 (352 mg) which is an end-capping agent and bis(tris-o-methoxyphenylphosphine)palladium(II) dichloride (0.16 mg), then, the mixture was heated at 100° C. and stirred under reflux for 16 hours, thereby introducing the end group into the terminal block, to form an end group.

(4) Post Treatment

The reaction liquid obtained in the above-described (3) was cooled to room temperature, the aqueous layer was removed, and washed once with 10% by mass hydrochloric acid, once with a 3% by mass aqueous ammonia solution, and once with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a block copolymer HTL-4 (4.47 g).

The block copolymer HTL-4 had an Mn of $3.3 \times 10^4$ and an Mw of $1.6 \times 10^5$.

TABLE 5

| mixture | HTL-4a | | HTL-4b | | |
|---|---|---|---|---|---|
| compound | M1 | M2 | M1 | M9 | M2 |
| molar ratio (% by mol) | 30 | 25 | 20 | 10 | 15 |

The block copolymer HTL-4 is a block copolymer having a non-terminal block containing a constitutional unit derived from the compound M1 and a constitutional unit derived from the compound M2 at a molar ratio of 30:25, having a terminal block containing a constitutional unit derived from the compound M1, a constitutional unit derived from the compound M9 and a constitutional unit derived from the compound M2 at a molar ratio of 20:10:15, and having a crosslinkable group derived from the compound M12 as an end group, according to the theoretical values determined from the amounts of the charging raw materials.

The block copolymer HTL-4 contains an end group, a terminal block, a non-terminal block, a terminal block and an end group in this order. The block copolymer HTL-4 satisfies the above-described formulae (i) and (iii).

<Synthesis Example HTL-5> Synthesis of Block Copolymer HTL-(1) Formation of Non-Terminal Block An inert gas atmosphere was prepared in the reaction vessel, then, a mixture HTL-5a [compound M1 (0.407 g), compound M10 (1.39 g), and compound M2 (1.37 g)] shown in Table 6 below, bis(tris-o-methoxyphenylphosphine)palladium (II) dichloride (0.29 mg) and toluene (23 mL) were added, and the mixture was heated at 80° C. To this was added a 20% by mass tetraethylammonium hydroxide aqueous solution (15.4 g), then, the mixture was stirred at 100° C. for 2.5 hours, to form a non-terminal block.

The polymer compound (non-terminal block) present in the reaction liquid had an Mn of $6.6 \times 10^3$ and an Mw of $1.8 \times 10^4$.

(2) Formation of Terminal Block

To the reaction liquid obtained in the above-described (1) were added a mixture HTL-5b [compound M13 (0.241 g), compound M2 (0.556 g) and compound M11 (0.248 g)] shown in Table 6 below, bis(tris-o-methoxyphenylphosphine)palladium(II) dichloride (0.33 mg), a 20% by mass tetraethylammonium hydroxide aqueous solution (14.5 g) and toluene (29 mL), and the mixture was stirred at 100° C. for 4.5 hours, thereby binding the terminal block to the non-terminal block, to form a terminal block.

(3) Formation of End Group

To the reaction liquid obtained in the above-described (2) were added phenylboronic acid (109 mg) which is an end capping agent and bis(tris-o-methoxyphenylphosphine)palladium(II) dichloride (0.07 mg), and the mixture was heated at 100° C. and stirred under reflux for 16 hours, thereby introducing the end group into the terminal block, to form an end group.

(4) Post Treatment

The reaction liquid obtained in the above-described (3) was cooled to room temperature, the aqueous layer was removed, then, washed once with 10% by mass hydrochloric acid, once with a 3% by mass aqueous ammonia solution, and once with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a block copolymer HTL-5 (2.72 g).

The block copolymer HTL-5 had an Mn of $3.2 \times 10^4$ and an Mw of $1.6 \times 10^5$.

TABLE 6

| mixture | HTL-5a | | | HTL-5b | | |
|---|---|---|---|---|---|---|
| compound | M1 | M10 | M2 | M13 | M2 | M11 |
| molar ratio (% by mol) | 10 | 30 | 33.4 | 10 | 13.6 | 3 |

The block copolymer HTL-5 is a block copolymer having a non-terminal block containing a constitutional unit derived from the compound M1, a constitutional unit derived from the compound M10 and a constitutional unit derived from the compound M2 at a molar ratio of 10:30:33.4, having a terminal block containing a constitutional unit derived from the compound M13, a constitutional unit derived from the compound M2 and a constitutional unit derived from the compound M11 at a molar ratio of 10:13.6:3, and having a phenyl group as an end group, according to the theoretical values determined from the amounts of the charging raw materials. The block copolymer HTL-5 contains an end group, a terminal block, a non-terminal block, a terminal block and an end group in this order. The block copolymer HTL-5 satisfies the above-described formulae (i) and (iii).

<Synthesis Example HTL-C1> Synthesis of Polymer Compound HTL-C1

The polymer compound HTL-C1 was synthesized according to a method described in JP-A No. 2013-131995 using a mixture HTL-C1a (compound M15, compound M3, compound M16 and compound M9) shown in Table 7. The polymer compound HTL-C1 had an Mn of $7.8 \times 10^4$ and an Mw of $2.6 \times 10^5$.

TABLE 7

| mixture | HTL-C1a | | | |
|---|---|---|---|---|
| compound | M15 | M3 | M16 | M9 |
| molar ratio [% by mol] | 50 | 12.5 | 30 | 7.5 |

The polymer compound HTL-C1 is a random copolymer (a copolymer not having terminal block and non-terminal block) containing a constitutional unit derived from the compound M15, a constitutional unit derived from the compound M3, a constitutional unit derived from the compound M16 and a constitutional unit derived from the compound M9 at a molar ratio of 50:12.5:30:7.5, and has a phenyl group as an end group, according to the theoretical values determined from the amounts of the charging raw materials.

<Synthesis Example HTL-C2> Synthesis of Polymer Compound HTL-C2

(1) Synthesis of Polymer Compound HTL-C2

The polymer compound HTL-C2 was synthesized according to a method described in JP-A No. 2015-110751 using a mixture HTL-C2a (compound M6, compound M7, compound M5 and compound M8) shown in Table 8 below.

The polymer compound HTL-C2 had an Mn of $5.9 \times 10^4$ and an Mw of $1.8 \times 10^5$.

TABLE 8

| mixture | HTL-C2a | | | |
|---|---|---|---|---|
| compound | M6 | M7 | M5 | M8 |
| molar ratio [% by mol] | 50 | 40 | 5 | 5 |

The polymer compound HTL-C2 is a random copolymer (a copolymer not having terminal block and non-terminal block) containing a constitutional unit derived from the compound M6, a constitutional unit derived from the compound M7, a constitutional unit derived from the compound M5 and a constitutional unit derived from the compound M8 at a molar ratio of 50:40:5:5, and has a phenyl group as an end group, according to the theoretical values determined from the amounts of the charging raw materials.

<Synthesis Example HTL-C3> Synthesis of Block Copolymer HTL-C3

(1) Formation of Non-Terminal Block

An inert gas atmosphere was prepared in the reaction vessel, then, a mixture HTL-C3a [compound M1 (0.694 g) and compound M2 (1.05 g)] shown in Table 9 below, bis(tris-o-methoxyphenylphosphine)palladium (II) dichloride (0.10 mg) and toluene (35 mL) were added, and the mixture was heated at 80° C. To this was added a 20% by mass tetraethylammonium hydroxide aqueous solution (23.4 g), then, the mixture was stirred at 100° C. for 2.5 hours, to form a non-terminal block.

The polymer compound (non-terminal block) present in the reaction liquid had an Mn of $3.2 \times 10^3$ and an Mw of $7.8 \times 10^3$.

(2) Formation of Terminal Block

To the reaction liquid obtained in the above-described (1) were added a mixture HTL-C3b [compound M1 (2.38 g), compound M9 (0.328 g) and compound M2 (1.75 g)] shown in Table 9 below, bis(tris-o-methoxyphenylphosphine)palladium(II) dichloride (0.24 mg), a 20% by mass tetraethylammonium hydroxide aqueous solution (26.6 g) and toluene (40 mL), and the mixture was stirred at 100° C. for 4.5 hours, thereby binding the terminal block to the non-terminal block, to form a terminal block.

(3) Formation of End Group

To the reaction liquid obtained in the above-described (2) were added M12 (352 mg) which is an end-capping agent and bis(tris-o-methoxyphenylphosphine)palladium(II) dichloride (0.24 mg), and the mixture was heated at 100° C. and stirred under reflux for 16 hours, thereby introducing the end group into the terminal block, to form an end group.

(4) Post treatment

The reaction liquid obtained in the above-described (3) was cooled to room temperature, the aqueous layer was removed, then, washed once with 10% by mass hydrochloric acid, once with a 3% by mass aqueous ammonia solution, and once with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a block copolymer CP3 (4.55 g).

The block copolymer HTL-C3 had an Mn of $3.4 \times 10^4$ and an Mw of $1.3 \times 10^5$.

TABLE 9

| mixture | HTL-C3a | | HTL-C3b | | |
|---|---|---|---|---|---|
| compound | M1 | M2 | M1 | M9 | M2 |
| molar ratio (% by mol) | 10 | 15 | 40 | 10 | 25 |

The block copolymer HTL-C3 is a block copolymer having a non-terminal block containing a constitutional unit derived from the compound M1 and a constitutional unit derived from the compound M2 at a molar ratio of 10:15, having a terminal block containing a constitutional unit derived from the compound M1, a constitutional unit derived from the compound M9 and a constitutional unit derived from the compound M2 at a molar ratio of 40:10:25, and having a crosslinkable group derived from the compound M12 as an end group, according to the theoretical values determined from the amounts of the charging raw materials.

The block copolymer HTL-C3 does not satisfy the above-described formulae (i), (ii) and (iii).

<Synthesis Example HTL-C4> Synthesis of Block Copolymer HTL-C4

(1) Synthesis of block copolymer HTL-C4

The block copolymer HTL-C4 was synthesized according to a method described in JP-A No. 2016-111355 using a mixture HTL-C4a (compound M1, compound M2 and compound M11) shown in Table 10 below, and a mixture HTL-C4b (compound M10, compound M13 and compound M2) shown in Table 10 below.

In the synthesis of the block copolymer HTL-C4, the non-terminal block had an Mn of $2.8 \times 10^3$ and an Mw of $5.8 \times 10^3$. The block copolymer HTL-C4 had an Mn of $3.3 \times 10^4$ and an Mw of $1.7 \times 10^5$.

TABLE 10

| mixture | HTL-C4a | | | HTL-C4b | | |
|---|---|---|---|---|---|---|
| compound | M1 | M2 | M11 | M10 | M13 | M2 |
| molar ratio (% by mol) | 10 | 13.6 | 3 | 30 | 10 | 33.4 |

The block copolymer HTL-C4 is a block copolymer having a non-terminal block containing a constitutional unit derived from the compound M1, a constitutional unit derived from the compound M2, and a constitutional unit derived from the compound M11 at a molar ratio of 10:13.6:3, having a terminal block containing a constitutional unit derived from the compound M10, a constitutional unit derived from the compound M13, and a constitutional unit derived from the compound M2 at a molar ratio of 30:10:33.4, and having a phenyl group as an end group, according to the theoretical values determined from the amounts of the charging raw materials. The block copolymer CP4 contains an end group, a terminal block, a non-terminal block, a terminal block and an end group in this order. The block copolymer HTL-C4 does not satisfy the above-described formulae (i), (ii) and (iii).

<Synthesis Example HP-1> Synthesis of Polymer Compound HP-1

An inert gas atmosphere was prepared in the reaction vessel, then, a mixture HP-1a [compound M6 (1.04 g) and compound M17 (2.11 g)] shown in Table 11 below and toluene (170 g) were added, and the mixture was heated at 80° C. To this were added palladium acetate (0.77 mg), tris(2-methoxyphenyl)phosphine (4.7 mg) and a 20% by mass tetraethylammonium hydroxide aqueous solution (58 g), and the mixture was stirred under reflux for 3 hours, to obtain a reaction liquid.

The temperature of the resultant reaction liquid was adjusted to 55° C., then, a mixture HP-1b [compound M6 (7.00 g) and compound M14 (8.53 g)] shown in Table 11 below and toluene (39 g) were added, and the mixture was heated at 80° C. To this were added palladium acetate (1.5 mg) and tris(2-methoxyphenyl)phosphine (9.3 mg), then, the mixture was stirred under reflux for 6 hours, to obtain a reaction liquid. To this were added phenylboronic acid (0.81 g) which is an end capping agent, palladium acetate (1.9 mg), tris(2-methoxyphenyl)phosphine (12 mg), and a 20% by mass tetraethylammonium hydroxide aqueous solution (58 g), then, the mixture was stirred under reflux for 15 hours, to form an end group.

The temperature of the resultant reaction liquid was adjusted to 40° C., then, to this was added an aqueous sodium diethyldithiocarbamate solution, and the mixture was stirred at 80° C. for 2 hours. The reaction liquid was cooled to room temperature, the aqueous layer was removed, then, washed twice with 3.6% by mass hydrochloric acid, twice with a 2.5% by mass aqueous ammonia solution, and twice with ion-exchanged water. When the resultant solution was added dropwise to methanol, a precipitate was generated, so the precipitate was collected by filtration and dried, to obtain a solid. This solid was dissolved in toluene and purified by passing through an alumina column and a silica gel column in series through which toluene had been passed previously. When the purified liquid was added dropwise to methanol and stirred, a precipitate was generated, so the precipitate was collected by filtration and dried, to obtain a polymer compound HP-1 (8.4 g). The polymer compound HP-1 had an Mn of $4.4 \times 10^4$ and an Mw of $1.1 \times 10^5$.

TABLE 11

| mixture | HP-1a | | HP-1b | |
|---|---|---|---|---|
| compound | M6 | M17 | M6 | M14 |
| molar ratio [% by mol] | 6.5 | 10 | 43.5 | 40 |

The polymer compound HP-1 is a polymer compound having a block constituted of a constitutional unit derived from the compound M6 and a constitutional unit derived from the compound M17 at a molar ratio of 6.5:10, having a block constituted of a constitutional unit derived from the compound M6 and a constitutional unit derived from the compound M14 at a molar ratio of 43.5:40, and having a phenyl group as an end group, according to the theoretical values determined from the amounts of the charging raw materials.

<Synthesis Example HP-2> Synthesis of Polymer Compound HP-2

The polymer compound HP-2 was synthesized according to a method described in JP-A No. 2012-131995 using a mixture HP-2a (compound M18, compound M3 and compound M17) and a mixture HP-2b (compound M18, compound M19 and compound M3) shown in Table 12. The polymer compound HP-2 had an Mn of $9.0 \times 10^3$ and an Mw of $2.5 \times 10^4$.

TABLE 12

| mixture | HP-2a | | | HP-2b | | |
|---|---|---|---|---|---|---|
| compound | M18 | M3 | M17 | M18 | M19 | M3 |
| molar ratio [% by mol] | 25 | 10 | 10 | 15 | 10 | 30 |

The polymer compound HP-2 is a polymer compound having a block containing a constitutional unit derived from the compound M18, a constitutional unit derived from the compound M3 and a constitutional unit derived from the compound M17 at a molar ratio of 25:10:10, having a block constituted of a constitutional unit derived from the compound M18, a constitutional unit derived from the compound M19 and a constitutional unit derived from the compound M3 at a molar ratio of 15:10:30, and having a phenyl group as an end group, according to the theoretical values determined from the amounts of the charging raw materials.

<Synthesis Example HP-3> Synthesis of Polymer Compound HP-3

The polymer compound HP-3 was synthesized according to a method described in JP-A No. 2012-036388 using a mixture HP-3a (compound M6, compound M14 and compound M17) shown in Table 13. The polymer compound HP-3 had an Mn of $9.6 \times 10^4$ and an Mw of $2.2 \times 10^5$.

TABLE 13

| mixture | HP-3a | | |
|---|---|---|---|
| compound | M6 | M14 | M17 |
| molar ratio [% by mol] | 50 | 40 | 10 |

The polymer compound HP-3 is a random copolymer containing a constitutional unit derived from the compound M6, a constitutional unit derived from the compound M14 and a constitutional unit derived from the compound M17 at a molar ratio of 50:40:10 according to the theoretical values determined from the amounts of the charging raw materials, and it has a phenyl group as an end group.

<Synthesis Example HP-4> Synthesis of Polymer Compound HP-4

The polymer compound HP-4 was synthesized according to a method described in JP-A No. 2010-189630 using a mixture HP-4a (compound M18, compound M19, compound M3 and compound M17) shown in Table 14. The polymer compound HP-4 had an Mn of $9.2 \times 10^4$ and an Mw of $2.8 \times 10^5$.

TABLE 14

| mixture | HP-4a | | | |
|---|---|---|---|---|
| compound | M18 | M19 | M3 | M17 |
| molar ratio [% by mol] | 40 | 10 | 40 | 10 |

The polymer compound HP-4 is a random copolymer containing a constitutional unit derived from the compound M18, a constitutional unit derived from the compound M19, a constitutional unit derived from the compound M3 and a constitutional unit derived from the compound M17 at a molar ratio of 40:10:40:10 according to the theoretical values determined from the amounts of the charging raw materials, and it has a phenyl group as an end group.

<Synthesis Example HP-5> Synthesis of Polymer Compound HP-5

The polymer compound HP-5 was synthesized according to a method described in JP-A No. 2015-35600 using a mixture HP-5a (compound M20, compound M21, compound M22, compound M23 and compound M24) shown in Table 15.

The polymer compound HP-5 had an Mn of $1.0 \times 10^5$ and an Mw of $2.4 \times 10^5$.

TABLE 15

| mixture | HP-5a | | | | |
|---|---|---|---|---|---|
| compound | M20 | M21 | M22 | M23 | M24 |
| molar ratio (% by mol) | 36 | 14 | 45 | 4 | 1 |

The polymer compound HP-5 is a random copolymer (a copolymer not having terminal block and non-terminal block) containing a constitutional unit derived from the compound M20, a constitutional unit derived from the compound M21, a constitutional unit derived from the compound M22, a constitutional unit derived from the compound M23 and a constitutional unit derived from the compound M24 at a molar ratio of 36:14:45:4:1 according to the theoretical values determined from the amounts of the charging raw materials, and it has a phenyl group as an end group.

<Synthesis Example ETL1> Synthesis of Polymer Compound ETL-1

An inert gas atmosphere was prepared in the reaction vessel, then, the compound M25 (9.23 g), the compound M6 (4.58 g), dichlorobis(tris-o-methoxyphenylphosphine)palladium (8.6 mg), methyltrioctyl ammonium chloride (manufactured by Sigma Aldrich, trade name: Aliquat336 (registered trademark)) (0.098 g) and toluene (175 mL) were added, and the mixture was heated at 105° C. Then, to this was added dropwise a 12% by mass sodium carbonate aqueous solution (40.3 mL), and the mixture was refluxed for 29 hours. Then, to this were added phenylboronic acid (0.47 g) and dichlorobis(tris-o-methoxyphenylphosphine) palladium (8.7 mg), and the mixture was refluxed for 14 hours. Then, to this was added an aqueous sodium diethyldithiocarbamate solution, and the mixture was stirred at 80° C. for 2 hours. When the resultant reaction liquid was cooled and then added dropwise to methanol, a precipitate was generated. The resultant precipitate was collected by filtration, washed with methanol and water, and dried. The resultant solid was dissolved in chloroform and purified by passing through an alumina column and a silica gel column in series through which chloroform had been passed previously. When the resultant purified liquid was added dropwise to methanol and stirred, a precipitate was generated. The resultant precipitate was collected by filtration and dried, to obtain a polymer compound ETL-1a (7.15 g). The polymer compound ETL-1a had an Mn of $3.2 \times 10^4$ and an Mw of $6.0 \times 10^4$.

The polymer compound ETL-1a is a random copolymer containing a constitutional unit derived from the compound M25 and a constitutional unit derived from the compound M6 at a molar ratio of 50:50 according to the theoretical values determined from the amounts of the charging raw materials, and it has a phenyl group as an end group.

An argon gas atmosphere was prepared in the reaction vessel, then, the polymer compound ETL-1a (3.1 g), tetrahydrofuran (130 mL), methanol (66 mL), cesium hydroxide monohydrate (2.1 g) and water (12.5 mL) were added, and the mixture was stirred at 60° C. for 3 hours. Then, to this was added methanol (220 mL) and the mixture was stirred for 2 hours. The resultant reaction mixture was concentrated, then added dropwise to isopropyl alcohol and stirred, to generate a precipitate. The resultant precipitate was collected by filtration and dried, to obtain a polymer compound ETL-1 (3.5 g). According to $^1$H-NMR analysis of the polymer compound ETL-1, the signal of an ethyl ester moiety in the polymer compound ETL-1 disappeared, confirming that the reaction was completed.

The polymer compound ETL-1 is a random copolymer containing a constitutional unit represented by the following formula and a constitutional unit derived from the compound M6 at a molar ratio of 50:50 according to the theoretical values determined from the amounts of the charging raw materials of the polymer compound ETL-1, and it has a phenyl group as an end group.

[Chemical Formula 106]

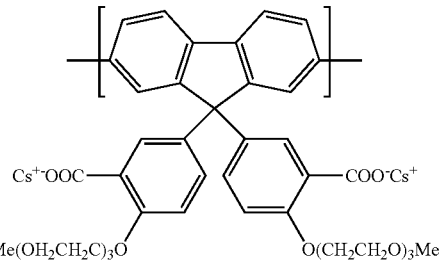

Table 16 shows the calculation results of the total number of each constitutional unit in the block copolymers HTL-1 to 5 and HTL-C1 to C4.

TABLE 16

| | HTL-1 | HTL-2 | HTL-3 | HTL-4 | HTL-5 | HTL-C1 | HTL-C2 | HTL-C3 | HTL-C4 |
|---|---|---|---|---|---|---|---|---|---|
| total number of the constitutional unit represented by the formula (Y) in the non-terminal block | 0.700 | 0.700 | 1.634 | 0.459 | 0.137 | — | — | 0.153 | 0.137 |
| total number of the constitutional unit represented by the formula (X) in the non-terminal block | 0.494 | 0.494 | 1.452 | 0.382 | 0.456 | — | — | 0.229 | 0.186 |
| total number of the constitutional unit represented by the formula (Z) in the non-terminal block | 0 | 0 | 0 | 0 | 0 | — | — | 0 | 0 |
| total number of the constitutional unit represented by the formula (X) and the constitutional unit represented by the formula (Z) in the non-terminal block | 0.494 | 0.494 | 1.452 | 0.382 | 0.456 | — | — | 0.229 | 0.186 |
| total number of the constitutional unit having a crosslinkable group in the non-terminal block | 0 | 0.124 | 0 | 0 | 0.410 | — | — | 0 | 0 |
| total number of the crosslinkable group in the non-terminal block | 0 | 0.247 | 0 | 0 | 0.820 | — | — | 0 | 0 |
| total number of the constitutional unit represented by the formula (Y) in the terminal block | 0.330 | 0.330 | 0.182 | 0.306 | 0 | — | — | 0.612 | 0 |
| total number of the constitutional unit represented by the formula (X) in the terminal block | 0 | 0 | 0 | 0.229 | 0.186 | — | — | 0.382 | 0.456 |
| total number of the constitutional unit represented by the formula (Z) in the terminal block | 0 | 0 | 0 | 0 | 0 | — | — | 0 | 0 |
| total number of the constitutional unit represented by the formula (X) and the constitutional unit represented by the formula (Z) in the terminal block | 0 | 0 | 0 | 0.229 | 0.186 | — | — | 0.382 | 0.456 |
| total number of the constitutional unit having a crosslinkable group in the terminal block | 0.124 | 0 | 0.363 | 0.153 | 0.137 | — | — | 0.153 | 0.546 |
| total number of the crosslinkable group in the terminal block | 0.247 | 0 | 0.726 | 0.153 | 0.273 | — | — | 0.153 | 1.093 |
| total number of the constitutional unit represented by the formula (Y) in the block copolymer or the polymer compound | 1.030 | 1.030 | 1.815 | 0.765 | 0.137 | 1.488 | 1.815 | 0.765 | 0.137 |
| total number of the constitutional unit represented by the formula (X) in the block copolymer or the polymer compound | 0.494 | 0.494 | 1.452 | 0.612 | 0.642 | 0.714 | 1.452 | 0.612 | 0.642 |
| total number of the constitutional unit represented by the formula (Z) in the block copolymer or the polymer compound | 0 | 0 | 0 | 0 | 0 | 0 | 0 | 0 | 0 |
| total number of the constitutional unit represented by the formula (X) and the constitutional unit represented by the formula (Z) in the block copolymer or the polymer compound | 0.494 | 0.494 | 1.452 | 0.612 | 0.642 | 0.714 | 1.452 | 0.612 | 0.642 |

TABLE 16-continued

|  | HTL-1 | HTL-2 | HTL-3 | HTL-4 | HTL-5 | HTL-C1 | HTL-C2 | HTL-C3 | HTL-C4 |
|---|---|---|---|---|---|---|---|---|---|
| total number of the constitutional unit having a crosslinkable group in the block copolymer or the polymer compound | 0.124 | 0.124 | 0.363 | 0.153 | 0.546 | 0.179 | 0.363 | 0.153 | 0.546 |
| total number of the crosslinkable group in the block copolymer or the polymer compound | 0.247 | 0.247 | 0.726 | 0.153 | 1.093 | 0.179 | 0.726 | 0.153 | 1.093 |

<Example D3> Fabrication and Evaluation of Light Emitting Device D3

(Formation of Anode and Hole Injection Layer)

An ITO film with a thickness of 45 nm was attached to a glass substrate by a sputtering method, to form an anode. On the anode, AQ-1200 (manufactured by Plectronics) as a hole injection material was spin-coated to form a film with a thickness of 50 nm. The film was heated at 170° C. for 15 minutes on a hot plate under an air atmosphere, to form a hole injection layer.

(Formation of Second Organic Layer)

The block copolymer HTL-1 was dissolved in xylene at a concentration of 0.7% by mass. The resultant xylene solution was spin-coated on the hole injection layer to form a film having a thickness of 20 nm which was then heated at 180° C. for 60 minutes on a hot plate under a nitrogen gas atmosphere, to form a second organic layer (hole transporting layer). By this heating, the block copolymer HTL-1 became a crosslinked product.

(Formation of First Organic Layer)

The polymer compound HP-1 and the phosphorescent compound G1 (polymer compound HP-1/phosphorescent compound G1=70% by mass/30% by mass) were dissolved in xylene at a concentration of 2% by mass. The resultant xylene solution was spin-coated on the second organic layer to form a film having a thickness of 80 nm which was then heated at 180° C. for 10 minutes under a nitrogen gas atmosphere, to form a first organic layer (first light emitting layer).

(Formation of Cathode)

The substrate carrying the first organic layer formed thereon was placed in a vapor deposition machine and its inner pressure was reduced to $1.0 \times 10^{-4}$ Pa or less, then, sodium fluoride was vapor-deposited with a thickness of about 4 nm on the first organic layer, then, aluminum was vapor-deposited with a thickness of about 80 nm on the sodium fluoride layer, as a cathode. After vapor deposition, sealing was performed using a glass substrate, to fabricate a light emitting device D3 in which an anode, a hole injection layer, a hole transporting layer (second organic layer), a first light emitting layer (first organic layer) and a cathode are laminated in this order.

(Evaluation of Light Emitting Device)

EL light emission was observed by applying voltage to the light emitting device D3. The CIE chromaticity coordinates at 1000 cd/m$^2$ were (x, y)=(0.30, 0.64). After setting the current value so that the initial luminance was 1000 cd/m$^2$, the device was driven at constant current and the time until the luminance reached 95% of the initial luminance was measured and found to be 473.9 hours.

<Example D1> Fabrication and Evaluation of Light Emitting Device D1

A light emitting device D1 in which an anode, a hole injection layer, a hole transporting layer (second organic layer), a first light emitting layer (first organic layer) and a cathode are laminated in this order was fabricated in the same manner as in Example D1 except that the "polymer compound HP-3" was used instead of the "polymer compound HP-1" in (Formation of first organic layer) of Example D3. EL light emission was observed by applying voltage to the light emitting device D4. The CIE chromaticity coordinates at 1000 cd/m$^2$ were (x, y)=(0.30, 0.64). After setting the current value so that the initial luminance was 1000 cd/m$^2$, the device was driven at constant current and the time until the luminance reached 95% of the initial luminance was measured and was found to be 71.5 hours.

<Example D2> Fabrication and Evaluation of Light Emitting Device D2

A light emitting device D2 in which an anode, a hole injection layer, a hole transporting layer (second organic layer), a first light emitting layer (first organic layer) and a cathode are laminated in this order was fabricated in the same manner as in Example D3 except that the "block copolymer HTL-2" was used instead of the "block copolymer HTL-1" in (Formation of second organic layer) of Example D3, and further, the "polymer compound HP-3" was used instead of the "polymer compound HP-1" in (Formation of first organic layer) of Example D3. EL light emission was observed by applying voltage to the light emitting device D2. The CIE chromaticity coordinates at 1000 cd/m$^2$ were (x, y)=(0.30, 0.64). After setting the current value so that the initial luminance was 1000 cd/m$^2$, the device was driven at constant current and the time until the luminance reached 95% of the initial luminance was measured and found to be 37.4 hours.

<Example D4> Fabrication and Evaluation of Light Emitting Device D4

A light emitting device D4 in which an anode, a hole injection layer, a hole transporting layer (second organic layer), a first light emitting layer (first organic layer) and a cathode are laminated in this order was fabricated in the same manner as in Example D3 except that the "block copolymer HTL-2" was used instead of the "block copolymer HTL-1" in (Formation of second organic layer) of Example D3. EL light emission was observed by applying voltage to the light emitting device D4. The CIE chromaticity coordinates at 1000 cd/m$^2$ were (x, y)=(0.30, 0.64). After setting the current value so that the initial luminance was 1000 cd/m$^2$, the device was driven at constant current and the time until the luminance reached 95% of the initial luminance was measured and found to be 361.6 hours.

<Example D5> Fabrication and Evaluation of Light Emitting Device D5

A light emitting device D5 in which an anode, a hole injection layer, a hole transporting layer (second organic layer), a first light emitting layer (first organic layer) and a cathode are laminated in this order was fabricated in the same manner as in Example D3 except that the "polymer compound HP-2" was used instead of the "polymer compound HP-1" in (Formation of first organic layer) of Example D3. EL light emission was observed by applying voltage to the light emitting device D5. The CIE chromaticity coordinates at 1000 cd/m² were (x, y)=(0.30, 0.64). After setting the current value so that the initial luminance was 1000 cd/m², the device was driven at constant current and the time until the luminance reached 95% of the initial luminance was measured and found to be 108.6 hours.

<Example D6> Fabrication and Evaluation of Light Emitting Device D6

A light emitting device D6 in which an anode, a hole injection layer, a hole transporting layer (second organic layer), a first light emitting layer (first organic layer) and a cathode are laminated in this order was fabricated in the same manner as in Example D3 except that the "block copolymer HTL-2" was used instead of the "block copolymer HTL-1" in (Formation of second organic layer) of Example D3, and further, the "polymer compound HP-2" was used instead of the "polymer compound HP-1" in (Formation of first organic layer) of Example D3. EL light emission was observed by applying voltage to the light emitting device D6. The CIE chromaticity coordinates at 1000 cd/m² were (x, y)=(0.30, 0.64). After setting the current value so that the initial luminance was 1000 cd/m², the device was driven at constant current and the time until the luminance reached 95% of the initial luminance was measured and found to be 95.5 hours.

<Example D7> Fabrication and Evaluation of Light Emitting Device D7

A light emitting device D7 in which an anode, a hole injection layer, a hole transporting layer (second organic layer), a first light emitting layer (first organic layer) and a cathode are laminated in this order was fabricated in the same manner as in Example D3 except that the "polymer compound HP-4" was used instead of the "polymer compound HP-1" in (Formation of first organic layer) of Example D3. EL light emission was observed by applying voltage to the light emitting device D7. The CIE chromaticity coordinates at 1000 cd/m² were (x, y)=(0.30, 0.64). After setting the current value so that the initial luminance was 1000 cd/m², the device was driven at constant current and the time until the luminance reached 95% of the initial luminance was measured and found to be 24.9 hours.

<Example D8> Fabrication and Evaluation of Light Emitting Device D8

A light emitting device D8 in which an anode, a hole injection layer, a hole transporting layer (second organic layer), a first light emitting layer (first organic layer) and a cathode are laminated in this order was fabricated in the same manner as in Example D3 except that the "block copolymer HTL-2" was used instead of the "block copolymer HTL-1" in (Formation of second organic layer) of Example D3, and further, the "polymer compound HP-4" was used instead of the "polymer compound HP-1" in (Formation of first organic layer) of Example D3. EL light emission was observed by applying voltage to the light emitting device D8. The CIE chromaticity coordinates at 1000 cd/m² were (x, y)=(0.30, 0.64). After setting the current value so that the initial luminance was 1000 cd/m², the device was driven at constant current and the time until the luminance reached 95% of the initial luminance was measured and found to be 29.1 hours.

<Comparative Example CD1> Fabrication and Evaluation of Light Emitting Device CD1

A light emitting device CD1 in which an anode, a hole injection layer, a hole transporting layer (second organic layer), a first light emitting layer (first organic layer) and a cathode are laminated in this order was fabricated in the same manner as in Example D3 except that the "polymer compound HTL-C1" was used instead of the "block copolymer HTL-1" in (Formation of second organic layer) of Example D3, and further, the "polymer compound HP-2" was used instead of the "polymer compound HP-1" in (Formation of first organic layer) of Example D3. EL light emission was observed by applying voltage to the light emitting device CD1. The CIE chromaticity coordinates at 1000 cd/m² were (x, y)=(0.30, 0.64). After setting the current value so that the initial luminance was 1000 cd/m², the device was driven at constant current, and the time until the luminance reached 95% of the initial luminance was measured and found to be 4.6 hours.

TABLE 17

| | light emitting device | second organic layer material | first organic layer material | material ratio (% by mass) | luminance life (hrs) |
|---|---|---|---|---|---|
| Example D1 | D1 | crosslinked product of HTL-1 | HP-3/G1 | 70/30 | 71.5 |
| Example D2 | D2 | crosslinked product of HTL-2 | HP-3/G1 | 70/30 | 37.4 |
| Example D3 | D3 | crosslinked product of HTL-1 | HP-1/G1 | 70/30 | 473.9 |
| Example D4 | D4 | crosslinked product of HTL-2 | HP-1/G1 | 70/30 | 361.6 |
| Example D5 | D5 | crosslinked product of HTL-1 | HP-2/G1 | 70/30 | 108.6 |
| Example D6 | D6 | crosslinked product of HTL-2 | HP-2/G1 | 70/30 | 95.5 |
| Example D7 | D7 | crosslinked product of HTL-1 | HP-4/G1 | 70/30 | 24.9 |

TABLE 17-continued

|  |  |  | first organic layer | |
| --- | --- | --- | --- | --- |
| light emitting device | second organic layer material | material | material ratio (% by mass) | luminance life (hrs) |
| Example D8 | D8 | crosslinked product of HTL-2 | HP-4/G1 | 70/30 | 29.1 |
| Comparative Example CD1 | CD1 | crosslinked product of HTL-C1 | HP-2/G1 | 70/30 | 4.6 |

<Example D9> Fabrication and Evaluation of Light Emitting Device D9

A light emitting device D9 in which an anode, a hole injection layer, a hole transporting layer (second organic layer), a first light emitting layer (first organic layer) and a cathode are laminated in this order was fabricated in the same manner as in Example D3 except that the "block copolymer HTL-4" was used instead of the "block copolymer HTL-1" in (Formation of second organic layer) of Example D3, and further, (Formation of first organic layer) of Example D3 was changed to (Formation-D9 of first organic layer) describe below. EL light emission was observed by applying voltage to the light emitting device D9. The CIE chromaticity coordinates at 3000 cd/m² were (x, y)=(0.66, 0.32). After setting the current value so that the initial luminance was 3000 cd/m², the device was driven at constant current, and the time until the luminance reached 65% of the initial luminance (hereinafter, also referred to as "LT65") was measured. The results are shown in Table 18.

(Formation-D9 of First Organic Layer)

The polymer compound HP-5 and the phosphorescent compound R1 (polymer compound HP-5/phosphorescent compound R1=92.5% by mass/7.5% by mass) were dissolved in xylene at a concentration of 2% by mass. The resultant xylene solution was spin-coated on the second organic layer to form a film having a thickness of 60 nm which was then heated at 180° C. for 10 minutes under a nitrogen gas atmosphere, to form a first organic layer (first light emitting layer).

<Comparative Example CD2> Fabrication and Evaluation of Light Emitting Device CD2

A light emitting device CD2 in which an anode, a hole injection layer, a hole transporting layer (second organic layer), a first light emitting layer (first organic layer) and a cathode are laminated in this order was fabricated in the same manner as in Example D9 except that the "block copolymer HTL-C3" was used instead of the "block copolymer HTL-4" in (Formation of second organic layer) of Example D9. EL light emission was observed by applying voltage to the light emitting device CD2. The CIE chromaticity coordinates at 3000 cd/m² were (x, y)=(0.66, 0.32). The device was driven at constant current at an initial luminance of 3000 cd/m², and LT65 was measured. The results are shown in Table 18.

The results of Example D9 and Comparative Example CD2 are shown in Table 18. The relative value of LT65 of the light emitting device D9 when the LT65 of the light emitting device CD2 is taken as 1.0 is shown.

TABLE 18

|  |  | first organic layer | | |
| --- | --- | --- | --- | --- |
| light emitting device | second organic layer material | material | material ratio (% by mass) | LT65 (relative value) |
| Example D9 | D9 | crosslinked product of HTL-4 | HP-5/R1 | 92.5/7.5 | 2.2 |
| Comparative Example CD2 | CD2 | crosslinked product of HTL-C3 | HP-5/R1 | 92.5/7.5 | 1.0 |

<Example D10> Fabrication and Evaluation of Light Emitting Device D10

(Formation of Anode and Hole Injection Layer)

An ITO film with a thickness of 45 nm was attached to a glass substrate by a sputtering method, to form an anode. On the anode, AQ-1200 (manufactured by Plectronics) as a hole injection material was spin-coated to form a film with a thickness of 50 nm. The film was heated at 170° C. for 15 minutes on a hot plate under an air atmosphere, to form a hole injection layer.

(Formation of Second Organic Layer)

The block copolymer HTL-3 was dissolved in xylene at a concentration of 0.7% by mass. The resultant xylene solution was spin-coated on the hole injection layer to form a film having a thickness of 20 nm which was then heated at 180° C. for 60 minutes on a hot plate under a nitrogen gas atmosphere, to form a second organic layer (hole transporting layer). By this heating, the block copolymer HTL-3 became a crosslinked product.

(Formation of First Organic Layer)

The compound HM-1 and the phosphorescent compound R2 (compound HM-1/phosphorescent compound R2=92.5% by mass/7.5% by mass) were dissolved in xylene at a concentration of 2% by mass. The resultant xylene solution was spin-coated on the second organic layer to form a film having a thickness of 60 nm which was then heated at 180° C. for 10 minutes under a nitrogen gas atmosphere, to form a first organic layer (first light emitting layer).

(Formation of Electron Transporting Layer)

The polymer compound ETL-1 was dissolved at a concentration of 0.25% by mass in 2,2,3,3,4,4,5,5-octafluoro-1-pentanol. The resultant 2,2,3,3,4,4,5,5-octafluoro-1-pentanol solution was spin-coated on the first organic layer to form a film having a thickness of 10 nm which was then heated at 130° C. for 10 minutes under a nitrogen gas atmosphere, to form an electron transporting layer.

(Formation of Cathode)

The substrate carrying the electron transporting layer formed thereon was placed in a vapor deposition machine and its inner pressure was reduced to $1.0 \times 10^{-4}$ Pa or less, then, sodium fluoride was vapor-deposited with a thickness of about 4 nm on the electron transporting layer, then, aluminum was vapor-deposited with a thickness of about 80 nm on the sodium fluoride layer, as a cathode. After vapor deposition, sealing was performed using a glass substrate, to fabricate a light emitting device D10 in which an anode, a hole injection layer, a hole transporting layer (second organic layer), a first light emitting layer (first organic layer), an electron transporting layer and a cathode are laminated in this order.

(Evaluation of Light Emitting Device)

EL light emission was observed by applying voltage to the light emitting device D10. The CIE chromaticity coordinates at 1000 cd/m² were (x, y)=(0.61, 0.40). After setting the current value so that the initial luminance was 1000 cd/m², the device was driven at constant current, and the time until the luminance reached 80% of the initial luminance (hereinafter, also referred to as "LT80") was measured. The results are shown in Table 19.

<Comparative Example CD3> Fabrication and Evaluation of Light Emitting Device CD3

A light emitting device CD3 in which an anode, a hole injection layer, a hole transporting layer (second organic layer), a first light emitting layer (first organic layer), an electron transporting layer and a cathode are laminated in this order was fabricated in the same manner as in Example D10 except that the "polymer compound HTL-C2" was used instead of the "block copolymer HTL-3" in (Formation of second organic layer) of Example D10.

EL light emission was observed by applying voltage to the light emitting device CD3. The CIE chromaticity coordinates at 1000 cd/m² were (x, y)=(0.61, 0.40). The device was driven at constant current at an initial luminance of 1000 cd/m², and LT80 was measured. The results are shown in Table 19.

The results of Example D10 and Comparative Example CD3 are shown in Table 19. The relative value of LT80 of the light emitting device D10 when the LT80 of the light emitting device CD3 is taken as 1.00 is shown.

TABLE 19

| | light emitting device | second organic layer material | first organic layer material | first organic layer material ratio (% by mass) | LT80 (relative value) |
|---|---|---|---|---|---|
| Example D10 | D10 | crosslinked product of HTL-3 | HM-1/R2 | 92.5/7.5 | 1.32 |
| Comparative Example CD3 | CD3 | crosslinked product of HTL-C2 | HM-1/R2 | 92.5/7.5 | 1.00 |

<Example D11> Fabrication and Evaluation of Light Emitting Device D11

A light emitting device D11 in which an anode, a hole injection layer, a hole transporting layer (second organic layer), a first light emitting layer (first organic layer), an electron transporting layer and a cathode are laminated in this order was fabricated in the same manner as in Example D10 except that the "compound HM-1 and phosphorescent compound B1 (compound HM-1/phosphorescent compound B1=75% by mass/25% by mass)" were used instead of the "compound HM-1 and phosphorescent compound R2 (compound HM-1/phosphorescent compound R2=92.5% by mass/7.5% by mass)" in (Formation of first organic layer) of Example D10.

EL light emission was observed by applying voltage to the light emitting device D11. The CIE chromaticity coordinates at 1000 cd/m² were (x, y)=(0.23, 0.42). After setting the current value so that the initial luminance was 1000 cd/m², the device was driven at constant current, and the time until the luminance reached 90% of the initial luminance (hereinafter, also referred to as "LT90") was measured. The results are shown in Table 20.

<Comparative Example CD4> Fabrication and Evaluation of Light Emitting Device CD4

A light emitting device CD4 in which an anode, a hole injection layer, a hole transporting layer (second organic layer), a first light emitting layer (first organic layer), an electron transporting layer and a cathode are laminated in this order was fabricated in the same manner as in Example D10 except that the "polymer compound HTL-C2" was used instead of the "block copolymer HTL-3" in (Formation of second organic layer) of Example D10, and further, the "compound HM-1 and phosphorescent compound B1 (compound HM-1/phosphorescent compound B1=75% by mass/25% by mass)" were used instead of the "compound HM-1 and phosphorescent compound R2 (compound HM-1/phosphorescent compound R2=92.5% by mass/7.5% by mass)" in (Formation of first organic layer) of Example D10.

EL light emission was observed by applying voltage to the light emitting device CD4. The CIE chromaticity coordinates (x, y) at 1000 cd/m² were (0.24, 0.43). The device was driven at constant current at an initial luminance of 1000 cd/m², and LT90 was measured. The results are shown in Table 20.

The results of Example D11 and Comparative Example CD4 are shown in Table 20. The relative value of LT90 of the light emitting device D11 when the LT90 of the light emitting device CD4 is taken as 1.0 is shown.

TABLE 20

| | light emitting device | second organic layer material | first organic layer material | first organic layer material ratio (% by mass) | LT90 (relative value) |
|---|---|---|---|---|---|
| Example D11 | D11 | crosslinked product of HTL-3 | HM-1/B1 | 75/25 | 3.0 |
| Comparative Example CD4 | CD4 | crosslinked product of HTL-C2 | HM-1/B1 | 75/25 | 1.0 |

<Example D12> Fabrication and Evaluation of Light Emitting Device D12

A light emitting device D12 in which an anode, a hole injection layer, a hole transporting layer (second organic layer), a first light emitting layer (first organic layer), an electron transporting layer and a cathode are laminated in this order was fabricated in the same manner as in Example D10 except that the "compound HM-1, phosphorescent compound B1, phosphorescent compound G1 and phosphorescent compound R1 (compound HM-1/phosphorescent compound B1/phosphorescent compound G1/phosphorescent compound R1=73.9% by mass/25% by mass/1% by mass/0.1% by mass)" were used instead of the "compound HM-1 and phosphorescent compound R2 (compound HM-1/phosphorescent compound R2=92.5% by mass/7.5% by mass) in (Formation of first organic layer) of Example D10.

EL light emission was observed by applying voltage to the light emitting device D12. The CIE chromaticity coordinates at 1000 cd/m² were (x, y)=(0.26, 0.47). After setting the current value so that the initial luminance was 1000 cd/m², the device was driven at constant current, and the time until the luminance reached 95% of the initial luminance (hereinafter, also referred to as "LT95") was measured. The results are shown in Table 21.

<Comparative Example CD5> Fabrication and Evaluation of Light Emitting Device CD5

A light emitting device CD5 in which an anode, a hole injection layer, a hole transporting layer (second organic layer), a first light emitting layer (first organic layer), an electron transporting layer and a cathode are laminated in this order was fabricated in the same manner as in Example D10 except that the "polymer compound HTL-C2" was used instead of the "block copolymer HTL-3" in (Formation of second organic layer) of Example D10, and further, the "compound HM-1, Phosphorescent compound B1, phosphorescent compound G1 and phosphorescent compound R1 (compound HM-1/phosphorescent compound B1/phosphorescent compound G1/phosphorescent compound R1=73.9% by mass/25% by mass/1% by mass/0.1% by mass)" were used instead of the "compound HM-1 and phosphorescent compound R2 (compound HM-1/phosphorescent compound R2=92.5% by mass/7.5% by mass)" in (Formation of first organic layer) of Example D10.

EL light emission was observed by applying voltage to the light emitting device CD5. The CIE chromaticity coordinates at 1000 cd/m² were (x, y)=(0.26, 0.47). The device was driven at constant current at an initial luminance of 1000 cd/m², and LT95 was measured. The results are shown in Table 21.

The results of Example D12 and Comparative Example CD5 are shown in Table 21. The relative value of LT95 of the light emitting device D12 when the LT95 of the light emitting device CD5 is taken as 1.0 is shown.

TABLE 21

| | light emitting device | second organic layer material | first organic layer material | material ratio (% by mass) | LT95 (relative value) |
|---|---|---|---|---|---|
| Example D12 | D12 | crosslinked product of HTL-3 | HM-1/B1/G1/R1 | 73.9/25/1/0.1 | 36.7 |
| Comparative Example CD5 | CD5 | crosslinked product of HTL-C2 | HM-1/B1/G1/R1 | 73.9/25/1/0.1 | 1.0 |

<Example D13> Fabrication and Evaluation of Light Emitting Device D13

(Formation of Anode and Hole Injection Layer)
An ITO film with a thickness of 45 nm was attached to a glass substrate by a sputtering method, to form an anode. On the anode, AQ-1200 (manufactured by Plectronics) as a hole injection material was spin-coated to form a film with a thickness of 50 nm. The film was heated at 170° C. for 15 minutes on a hot plate under an air atmosphere, to form a hole injection layer.

(Formation of Second Organic Layer)
The block copolymer HTL-5 was dissolved in xylene at a concentration of 0.7% by mass. The resultant xylene solution was spin-coated on the hole injection layer to form a film having a thickness of 20 nm which was then heated at 180° C. for 60 minutes on a hot plate under a nitrogen gas atmosphere, to form a second organic layer (second light emitting layer). By this heating, the block copolymer HTL-5 became a crosslinked product.

(Formation of First Organic Layer)
The compound HM-1 and the phosphorescent compound B1 (compound HM-1/phosphorescent compound B1=75% by mass/25% by mass) were dissolved in xylene at a concentration of 2% by mass. The resultant xylene solution was spin-coated on the second organic layer to form a film having a thickness of 60 nm which was then heated at 180° C. for 10 minutes under a nitrogen gas atmosphere, to form a first organic layer (first light emitting layer).

(Formation of Electron Transporting Layer)
The polymer compound ETL-1 was dissolved at a concentration of 0.25% by mass in 2,2,3,3,4,4,5,5-octafluoro-1-pentanol. The resultant 2,2,3,3,4,4,5,5-octafluoro-1-pentanol solution was spin-coated on the first organic layer to form a film having a thickness of 10 nm which was then heated at 130° C. for 10 minutes under a nitrogen gas atmosphere, to form an electron transporting layer.

(Formation of Cathode)
The substrate carrying the electron transporting layer formed thereon was placed in a vapor deposition machine and its inner pressure was reduced to $1.0 \times 10^{-4}$ Pa or less, then, sodium fluoride was vapor-deposited with a thickness of about 4 nm on the electron transporting layer, then, aluminum was vapor-deposited with a thickness of about 80 nm on the sodium fluoride layer, as a cathode. After vapor deposition, sealing was performed using a glass substrate, to fabricate a light emitting device D13 in which an anode, a hole injection layer, a second light emitting layer (second organic layer), a first light emitting layer (first organic layer), an electron transporting layer and a cathode are laminated in this order.

(Evaluation of Light Emitting Device)
EL light emission was observed by applying voltage to the light emitting device D13. The CIE chromaticity coordinates at 1000 cd/m² were (x, y)=(0.49, 0.46). After setting the current value so that the initial luminance was 1000 cd/m², the device was driven at constant current, and the time until the luminance reached 98% of the initial luminance (hereinafter, also referred to as "LT98") was measured. The results are shown in Table 22.

<Comparative Example CD6> Fabrication and Evaluation of Light Emitting Device CD6

A light emitting device CD6 in which an anode, a hole injection layer, a second light emitting layer (second organic layer), a first light emitting layer (first organic layer), an electron transporting layer, and a cathode are laminated in this order was fabricated in the same manner as in Example D13 except that "block copolymer HTL-C4" was used instead of "block copolymer HTL-5" in (Formation of second organic layer) of Example D13.

EL light emission was observed by applying voltage to the light emitting device CD6. The CIE chromaticity coordinates at 1000 cd/m² were (x, y)=(0.50, 0.45). LT98 was measured when driving at constant current at an initial luminance of 1000 cd/m². The results are shown in Table 22.

The results for Example D13 and Comparative Example CD6 are shown in Table 22. The relative value of LT98 of the light emitting device D13 when the LT98 of the light emitting device CD6 is taken as 1.0 is shown.

TABLE 22

| | light emitting device | second organic layer material | first organic layer material | material ratio (% by mass) | LT98 (relative value) |
|---|---|---|---|---|---|
| Example D13 | D13 | crosslinked product of HTL-5 | HM-1/B1 | 75/25 | 6.1 |
| Comparative Example CD6 | CD6 | crosslinked product of HTL-C4 | HM-1/B1 | 75/25 | 1.0 |

INDUSTRIAL APPLICABILITY

According to the present invention, it is possible to provide a light emitting device excellent in luminance life.

EXPLANATION OF SYMBOLS

10: light emitting device, 11: anode, 12: second organic layer, 13: first organic layer, 14: cathode.

The invention claimed is:

1. A light emitting device comprising an anode, a cathode, and a first organic layer and a second organic layer provided between the anode and the cathode, wherein
the first organic layer is a layer comprising a phosphorescent compound,
the second organic layer is a layer comprising at least one of a block copolymer comprising an end group, a block that binds to the end group and a block that does not bind to the end group, and a crosslinked product of the block copolymer,
said block that does not bind to the end group comprises at least one constitutional unit selected from the group consisting of a non-crosslinkable constitutional unit represented by the following formula (X) and a non-crosslinkable constitutional unit represented by the following formula (Z), and
at least one of the following formulae (i) to (iii) is satisfied when the total number of said non-crosslinkable constitutional unit represented by the formula (X) and the total number of said non-crosslinkable constitutional unit represented by the formula (Z) in said block that does not bind to the end group are represented by $X_I$ and $Z_I$, respectively, and the total number of said non-crosslinkable constitutional unit represented by the formula (X) and the total number of said non-crosslinkable constitutional unit represented by the formula (Z) in said block that binds to the end group are represented by $X_{II}$ and $Z_{II}$, respectively:

$$X_I > X_{II} \quad (i)$$

$$Z_I > Z_{II} \quad (ii)$$

$$X_I + Z_I > X_{II} + Z_{II} \quad (iii)$$

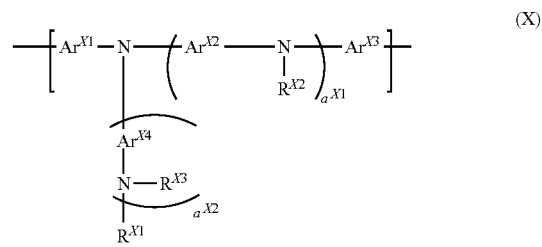

wherein,
$a^{X1}$ and $a^{X2}$ each independently represent an integer of 0 or more and 10 or less,
$Ar^{X1}$ and $Ar^{X3}$ each independently represent an arylene group or a divalent heterocyclic group, and the foregoing groups optionally have a substituent,
$Ar^{X2}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent, and when a plurality of $Ar^{X2}$ are present, they may be the same or different and when a plurality of $Ar^{X4}$ are present, they may be the same or different,
$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent, and when a plurality of $R^{X2}$ are present, they may be the same or different and when a plurality of $R^{X3}$ are present, they may be the same or different,

wherein, $Ar^Z$ represents a divalent heterocyclic group, or a divalent group in which at least one arylene group and at least one divalent heterocyclic group are bonded directly, and the foregoing groups optionally have a substituent.

2. The light emitting device according to claim 1, wherein said phosphorescent compound is a phosphorescent compound represented by the following formula (1):

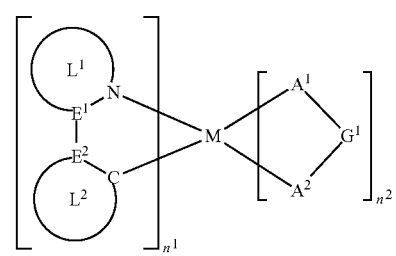

wherein,
M represents a ruthenium atom, a rhodium atom, a palladium atom, an iridium atom or a platinum atom,
$n^1$ represents an integer of 1 or more, and $n^2$ represents an integer of 0 or more, however, $n^1+n^2$ is 3 when M is a ruthenium atom, a rhodium atom, or an iridium atom, while $n^1+n^2$ is 2 when M is a palladium atom or a platinum atom,
$E^1$ and $E^2$ each independently represent a carbon atom or a nitrogen atom, however, at least one of $E^1$ and $E^2$ is a carbon atom, and when a plurality of $E^1$ are present, they may be the same or different and when a plurality of $E^2$ are present, they may be the same or different, Ring $L^1$ represents an aromatic hetero ring which optionally has a substituent, and when a plurality of the substituents are present, they may be combined together to form a ring together with atoms to which they are attached and when a plurality of Rings $L^1$ are present, they may be the same or different, Ring $L^2$ represents an aromatic hydrocarbon ring or an aromatic hetero ring, and the foregoing rings optionally have a substituent, and when a plurality of the substituents are present, they may be combined together to form a ring together with atoms to which they are attached and when a plurality of Rings $L^2$ are present, they may be the same or different, the substituent which Ring $L^1$ optionally has and the substituent which Ring $L^2$ optionally has may be combined together to form a ring together with atoms to which they are attached, $A^1\text{-}G^1\text{-}A^2$ represents an anionic bidentate ligand, $A^1$ and $A^2$ each independently represent a carbon atom, an oxygen atom or a nitrogen atom, and these atoms may be ring constituent atoms, $G^1$ represents a single bond or an atomic group constituting a bidentate ligand together with $A^1$ and $A^2$, and when a plurality of $A^1\text{-}G^1\text{-}A^2$ are present, they may be the same or different.

3. The light emitting device according to claim 2, wherein said phosphorescent compound represented by the formula (1) is a phosphorescent compound represented by the following formula (1-A):

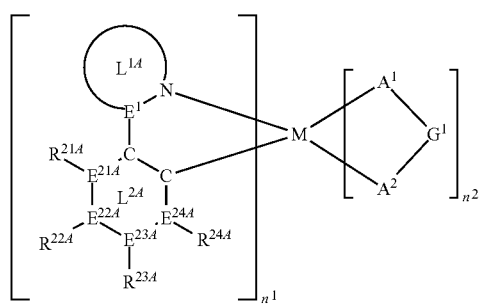

(1-A)

wherein,

M, $n^1$, $n^2$, $E^1$ and $A^1\text{-}G^1\text{-}A^2$ represent the same meaning as described above, Ring $L^{1A}$ represents a pyridine ring, a diazabenzene ring, an azanaphthalene ring, a diazanaphthalene ring, a triazole ring or a diazole ring, and the foregoing rings optionally have a substituent, and when a plurality of the substituents are present, they may be combined together to form a ring together with carbon atoms to which they are attached and when a plurality of Rings $L^{1A}$ are present, they may be the same or different, $E^{21A}$, $E^{22A}$, $E^{23A}$ and $E^{24A}$ each independently represent a nitrogen atom or a carbon atom, and when a plurality of $E^{21A}$, $E^{22A}$, $E^{23A}$ and $E^{24A}$ are present, they may be the same or different at each occurrence, and when $E^{21A}$ is a nitrogen atom, $R^{21A}$ is absent; when $E^{22A}$ is a nitrogen atom, $R^{22A}$ is absent; when $E^{23A}$ is a nitrogen atom, $R^{23A}$ is absent; and when $E^{24A}$ is a nitrogen atom, $R^{24A}$ is absent, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of $R^{21A}$, $R^{22A}$, $R^{23A}$ and $R^{24A}$ are present, they may be the same or different at each occurrence, $R^{21A}$ and $R^{22A}$, $R^{22A}$ and $R^{23A}$, $R^{23A}$ and $R^{24A}$, and the substituent which Ring $L^{1A}$ optionally has and $R^{21A}$ may each be combined together to form a ring together with atoms to which they are attached, and Ring $L^{2A}$ represents a benzene ring, a pyridine ring or a diazabenzene ring.

4. The light emitting device according to claim 3, wherein said phosphorescent compound represented by the formula (1-A) is a phosphorescent compound represented by the following formula (1-B1), formula (1-B2), formula (1-B3), formula (1-B4) or formula (1-B5):

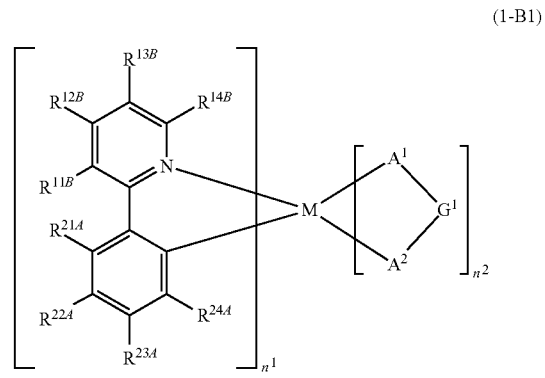

(1-B1)

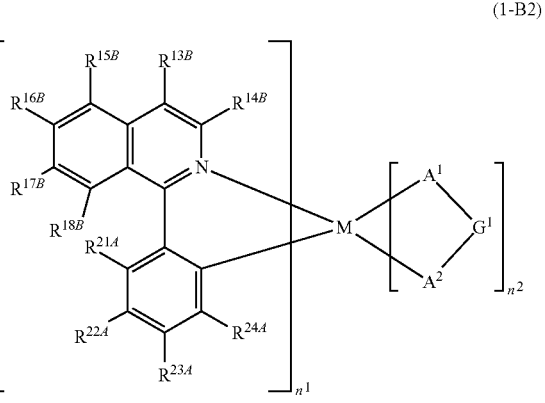

(1-B2)

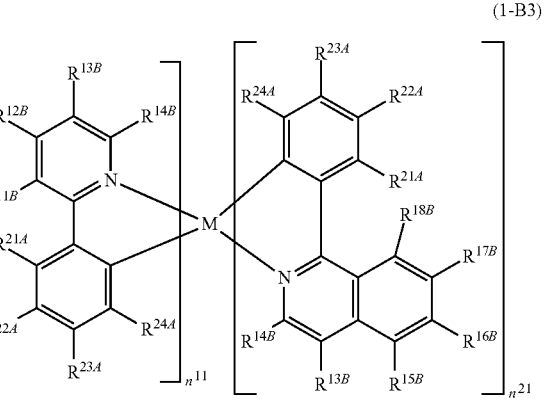

(1-B3)

-continued (1-B4)

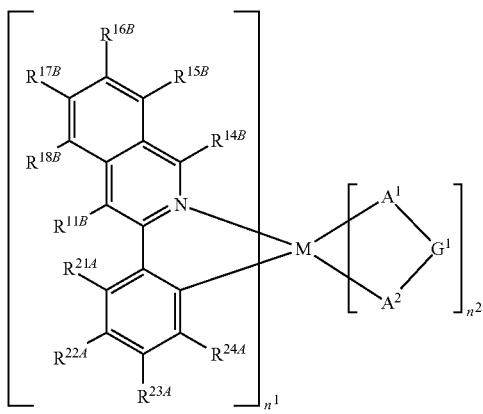

(1-B5)

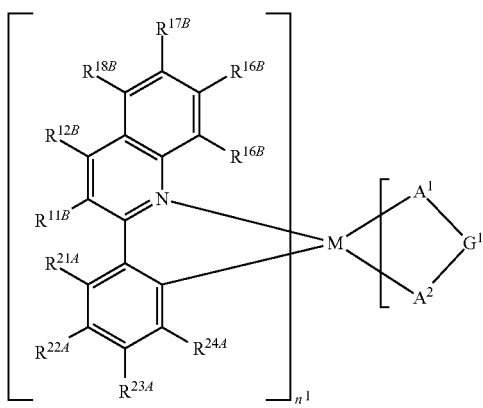

wherein,
M, $n^1$, $n^2$, $R^{21A}$, $R^{22A}$, $R^{23A}$, $R^{24A}$ and $A^1$-$G^1$-$A^2$ represent the same meaning as described above, $n^{11}$ and $n^{21}$ each independently represent 1 or 2, however, $n^{11}+n^{21}$ is 3 when M is a ruthenium atom, a rhodium atom or an iridium atom, while $n^{11}+n^{21}$ is 2 when M is a palladium atom or a platinum atom, $R^{11B}$, $R^{12B}$, $R^{13B}$, $R^{14B}$, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence, in the formula (1-B1), $R^{11B}$ and $R^{12B}$, $R^{12B}$ and $R^{13B}$, $R^{13B}$ and $R^{14B}$, and $R^{11B}$ and $R^{21A}$ may each be combined together to form a ring together with atoms to which they are attached, in the formula (1-B2), $R^{13B}$ and $R^{14B}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ may each be combined together to form a ring together with atoms to which they are attached, in the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ may each be combined together to form a ring together with atoms to which they are attached, in the formula (1-B4), $R^{11B}$ and $R^{18B}$, $R^{14B}$ and $R^{15B}$, $R^{15B}$ and $R^{16B}$, $R^{16B}$ and $R^{17B}$, $R^{17B}$ and $R^{18B}$, and $R^{11B}$ and $R^{21A}$ may each be combined together to form a ring together with atoms to which they are attached, and in the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and $R^{18B}$ and $R^{11B}$ and $R^{21A}$ may each be combined together to form a ring together with atoms to which they are attached.

5. The light emitting device according to claim 3, wherein said phosphorescent compound represented by the formula (1-A) is a phosphorescent compound represented by the following formula (1-A1), formula (1-A2), formula (1-A3) or formula (1-A4):

(1-A1)

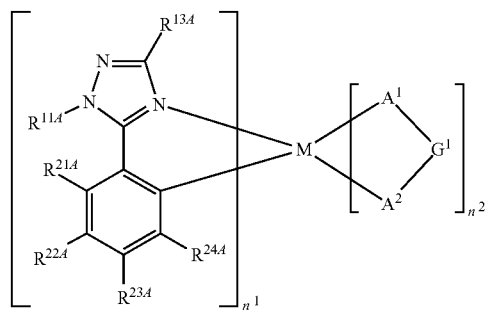

(1-A2)

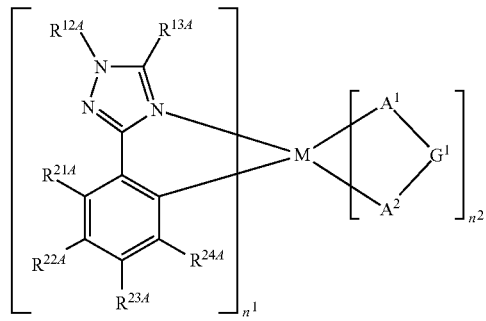

(1-A3)

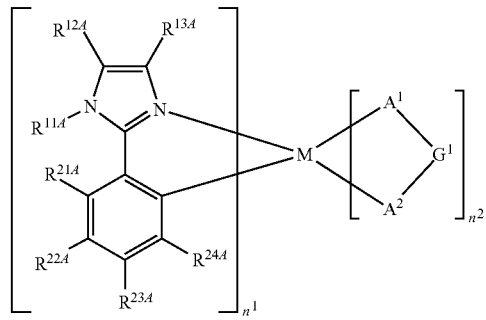

-continued

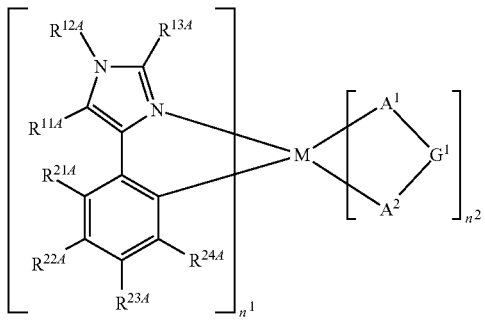

(1-A4)

wherein, M, n$^1$, n$^2$, R$^{21A}$, R$^{22A}$, R$^{23A}$, R$^{24A}$ and A$^1$-G$^1$-A$^2$ represent the same meaning as described above, R$^{11A}$, R$^{12A}$ and R$^{13A}$ each independently represent a hydrogen atom, an alkyl group, a cycloalkyl group, an alkoxy group, a cycloalkoxy group, an aryl group, an aryloxy group, a monovalent heterocyclic group, a substituted amino group or a halogen atom, and the foregoing groups optionally have a substituent, and when a plurality of R$^{11A}$, R$^{12A}$ and R$^{13A}$ are present, they may be the same or different at each occurrence, in the formula (1-A1), R$^{11A}$ and R$^{21A}$ may be combined together to form a ring together with atoms to which they are attached, in the formula (1-A2), R$^{12A}$ and R$^{13A}$ may be combined together to form a ring together with atoms to which they are attached, and in the formula (1-A3) and the formula (1-A4), R$^{11A}$ and R$^{12A}$, R$^{12A}$ and R$^{13A}$, and R$^{11A}$ and R$^{21A}$ may each be combined together to form a ring together with atoms to which they are attached.

6. The light emitting device according to claim 1, wherein said block that binds to the end group comprises at least one constitutional unit selected from the group consisting of a non-crosslinkable constitutional unit represented by the following formula (Y), a non-crosslinkable constitutional unit represented by said formula (X), a non-crosslinkable constitutional unit represented by said formula (Z) and a constitutional unit having a crosslinkable group:

 (Y)

wherein, Ar$^{Y1}$ represents an arylene group which optionally has a substituent.

7. The light emitting device according to claim 1, wherein said block that binds to the end group does not comprise said non-crosslinkable constitutional unit represented by the formula (X) and said non-crosslinkable constitutional unit represented by the formula (Z).

8. The light emitting device according to claim 1, wherein said block that does not bind to the end group further comprises at least one constitutional unit selected from the group consisting of a non-crosslinkable constitutional unit represented by the formula (Y) and a constitutional unit having a crosslinkable group:

 (Y)

wherein, Ar$^{Y1}$ represents an arylene group which optionally has a substituent.

9. The light emitting device according to claim 1, wherein said block copolymer comprises a constitutional unit having a crosslinkable group.

10. The light emitting device according to claim 6, wherein said constitutional unit having a crosslinkable group is at least one selected from the group consisting of a constitutional unit represented by the following formula (2) and a constitutional unit represented by the following formula (2'):

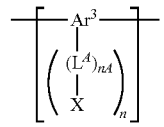 (2)

wherein, nA represents an integer of 0 or more and 5 or less, and n represents an integer of 1 or more and 5 or less, and when a plurality of nA are present, they may be the same or different, Ar$^3$ represents an aromatic hydrocarbon group or a heterocyclic group, and the foregoing groups optionally have a substituent, L$^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, and when a plurality of L$^A$ are present, they may be the same or different, X represents said crosslinkable group, and when a plurality of X are present, they may be the same or different,

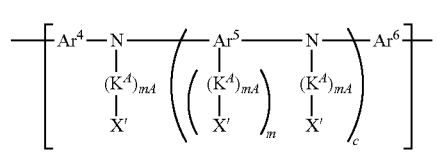 (2')

wherein, mA represents an integer of 0 or more and 5 or less, m represents an integer of 1 or more and 5 or less, and c represents 0 or 1, and when a plurality of mA are present, they may be the same or different, Ar$^5$ represents an aromatic hydrocarbon group, a heterocyclic group, or a group in which at least one aromatic hydrocarbon group and at least one heterocyclic group are bonded directly, and the foregoing groups optionally have a substituent, Ar$^4$ and Ar$^6$ each independently represent an arylene group or a divalent heterocyclic group, and the foregoing groups optionally have a substituent, Ar$^4$, Ar$^5$ and Ar$^6$ each may be bonded directly or via an oxygen atom or a sulfur atom, to a group other than that group bonding to a nitrogen atom to which that group is bonded, to form a ring, K$^A$ represents an alkylene group, a cycloalkylene group, an arylene group, a divalent heterocyclic group, a group represented by —NR"—, an oxygen atom or a sulfur atom, and the foregoing groups optionally have a substituent, R" represents a hydrogen atom, an alkyl group, a cycloalkyl group, an aryl group or a monovalent heterocyclic group, and the foregoing groups optionally have a substituent, and when a plurality of $K^A$ are present, they may be the same or different, X' represents said crosslinkable group, a hydrogen atom, an alkyl group, a cycloalkyl group, an aryl group or a monovalent heterocyclic group, and the foregoing groups optionally have a substituent, and when a plurality of X' are present, they may be the same or different, however, at least one X' is said crosslinkable group.

11. The light emitting device according to claim 6, wherein said crosslinkable group comprises at least one structure selected from the group consisting of a carbon-carbon double bond, a carbon-carbon triple bond, oxirane, oxetane, aziridine, azetidine, azide, benzocyclobutene and naphthocyclobutene.

12. The light emitting device according to claim 6, wherein said crosslinkable group comprises at least one group selected from the group consisting of crosslinkable groups represented by the formula (XL-1) to the formula (XL-19) in Group A:

(Group A)

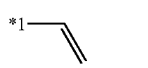
(XL-1)

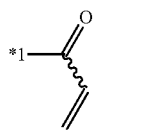
(XL-2)

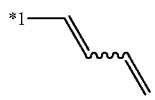
(XL-3)

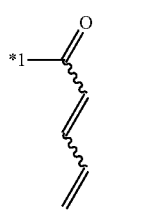
(XL-4)

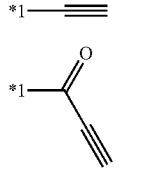
(XL-5)

(XL-6)

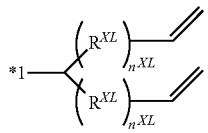
(XL-7)

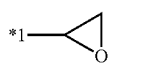
(XL-9)

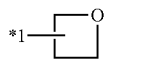
(XL-10)

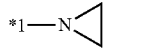
(XL-11)

(XL-12)

(XL-13)

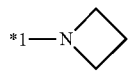
(XL-14)

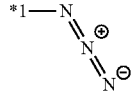
(XL-8)

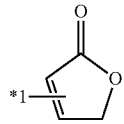
(XL-15)

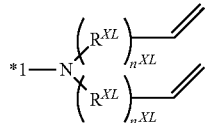
(XL-16)

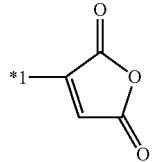
(XL-17)

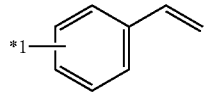
(XL-18)

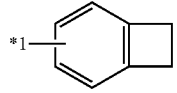
(XL-19)

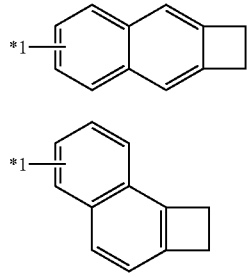

wherein,
- $n^{XL}$ represents an integer of 0 or more and 5 or less, and a plurality of n may be the same or different,
- $R^{XL}$ represents a methylene group, an oxygen atom or a sulfur atom, and when a plurality of R are present, they may be the same or different,
- the wavy line indicates that the group having the wavy line is any one of a plurality of geometric isomers or comprises a plurality of geometric isomers,
- *1 represents a binding position,
- the crosslinkable group in Group A optionally has a substituent, and when a plurality of the substituents are present, they may be combined together to form a ring together with carbon atoms to which they are attached.

13. The light emitting device according to claim 6, wherein said crosslinkable group comprises at least one group selected from the group consisting of a crosslinkable group represented by the following formula (XL-1), a crosslinkable group represented by the following formula (XL-16), a crosslinkable group represented by the following formula (XL-17), a crosslinkable group represented by the following formula (XL-18) and a crosslinkable group represented by the following formula (XL-19):

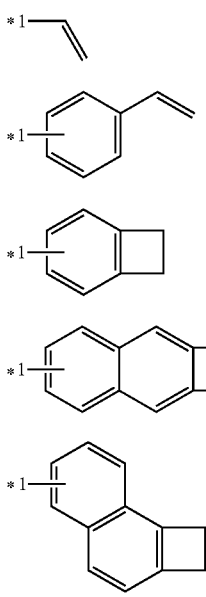

(XL-1)

(XL-16)

(XL-17)

(XL-18)

(XL-19)

wherein,

*1 represents a binding position, said crosslinkable group represented by the formula (XL-1), the formula (XL-16), the formula (XL-17), the formula (XL-18) or the formula (XL-19) optionally has a substituent, and when a plurality of the substituents are present, they may be combined together to form a ring together with carbon atoms to which they are attached.

14. The light emitting device according to claim 1, which satisfies said formula (i).

15. The light emitting device according to claim 1, wherein said first organic layer is a layer further comprising a compound represented by the following formula (H-1), a polymer compound comprising at least one selected from the group consisting of a non-crosslinkable constitutional unit represented by the following formula (Y) and a non-crosslinkable constitutional unit represented by the following formula (Z), or both the compounds:

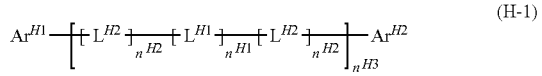

(H-1)

wherein, $Ar^{H1}$ and $Ar^{H2}$ each independently represent an aryl group or a monovalent heterocyclic group, and the foregoing groups optionally have a substituent, $n^{H1}$ and $n^{H2}$ each independently represent 0 or 1, and when a plurality of $n^{H1}$ are present, they may be the same or different, and the plurality of $n^{H2}$ may be the same or different, $n^{H3}$ represents an integer of 0 or more and 10 or less, $L^{H1}$ represents an arylene group, a divalent heterocyclic group, or a group represented by $-[C(R^{H11})_2]n^{H11}-$, and the foregoing groups optionally have a substituent, and when a plurality of $L^{H1}$ are present, they may be the same or different, and $n^{H11}$ represents an integer of 1 or more and 10 or less, $R^{H11}$ represents a hydrogen atom, an alkyl group, a cycloalkyl group, an alkoxy group, a cycloalkoxy group, an aryl group or a monovalent heterocyclic group, and the foregoing groups optionally have a substituent, a plurality of $R^{H11}$ may be the same or different and may be combined together to form a ring together with carbon atoms to which they are attached, $L^{H2}$ represents a group represented by $-N(-L^{H21}-R^{H21})-$, and when a plurality of $L^{H2}$ are present, they may be the same or different, $L^{H21}$ represents a single bond, an arylene group or a divalent heterocyclic group, and the foregoing groups optionally have a substituent, and $R^{H21}$ represents a hydrogen atom, an alkyl group, a cycloalkyl group, an aryl group or a monovalent heterocyclic group, and the foregoing groups optionally have a substituent,

(Y)

wherein, $Ar^{Y1}$ represents an arylene group which optionally has a substituent,

(Z)

wherein, $Ar^Z$ represents a divalent heterocyclic group, or a divalent group in which at least one arylene group and at least one divalent heterocyclic group are directly bonded, and the foregoing groups optionally have a substituent.

16. The light emitting device according to claim 1, wherein said first organic layer further comprises at least one material selected from the group consisting of a hole transporting material, a hole injection material, an electron transporting material, an electron injection material and a light emitting material.

17. The light emitting device according to claim 1, wherein said first organic layer and said second organic layer are adjacent to each other.

18. The light emitting device according to claim 1, wherein said second organic layer is a layer provided between said anode and said first organic layer.

* * * * *